US011133894B2

(12) United States Patent
Zhang et al.

(10) Patent No.: US 11,133,894 B2
(45) Date of Patent: Sep. 28, 2021

(54) INFORMATION TRANSMISSION METHOD, AND DECODING METHOD AND APPARATUS

(71) Applicant: HUAWEI TECHNOLOGIES CO., LTD., Guangdong (CN)

(72) Inventors: Huazi Zhang, Hangzhou (CN); Rong Li, Hangzhou (CN); Yunfei Qiao, Hangzhou (CN); Hejia Luo, Hangzhou (CN); Gongzheng Zhang, Hangzhou (CN); Ying Chen, Hangzhou (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

(21) Appl. No.: 16/529,514

(22) Filed: Aug. 1, 2019

(65) Prior Publication Data

US 2019/0356342 A1 Nov. 21, 2019

Related U.S. Application Data

(63) Continuation of application No. PCT/CN2018/073229, filed on Jan. 18, 2018.

(30) Foreign Application Priority Data

Feb. 3, 2017 (CN) ......................... 201710063758.3

(51) Int. Cl.

| | |
|---|---|
| ***H04L 1/00*** | (2006.01) |
| ***H03M 13/00*** | (2006.01) |
| ***H03M 13/11*** | (2006.01) |
| ***H03M 13/15*** | (2006.01) |

(52) U.S. Cl.

CPC ....... *H04L 1/0061* (2013.01); *H03M 13/1174* (2013.01); *H03M 13/157* (2013.01); *H03M 13/616* (2013.01)

(58) Field of Classification Search

CPC .............. H04L 1/0061; H03M 13/616; H03M 13/1174

See application file for complete search history.

(56) References Cited

U.S. PATENT DOCUMENTS

| | | | | |
|---|---|---|---|---|
| 10,320,522 | B2 * | 6/2019 | Jeong | H03M 13/1191 |
| 2008/0065959 | A1 * | 3/2008 | Pisek | H03M 13/091 714/758 |

(Continued)

FOREIGN PATENT DOCUMENTS

| | | |
|---|---|---|
| CN | 101094000 A | 12/2007 |
| CN | 101192833 A | 6/2008 |

(Continued)

OTHER PUBLICATIONS

Extended European Search Report issued in European Application No. 18747486.1 dated May 15, 2020, 9 pages.

(Continued)

*Primary Examiner* — Joseph D Torres

(74) *Attorney, Agent, or Firm* — Fish & Richardson P.C.

(57) ABSTRACT

The present disclosure relates to information transmission method, decoding method, and apparatus. One example method includes encoding, by a sending device, a to-be-encoded sequence based on preset parameters to obtain an encoded sequence, where the preset parameters include a quantity of check bits, positions of the check bits, and a check equation, and sending the encoded sequence to a receiving device.

18 Claims, 4 Drawing Sheets

(56) References Cited

U.S. PATENT DOCUMENTS

| | | | | |
|---|---|---|---|---|
| 2014/0019820 A1* | 1/2014 | Vardy | H03M 13/13 714/752 |
| 2014/0169388 A1* | 6/2014 | Jeong | H03M 13/1191 370/474 |
| 2014/0173376 A1 | 6/2014 | Jeong et al. | |
| 2017/0353193 A1* | 12/2017 | Jang | H03M 13/13 |

FOREIGN PATENT DOCUMENTS

| | | | |
|---|---|---|---|
| CN | 101753150 | A | 6/2010 |
| CN | 102158894 | A | 8/2011 |
| CN | 103684477 | A | 3/2014 |
| CN | 103780329 | A | 5/2014 |
| CN | 105471545 | A | 4/2016 |
| CN | 105680883 | A | 6/2016 |
| CN | 106209113 | A | 12/2016 |
| EP | 1487118 | B1 | 8/2006 |
| WO | 2014017062 | A1 | 1/2014 |
| WO | 2015002896 | A1 | 1/2015 |

OTHER PUBLICATIONS

Huawei et al., Summary of polar code design for control channels, ,3GPP TSG RAN WG1 Ad-Hoc Meeting, R1-1700088, Spokane, USA, XP051207630, Jan. 16-20, 2017, 10 pages.

Intel Corporation, "Polar code design," 3GPP TSG RAN WG1 Ad Hoc, R1-1700386, Spokane, USA, XP051207923,, Jan. 16-20, 2017, 12 pages.

PCT International Search Report and Written Opinion issued in International Application No. PCT/CN2018/073229 dated Mar. 28, 2018, 16 pages (with English translation).

R1-1608862—Huawei, HiSilicon, "Polar Code Construction for NR," 3GPP TSG RAN WG1 Meeting #86bis, Lisbon, Portugal, Oct. 10-14, 2016, 8 pages.

Ma et al., "Research on polar codes about channel polarization,coding and decoding," Harbin Institute of Technology, Journal of Qiqihar University, vol. 32, No. 1, Jan. 2016, 6 pages (with English abstract).

Niu et al., "CRC-Aided Decoding of Polar Codes," IEEE Communications Letters, vol. 16, No. 10, Oct. 2012, 4 pages.

Office Action issued in Chinese Application No. 201910711193.4 dated Apr. 15, 2020, 31 pages (with English translation).

Office Action issued in Chinese Application No. 201710063758.3 dated May 28, 2020, 22 pages (with English translation).

Office Action issued in Chinese Application No. 201710063758.3 dated Jan. 21, 2021, 5 pages (with English translation).

Xiuchuan, "Research on High Performance Error Correcting Codes with Iterative Decoding," Tianjin University Master Thesis, Dec. 2013, 57 pages (with English Abstract).

Wang et al., "Parity-Check-Concatenated Polar Codes," IEEE Communications Letters, vol. 20, No. 12, Dec. 12, 2016, 4 pages.

* cited by examiner

INFORMATION TRANSMISSION METHOD, AND DECODING METHOD AND APPARATUS

CROSS-REFERENCE TO RELATED APPLICATIONS

This application is a continuation of International Application No. PCT/CN2018/073229, filed on Jan. 18, 2018, which claims priority to Chinese Patent Application No. 201710063758.3, filed on Feb. 3, 2017. The aforementioned patent applications are incorporated herein by reference in their entirety.

TECHNICAL FIELD

This application relates to communications technologies, and in particular, to an information transmission method and a decoding method and apparatus.

BACKGROUND

A polar code (Polar Code) is a new type of channel encoding proposed by E. Arikan in 2008. The polar code is designed based on channel polarization (Channel Polarization), and is the first constructive encoding scheme that can be proved by a strict mathematical method to have achieved a channel capacity. The polar code is a linear block code with a generator matrix $G_N$ and an encoding process $x_1^N=u_1^N G_N$, where $u_1^N=(u_1, u_2, \ldots u_N)$ is a binary row vector having a length N (that is, a code length); and $G_N$ is an N×N matrix, and $G_N=F_2^{\otimes(log_2(N))}$. Herein, $$F_2=\begin{bmatrix}1 & 0\\ 1 & 1\end{bmatrix},$$

and $F_2^{237\ (log_2(N))}$ is defined as a Kronecker (Kronecker) product of $\log_2 N$ matrices $F_2$.

$$F=\begin{bmatrix}1 & 0\\ 1 & 1\end{bmatrix}$$

$$F^{\otimes 2}=\begin{bmatrix}1 & 0 & 0 & 0\\ 1 & 1 & 0 & 0\\ 1 & 0 & 1 & 0\\ 1 & 1 & 1 & 1\end{bmatrix}$$

$$F^{\otimes 3}=\begin{bmatrix}1 & 0 & 0 & 0 & 0 & 0 & 0 & 0\\ 1 & 1 & 0 & 0 & 0 & 0 & 0 & 0\\ 1 & 0 & 1 & 0 & 0 & 0 & 0 & 0\\ 1 & 1 & 1 & 1 & 0 & 0 & 0 & 0\\ 1 & 0 & 0 & 0 & 1 & 0 & 0 & 0\\ 1 & 1 & 0 & 0 & 1 & 1 & 0 & 0\\ 1 & 0 & 1 & 0 & 1 & 0 & 1 & 0\\ 1 & 1 & 1 & 1 & 1 & 1 & 1 & 1\end{bmatrix}$$

In a polar encoding process, some bits in $u_1^N$ are used to carry information and referred to as information bits, and a set of indices of these bits is denoted as A; other bits are set to fixed values pre-agreed on between a transmit end and a receive end (and referred to as fixed bits), and a set of indices of these bits is represented by a complementary set $A^c$ of A. Without loss of generality, these fixed bits are usually set to 0, and a sequence of the fixed bits may be arbitrarily set, provided that a pre-agreement is made between the transmit end and the receive end. Therefore, output of polar encoding may be simplified as; $x_1^N=u_A G_N(A)$. Herein, $u_A$ is a set of information bits in $u_1^N$, $u_A$ is a row vector of a length K, that is, $|A|=K$, $|\bullet|$ represents a quantity of elements in a set. K is a size of an information block. $G_N(A)$ is a submatrix including rows in the matrix $G_N$ that correspond to the indices in the set A, and $G_N(A)$ is a K×N matrix. A construction process of the polar code is a selection process of the set A, and performance of the polar code depends on the set A.

After the polar code is proposed, in a common information transmission mode, polar encoding is performed on a to-be-sent information block to obtain an encoded block, and then the encoded block is transmitted. However, data transmission in this manner has a relatively high error rate and relatively low transmission reliability.

SUMMARY

This application provides an information transmission method and apparatus, to resolve problems of a relatively high error rate of data transmission and relatively low transmission reliability in a common information transmission mode in which polar encoding is performed on to-be-sent data, that is, an information block, to obtain an encoded block and the encoded block is then transmitted.

A first aspect of this application provides an information transmission method, including:

encoding, by a sending device, a to-be-encoded sequence based on preset parameters, to obtain an encoded sequence, where the parameters include a quantity of check bits, positions of the check bits, and a check equation, a length of the to-be-encoded sequence is K, and K is an integer greater than 0; and sending, by the sending device, the encoded sequence to a receiving device.

In a specific implementation of the foregoing solution:

the quantity of the check bits is preconfigured, or the quantity of the check bits is determined based on a list length of a decoder, or the quantity of the check bits is determined based on a code length and a code rate, or the quantity of the check bits is determined based on a preconfigured quantity of bits, a list length of a decoder, a code length, and a code rate.

In the foregoing solution, when the check bits are cyclic redundancy check (Cyclic Redundancy Check. CRC) bits:

the quantity (also referred to as a length) of the check bits may be specified in a protocol or configured to be 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like; the quantity of the check bits may alternatively be determined based on a size of a list, and a formula $F_1=\text{ceil}(\log_2(L))$ is used, where L represents the size of the list. $F_1$ represents the quantity of the check bits, the function cell represents rounding up, or may be rounding down or rounding off during actual application, possible sizes (also referred to as lengths) L of the list are 1, 2, 4, 8, 16, 32, 64, 128, 256, 512, and 1024, and quantities $F_1$ of check bits corresponding to the sizes L of the list are 0, 1, 2, 3, 4, 5, 6, 7, 8, 9, and 10; the quantity of the check bits may alternatively be determined by using a code length and a code rate, where "$F_2=\text{ceil}(\log_2(M))$", or "$F_2=\text{ceil}(\log_2(K))$", or "$F_2=\text{ceil}(a*\log_2(N))$", where a is a coefficient. K represents the length of the to-be-encoded sequence (also referred to as an information bit length). M represents a code length (after encoding, and after rate matching). $F_2$ represents the quantity of the check bits, and the function cell represents rounding up, or may be rounding down or rounding off during actual application; in addition, the quantity of the check bits may alternatively be a combination of quantities obtained by using the foregoing manners.

When the check bits are parity check (Parity Check. PC) bits:

the quantity of the check bits may be configured to be 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like; the quantity of the check bits may alternatively be determined based on a size of a list, and a formula. $F_1$=ceil($\log_2$ (L)) is used, where L represents the size of the list. $F_1$ represents the quantity of the check bits, the function cell represents rounding up, or may be rounding down or rounding off during actual application, possible sizes (also referred to as lengths) L of the list are 1, 2, 4, 8, 16, 32, 64, 128, 256, 512, and 1024, and quantities $F_1$ of check bits corresponding to the sizes L of the list are 0, 1, 2, 3, 4, 5, 6, 7, 8, 9, and 10; the quantity of the check bits may alternatively be determined by using a code length and a code rate, and a PC quantity=$f_p$=$F_2$", where "$F_2$=ceil($\log_2$ (N)*(α−|α*(K/M−½)|$^2$))" or "$F_2$=ceil($\log_2$ (M))", where a is a coefficient greater than 0, and may usually be 0.75, 1, 1.25, 1.5, or the like, N represents a mother code length (after encoding, and before rate matching). K represents the length of the to-be-encoded sequence (also referred to as an information bit length). M represents a code length (after encoding, and after rate matching). $F_2$ represents the quantity of the check bits, and the function cell represents rounding up, or may be rounding down or rounding off during actual application; in addition, the quantity of the check bits may alternatively be a combination of quantities obtained by using the foregoing manners.

In a specific implementation, when the check bits are CRC bits, the positions of the CRC bits are: bit positions selected from a new generator matrix, where the new generator matrix is obtained by performing row-column transformation on a CRC generator matrix and moving CRC bits in the CRC generator matrix that depend only on some information bits to subchannels with smaller sequence numbers.

In another implementation, when the check bits are PC bits, the positions of the PC bits are:

preset, where the positions of the PC bits correspond to a position of any bit in the to-be-encoded sequence, or correspond to positions of a plurality of bits in the to-be-encoded sequence, where positions of at least two of the plurality of bits are non-consecutive; or determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_P$ is used to represent reliability corresponding to a least reliable subchannel in a set of subchannels whose reliability is greater than the information threshold $Z_I$ and whose row weight is the largest among all check subchannels.

Based on any one of the foregoing solutions, when the check bits are PC bits, the check equation is determined based on a check equation table, where the check equation table includes at least PC check bits, information bits, and information bits that participate in the check equation. In a specific implementation, the check equation table further includes fixed bits and shortened bits.

A second aspect of this application provides an information transmission method, including:

receiving, by a receiving device, an encoded sequence sent by a sending device, where the encoded sequence is obtained by encoding a to-be-encoded sequence based on preset parameters, a length of the to-be-encoded sequence is K, and K is an integer greater than 0; and decoding, by the receiving device, the encoded sequence based on the preset parameters, to obtain a decoded sequence, where the parameters include a quantity of check bits, positions of the check bits, and a check equation.

In the foregoing solution:

the quantity of the check bits is preconfigured, or the quantity of the check bits is determined based on a list length of a decoder, or the quantity of the check bits is determined based on a code length and a code rate, or the quantity of the check bits is determined based on a preconfigured quantity of bits, a list length of a decoder, a code length, and a code rate.

In the foregoing solution, when the check bits are CRC bits:

the quantity (also referred to as a length) of the check bits may be specified in a protocol or configured to be 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like; the quantity of the check bits may alternatively be determined based on a size of a list, and a formula $F_1$=ceil($\log_2$ (L)) is used, where L represents the size of the list. $F_1$ represents the quantity of the check bits, the function cell represents rounding up, or may be rounding down or rounding off during actual application, possible sizes (also referred to as lengths) L of the list are 1, 2, 4, 8, 16, 32, 64, 128, 256, 512, and 1024, and quantities $F_1$ of check bits corresponding to the sizes L of the list are 0, 1, 2, 3, 4, 5, 6, 7, 8, 9, and 10; the quantity of the check bits may alternatively be determined by using a code length and a code rate, where "$F_2$=ceil($\log_2$ (M))", or "$F_2$=ceil($\log_2$ (K))", or "$F_2$=ceil(a*$\log_2$ (N))", where a is a coefficient. K represents the length of the to-be-encoded sequence (also referred to as an information bit length). M represents a code length (after encoding, and after rate matching). $F_2$ represents the quantity of the check bits, and the function cell represents rounding up, or may be rounding down or rounding off during actual application; in addition, the quantity of the check bits may alternatively be a combination of quantities obtained by using the foregoing manners.

When the check bits are PC bits:

the quantity of the check bits may be configured to be 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like; the quantity of the check bits may alternatively be determined based on a size of a list, and a formula $F_1$=ceil($\log_2$ (L)) is used, where L represents the size of the list. $F_1$ represents the quantity of the check bits, the function cell represents rounding up, or may be rounding down or rounding off during actual application, possible sizes (also referred to as lengths) L of the list are 1, 2, 4, 8, 16, 32, 64, 128, 256, 512, and 1024, and quantities $F_1$ of check bits corresponding to the sizes L of the list are 0, 1, 2, 3, 4, 5, 6, 7, 8, 9, and 10; the quantity of the check bits may alternatively be determined by using a code length and a code rate, and a PC quantity=$F_P$=$F_2$", where "$F_2$=ceil($\log_2$ (N)*(α-|α*(K/M−½)|$^2$))" or "$F_2$=ceil($\log_2$ (M))", where a is a coefficient greater than 0, and may usually be 0.75, 1, 1.25, 1.5, or the like, N represents a mother code length (after encoding, and before rate matching). K represents the length of the to-be-encoded sequence (also referred to as an information bit length). M represents a code length (after encoding, and after rate matching). $F_2$ represents the quantity of the check bits, and the function cell represents rounding up, or may be rounding down or rounding off during actual application; in addition, the quantity of the check bits may alternatively be a combination of quantities obtained by using the foregoing manners.

In a specific implementation, when the check bits are CRC bits, the positions of the CRC bits are:

bit positions selected from a new generator matrix, where the new generator matrix is obtained by performing row-column transformation on a CRC generator matrix and moving CRC bits in the CRC generator matrix that depend only on some information bits to subchannels with smaller sequence numbers.

In another implementation, when the check bits are PC bits, the positions of the PC bits are:

preset, where the positions of the PC bits correspond to a position of any bit in the to-be-encoded sequence, or correspond to positions of a plurality of bits in the to-be-encoded sequence, where positions of at least two of the plurality of bits are non-consecutive; or determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_P$ is used to represent reliability corresponding to a least reliable subchannel in a set of subchannels whose reliability is greater than the information threshold $Z_I$ and whose row weight is the largest among all check subchannels.

Based on any one of the foregoing solutions, when the check bits are parity check PC bits, the check equation is determined based on a check equation table, where the check equation table includes at least PC check bits, information bits, and information bits that participate in the check equation. In a specific implementation, the check equation table further includes fixed bits and shortened bits.

A third aspect of this application provides an information transmission apparatus, including:

a processing module, configured to encode a to-be-encoded sequence based on preset parameters, to obtain an encoded sequence, where the parameters include a quantity of check bits, positions of the check bits, and a check equation, a length of the to-be-encoded sequence is K, and K is an integer greater than 0; and a sending module, configured to send the encoded sequence to a receiving device.

In another implementation, when the check bits are CRC bits, the positions of the CRC bits are:

bit positions selected from a new generator matrix, where the new generator matrix is obtained by performing row-column transformation on a CRC generator matrix and moving CRC bits in the CRC generator matrix that depend only on some information bits to subchannels with smaller sequence numbers.

In another implementation, when the check bits are PC bits, the positions of the PC bits are:

preset, where the positions of the PC bits correspond to a position of any bit in the to-be-encoded sequence, or correspond to positions of a plurality of bits in the to-be-encoded sequence, where positions of at least two of the plurality of bits are non-consecutive; or determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_P$ is used to represent reliability corresponding to a least reliable subchannel in a set of subchannels whose reliability is greater than the information threshold $Z_I$ and whose row weight is the largest among all check subchannels.

Based on any one of the foregoing implementations, when the check bits are PC bits, the check equation is determined based on a check equation table, where the check equation table may include PC check bits, information bits, fixed bits, shortened bits, and information bits that participate in the check equation.

A fourth aspect of this application provides an information transmission apparatus, including:

a receiving module, configured to receive an encoded sequence sent by a sending device, where the encoded sequence is obtained by encoding a to-be-encoded sequence based on preset parameters, a length of the to-be-encoded sequence is K, and K is an integer greater than 0; and a processing module, configured to decode the encoded sequence based on the preset parameters, to obtain a decoded sequence, where the parameters include a quantity of check bits, positions of the check bits, and a check equation.

In an implementation, when the check bits are CRC bits, the positions of the CRC bits are:

bit positions selected from a new generator matrix, where the new generator matrix is obtained by performing row-column transformation on a CRC generator matrix and moving CRC bits in the CRC generator matrix that depend only on some information bits to subchannels with smaller sequence numbers.

In another implementation, when the check bits are PC bits, the positions of the PC bits are:

preset, where the positions of the PC bits correspond to a position of any bit in the to-be-encoded sequence, or correspond to positions of a plurality of bits in the to-be-encoded sequence, where positions of at least two of the plurality of bits are non-consecutive; or determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_I$ is used to represent reliability corresponding to a least reliable subchannel in a set of subchannels whose reliability is greater than the information threshold $Z_I$ and whose row weight is the largest among all check subchannels.

Based on any one of the foregoing solutions, when the check bits are PC bits, the check equation is determined based on a check equation table, where the check equation table includes PC check bits, information bits, fixed bits, shortened bits, and information bits that participate in the check equation.

A fifth aspect of this application provides a decoding method, including: receiving, by a receiving device, a to-be-decoded bit sequence from a sending device, where the to-be-decoded bit sequence includes at least information bits and at least one check bit; and decoding, by the receiving device, the to-be-decoded bit sequentially by using a successive cancellation list SCL decoding algorithm, where 1 candidate paths having optimal metrics are output, $1 \le l \le L$. L is a width of an SCL, and L is an integer greater than or equal to 1; and checking, starting from a candidate path having an optimal metric. T candidate paths by using the at least one check bit, and using a bit sequence in a first candidate path that passes the check as a decoding output, where T is an integer, and $1 \le T \le 1$.

A metric is used to represent a decoding success rate calculated by a decoder side. The "starting from a candidate path having an optimal metric" means starting from a path having a highest decoding success rate calculated by the decoder side.

A sixth aspect of this application provides a decoding apparatus, including:

a receiving module, configured to receive a to-be-decoded bit sequence from a sending device, where the to-be-decoded bit sequence includes at least information bits and at least one check bit; and a processing module, configured to decode the to-be-decoded bit sequentially by using a successive cancellation list SCL decoding algorithm, where 1 candidate paths having optimal metrics are output, $1 \le 1 \le L$. L is a width of an SCL, and L is an integer greater than or equal to 1, where the processing module is further configured to: check, starting from a candidate path having an optimal metric. T candidate paths by using the at least one check bit, and use a bit sequence in a first candidate path that passes the check as a decoding output, where T is an integer, and $1 \le T \le 1$.

A seventh aspect of this application provides a sending device, including:

a processor, configured to encode a to-be-encoded sequence based on preset parameters, to obtain an encoded sequence, where the parameters include a quantity of check bits, positions of the check bits, and a check equation, a length of the to-be-encoded sequence is K, and K is an integer greater than 0; and a transmitter, configured to send the encoded sequence to a receiving device.

In a specific implementation of the sending device, the sending device may further include a memory, and there is at least one processor, configured to execute a computer executable instruction stored in the memory, so that the sending device exchanges data with the receiving device by using a communications interface to perform the information transmission method provided in the first aspect or various implementations of the first aspect. Optionally, the memory may be integrated inside the processor.

An eighth aspect of this application provides a receiving device, including:

a receiver, configured to receive an encoded sequence sent by a sending device, where the encoded sequence is obtained by encoding a to-be-encoded sequence based on preset parameters, a length of the to-be-encoded sequence is K, and K is an integer greater than 0; and a processor, configured to decode the encoded sequence based on the preset parameters, to obtain a decoded sequence, where the parameters include a quantity of check bits, positions of the check bits, and a check equation.

In a specific implementation of the receiving device, the receiving device may further include a memory, and there is at least one processor, configured to execute an executable instruction stored in the memory, so that the receiving device exchanges data with the sending device by using a communications interface to perform the information transmission method provided in the second aspect or various implementations of the second aspect, or the receiving device performs the decoding method provided in the fifth aspect. Optionally, the memory may be further integrated inside the processor.

A ninth aspect of this application provides a readable storage medium, where the readable storage medium stores an executable instruction, and when at least one processor of a sending device executes the executable instruction, the sending device performs the information transmission method provided in the first aspect or various implementations of the first aspect.

A tenth aspect of this application provides a readable storage medium, where the readable storage medium stores an executable instruction, and when at least one processor of a receiving device executes the executable instruction, the receiving device performs the information transmission method provided in the second aspect or various implementations of the second aspect, or the receiving device performs the decoding method provided in the fifth aspect or various implementations of the fifth aspect.

A eleventh aspect of this application provides a program product, where the program product includes an executable instruction, and the executable instruction is stored in a readable storage medium. At least one processor of a sending device may read the executable instruction from the readable storage medium, and the at least one processor executes the executable instruction so that the sending device implements the information transmission method provided in the first aspect or various implementations of the first aspect.

A twelfth aspect of this application provides a program product, where the program product includes an executable instruction, and the executable instruction is stored in a readable storage medium. At least one processor of a receiving device may read the executable instruction from the readable storage medium, and the at least one processor executes the executable instruction so that the receiving device implements the information transmission method provided in the second aspect or various implementations of the second aspect, or the receiving device performs the decoding method provided in the fifth aspect or various implementations of the fifth aspect.

In the information transmission method and the decoding method and apparatus provided in this application, the sending device encodes the to-be-encoded sequence based on the preset parameters, to obtain the encoded sequence, where the parameters include the quantity of the check bits, the positions of the check bits, and the check equation, the parameters of the sending device need to be preset, the to-be-encoded sequence is then precoded based on the check bits, and polar encoding is then performed; and sends the encoded sequence to the receiving device. This effectively reduces an error rate in data transmission, and improves reliability of data transmission.

DESCRIPTION OF EMBODIMENTS

The technical solutions in the embodiments of this application may be applied to a 5G communications system or a future communications system, and may also be applied to other wireless communications systems, such as a Global System for Mobile Communications (Global System for Mobile Communications, GSM), a Code Division Multiple Access (Code Division Multiple Access, CDMA) system, a Wideband Code Division Multiple Access (Wideband Code Division Multiple Access, WCDMA) system, a general packet radio service (General Packet Radio Service. GPRS), a Long Term Evolution (Long Term Evolution, LTE) system, an LTE Frequency Division Duplex (Frequency Division Duplex, FDD) system, an LIE Time Division Duplex (Time Division Duplex, TDD) system, and a Universal Mobile Telecommunications System (Universal Mobile Telecommunications System. UNITS).

Figure 1:
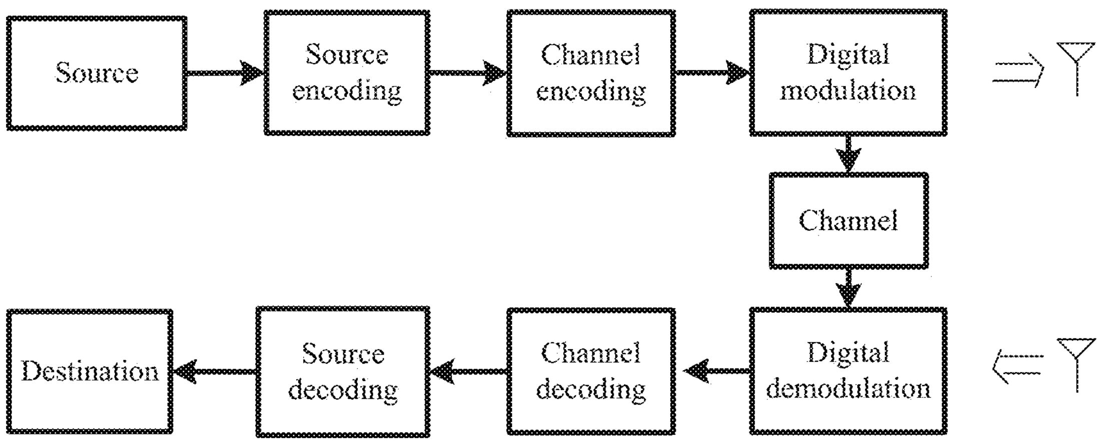
FIG. 1 is a basic schematic flowchart of wireless communication.

FIG. 1 is a basic schematic flowchart of wireless communication. As shown in FIG. 1, at a transmit end, source encoding, channel encoding, and digital modulation are sequentially performed at a source before the source is sent. At a receive end, digital demodulation, channel decoding, and source decoding are sequentially performed before a destination is output. A polar code may be used in channel encoding, and SC decoding. SCL decoding, and the like may be used in channel decoding. To improve performance of the polar code, many improved technologies such as a CA-polar code, a PC-polar code, and CA+PC-polar code based on the polar code are proposed at present.

Figure 2:
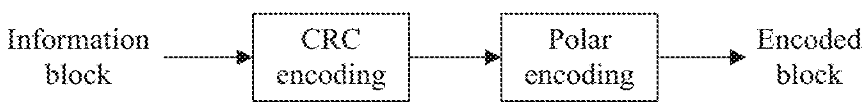
FIG. 2 is a schematic diagram of encoding in a CA-polar manner.

FIG. 2 is a schematic diagram of encoding in a CA-polar manner. To be specific, concatenated cyclic redundancy check (Cyclic Redundancy Check. CRC) encoding is first performed on a to-be-encoded information block, and polar encoding is then performed to obtain an encoded block for sending. CA-polar encoding is also referred to as CRC concatenated polar encoding. Correspondingly, during decoding, a CA-SCL (CRC-Aided Successive Cancellation List) decoding algorithm may be used to perform decoding. That is, a candidate path that passes CRC is selected from a plurality of candidate paths output by SCL decoding as a decoding output. The performance of the polar code can be significantly improved by using the CA-SCL decoding algorithm. CA-polar may be uniquely determined by using the following parameters; a quantity of CRC check bits, positions of the CRC check bits, and a CRC check equation.

Figure 3:
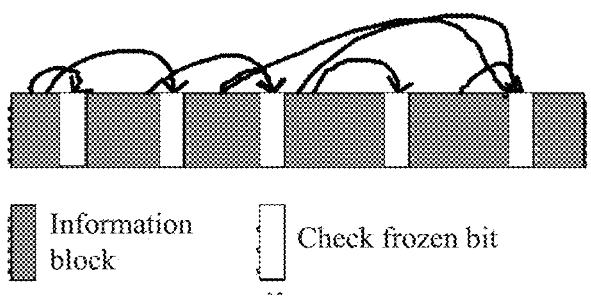
FIG. 3 is a schematic diagram of encoding in a PC-polar (Parity-check-Polar) manner.

FIG. 3 is a schematic diagram of encoding in a PC-polar (Parity-check-Polar) manner. A main idea of PC-polar is to select some check frozen bits, which are also referred to as parity check bits (parity-check) or dynamic frozen (Dynamic Frozen) bits, and distribute the check frozen bits into an information block. Values of these check frozen bits are determined based on a check equation by using information bits before these check frozen bits. PC-polar decoding may be based on an SCL decoding algorithm. Processing on information bits and processing on static frozen bits are the same as processing in the SCL decoding algorithm and a difference lies in processing on the check frozen bits. Specifically, the check frozen bits are used to complete a sorting process and a pruning process in a decoding process. In PC-SCL decoding, a most reliable path is finally output. PC-polar is uniquely determined by using the following parameters: a quantity of the check frozen bits, positions of the check frozen bits, and the check equation.

Figure 4:
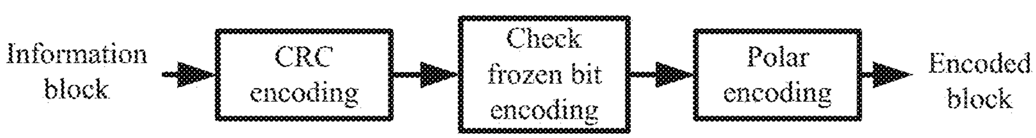
FIG. 4 is a schematic diagram of encoding in a PC+CA-polar manner.

FIG. 4 is a schematic diagram of encoding in a PC+CA-polar manner. An encoding process includes: (1) first performing concatenated cyclic redundancy check (Cyclic Redundancy Check. CRC) encoding on a to-be-encoded information block; (2) performing PC encoding, that is, determining values of information bits, static frozen bits, and check frozen bits; and (3) then performing polar encoding to obtain an encoded block. A CRC encoding matrix is uniquely determined by using the following parameters: a quantity of CRC check bits, positions of the CRC check bits, and a CRC check equation. PC encoding is determined by using the following parameters: a quantity of the check frozen bits, positions of the check frozen bits, and a check equation.

In conclusion, for check concatenated polar encoding (CA-polar. PC-polar or PC+CA-polar), an encoding matrix may be uniquely determined by using the following parameters: a quantity of check bits, positions of the check bits, and selection of a check equation. These parameters may be determined in various manners, which are described in the following embodiments. In subsequent technical solutions, it should be understood that if no distinction is made between CRC bits and PC bits. CRC-related content is applicable to PC, and PC-related content is also applicable to CRC.

Figure 5:
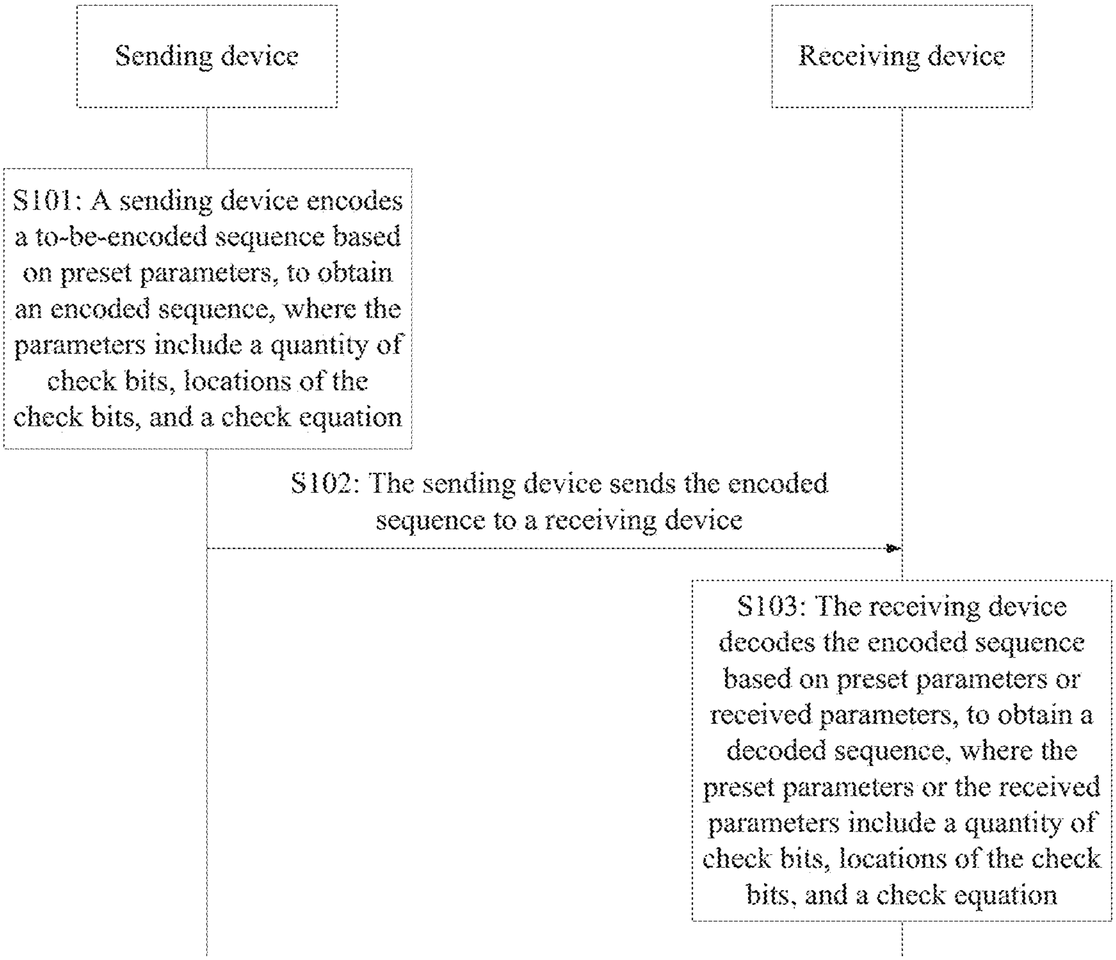
FIG. 5 is a schematic flowchart of Embodiment 1 of an information transmission method according to this application.

FIG. 5 is a schematic flowchart of Embodiment 1 of an information transmission method according to this application. As shown in FIG. 5, based on the schematic flowchart of communication in FIG. 1, or between other sending devices and receiving devices that exchange information, the information transmission method provided in this application specifically includes the following steps.

S101: A sending device encodes a to-be-encoded sequence based on preset parameters, to obtain an encoded sequence, where the parameters include a quantity of check bits, positions of the check bits, and a check equation.

The check bits are used to check information bits. The check can be implemented in various manners such as a CA-polar encoding scheme, a PC-polar encoding scheme, or a PC+CA-polar encoding scheme, but a person skilled in the art may understand that implementation may be not limited to these encoding schemes, provided that the check bits are used in an encoding process to check the information bits.

In this step, the sending device needs to perform encoding processing on a to-be-sent sequence. To enable a receiving device to correctly decode the encoded sequence sent by the sending device, the parameters used in the encoding process, such as the quantity of the check bits, the positions of the check bits, and the check equation, need to be pre-agreed on between the sending device and the receiving device. Alternatively, the sending device needs to notify the receiving device of these parameters before the receiving device performs decoding. The parameters may be specified in a protocol and configured on the sending device, or may be obtained through negotiation between the sending device and the receiving device, or are carried in a notification message sent by another device. This is not limited in this solution.

In a specific implementation of this solution, a manner of determining the quantity of the check bits includes at least the following manners:

the quantity of the check bits is preconfigured; or the quantity of the check bits is determined based on a list length of a decoder; or the quantity of the check bits is determined based on a code length and a code rate; or the quantity of the check bits is determined based on a preconfigured quantity of bits, a list length of a decoder, a code length, and a code rate, that is, quantities obtained by using the foregoing three manners are combined as the quantity of the check bits (also referred to as the length of the check bits); or the quantity of the check bits is J, and $J \geq \log_2(T/FAR)$, where T is a maximum quantity of checks that are allowed to be performed by using a check bit, and FAR is a maximum false alarm rate of a single check performed by using a check bit; or the quantity of the check bits is J(T), and $J(T)+J(1)+\Delta J=J(1)+\log_2 T$, where J(1) is a quantity of check bits that need to be used in a single check. J(T) is a quantity of check bits that need to be used in T checks, and T is a maximum quantity of checks that are allowed to be performed by using a check bit. When T=1, one check means one error detection for a decoding result corresponding to a path.

The positions of the check bits may be consecutive positions whose quantity is the same as that of the check bits and that are selected after the to-be-encoded sequence is sorted based on sequence numbers, or may be randomly selected positions, or may be directly preset, or may be positions determined based on preset position parameters.

Specifically, a manner for determining the positions of the check bits includes at least the following manners:

In a first manner, the positions of the check bits are: positions of $F_P$ consecutive bits selected starting from a bit whose position sequence number is $N_X$ in descending order of position sequence numbers of bits in the to-be-encoded sequence; or positions of $F_P$ consecutive bits selected starting from a bit whose position sequence number is $N_X$ in ascending order of position sequence numbers of bits in the to-be-encoded sequence, where $0 \leq N_X \leq K$, $0 < F_P < K$, and a position sequence number of a bit in the to-be-encoded sequence is any integer greater than or equal to 0 and less than K.

In a second manner, the positions of the check bits are: bit positions selected from a new generator matrix, where the new generator matrix is obtained by performing row-column transformation on a check generator matrix and moving check bits in the check generator matrix that depend only on some information bits to subchannels with smaller sequence numbers.

In a third manner, the positions of the check bits correspond to a position of any bit in the to-be-encoded sequence.

In a fourth manner, the positions of the check bits correspond to positions of a plurality of bits in the to-be-encoded sequence, where positions of at least two of the plurality of bits are non-consecutive.

In a fifth manner, the positions of the check bits are determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_P$ is used to represent reliability corresponding to a least reliable subchannel in a set of subchannels whose reliability is greater than the information threshold $Z_I$ and whose row weight is the largest among all check subchannels.

Similarly, the check equation may be preconfigured, or determined based on a polynomial or a check equation table. The polynomial in the check equation may be represented by using any one of forms such as a binary form, an octal form, a decimal form, a hexadecimal form, and a position vector.

After obtaining the required parameters of the check bits, the sending device first encodes the to-be-encoded sequence by using a check matrix and then performs polar encoding to obtain the encoded sequence. In an optional embodiment, the check matrix and a matrix of a polar code may be combined into one matrix. That is, the to-be-encoded sequence is encoded by using the combined matrix to obtain the encoded sequence.

S102: The sending device sends the encoded sequence to a receiving device.

S103: The receiving device decodes the encoded sequence based on preset parameters or received parameters, to obtain a decoded sequence, where the preset parameters or the received parameters include a quantity of check bits, positions of the check bits, and a check equation.

In the foregoing steps, the sending device sends the encoded sequence to the receiving device, and after receiving the encoded sequence sent by the sending device, the receiving device needs to perform decoding processing to obtain the decoded sequence. Therefore, the receiving device also requires the quantity of the check bits, the positions of the check bits, and the check equation to perform decoding.

The preset parameters may be specified in a protocol and configured on the receiving device, or may be obtained through negotiation between the sending device and the receiving device, or are carried in a notification message sent by the sending device or another device to the receiving device. This is not limited in this solution.

The quantity of the check bits, the positions of the check bits, and the check equation that are used by the receiving device in decoding are the same as those used by the sending device. How these parameters are determined has been described above, and details are not described herein again.

In the information transmission method provided in this embodiment, the sending device encodes the to-be-encoded sequence based on the preset parameters, to obtain the encoded sequence, where the parameters include the quantity of the check bits, the positions of the check bits, and the check equation, the parameters of the sending device need to be preset, the to-be-encoded sequence is then precoded based on the check bits, and polar encoding is then performed; and sends the encoded sequence to the receiving device. This effectively reduces an error rate in information transmission, and improves reliability of information transmission.

With reference to the foregoing embodiment, how the parameters used in the encoding process during information transmission by the sending device are determined is specifically described below. A CRC check or a PC check is used as an example to specifically describe manners for determining the quantity of the check bits, the positions of the check bits, and the check equation. For example, a method for determining CRC-related parameters is applicable to CA-polar and CA+PC-polar encoding schemes, and a method for determining PC-related parameters is applicable to PC-polar and CA+PC-polar encoding schemes. The CRC-related parameters include: a quantity of CRC bits, positions of the CRC bits, and a CRC check equation. The PC-related parameters include: a quantity of PC bits, positions of the PC bits, and a PC check equation.

1. The quantity of the check bits (also referred to as a length of the check bits)

For an encoding scheme such as a CA-polar encoding scheme or a CA+PC-polar encoding scheme in which CRC bits are used to perform a check in an encoding process, a quantity of the CRC bits may be determined by using any one of the following manners:

(1). The quantity of the CRC bits is preconfigured, that is, a CRC length is fixed in advance.

It is preconfigured in a device that the length of the CRC bits (that is, the quantity of the CRC bits) is a fixed value, or it is specified in a protocol that the length of the CRC bits (that is, the quantity of the CRC bits) is a fixed value. For example, "the quantity of the CRC bits is $J=F_0$". For example, $F_0$=2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like.

(2). The quantity of the CRC bits may be determined based on a list (list) length of a decoder.

For example, the quantity of the CRC bits is $J=F_1$.

"$F_1$=ceil($\log_2$ (L))", where L represents a size of the list. $F_1$ represents the quantity of the check bits, the function cell represents rounding up, or may be rounding down or rounding off during actual application, possible sizes (also referred to as lengths) L of the list are 1, 2, 4, 8, 16, 32, 64, 128, 256, 512, and 1024, and quantities $F_1$ of check bits corresponding to the sizes L of the list are 0, 1, 2, 3, 4, 5, 6, 7, 8, 9, and 10.

Alternatively, based on $F_0$ in the foregoing manner (1). $F_1$ is further added to a length of CRC, that is, the quantity of the CRC bits is $J=F_0+F_1$.

(3). The quantity of the CRC bits may be determined based on a code length and a code rate.

For example, "the quantity of the CRC bits is $J=F_2$", where "$F_2$=ceil($\log_2$ (M))" or "$F_2$=ceil($\log_2$ (K))" or "$F_2$=ceil(a*$\log_2$ (N))", where a is a coefficient. K represents a length of a to-be-encoded sequence (also referred to as an information bit length). M represents a code length (after encoding, and after rate matching). $F_2$ represents the quantity of the check bits, and the function cell represents rounding up, or may be rounding down or rounding off during actual application. In a specific implementation. $F_2$ may be 3, 4, 5, 6, 7, 8, 9, 10, or 11.

(4). The quantity of the CRC bits may be determined based on a preconfigured quantity of bits, a list length of a decoder, a code length, and a code rate.

For example, the quantity of the check bits may alternatively be a combination of quantities obtained by using the foregoing manners, that is, the quantity of the CRC bits is $J=F_0+F_1+F_2$.

For an encoding scheme such as a PC-polar encoding scheme or a CA+PC-polar encoding scheme in which PC bits are used to perform a check in an encoding process, a quantity of the PC bits (which may also be referred to as parity check bits, or parity check frozen bits, or dynamic frozen bits) may be determined by using one of the following manners: (1). The quantity of the PC bits may be preconfigured, that is, the quantity of the PC bits is fixed in advance:

It is preconfigured in a device that the length (that is, the quantity of the PC bits) of the PC bits is a fixed value, or it is specified in a protocol that the length of the PC bits (that is, the quantity of the PC bits) is a fixed value. For example, "the quantity of the PC bits is $P=F_0$". For example, $F_0$=2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 36, 40, 44, 48, 52, 56, 60, 64, or the like.

(2). The quantity of the PC bits may be determined based on a list (list) length of a decoder.

For example, the quantity of the PC bits is $P=F_1$.

"$F_1$=ceil($\log_2$ (L))", where L represents a size of the list. $F_1$ represents the quantity of the check bits, the function coil represents rounding up, or may be rounding down or rounding off during actual application, possible sizes (also referred to as lengths) L of the list are 1, 2, 4, 8, 16, 32, 64, 128, 256, 512, and 1024, and quantities Ft of check bits corresponding to the sizes L of the list are 0, 1, 2, 3, 4, 5, 6, 7, 8, 9, and 10.

Alternatively, based on $F_0$ in the foregoing manner (1). $F_1$ is further added to a length of PC, that is, the quantity of the PCbits is $P=F_0+F_1$.

(3). The quantity of the PC bits may be determined based on a code length and a code rate.

For example, the quantity of the PC bits is $P=F_2$, where $F_2$=ceil($\log_2$ (N)*(α−|α*(K/M−½|²)) or $F_2$=ceil($\log_2$ (M)), where a is a coefficient greater than 0, and may usually be 0.75, 1, 1.25, 1.5, or the like. N represents a mother code length (after encoding, and before rate matching). K represents the length of the to-be-encoded sequence (also referred to as an information bit length). M represents a code length (after encoding, and after rate matching). $F_2$ represents the quantity of the check bits, and the function cell represents rounding up, or may be rounding down or rounding off during actual application.

(4). The quantity of the PC bits may be determined based on a preconfigured quantity of bits, a list length of a decoder, a code length, and a code rate.

That is, the quantity of the PC bits is a combination of the foregoing parameters. For example, the quantity of the PC bits is $P=F_0+F_1+F_2$.

2. The positions of the check bits

For an encoding scheme such as a CA-polar encoding scheme or a CA+PC-polar encoding scheme in which CRC bits are used to perform a check in an encoding process, positions of the CRC bits may be determined by using any one of the following manners:

(1). The positions of the CRC bits are consecutive.

For example, a position sequence number of a bit in a to-be-encoded sequence is any integer greater than or equal to 0 and less than a length K of the to-be-encoded sequence. That is, each bit in the to-be-encoded sequence has a unique sequence number. The sequence numbers are consecutive and different numbers. In this case, a specific manner for determining the positions of the CRC bits is as follows: Positions of J consecutive bits selected starting from a bit whose position sequence number is $N_X$ in descending order of position sequence numbers of bits in the to-be-encoded sequence may be used as the positions of the CRC bits; or positions of J consecutive bits selected starting from a bit whose position sequence number is $N_X$ in ascending order of position sequence numbers of bits in the to-be-encoded sequence may be used as the positions of the CRC bits. $0 \le N_X < K$, and $0 < J < K$. For example, the last J consecutive positions are selected as the positions of the CRC bits.

(2). The positions of the CRC bits are non-consecutive.

In this manner, the positions of the CRC bits may be bit positions selected from a new generator matrix, where the new generator matrix is obtained by performing row-column transformation on a CRC generator matrix and moving CRC bits in the CRC generator matrix that depend only on some information bits to subchannels with smaller sequence numbers.

For example, basic row-column transformation (for example. Gaussian elimination) and/or row-column permutation (for example, column rearrangement) are/is performed on the generator matrix of the CRC bits, and then some CRC bits depend only on some information bits or are related only to some information bits. Therefore, these CRC bits may be moved to subchannels with smaller sequence numbers (for example, a column corresponding to these CRC bits in the CRC generator matrix and a column following these information bits exchange positions), to help eliminate an error path in advance during decoding.

A 3-bit CRC is used as an example. If a generator matrix of the 3-bit CRC is as follows:

$$G_{CRC} = \begin{bmatrix} 1 & 0 & 0 & 1 & 0 & 1 \\ 0 & 1 & 0 & 0 & 1 & 1 \\ 0 & 0 & 1 & 1 & 1 & 0 \end{bmatrix}$$

It may be found that the last bit (corresponding to the sixth column of the generator matrix) of the three CRC bits is related only to the first two bits. Therefore, the column corresponding to the last CRC bit may be moved to the third column in the CRC generator matrix:

$$G_{CRC} = \begin{bmatrix} 1 & 0 & 1 & 1 & 0 & 0 \\ 0 & 1 & 1 & 0 & 1 & 0 \\ 0 & 0 & 0 & 1 & 1 & 1 \end{bmatrix}$$

In this way, when a receive end decodes the third bit, the third bit may be considered as a check bit and may be set to an XOR, value of the first two bits, and a path that does not satisfy a preset value is removed.

In the foregoing example, an example in which the quantity of the check bits is 3 is used for description. In a specific implementation, the quantity of the check bits is not limited in this solution.

The positions of the non-consecutive CRC bits may alternatively be determined by using another method. For example, a CRC generator matrix is simplified through Gaussian elimination, and then CRC bits that depend only on some information bits are moved ahead through row-column permutation.

For example, $x_p=(u_i+u_j+ \ldots +u_k)$, that is, a $p^{th}$ bit of a CRC codeword is a modulo-2 sum of $i^{th}$, $j^{th}$, . . . , and $k^{th}$ information bits. The $p^{th}$ bit of the CRC bits is moved ahead to a $(\max\{i, j, \ldots, k\}+1)^{th}$ position, where $x_p$ represents a value of a check position of the $p^{th}$ check bit, $u_i$ represents a decoding value of an $i^{th}$ information bit, and i, j, . . . , and k represent sequence numbers of information bits.

For an encoding scheme such as a PC-polar encoding scheme or a CA+PC-polar encoding scheme in which PC bits are used to perform a check in an encoding process, positions of the PC bits may be determined by using any one of the following manners:

(1) The positions of the PC bits are consecutive.

This manner means that a position sequence number of a bit in a to-be-encoded sequence is any integer greater than or equal to 0 and less than a length K of the to-be-encoded sequence. That is, each bit in the to-be-encoded sequence has a unique sequence number, and the sequence numbers are consecutive and different numbers. In this case, a specific manner for determining the positions of the PC bits is as follows: Positions of P consecutive bits selected starting from a bit whose position sequence number is $N_X$ in descending order of position sequence numbers of bits in the to-be-encoded sequence may be used as the positions of the PC bits; or positions of P consecutive bits selected starting from a bit whose position sequence number is $N_X$ in ascending order of position sequence numbers of bits in the to-be-encoded sequence may be used as the positions of the PC bits. $0 \le N_X \le K$, and $0<P<K$. For example, P consecutive positions before a CRC bit may be selected as the positions of the PC bits.

(2) The positions of the PC bits are random.

For example, a position of any PC bit may be preset. For PC positions that are not based on any pattern, all the PC positions may be stored in a table. This manner is usually used in a super-short code. Generally, the positions of the PC bits correspond to a position of any bit in the to-be-encoded sequence, or correspond to positions of a plurality of bits in the to-be-encoded sequence, where positions of at least two of the plurality of bits are non-consecutive.

(3) The positions of the PC bits are selected based on a subchannel row weight.

For a long code, if the positions of all the PC bits are stored, relatively high storage overheads are caused. Some patterns may be used to reduce the storage overheads and accelerate hardware implementation. In this solution, the positions of the PC bits may be determined based on position parameters, where the position parameters include at least an information threshold $Z_I$ and a check threshold $Z_P$, the information threshold $Z_I$ is used to represent reliability corresponding to a least reliable subchannel of all information subchannels, and the check threshold $Z_P$ is used to represent reliability corresponding to a least reliable subchannel in a set of subchannels whose reliability is greater than the information threshold $Z_I$ and whose row weight is the largest among all information subchannels. A specific determining process includes:

First, a normalized reliability sequence $Z_I$ is defined: A sequence Q of subchannel sequence numbers sorted in ascending order of reliability and a sequence length $N_{max}$ are given, and normalized reliability may be uniquely defined as: for i from 0 to $N_{max}-1$, set $Z[Q_i]=i$; endfor.

A row weight $RW_i$ corresponding to a subchannel is defined as a quantity of 1s in a row corresponding to the $i^{th}$ subchannel in a polar code generator matrix.

A Hamming weight $HW_i$ of a sequence number of a subchannel is defined as a quantity of 1s in a binary representation of the sequence number of the $i^{th}$ subchannel. For example, a sequence number of a fifth subchannel may be represented by 101 in binary system, and $HW_5=2$. For all subchannels i. $RW_i=2\hat{}(HW_i)$ is satisfied. Because HW has a smaller value range, it is more likely to use HW rather than RW for representation in standards and hardware.

Positions of information bits/frozen bits/check bits of a PC-polar code may be uniquely determined by using two or three parameters.

The information threshold $Z_I$ represents reliability (or a polarization weight) corresponding to a least reliable subchannel of all information subchannels (excluding shortened positions).

The check threshold $Z_P$ represents reliability corresponding to a least reliable subchannel in a set of subchannels whose reliability is greater than that of the least reliable information bit ($>Z_I$) and whose row weight is the largest among all check subchannels (excluding shortened positions).

(Optionally) A check row weight $RW_P$ (or a check Hamming weight $HW_P$) represents a row weight (or a check Hamming weight) corresponding to a subchannel whose reliability is equal to the check threshold $Z_P$, and may be obtained through unique conversion by using $Z_P$, or may be directly given as a parameter.

($Z_I$. $Z_P$. $RW_P$) and the row weight $RW_i$ and the row weight $Z_i$ of the $i^{th}$ subchannel are given, and optional positions (shortened positions are not included in an optional range) of potential PC bits can be obtained, and may include three types:

Type-A PC bit positions are a position ($Z \geq Z_I$ && $RW=RW_P/2$) whose subchannel row weight is $RW_P/2$ and whose reliability is not less than the information threshold and a position ($Z \geq Z_P$ && $RW-RW_P$) whose row weight is $RW_P$ and whose reliability is not less than the check threshold.

Type-B PC bit positions are all subchannel positions ($Z<Z_I$) whose reliability is less than the information threshold.

Type-W PC bit positions are a union of the following two types of positions: (1) all the type-A subchannel positions and (2) positions, in the type-B subchannel positions, whose row weight is $RW_P/2$ and whose row weight is $RW_P$, that is, (($RW=RW_P/2$)||($Z<Z_I$ && $RW=RW_P$)||($Z>Z_P$ && $RW=RW_P$)).

After the foregoing types of positions of the PC bits are given, the positions of the PC bits and positions of other bits in the PC-polar code may be determined in the following manner:

(1) Type-A check: Only type-A PC bit positions are selected (positions having relatively high reliability), and include:

F (frozen bits): $Z_i<Z_I$;

PF (PC bits): ($RW_i=RW_P/2$ && $Z_i>Z_I$)||($RW_i=RW_P$ && $Z_i>Z_P$); and I (information bits): $Z_i \geq Z_I$ && I≠(PF||P).

(2) Type-B check: Only type-B PC bit positions (positions having relatively low reliability) are selected, and include:

PF (PC bits): $Z_i<Z_I$; and

I (information bits): $Z_i \geq Z_I$ && I≠(PF||P).

(3) Type-W check: Type-W PC bit positions are selected, and include:

F (frozen bits): $Z_i<Z_I$ && $RW_i \neq RW_P$;

PF (PC bits): ($RW_i==RW_P/2$)||($RW_i==RW_P$ && $Z_i>Z_P$)||($Z_i<Z_I$ && $RW==RW_P$); and I (information bits): $Z_i \geq Z_I$ && I≠(PF||P).

(4) Full check: Positions of all non-information bits and non-shortened subchannels are selected, and include:

PF (PC bits): $Z_i<Z_I$||($RW_i<RW_P$)||($RW_i--RW_P$ && $Z_i>Z_P$); or

I (information bits): $Z_i \geq Z_I$ && I≠(PF||P).

(5) Hybrid check: CRC check and a check code that is generated by using any one of the foregoing types of PC bit positions are concatenated.

Examples of possible cases of a normalized reliability sequence and a subchannel row weight sequence are provided below:

(1). Normalized reliability sequence $Z_i$:

$Z_i$ (8): 0, 1, 2, 4, $Z_i$ (16): 0, 1, 2, 5, 3, 6, 7, 11, 4, 8, 9, 12, 10, 13, 14, 15;

$Z_i$ (32): 0, 1, 2, 6, 3, 7, 8, 15, 4, 9, 10, 17, 12, 18, 20, 26, 5, 11, 13, 19, 14, 21, 22, 27, 16, 23, 24, 28, 25, 29, 30, 31;

$Z_i$ (64): 0, 1, 2, 6, 3, 8, 9, 18, 4, 10, 11, 21, 13, 23, 25, 37, 5, 12, 14, 24, 16, 27, 29, 41, 19, 30, 32, 43, 35, 46, 48, 56, 7, 15, 17, 28, 20, 31, 33, 44, 22, 34, 36, 47, 39, 49, 51, 58, 26, 38, 40, 50, 42, 52, 53, 59, 45, 54, 55, 60, 57, 61, 62, 63;

$Z_i$ (128): 0, 1, 2, 6, 3, 8, 9, 19, 4, 10, 12, 23, 14, 26, 29, 46, 5, 13, 15, 27, 17, 31, 34, 52, 20, 35, 38, 56, 42, 61, 65, 84, 7, 16, 18, 33, 21, 36, 39, 58, 25, 41, 45, 64, 49, 68, 72, 90, 30, 47, 51, 70, 54, 74, 77, 95, 60, 79, 83, 99, 87, 103, 105, 116, 11, 22, 24, 40, 28, 44, 48, 67, 32, 50, 53, 73, 57, 76, 80, 97, 37, 55, 59, 78, 63, 82, 86, 102, 69, 88, 91, 106, 94, 109, 111, 120, 43, 62, 66, 85, 71, 89, 92, 107, 75, 93, 96, 110, 100, 112, 114, 122, 81, 98, 101, 113, 104, 115, 117, 123, 108, 118, 119, 124, 121, 125, 126, 127;

$Z_i$ (256): 0, 1, 2, 6, 3, 8, 9, 20, 4, 10, 12, 24, 14, 27, 30, 51, 5, 13, 15, 28, 18, 33, 37, 59, 21, 38, 42, 65, 47, 72, 78, 108, 7, 17, 19, 36, 22, 40, 43, 68, 26, 46, 50, 77, 55, 83, 88, 120, 32, 53, 58, 86, 63, 92, 97, 130, 71, 100, 107, 138, 114, 146, 152, 182, 11, 23, 25, 44, 29, 49, 54, 81, 34, 56, 60, 89, 66, 94, 101, 133, 41, 64, 69, 98, 76, 106, 112, 144, 84, 115, 121, 153, 127, 160, 165, 194, 48, 74, 80, 110, 87, 118, 124, 156, 93, 126, 132, 164, 139, 170, 176, 203, 104, 136, 142, 173, 150, 180, 185, 210, 159, 188, 193, 216, 198, 220, 224, 239, 16, 31, 35, 57, 39, 62, 67, 96, 45, 70, 75, 105, 82, 113, 119, 151, 52, 79, 85, 116, 91, 123, 129, 162, 99, 131, 137, 168, 145, 175, 181, 207, 61, 90, 95, 128, 102, 134, 140, 171, 111, 143, 149, 179, 186, 191, 214, 122, 154, 161, 189, 166, 195, 199, 221, 174, 201, 206, 226, 211, 230, 232, 244, 73, 103, 109, 141, 117, 148, 155, 184, 125, 158, 163, 192, 169, 197, 202, 223, 135, 167, 172, 200, 178, 205, 209, 229, 187, 212, 215, 233, 219, 236, 238, 248, 147, 177, 183, 208, 190, 213, 217, 234, 196, 218, 222, 237, 227, 240, 242, 250, 204, 225, 228, 241, 231, 243, 245, 251, 235, 246, 247, 252, 249, 253, 254, 255;

$Z_i$ (512): 0, 1, 2, 6, 3, 8, 9, 20, 4, 10, 12, 24, 14, 28, 31, 54, 5, 13, 15, 29, 18, 34, 38, 63, 21, 39, 43, 70, 49, 78, 85, 124, 7, 17, 19, 37, 22, 41, 44, 73, 27, 48, 53, 84, 59, 92, 98, 141, 33, 56, 62, 95, 68, 103, 110, 155, 77, 114, 123, 168, 133, 180, 190, 242, 11, 23, 26, 46, 30, 52, 58, 90, 35, 60, 65, 100, 71, 107, 116, 161, 42, 69, 75, 112, 83, 122, 131, 178, 93, 134, 143, 192, 152, 203, 213, 267, 51, 81, 88, 128, 97, 139, 147, 197, 106, 151, 159, 211, 170, 222, 232, 287, 120, 165, 175, 227, 188, 240, 249, 303, 202, 254, 265, 317, 277, 329, 339, 386, 16, 32, 36, 61, 40, 67, 72, 109, 47, 76, 82, 121, 91, 132, 140, 189, 55, 86, 94, 135, 102, 145, 154, 205, 113, 157, 166, 217, 179, 230, 241, 295, 66, 101, 108, 153, 117, 162, 171, 223, 130, 177, 187, 239, 199, 251, 261, 313, 144, 193, 204, 256, 214, 268, 278, 330, 228, 282, 293, 344, 304, 355, 363, 407, 80, 119, 127, 174, 138, 186, 196, 248, 150, 201, 210, 264, 221, 276, 286, 338, 164, 215, 226, 280, 238, 292, 302, 353, 253, 305, 316, 365, 328, 375, 385, 424, 184, 236, 245, 299, 259, 311, 320, 369, 274, 326, 335, 382, 348, 393, 400, 437, 291, 342, 351, 396, 362, 406, 412, 447, 374, 415, 422, 454, 432, 461, 466, 486, 25, 45, 50, 79, 57, 89, 96, 137, 64, 99, 105, 149, 115, 160, 169, 220, 74, 111, 118, 163, 129, 176, 185, 237, 142, 191, 200, 252, 212, 266, 275, 327, 87, 126, 136, 183, 146, 195, 206, 258, 158, 209, 219, 273, 231, 285, 296, 347, 173, 225, 235, 290, 247, 301, 310, 361, 263, 315, 325, 373, 337, 384, 392, 431, 104, 148, 156, 207, 167, 218, 229, 283, 181, 233, 243, 297, 255, 307, 318, 367, 198, 250, 260, 312, 272, 324, 334, 381, 288, 340, 349, 394, 358, 403, 410, 445, 216, 270, 281, 332, 294, 345, 354, 398, 306, 357, 366, 409, 376, 417, 425, 456, 322, 371, 379, 420, 390, 429, 435, 464, 402, 439, 444, 471, 450, 475, 479, 495, 125, 172, 182, 234, 194, 246, 257, 309, 208, 262, 271, 323, 284, 336, 346, 391, 224, 279, 289, 341, 300, 352, 360, 405, 314, 364, 372, 414, 383, 423, 430, 460, 244, 298, 308, 359, 319, 368, 377, 418, 333, 380, 389, 428, 399, 436, 442, 469, 350, 395, 404, 440, 411, 446, 451, 476, 421, 453, 459, 481, 465, 485, 488, 500, 269, 321, 331, 378, 343, 388, 397, 434, 356, 401, 408, 443, 416, 449, 455, 478, 370, 413, 419, 452, 427, 458, 463, 484, 438, 467, 470, 489, 474, 492, 494, 504, 387, 426, 433, 462, 441, 468, 472, 490, 448, 473, 477, 493, 482, 496, 498, 506, 457, 480, 483, 497, 487, 499, 501, 507, 491, 502, 503, 508, 505, 509, 510, 511;

$Z_i$ (1024): 0, 1, 2, 6, 3, 8, 9, 20, 4, 10, 12, 24, 14, 28, 31, 55, 5, 13, 15, 29, 18, 34, 38, 64, 21, 39, 44, 72, 50, 81, 89, 133, 7, 17, 19, 37, 22, 42, 45, 76, 27, 49, 54, 88, 60, 97, 103, 154, 33, 57, 63, 100, 70, 109, 117, 171, 80, 121, 132, 187, 144, 202, 215, 286, 11, 23, 26, 47, 30, 53, 59, 94, 35, 61, 66, 105, 73, 113, 123, 177, 43, 71, 78, 119, 87, 131, 141, 199, 98, 145, 156, 217, 167, 232, 245, 322, 52, 85, 92, 138, 102, 151, 161, 224, 112, 166, 175, 243, 189, 258, 272, 353, 129, 184, 196, 266, 212, 283, 297, 380, 231, 304, 320, 403, 338, 423, 440, 530, 16, 32, 36, 62, 41, 69, 75, 116, 48, 79, 86, 130, 96, 143, 153, 214, 56, 90, 99, 146, 108, 159, 170, 235, 120, 173, 185, 252, 201, 270, 285, 366, 67, 106, 114, 168, 125, 180, 191, 261, 140, 198, 211, 282, 227, 300, 315, 398, 157, 218, 233, 306, 248, 325, 341, 426, 267, 346, 363, 449, 382, 470, 487, 576, 84, 128, 137, 195, 150, 210, 223, 295, 165, 230, 242, 319, 257, 337, 352, 439, 183, 250, 265, 344, 281, 362, 378, 466, 303, 384, 402, 490, 422, 510, 529, 617, 207, 278, 291, 374, 311, 393, 410, 499, 334, 419, 435, 525, 455, 545, 561, 650, 360, 446, 463, 552, 483, 572, 589, 675, 508, 596, 614, 697, 635, 716, 733, 804, 25, 46, 51, 83, 58, 93, 101, 149, 65, 104, 111, 164, 122, 176, 188, 256, 77, 118, 127, 182, 139, 197, 209, 280, 155, 216, 229, 302, 244, 321, 336, 421, 91, 136, 147, 206, 160, 222, 236, 310, 174, 241, 254, 333, 271, 351, 367, 454, 194, 264, 277, 359, 294, 377, 392, 482, 318, 401, 418, 507, 438, 528, 544, 634, 110, 162, 172, 238, 186, 253, 268, 347, 203, 273, 287, 369, 305, 386, 404, 492, 226, 299, 314, 397, 332, 417, 433, 523, 355, 442, 458, 548, 476, 566, 582, 669, 251, 329, 345, 430, 364, 450, 468, 556, 385, 474, 491, 580, 511, 599, 618, 700, 413, 503, 519, 609, 539, 629, 644, 727, 564, 653, 667, 749, 684, 764, 777, 845, 135, 193, 205, 276, 221, 293, 309, 391, 240, 317, 331, 416, 350, 437, 453, 543, 263, 343, 358, 445, 376, 465, 481, 571, 400, 489, 506, 595, 527, 616, 633, 715, 289, 372, 387, 477, 408, 497, 514, 603, 432, 522, 538, 628, 559, 648, 662, 744, 461, 551, 567, 655, 587, 674, 688, 768, 612, 696, 711, 786, 731, 803, 815, 875, 328, 412, 429, 518, 448, 537, 554, 642, 473, 563, 579, 666, 598, 683, 699, 776, 502, 592, 608, 693, 627, 710, 725, 798, 652, 735, 748, 819, 763, 833, 844, 899, 535, 624, 640, 722, 658, 739, 754, 823, 681, 761, 774, 842, 789, 854, 865, 916, 707, 784, 795, 860, 810, 871, 881, 928, 831, 889, 897, 941, 908, 949, 955, 983, 40, 68, 74, 115, 82, 126, 134, 192, 95, 142, 152, 213, 163, 228, 239, 316, 107, 158, 169, 234, 181, 249, 262, 342, 200, 269, 284, 365, 301, 383, 399, 488, 124, 179, 190, 260, 204, 275, 288, 371, 225, 298, 313, 396, 330, 415, 431, 521, 247, 324, 340, 425, 357, 444, 460, 550, 381, 469, 486, 575, 505, 594, 611, 695, 148, 208, 220, 292, 237, 312, 327, 411, 255, 335, 349, 436, 368, 456, 472, 562, 279, 361, 375, 464, 395, 485, 501, 591, 420, 509, 526, 615, 546, 636, 651, 734, 308, 390, 407, 496, 428, 517, 534, 623, 452, 542, 558, 647, 578, 665, 680, 760, 480, 570, 586, 673, 607, 692, 706, 783, 632, 714, 730, 802, 747, 818, 830, 888, 178, 246, 259, 339, 274, 356, 370, 459, 296, 379, 394, 484, 414, 504, 520, 610, 323, 405, 424, 512, 443, 532, 549, 638, 467, 555, 573, 659, 593, 678, 694, 772, 354, 441, 457, 547, 475, 565, 581, 668, 500, 590, 606, 691, 626, 709, 724, 797, 531, 619, 637, 718, 654, 736, 750, 820, 676, 755, 770, 837, 785, 851, 861, 913, 389, 479, 495, 585, 516, 605, 622, 705, 541, 631, 646, 729, 664, 746, 759, 829, 569, 656, 672, 752, 690, 769, 782, 849, 713, 787, 801, 863, 817, 876, 887, 932, 602, 687, 702, 779, 721, 794, 807, 868, 743, 814, 826, 884, 841, 896, 905, 946, 767, 835, 847, 901, 859, 912, 919, 958, 874, 922, 930, 965, 940, 972, 977, 998, 219, 290, 307, 388, 326, 409, 427, 515, 348, 434, 451, 540, 471, 560, 577, 663, 373, 462, 478, 568, 498, 588, 604, 689, 524, 613, 630, 712, 649, 732, 745, 816, 406, 494, 513, 601, 533, 621, 639, 720, 557, 645, 661, 742, 679, 758, 773, 840, 584, 671, 686, 766, 704, 781, 793, 858, 728, 800, 813, 873, 828, 886, 895, 939, 447, 536, 553, 641, 574, 660, 677, 756, 597, 682, 698, 775, 717, 790, 805, 866, 625, 708, 723, 796, 741, 812, 825, 883, 762, 832, 843, 898, 855, 909, 917, 956, 657, 738, 753, 822, 771, 838, 850, 903, 788, 853, 864, 915, 877, 924, 933, 967, 809, 870, 880, 927, 893, 937, 944, 975, 907, 948, 954, 982, 961, 987, 991, 1007, 493, 583, 600, 685, 620, 703, 719, 792, 643, 726, 740, 811, 757, 827, 839, 894, 670, 751, 765, 834, 780, 848, 857, 911, 799, 862, 872, 921, 885, 931, 938, 971, 701, 778, 791, 856, 806, 867, 878, 925, 824, 882, 892, 936, 904, 945, 952, 980, 846, 900, 910, 950, 918, 957, 962, 988, 929, 964, 970, 993, 976, 997, 1000, 1012, 737, 808, 821, 879, 836, 891, 902, 943, 852, 906, 914, 953, 923, 960, 966, 990, 869, 920, 926, 963, 935, 969, 974, 996, 947, 978, 981, 1001, 986, 1004, 1006, 1016, 890, 934, 942, 973, 951, 979, 984, 1002, 959, 985, 989, 1005, 994, 1008, 1010, 1018, 968, 992, 995, 1009, 999, 1011, 1013, 1019, 1003, 1014, 1015, 1020, 1017, 1021, 1022, 1023;

$Z_i$ (2048): 0, 1, 2, 6, 3, 8, 9, 20, 4, 10, 12, 24, 14, 28, 31, 55, 5, 13, 15, 29, 18, 34, 38, 64, 21, 39, 44, 73, 50, 82, 90, 137, 7, 17, 19, 37, 22, 42, 45, 77, 27, 49, 54, 89, 60, 98, 105, 160, 33, 57, 63, 101, 71, 111, 120, 178, 81, 124, 136, 196, 149, 213, 229, 312, 11, 23, 26, 47, 30, 53, 59, 95, 35, 61, 67, 107, 74, 116, 127, 186, 43, 72, 79, 122, 88, 135, 146, 210, 99, 150, 162, 231, 174, 248, 264, 357, 52, 86, 93, 143, 103, 156, 167, 239, 115, 173, 184, 262, 199, 279, 296, 397, 133, 193, 207, 288, 225, 308, 326, 431, 247, 334, 355, 462, 377, 488, 512, 641, 16, 32, 36, 62, 41, 70, 76, 119, 48, 80, 87, 134, 97, 148, 158, 227, 56, 91, 100, 151, 110, 165, 177, 251, 123, 181, 194, 272, 212, 293, 310, 412, 68, 108, 117, 175, 129, 189, 202, 283, 145, 209, 224, 307, 242, 329, 348, 455, 163, 232, 249, 337, 267, 360, 381, 492, 289, 387, 408, 524, 433, 553, 578, 712, 85, 132, 142, 206, 155, 223, 238, 324, 172, 246, 260, 353, 278, 376, 395, 510, 192, 269, 287, 384, 306, 407, 429, 548, 333, 437, 460, 583, 487, 613, 639, 779, 220, 303, 320, 425, 343, 449, 472, 598, 372, 483, 505, 634, 533, 664, 690, 834, 405, 519, 545, 675, 573, 706, 735, 879, 609, 745, 774, 919, 807, 954, 984, 1133, 25, 46, 51, 84, 58, 94, 102, 154, 66, 106, 114, 171, 126, 185, 198, 277, 78, 121, 131, 191, 144, 208, 222, 305, 161, 230, 245, 332, 263, 356, 375, 486, 92, 141, 152, 219, 166, 237, 252, 342, 182, 259, 274, 371, 294, 394, 414, 532, 205, 286, 302, 404, 323, 428, 448, 572, 352, 459, 482, 608, 509, 638, 663, 806, 112, 168, 179, 254, 195, 273, 290, 388, 215, 297, 314, 417, 336, 441, 464, 588, 241, 328, 346, 453, 370, 481, 502, 631, 399, 514, 537, 668, 565, 699, 725, 870, 270, 365, 385, 497, 409, 525, 550, 681, 438, 560, 585, 720, 614, 752, 781, 927, 475, 602, 625, 766, 655, 799, 824, 975, 694, 838, 865, 1016, 898, 1049, 1077, 1227, 140, 204, 218, 301, 236, 322, 341, 447, 258, 351, 369, 480, 393, 508, 530, 661, 285, 383, 403, 518, 427, 547, 571, 705, 458, 581, 607, 743, 637, 777, 805, 952, 317, 422, 442, 566, 469, 595, 619, 759, 501, 630, 654, 798, 686, 830, 856, 1008, 542, 673, 700, 843, 732, 877, 905, 1055, 771, 916, 946, 1094, 981, 1130, 1159, 1303, 364, 474, 496, 624, 523, 653, 679, 822, 559, 693, 718, 863, 751, 897, 925, 1075, 601, 738, 765, 911, 797, 945, 973, 1123, 837, 987, 1015, 1165, 1048, 1199, 1226, 1369, 648, 791, 817, 967, 849, 1000, 1028, 1179, 890, 1041, 1068, 1219, 1103, 1251, 1278, 1419, 939, 1089, 1117, 1264, 1151, 1297, 1324, 1460, 1193, 1337, 1363, 1495, 1395, 1525, 1548, 1661, 40, 69, 75, 118, 83, 130, 139, 203, 96, 147, 157, 226, 170, 244, 257, 350, 109, 164, 176, 250, 190, 268, 284, 382, 211, 291, 309, 410, 331, 435, 457, 580, 128, 188, 200, 281, 217, 300, 316, 421, 240, 327, 345, 452, 368, 479, 500, 629, 266, 359, 379, 490, 402, 517, 541, 672, 432, 551, 576, 709, 606, 742, 770, 915, 153, 221, 235, 321, 253, 344, 363, 473, 276, 374, 392, 507, 416, 535, 558, 692, 304, 406, 426, 546, 451, 575, 600, 737, 485, 611, 636, 776, 666, 809, 836, 986, 340, 446, 468, 594, 495, 623, 647, 790, 529, 660, 685, 829, 717, 862, 889, 1040, 570, 704, 731, 876, 764, 910, 938, 1088, 804, 951, 980, 1129, 1014, 1164, 1192, 1336, 187, 265, 280, 378, 299, 401, 420, 540, 325, 430, 450, 574, 477, 604, 627, 768, 358, 465, 489, 615, 516, 644, 671, 813, 549, 680, 707, 850, 740, 884, 913, 1062, 398, 513, 536, 667, 564, 698, 724, 869, 599, 736, 763, 909, 795, 943, 971, 1121, 642, 782, 810, 957, 842, 991, 1020, 1169, 880, 1029, 1058, 1207, 1092, 1239, 1267, 1407, 445, 569, 593, 730, 622, 762, 789, 937, 658, 802, 827, 978, 860, 1012, 1038, 1190, 703, 845, 875, 1024, 908, 1057, 1087, 1235, 949, 1097, 1127, 1272, 1162, 1306, 1334, 1468, 757, 903, 931, 1081, 965, 1115, 1143, 1289, 1005, 1156, 1183, 1328, 1216, 1360, 1385, 1516, 1054, 1203, 1231, 1373, 1263, 1404, 1429, 1556, 1301, 1437, 1463, 1586, 1493, 1613, 1634, 1736, 234, 319, 339, 444, 362, 471, 494, 621, 390, 504, 527, 657, 556, 689, 715, 859, 424, 544, 568, 702, 597, 734, 761, 907, 633, 773, 801, 948, 833, 983, 1011, 1161, 467, 592, 617, 756, 646, 788, 815, 964, 683, 826, 853, 1004, 887, 1037, 1065, 1215, 729, 874, 902, 1053, 936, 1086, 1114, 1262, 977, 1126, 1155, 1300, 1189, 1333, 1359, 1492, 521, 650, 677, 819, 708, 851, 881, 1030, 748, 893, 922, 1071, 956, 1105, 1135, 1280, 793, 941, 969, 1119, 1002, 1153, 1181, 1326, 1044, 1195, 1222, 1365, 1253, 1396, 1421, 1549, 847, 997, 1026, 1176, 1059, 1208, 1236, 1378, 1100, 1247, 1275, 1415, 1308, 1444, 1470, 1593, 1148, 1294, 1321, 1458, 1352, 1486, 1509, 1629, 1391, 1521, 1544, 1658, 1571, 1681, 1700, 1792, 590, 727, 754, 900, 786, 934, 962, 1112, 823, 974, 1001, 1152, 1034, 1186, 1212, 1356, 872, 1022, 1051, 1201, 1084, 1233, 1260, 1402, 1124, 1269, 1298, 1435, 1331, 1465, 1490, 1611, 929, 1079, 1107, 1255, 1141, 1287, 1314, 1451, 1180, 1325, 1351, 1485, 1382, 1513, 1536, 1651, 1229, 1371, 1398, 1527, 1427, 1554, 1577, 1686, 1461, 1584, 1608, 1712, 1632, 1734, 1752, 1833, 995, 1146, 1174, 1319, 1206, 1350, 1377, 1508, 1244, 1388, 1412, 1541, 1442, 1569, 1591, 1698, 1292, 1431, 1456, 1581, 1484, 1607, 1628, 1732, 1519, 1636, 1656, 1755, 1680, 1776, 1791, 1867, 1346, 1480, 1504, 1624, 1532, 1647, 1667, 1765, 1563, 1674, 1693, 1786, 1717, 1804, 1819, 1888, 1604, 1709, 1729, 1814, 1749, 1831, 1846, 1909, 1772, 1850, 1864, 1922, 1878, 1934, 1943, 1982, 65, 104, 113, 169, 125, 183, 197, 275, 138, 201, 216, 298, 233, 318, 338, 443, 159, 228, 243, 330, 261, 354, 373, 484, 282, 380, 400, 515, 423, 543, 567, 701, 180, 256, 271, 367, 292, 391, 411, 528, 315, 419, 440, 563, 466, 591, 616, 755, 349, 456, 478, 605, 506, 635, 659, 803, 539, 670, 697, 841, 728, 873, 901, 1052, 214, 295, 313, 415, 335, 439, 463, 586, 361, 470, 493, 620, 520, 649, 676, 818, 396, 511, 534, 665, 562, 696, 722, 867, 596, 733, 760, 906, 792, 940, 968, 1118, 436, 557, 582, 716, 612, 749, 778, 923, 645, 787, 814, 963, 846, 996, 1025, 1175, 691, 835, 861, 1013, 895, 1046, 1073, 1224, 935, 1085, 1113, 1261, 1147, 1293, 1320, 1457, 255, 347, 366, 476, 389, 503, 526, 656, 418, 538, 561, 695, 589, 726, 753, 899, 454, 577, 603, 739, 632, 772, 800, 947, 669, 811, 839, 988, 871, 1021, 1050, 1200, 498, 626, 651, 794, 682, 825, 852, 1003, 721, 866, 894, 1045, 928, 1078, 1106, 1254, 767, 912, 942, 1091, 976, 1125, 1154, 1299, 1017, 1166, 1196, 1339, 1228, 1370, 1397, 1526, 555, 688, 714, 858, 747, 892, 921, 1070, 785, 933, 961, 1111, 994, 1145, 1173, 1318, 832, 982, 1010, 1160, 1043, 1194, 1221, 1364, 1083, 1232, 1259, 1401, 1291, 1430, 1455, 1580, 886, 1036, 1064, 1214, 1099, 1246, 1274, 1414, 1140, 1286, 1313, 1450, 1345, 1479, 1503, 1623, 1188, 1332, 1358, 1491, 1390, 1520, 1543, 1657, 1426, 1553, 1576, 1685, 1603, 1708, 1728, 1813, 311, 413, 434, 554, 461, 584, 610, 746, 491, 618, 643, 784, 674, 816, 844, 993, 531, 662, 687, 831, 719, 864, 891, 1042, 758, 904, 932, 1082, 966, 1116, 1144, 1290, 579, 713, 741, 885, 775, 920, 950, 1098, 812, 960, 990, 1139, 1023, 1172, 1202, 1344, 857, 1009, 1035, 1187, 1069, 1220, 1245, 1389, 1110, 1258, 1285, 1425, 1317, 1454, 1478, 1602, 640, 780, 808, 955, 840, 989, 1018, 1167, 878, 1027, 1056, 1205, 1090, 1237, 1265, 1405, 926, 1076, 1104, 1252, 1138, 1284, 1311, 1448, 1178, 1323, 1349, 1483, 1380, 1511, 1534, 1649, 985, 1134, 1163, 1307, 1197, 1340, 1367, 1498, 1234, 1376, 1403, 1531, 1432, 1558, 1582, 1689, 1279, 1420, 1443, 1570, 1473, 1597, 1617, 1722, 1507, 1627, 1646, 1748, 1669, 1767, 1782, 1860, 711, 855, 883, 1033, 918, 1067, 1096, 1243, 959, 1109, 1137, 1283, 1171, 1316, 1343, 1477, 1007, 1158, 1185, 1330, 1218, 1362, 1387, 1518, 1257, 1400, 1424, 1552, 1453, 1579, 1601, 1707, 1061, 1211, 1238, 1381, 1271, 1411, 1436, 1562, 1310, 1447, 1472, 1596, 1501, 1621, 1641, 1743, 1355, 1489, 1512, 1631, 1540, 1655, 1673, 1771, 1574, 1684, 1703, 1794, 1726, 1812, 1826, 1894, 1132, 1277, 1305, 1441, 1338, 1471, 1496, 1615, 1375, 1506, 1530, 1645, 1557, 1668, 1688, 1781, 1418, 1547, 1568, 1679, 1595, 1702, 1720, 1807, 1626, 1731, 1747, 1830, 1766, 1847, 1859, 1919, 1467, 1590, 1612, 1716, 1637, 1738, 1756, 1836, 1665, 1763, 1779, 1857, 1797, 1871, 1883, 1938, 1697, 1790, 1803, 1877, 1821, 1890, 1900, 1951, 1844, 1908, 1917, 1964, 1929, 1972, 1978, 2007, 386, 499, 522, 652, 552, 684, 710, 854, 587, 723, 750, 896, 783, 930, 958, 1108, 628, 769, 796, 944, 828, 979, 1006, 1157, 868, 1019, 1047, 1198, 1080, 1230, 1256, 1399, 678, 821, 848, 999, 882, 1032, 1060, 1210, 924, 1074, 1102, 1250, 1136, 1282, 1309, 1446, 972, 1122, 1150, 1296, 1184, 1329, 1354, 1488, 1225, 1368, 1394, 1524, 1423, 1551, 1573, 1683, 744, 888, 917, 1066, 953, 1101, 1131, 1276, 992, 1142, 1170, 1315, 1204, 1347, 1374, 1505, 1039, 1191, 1217, 1361, 1249, 1393, 1417, 1546, 1288, 1428, 1452, 1578, 1481, 1605, 1625, 1730, 1095, 1242, 1270, 1410, 1304, 1440, 1466, 1589, 1342, 1476, 1500, 1620, 1529, 1644, 1664, 1762, 1386, 1517, 1539, 1654, 1567, 1678, 1696, 1789, 1600, 1706, 1725, 1811, 1746, 1829, 1843, 1907, 820, 970, 998, 1149, 1031, 1182, 1209, 1353, 1072, 1223, 1248, 1392, 1281, 1422, 1445, 1572, 1120, 1266, 1295, 1433, 1327, 1462, 1487, 1609, 1366, 1497, 1522, 1638, 1550, 1662, 1682, 1777, 1322, 1348, 1482, 1379, 1510, 1533, 1648, 1416, 1545, 1566, 1677, 1594, 1701, 1719, 1806, 1459, 1583, 1606, 1711, 1630, 1733, 1750, 1832, 1659, 1757, 1774, 1852, 1793, 1868, 1879, 1935, 1241, 1384, 1409, 1538, 1439, 1565, 1588, 1695, 1475, 1599, 1619, 1724, 1643, 1745, 1761, 1842, 1515, 1633, 1653, 1753, 1676, 1773, 1788, 1865, 1705, 1795, 1810, 1881, 1828, 1895, 1906, 1955, 1561, 1672, 1691, 1784, 1715, 1802, 1817, 1886, 1742, 1825, 1839, 1903, 1856, 1916, 1926, 1969, 1770, 1849, 1862, 1921, 1876, 1933, 1941, 1981, 1893, 1945, 1953, 1989, 1963, 1996, 2001, 2022, 914, 1063, 1093, 1240, 1128, 1273, 1302, 1438, 1168, 1312, 1341, 1474, 1372, 1502, 1528, 1642, 1213, 1357, 1383, 1514, 1413, 1542, 1564, 1675, 1449, 1575, 1598, 1704, 1622, 1727, 1744, 1827, 1268, 1408, 1434, 1560, 1464, 1587, 1610, 1714, 1499, 1618, 1640, 1741, 1663, 1760, 1778, 1855, 1537, 1652, 1671, 1769, 1694, 1787, 1801, 1875, 1723, 1809, 1824, 1892, 1841, 1905, 1915, 1962, 1335, 1469, 1494, 1614, 1523, 1639, 1660, 1758, 1555, 1666, 1687, 1780, 1710, 1798, 1815, 1884, 1592, 1699, 1718, 1805, 1740, 1823, 1838, 1902, 1764, 1845, 1858, 1918, 1872, 1930, 1939, 1979, 1635, 1737, 1754, 1835, 1775, 1853, 1866, 1924, 1796, 1870, 1882, 1937, 1896, 1947, 1956, 1991, 1820, 1889, 1899, 1950, 1913, 1960, 1967, 1999, 1928, 1971, 1977, 2006, 1985, 2011, 2015, 2031, 1406, 1535, 1559, 1670, 1585, 1692, 1713, 1800, 1616, 1721, 1739, 1822, 1759, 1840, 1854, 1914, 1650, 1751, 1768, 1848, 1785, 1863, 1874, 1932, 1808, 1880, 1891, 1944, 1904, 1954, 1961, 1995, 1690, 1783, 1799, 1873, 1816, 1885, 1897, 1948, 1837, 1901, 1912, 1959, 1925, 1968, 1975, 2004, 1861, 1920, 1931, 1973, 1940, 1980, 1986, 2012, 1952, 1988, 1994, 2017, 2000, 2021, 2024, 2036, 1735, 1818, 1834, 1898, 1851, 1911, 1923, 1966, 1869, 1927, 1936, 1976, 1946, 1984, 1990, 2014, 1887, 1942, 1949, 1987, 1958, 1993, 1998, 2020, 1970, 2002, 2005, 2025, 2010, 2028, 2030, 2040, 1910, 1957, 1965, 1997, 1974, 2003, 2008, 2026, 1983, 2009, 2013, 2029, 2018, 2032, 2034, 2042, 1992, 2016, 2019, 2033, 2023, 2035, 2037, 2043, 2027, 2038, 2039, 2044, 2041, 2045, 2046, 2047;

$Z_i$ (4096): 0, 1, 2, 6, 3, 8, 9, 20, 4, 10, 12, 24, 14, 28, 31, 55, 5, 13, 15, 29, 18, 34, 38, 64, 21, 39, 44, 73, 50, 82, 90, 138, 7, 17, 19, 37, 22, 42, 45, 77, 27, 49, 54, 89, 60, 98, 105, 161, 33, 57, 63, 101, 71, 112, 121, 181, 81, 125, 137, 200, 150, 218, 234, 325, 11, 23, 26, 47, 30, 53, 59, 95, 35, 61, 67, 107, 74, 117, 128, 189, 43, 72, 79, 123, 88, 136, 147, 215, 99, 151, 163, 236, 177, 255, 272, 375, 52, 86, 93, 144, 103, 157, 169, 245, 116, 175, 187, 269, 203, 288, 307, 419, 134, 197, 211, 298, 230, 321, 340, 459, 253, 349, 371, 494, 397, 526, 553, 711, 16, 32, 36, 62, 41, 70, 76, 120, 48, 80, 87, 135, 97, 149, 159, 232, 56, 91, 100, 152, 111, 167, 180, 258, 124, 184, 198, 281, 217, 304, 323, 437, 68, 109, 118, 178, 130, 193, 206, 293, 146, 214, 229, 320, 248, 344, 364, 487, 165, 238, 256, 353, 276, 379, 402, 531, 300, 409, 433, 569, 462, 604, 634, 803, 85, 133, 143, 210, 156, 228, 244, 338, 174, 252, 267, 369, 287, 395, 417, 550, 196, 278, 297, 405, 319, 432, 457, 598, 348, 466, 492, 639, 524, 676, 708, 888, 225, 315, 334, 452, 359, 480, 507, 658, 391, 519, 545, 702, 578, 739, 773, 962, 429, 563, 593, 755, 628, 796, 832, 1027, 671, 845, 882, 1082, 925, 1130, 1172, 1399, 25, 46, 51, 84, 58, 94, 102, 155, 66, 106, 115, 173, 127, 188, 202, 286, 78, 122, 132, 195, 145, 213, 227, 318, 162, 235, 251, 347, 270, 373, 394, 523, 92, 142, 153, 224, 168, 243, 259, 358, 185, 266, 283, 390, 305, 416, 439, 577, 209, 296, 314, 428, 337, 456, 479, 627, 368, 491, 518, 670, 549, 707, 738, 924, 113, 170, 182, 261, 199, 282, 301, 410, 220, 308, 327, 442, 352, 471, 498, 646, 247, 343, 362, 485, 389, 517, 542, 699, 421, 556, 582, 745, 617, 785, 818, 1013, 279, 384, 406, 536, 434, 570, 600, 763, 467, 611, 641, 811, 678, 854, 891, 1092, 510, 663, 691, 872, 729, 915, 950, 1160, 777, 968, 1004, 1219, 1051, 1270, 1312, 1548, 141, 208, 223, 312, 242, 336, 357, 477, 265, 367, 388, 515, 415, 548, 575, 735, 295, 404, 426, 561, 454, 596, 624, 793, 490, 637, 668, 842, 705, 885, 921, 1126, 331, 448, 472, 618, 504, 654, 684, 862, 541, 697, 728, 913, 769, 957, 994, 1207, 589, 752, 786, 976, 827, 1023, 1061, 1280, 878, 1078, 1119, 1341, 1167, 1394, 1438, 1680, 383, 509, 535, 689, 568, 727, 761, 947, 610, 776, 809, 1001, 852, 1049, 1089, 1308, 661, 836, 869, 1070, 912, 1118, 1156, 1384, 966, 1176, 1216, 1447, 1267, 1501, 1544, 1792, 721, 904, 940, 1147, 986, 1197, 1240, 1471, 1041, 1257, 1300, 1534, 1353, 1589, 1637, 1885, 1108, 1332, 1373, 1613, 1426, 1670, 1715, 1966, 1491, 1737, 1782, 2034, 1838, 2092, 2139, 2389, 40, 69, 75, 119, 83, 131, 140, 207, 96, 148, 158, 231, 172, 250, 264, 366, 110, 166, 179, 257, 194, 277, 294, 403, 216, 302, 322, 435, 346, 464, 489, 636, 129, 191, 204, 290, 222, 311, 3341, 447, 246, 341, 361, 483, 387, 514, 540, 696, 274, 377, 399, 528, 425, 560, 588, 751, 460, 601, 631, 799, 667, 841, 877, 1077, 154, 226, 241, 335, 260, 360, 382, 508, 285, 393, 414, 547, 441, 580, 609, 775, 316, 430, 453, 595, 482, 630, 660, 835, 521, 673, 704, 884, 742, 928, 965, 1175, 356, 476, 503, 653, 534, 688, 720, 903, 574, 734, 768, 956, 808, 1000, 1040, 1256, 623, 792, 826, 1022, 868, 1069, 1107, 1331, 920, 1125, 1166, 1393, 1215, 1446, 1490, 1736, 190, 273, 289, 398, 310, 424, 445, 586, 339, 458, 481, 629, 512, 665, 693, 874, 376, 499, 527, 679, 559, 716, 749, 934, 599, 762, 797, 987, 839, 1034, 1074, 1292, 420, 554, 581, 743, 615, 782, 816, 1010, 659, 833, 867, 1067, 909, 1114, 1153, 1380, 712, 892, 929, 1134, 973, 1182, 1225, 1455, 1028, 1241, 1285, 1517, 1337, 1571, 1619, 1866, 475, 622, 651, 824, 687, 866, 901, 1105, 732, 918, 953, 1163, 998, 1212, 1253, 1487, 790, 979, 1019, 1232, 1066, 1284, 1328, 1563, 1123, 1345, 1390, 1628, 1443, 1685, 1733, 1982, 859, 1057, 1097, 1318, 1144, 1369, 1413, 1654, 1203, 1433, 1477, 1722, 1530, 1777, 1823, 2076, 1276, 1508, 1554, 1801, 1609, 1857, 1904, 2158, 1676, 1923, 1972, 2224, 2030, 2281, 2328, 2574, 240, 333, 355, 474, 381, 506, 533, 686, 412, 544, 572, 731, 607, 772, 806, 997, 451, 592, 621, 789, 657, 831, 865, 1065, 701, 881, 917, 1122, 961, 1171, 1211, 1142, 501, 650, 681, 858, 718, 900, 937, 1143, 765, 952, 990, 1202, 1037, 1252, 1296, 1529, 823, 1018, 1056, 1275, 1104, 1327, 1368, 1608, 1162, 1389, 1432, 1675, 1486, 1732, 1776, 2029, 565, 723, 758, 943, 798, 988, 1030, 1243, 848, 1044, 1085, 1303, 1133, 1356, 1402, 1640, 907, 1112, 1151, 1378, 1200, 1430, 1475, 1720, 1261, 1495, 1538, 1786, 1593, 1842, 1889, 2143, 982, 1192, 1236, 1466, 1287, 1519, 1566, 1812, 1348, 1583, 1632, 1879, 1688, 1935, 1985, 2236, 1421, 1664, 1709, 1960, 1765, 2017, 2063, 2316, 1832, 2086, 2132, 2383, 2189, 2439, 2484, 2724, 648, 820, 856, 1053, 898, 1101, 1141, 1365, 949, 1158, 1199, 1428, 1249, 1482, 1526, 1772, 1015, 1229, 1272, 1505, 1323, 1559, 1604, 1853, 1386, 1624, 1672, 1920, 1728, 1977, 2025, 2277, 1094, 1314, 1358, 1595, 1410, 1650, 1698, 1946, 1473, 1717, 1763, 2014, 1819, 2071, 2119, 2368, 1550, 1797, 1844, 2097, 1900, 2154, 2200, 2450, 1968, 2220, 2268, 2516, 2324, 2570, 2614, 2847, 1189, 1417, 1463, 1705, 1516, 1761, 1810, 2060, 1580, 1828, 1876, 2128, 1932, 2185, 2234, 2481, 1659, 1909, 1955, 2209, 2012, 2266, 2312, 2560, 2082, 2333, 2379, 2623, 2435, 2677, 2721, 2947, 1753, 2002, 2052, 2302, 2109, 2357, 2406, 2647, 2176, 2424, 2472, 2710, 2528, 2762, 2807, 3024, 2256, 2505, 2550, 2786, 2603, 2837, 2878, 3093, 2668, 2897, 2938, 3147, 2986, 3190, 3225, 3405, 65, 104, 114, 171, 126, 186, 201, 284, 139, 205, 221, 309, 239, 332, 354, 473, 160, 233, 249, 345, 268, 370, 392, 520, 292, 401, 423, 558, 450, 591, 620, 788, 183, 263, 280, 386, 303, 413, 436, 573, 328, 444, 469, 614, 500, 649, 680, 857, 365, 488, 513, 666, 546, 703, 733, 919, 585, 748, 781, 972, 822, 1017, 1055, 1274, 219, 306, 326, 440, 350, 468, 495, 642, 380, 505, 532, 685, 564, 722, 756, 941, 418, 552, 579, 741, 613, 780, 813, 1007, 656, 830, 864, 1064, 906, 1111, 1149, 1376, 465, 608, 638, 807, 674, 849, 886, 1086, 717, 899, 936, 1142, 980, 1190, 1234, 1464, 774, 964, 999, 1214, 1046, 1264, 1305, 1541, 1103, 1326, 1367, 1607, 1419, 1662, 1707, 1958, 262, 363, 385, 511, 411, 543, 571, 730, 443, 583, 612, 778, 647, 819, 855, 1052, 486, 633, 664, 838, 700, 880, 916, 1121, 746, 931, 969, 1178, 1014, 1228, 1271, 1504, 537, 692, 724, 908, 764, 951, 989, 1201, 812, 1005, 1045, 1262, 1093, 1313, 1357, 1594, 873, 1073, 1113, 1336, 1161, 1388, 1431, 1674, 1220, 1450, 1496, 1741, 1549, 1796, 1843, 2096, 606, 771, 805, 996, 847, 1043, 1084, 1302, 897, 1100, 1140, 1364, 1188, 1416, 1462, 1704, 960, 1170, 1210, 1441, 1260, 1494, 1537, 1785, 1322, 1558, 1603, 1852, 1658, 1908, 1954, 2208, 1036, 1251, 1295, 1528, 1347, 1582, 1631, 1878, 1409, 1649, 1697, 1945, 1752, 2001, 2051, 2301, 1485, 1731, 1775, 2028, 1831, 2085, 2131, 2382, 1899, 2153, 2199, 2449, 2255, 2504, 2549, 2785, 324, 438, 463, 605, 493, 640, 672, 846, 530, 683, 715, 896, 754, 939, 978, 1187, 576, 737, 770, 959, 810, 1003, 1042, 1259, 861, 1060, 1099, 1321, 1146, 1372, 1415, 1657, 635, 804, 840, 1035, 883, 1083, 1124, 1346, 933, 1139, 1181, 1408, 1231, 1461, 1507, 1751, 995, 1209, 1250, 1484, 1301, 1536, 1581, 1830, 1363, 1602, 1648, 1898, 1703, 1953, 2000, 2254, 710, 890, 927, 1132, 971, 1180, 1222, 1452, 1026, 1239, 1283, 1515, 1335, 1569, 1616, 1863, 1091, 1311, 1355, 1592, 1407, 1647, 694, 1943, 1470, 1714, 1760, 2011, 1816, 2068, 2115, 2365, 1174, 1401, 1445, 1687, 1498, 1743, 1789, 2040, 1562, 1809, 1856, 2108, 1912, 2165, 2212, 2460, 1639, 1888, 1934, 2188, 1991, 2244, 2290, 2538, 2059, 2311, 2356, 2602, 2412, 2655, 2698, 2926, 802, 993, 1033, 1247, 1081, 1299, 1344, 1578, 1137, 1361, 1405, 1644, 1459, 1701, 1749, 1997, 1206, 1437, 1480, 1726, 1533, 1781, 1826, 2080, 1599, 1848, 1894, 2148, 1950, 2204, 2250, 2499, 1291, 1524, 1570, 1817, 1627, 1874, 1922, 2174, 1692, 1940, 1989, 2241, 2047, 2297, 2345, 2589, 1770, 2023, 2069, 2322, 2126, 2377, 2422, 2666, 2194, 2444, 2490, 2729, 2544, 2780, 2822, 3041, 1398, 1636, 1684, 1931, 1740, 1988, 2037, 2287, 1806, 2056, 2105, 2353, 2162, 2409, 2457, 2695, 1884, 2138, 2184, 2434, 2240, 2489, 2534, 2770, 2307, 2555, 2598, 2832, 2651, 2882, 2922, 3132, 1981, 2233, 2280, 2527, 2336, 2581, 2626, 2857, 2402, 2644, 2689, 2916, 2741, 2964, 3005, 3206, 2480, 2720, 2761, 2985, 2813, 3032, 3070, 3266, 2874, 3089, 3125, 3316, 3169, 3355, 3386, 3544, 408, 539, 567, 726, 603, 767, 801, 992, 644, 815, 851, 1048, 894, 1096, 1136, 1360, 695, 876, 911, 1117, 955, 1165, 1205, 1436, 1009, 1224, 1266, 1500, 1317, 1553, 1598, 1847, 760, 946, 985, 1196, 1032, 1246, 1290, 1523, 1088, 1307, 1352, 1588, 1404, 1643, 1691, 1939, 1155, 1383, 1425, 1669, 1479, 1725, 1769, 2022, 1543, 1791, 1837, 2091, 1893, 2147, 2193, 2443, 844, 1039, 1080, 1298, 1128, 1350, 1396, 1634, 1185, 1412, 1458, 1700, 1511, 1755, 1804, 2054, 1255, 1489, 1532, 1780, 1586, 1835, 1882, 2136, 1653, 1903, 1949, 2203, 2005, 2259, 2305, 2553, 1343, 1577, 1626, 1873, 1682, 1929, 1979, 2231, 1748, 1996, 2046, 2296, 2103, 2351, 2400, 2642, 1825, 2079, 2125, 2376, 2182, 2432, 2478, 2718, 2249, 2498, 2543, 2779, 2596, 2830, 2872, 3087, 944, 1152, 1193, 1422, 1244, 1476, 1520, 1766, 1304, 1539, 1584, 1833, 1641, 1890, 1936, 2190, 1379, 1618, 1665, 1914, 1721, 1971, 2018, 2271, 1787, 2038, 2087, 2337, 2144, 2393, 2440, 2681, 1467, 1710, 1757, 2007, 1813, 2064, 2112, 2361, 1880, 2133, 2180, 2429, 2237, 2485, 2531, 2766, 1961, 2214, 2261, 2510, 2317, 2564, 2607, 2841, 2384, 2627, 2672, 2901, 2725, 2950, 2989, 3193, 1575, 1822, 1870, 2122, 1927, 2179, 2228, 2475, 1994, 2246, 2293, 2540, 2349, 2593, 2639, 2869, 2075, 2327, 2372, 2617, 2428, 2671, 2714, 2941, 2495, 2733, 2776, 2997, 2827, 3045, 3084, 3278, 2171, 2418, 2466, 2704, 2523, 2757, 2802, 3020, 2586, 2818, 2862, 3075, 2912, 3121, 3160, 3345, 2661, 2891, 2931, 3141, 2980, 3185, 3220, 3401, 3037, 3235, 3270, 3443, 3312, 3479, 3508, 3649, 1076, 1294, 1340, 1574, 1392, 1630, 1679, 1926, 1454, 1696, 1745, 1993, 1800, 2050, 2100, 2348, 1527, 1774, 1821, 2074, 1877, 2130, 2178, 2427, 1944, 2198, 2245, 2494, 2300, 2548, 2592, 2826, 1622, 1869, 1918, 2170, 1975, 2227, 2275, 2522, 2042, 2292, 2341, 2585, 2396, 2638, 2684, 2911, 2121, 2371, 2417, 2660, 2474, 2713, 2756, 2979, 2539, 2775, 2817, 3036, 2868, 3083, 3120, 3311, 1735, 1984, 2033, 284, 2089, 2339, 2387, 2630, 2157, 2405, 2453, 2692, 2508, 2744, 2789, 3008, 2235, 2483, 2530, 2765, 2583, 2816, 2860, 3074, 2646, 2877, 2918, 3128, 2966, 3172, 3208, 3389, 2331, 2577, 2621, 2853, 2675, 2904, 2945, 3153, 2736, 2960, 3000, 3202, 3048, 3245, 3281, 3452, 2809, 3027, 3066, 3261, 3114, 3304, 3338, 3501, 3165, 3351, 3382, 3540, 3420, 3573, 3599, 3723, 1865, 2117, 2167, 2414, 2223, 2470, 2519, 2753, 2288, 2535, 2582, 2814, 2635, 2865, 2909, 3118, 2366, 2612, 2656, 2887, 2708, 2936, 2975, 3181, 2771, 2993, 3033, 3232, 3079, 3274, 3308, 3476, 2462, 2700, 2746, 2968, 2798, 3016, 3057, 3252, 2858, 3071, 3112, 3301, 3157, 3342, 3376, 3533, 2927, 3137, 3173, 3359, 3216, 3397, 3426, 3579, 3267, 3440, 3470, 3617, 3505, 3646, 3668, 3782, 2573, 2806, 2850, 3064, 2900, 3111, 3150, 3336, 2957, 3163, 3200, 3381, 3242, 3418, 3450, 3598, 3023, 3224, 3258, 3433, 3300, 3469, 3498, 3640, 3348, 3511, 3538, 3673, 3570, 3699, 3721, 3824, 3104, 3295, 3329, 3493, 3370, 3529, 3557, 3688, 3413, 3566, 3593, 3717, 3625, 3744, 3766, 3858, 3463, 3611, 3634, 3753, 3664, 3778, 3796, 3883, 3695, 3804, 3820, 3903, 3841, 3919, 3931, 3987, 108, 164, 176, 254, 192, 275, 291, 400, 212, 299, 317, 431, 342, 461, 484, 632, 237, 329, 351, 470, 378, 502, 529, 682, 407, 538, 566, 725, 602, 766, 800, 991, 271, 374, 396, 525, 422, 557, 584, 747, 455, 597, 626, 795, 662, 837, 871, 1072, 497, 645, 677, 853, 714, 895, 932, 1138, 759, 945, 984, 1195, 1031, 1245, 1289, 1522, 313, 427, 449, 590, 478, 625, 655, 828, 516, 669, 698, 879, 736, 922, 958, 1168, 562, 719, 753, 938, 794, 983, 1024, 1237, 843, 1038, 1079, 1297, 1127, 1349, 1395, 1633, 619, 787, 821, 1016, 863, 1062, 1102, 1324, 914, 1120, 1159, 1387, 1208, 1439, 1483, 1729, 977, 1186, 1230, 1460, 1281, 1513, 1560, 1807, 1342, 1576, 1625, 1872, 1681, 1928, 1978, 2230, 372, 496, 522, 675, 555, 713, 744, 930, 594, 757, 791, 981, 834, 1029, 1068, 1286, 643, 814, 850, 1047, 893, 1095, 1135, 1359, 942, 1150, 1191, 1420, 1242, 1474, 1518, 1764, 706, 887, 923, 1129, 967, 1177, 1218, 1449, 1021, 1235, 1279, 1512, 1330, 1565, 1612, 1860, 1087, 1306, 1351, 1587, 1403, 1642, 1690, 1938, 1465, 1708, 1756, 2006, 1811, 2062, 2111, 2360, 784, 975, 1012, 1227, 1059, 1278, 1320, 1556, 1116, 1339, 1382, 1621, 1435, 1678, 1724, 1974, 1184, 1411, 1457, 1699, 1510, 1754, 1803, 2053, 1573, 1820, 1868, 2120, 1925, 2177, 2226, 2473, 1269, 1503, 1547, 1795, 1601, 1850, 1897, 2151, 1668, 1917, 1965, 2218, 2021, 2274, 2321, 2568, 1747, 1995, 2045, 2295, 2102, 2350, 2399, 2641, 2169, 2416, 2465, 2703, 2521, 2755, 2801, 3019, 446, 587, 616, 783, 652, 825, 860, 1058, 694, 875, 910, 1115, 954, 1164, 1204, 1434, 750, 935, 974, 1183, 1020, 1233, 1277, 1509, 1075, 1293, 1338, 1572, 1391, 1629, 1677, 1924, 817, 1011, 1050, 1268, 1098, 1319, 1362, 1600, 1154, 1381, 1424, 1667, 1478, 1723, 1768, 2020, 1226, 1456, 1502, 1746, 1555, 1802, 1849, 2101, 1620, 1867, 1916, 2168, 1973, 2225, 2273, 2520, 902, 1106, 1145, 1370, 1194, 1423, 1468, 1711, 1254, 1488, 1531, 1778, 1585, 1834, 1881, 2134, 1329, 1564, 1610, 1858, 1666, 1915, 1952, 2215, 1734, 1983, 2031, 2282, 2088, 2338, 2385, 2628, 1414, 1655, 1702, 1951, 1758, 2008, 2057, 2308, 1824, 2077, 2124, 2374, 2181, 2430, 2477, 2716, 1905, 2159, 2205, 2454, 2262, 2511, 2556, 2791, 2329, 2575, 2619, 2851, 2673, 2902, 2943, 3151, 1008, 1223, 1265, 1499, 1316, 1552, 1597, 1846, 1377, 1617, 1663, 1913, 1719, 1970, 2016, 2270, 1453, 1695, 1744, 1992, 1799, 2049, 2099, 2347, 1864, 2116, 2166, 2413, 2222, 2469, 2518, 2752, 1542, 1790, 1836, 2090, 1892, 2146, 2192, 2442, 1959, 2213, 2260, 2509, 2315, 2563, 2606, 2840, 2041, 2291, 2340, 2584, 2395, 2637, 2683, 2910, 2461, 2699, 2745, 2967, 2797, 3015, 3056, 3251, 1652, 1902, 1948, 2202, 2004, 2258, 2304, 2552, 2073, 2326, 2370, 2616, 2426, 2670, 2712, 2940, 2156, 2404, 2452, 2691, 2507, 2743, 2788, 3007, 2572, 2805, 2849, 3063, 2899, 3110, 3149, 3335, 2248, 2497, 2542, 2778, 2595, 2829, 2871, 3086, 2659, 2890, 2930, 3140, 2978, 3184, 3219, 3400, 2735, 2959, 2999, 3201, 3047, 3244, 3280, 3451, 3103, 3294, 3328, 3492, 3369, 3528, 3556, 3687, 551, 709, 740, 926, 779, 970, 1006, 1221, 829, 1025, 1063, 1282, 1110, 1334, 1375, 1615, 889, 1090, 1131, 1354, 1179, 1406, 1451, 1693, 1238, 1469, 1514, 1759, 1568, 1815, 1862, 2114, 963, 1173, 1213, 1444, 1263, 1497, 1540, 1788, 1325, 1561, 1606, 1855, 1661, 1911, 1957, 2211, 1400, 1638, 1686, 1933, 1742, 1990, 2039, 2289, 1808, 2058, 2107, 2355, 2164, 2411, 2459, 2697, 1054, 1273, 1315, 1551, 1366, 1605, 1651, 1901, 1429, 1673, 1718, 1969, 1773, 2026, 2072, 2325, 1506, 1750, 1798, 2048, 1854, 2106, 2155, 2403, 1921, 2173, 2221, 2468, 2278, 2525, 2571, 2804, 1596, 1845, 1891, 2145, 1947, 2201, 2247, 2496, 2015, 2269, 2314, 2562, 2369, 2615, 2658, 2889, 2098, 2346, 2394, 2636, 2451, 2690, 2734, 2958, 2517, 2751, 2796, 3014, 2848, 3062, 3102, 3293, 1169, 1397, 1440, 1683, 1493, 1739, 1784, 2036, 1557, 1805, 1851, 2104, 1907, 2161, 2207, 2456, 1635, 1883, 1930, 2183, 1987, 2239, 2286, 2533, 2055, 2306, 2352, 2597, 2408, 2650, 2694, 2921, 1730, 1980, 2027, 2279, 2084, 2335, 2381, 2625, 2152, 2401, 2448, 2688, 2503, 2740, 2784, 3004, 2232, 2479, 2526, 2760, 2580, 2812, 2856, 3069, 2643, 2873, 2915, 3124, 2963, 3168, 3205, 3385, 1841, 2095, 2142, 2392, 2197, 2447, 2493, 2732, 2265, 2514, 2559, 2794, 2611, 2845, 2886, 3100, 2344, 2588, 2634, 2864, 2687, 2914, 2956, 3162, 2749, 2971, 3012, 3212, 3060, 3255, 3291, 3460, 2438, 2680, 2723, 2949, 2774, 2996, 3035, 3234, 2836, 3053, 3092, 3285, 3136, 3325, 3358, 3519, 2908, 3117, 3156, 3341, 3199, 3380, 3412, 3565, 3249, 3423, 3455, 3602, 3490, 3632, 3657, 3771, 1310, 1546, 1591, 1840, 1646, 1896, 1942, 2196, 1713, 1964, 2010, 2264, 2067, 2320, 2364, 2610, 1794, 2044, 2094, 2343, 2150, 2398, 2446, 2686, 2217, 2464, 2513, 2748, 2567, 2800, 2844, 3059, 1887, 2141, 2187, 2437, 2243, 2492, 2537, 2773, 2310, 2558, 2601, 2835, 2654, 2885, 2925, 3135, 2391, 2633, 2679, 2907, 2731, 2955, 2995, 3198, 2793, 3011, 3052, 3248, 3099, 3290, 3324, 3489, 1999, 2252, 2299, 2546, 2354, 2599, 2645, 2875, 2421, 2664, 2707, 2934, 2759, 2982, 3022, 3222, 2501, 2738, 2782, 3002, 2833, 3050, 3090, 3283, 2894, 3106, 3144, 3331, 3187, 3371, 3403, 3558, 2591, 2824, 2867, 3081, 2917, 3126, 3164, 3349, 2974, 3179, 3215, 3395, 3257, 3431, 3462, 3609, 3043, 3240, 3276, 3448, 3317, 3483, 3512, 3652, 3365, 3524, 3552, 3684, 3584, 3710, 3732, 3833, 2137, 2388, 2433, 2676, 2488, 2728, 2769, 2992, 2554, 2790, 2831, 3049, 2881, 3096, 3131, 3321, 2631, 2861, 2905, 3115, 2953, 3159, 3196, 3378, 3009, 3209, 3246, 3421, 3288, 3457, 3487, 3630, 2719, 2946, 2984, 3189, 3031, 3231, 3265, 3439, 3088, 3282, 3315, 3482, 3354, 3516, 3543, 3677, 3154, 3339, 3373, 3531, 3410, 3563, 3590, 3715, 3453, 3600, 3627, 3745, 3655, 3769, 3789, 3876, 2821, 3040, 3078, 3273, 3123, 3314, 3347, 3510, 3176, 3362, 3392, 3549, 3429, 3582, 3607, 3730, 3238, 3415, 3446, 3595, 3481, 3626, 3651, 3767, 3522, 3659, 3682, 3792, 3709, 3815, 3832, 3912, 3307, 3475, 3504, 3645, 3537, 3672, 3694, 3803, 3575, 3703, 3725, 3827, 3750, 3846, 3862, 3935, 3622, 3741, 3763, 3856, 3786, 3874, 3890, 3956, 3811, 3894, 3909, 3969, 3924, 3981, 3991, 4030, 690, 870, 905, 1109, 948, 1157, 1198, 1427, 1002, 1217, 1258, 1492, 1309, 1545, 1590, 1839, 1071, 1288, 1333, 1567, 1385, 1623, 1671, 1919, 1448, 1689, 1738, 1986, 1793, 2043, 2093, 2342, 1148, 1374, 1418, 1660, 1472, 1716, 1762, 2013, 1535, 1783, 1829, 2083, 1886, 2140, 2186, 2436, 1614, 1861, 1910, 2163, 1967, 2219, 2267, 2515, 2035, 2285, 2334, 2579, 2390, 2632, 2678, 2906, 1248, 1481, 1525, 1771, 1579, 1827, 1875, 2127, 1645, 1895, 1941, 2195, 1998, 2251, 2298, 2545, 1727, 1976, 2024, 2276, 2081, 2332, 2378, 2622, 2149, 2397, 2445, 2685, 2500, 2737, 2781, 3001, 1818, 2070, 2118, 2367, 2175, 2423, 2471, 2709, 2242, 2491, 2536, 2772, 2590, 2823, 2866, 3080, 2323, 2569, 2613, 2846, 2667, 2896, 2937, 3146, 2730, 2954, 2994, 3197, 3042, 3239, 3275, 3447, 1371, 1611, 1656, 1906, 1712, 1963, 2009, 2263, 1779, 2032, 2078, 2330, 2135, 2386, 2431, 2674, 1859, 2110, 2160, 2407, 2216, 2463, 2512, 2747, 2283, 2529, 2576, 2808, 2629, 2859, 2903, 3113, 1952, 2206, 2253, 2502, 2309, 2557, 2600, 2834, 2375, 2620, 2665, 2895, 2717, 2944, 2983, 3188, 2455, 2693, 2739, 2962, 2792, 3010, 3051, 3247, 2852, 3065, 3107, 3297, 3152, 3337, 3372, 3530, 2066, 2319, 2363, 2609, 2420, 2663, 2706, 2933, 2487, 2727, 2768, 2991, 2820, 3039, 3077, 3272, 2566, 2799, 2843, 3058, 2893, 3105, 3143, 3330, 2952, 3158, 3195, 3377, 3237, 3414, 3445, 3594, 2653, 2884, 2924, 3134, 2973, 3178, 3214, 3394, 3030, 3230, 3264, 3438, 3306, 3474, 3503, 3644, 3098, 3289, 3323, 3488, 3364, 3523, 3551, 3683, 3409, 3562, 3589, 3714, 3621, 3740, 3762, 3855, 1521, 1767, 1814, 2065, 1871, 2123, 2172, 2419, 1937, 2191, 2238, 2486, 2294, 2541, 2587, 2819, 2019, 2272, 2318, 2565, 2373, 2618, 2662, 2892, 2441, 2682, 2726, 2951, 2777, 2998, 3038, 3236, 2113, 2362, 2410, 2652, 2467, 2705, 2750, 2972, 2532, 2767, 2811, 3029, 2863, 3076, 3116, 3305, 2608, 2842, 2883, 3097, 2932, 3142, 3177, 3363, 2990, 3194, 3229, 3408, 3271, 3444, 3473, 3620, 2229, 2476, 2524, 2758, 2578, 2810, 2854, 3067, 2640, 2870, 2913, 3122, 2961, 3166, 3203, 3383, 2715, 2942, 2981, 3186, 3028, 3228, 3262, 3436, 3085, 3279, 3313, 3480, 3352, 3514, 3541, 3675, 2803, 3021, 3061, 3256, 3108, 3298, 3333, 3496, 3161, 3346, 3379, 3536, 3416, 3568, 3596, 3719, 3221, 3402, 3430, 3583, 3466, 3614, 3637, 3756, 3509, 3650, 3671, 3785, 3697, 3806, 3822, 3905, 2359, 2605, 2649, 2880, 2702, 2929, 2970, 3175, 2764, 2988, 3026, 3227, 3073, 3269, 3303, 3472, 2839, 3055, 3095, 3287, 3139, 3327, 3361, 3521, 3192, 3375, 3407, 3561, 3442, 3592, 3619, 3739, 2920, 3130, 3167, 3353, 3211, 3391, 3422, 3574, 3260, 3435, 3465, 3613, 3500, 3642, 3665, 3779, 3320, 3486, 3515, 3654, 3548, 3681, 3702, 3810, 3587, 3713, 3735, 3835, 3760, 3854, 3869, 3941, 3018, 3218, 3254, 3428, 3296, 3464, 3494, 3635, 3344, 3507, 3535, 3670, 3567, 3696, 3718, 3821, 3399, 3555, 3581, 3708, 3612, 3734, 3754, 3849, 3648, 3765, 3784, 3873, 3805, 3891, 3904, 3966, 3459, 3606, 3631, 3749, 3660, 3773, 3793, 3879, 3692, 3801, 3818, 3901, 3838, 3916, 3929, 3985, 3729, 3831, 3845, 3923, 3864, 3937, 3947, 3999, 3888, 3955, 3964, 4012, 3976, 4020, 4026, 4055, 1706, 1956, 2003, 2257, 2061, 2313, 2358, 2604, 2129, 2380, 2425, 2669, 2482, 2722, 2763, 2987, 2210, 2458, 2506, 2742, 2561, 2795, 2838, 3054, 2624, 2855, 2898, 3109, 2948, 3155, 3191, 3374, 2303, 2551, 2594, 2828, 2648, 2879, 2919, 3129, 2711, 2939, 2977, 3183, 3025, 3226, 3259, 3434, 2787, 3006, 3046, 3243, 3094, 3286, 3319, 3485, 3148, 3334, 3368, 3527, 3406, 3560, 3586, 3712, 2415, 2657, 2701, 2928, 2754, 2976, 3017, 3217, 2815, 3034, 3072, 3268, 3119, 3309, 3343, 3506, 2888, 3101, 3138, 3326, 3182, 3367, 3398, 3554, 3233, 3411, 3441, 3591, 3477, 3623, 3647, 3764, 2969, 3174, 3210, 3390, 3253, 3427, 3458, 3605, 3302, 3471, 3499, 3641, 3534, 3669, 3691, 3800, 3360, 3520, 3547, 3680, 3580, 3707, 3728, 3830, 3618, 3738, 3759, 3853, 3783, 3872, 3887, 3954, 2547, 2783, 2825, 3044, 2876, 3091, 3127, 3318, 2935, 3145, 3180, 3366, 3223, 3404, 3432, 3585, 3003, 3204, 3241, 3417, 3284, 3454, 3484, 3628, 3332, 3495, 3525, 3661, 3559, 3689, 3711, 3816, 3082, 3277, 3310, 3478, 3350, 3513, 3539, 3674, 3396, 3553, 3578, 3706, 3610, 3733, 3752, 3848, 3449, 3597, 3624, 3743, 3653, 3768, 3787, 3875, 3685, 3794, 3813, 3896, 3834, 3913, 3925, 3982, 3171, 3357, 3388, 3546, 3425, 3577, 3604, 3727, 3468, 3616, 3639, 3758, 3667, 3781, 3799, 3886, 3518, 3656, 3679, 3790, 3705, 3812, 3829, 3910, 3737, 3836, 3852, 3927, 3871, 3942, 3953, 4003, 3572, 3701, 3722, 3825, 3748, 3844, 3860, 3933, 3777, 3868, 3882, 3950, 3900, 3963, 3973, 4017, 3809, 3893, 3907, 3968, 3922, 3980, 3989, 4029, 3940, 3993, 4001, 4037, 4011, 4044, 4049, 4070, 2696, 2923, 2965, 3170, 3013, 3213, 3250, 3424, 3068, 3263, 3299, 3467, 3340, 3502, 3532, 3666, 3133, 3322, 3356, 3517, 3393, 3550, 3576, 3704, 3437, 3588, 3615, 3736, 3643, 3761, 3780, 3870, 3207, 3387, 3419, 3571, 3456, 3603, 3629, 3747, 3497, 3638, 3663, 3776, 3690, 3798, 3817, 3899, 3545, 3678, 3700, 3808, 3726, 3828, 3843, 3921, 3757, 3851, 3867, 3939, 3885, 3952, 3962, 4010, 3292, 3461, 3491, 3633, 3526, 3662, 3686, 3795, 3564, 3693, 3716, 3819, 3742, 3839, 3857, 3930, 3608, 3731, 3751, 3847, 3775, 3866, 3881, 3949, 3802, 3889, 3902, 3965, 3917, 3977, 3986, 4027, 3658, 3772, 3791, 3878, 3814, 3897, 3911, 3971, 3837, 3915, 3928, 3984, 3943, 3995, 4004, 4039, 3863, 3936, 3946, 3998, 3960, 4008, 4015, 4047, 3975, 4019, 4025, 4054, 4033, 4059, 4063, 4079, 3384, 3542, 3569, 3698, 3601, 3724, 3746, 3842, 3636, 3755, 3774, 3865, 3797, 3884, 3898, 3961, 3676, 3788, 3807, 3892, 3826, 3908, 3920, 3979, 3850, 3926, 3938, 3992, 3951, 4002, 4009, 4043, 3720, 3823, 3840, 3918, 3859, 3932, 3944, 3996, 3880, 3948, 3959, 4007, 3972, 4016, 4023, 4052, 3906, 3967, 3978, 4021, 3988, 4028, 4034, 4060, 4000, 4036, 4042, 4065, 4048, 4069, 4072, 4084, 3770, 3861, 3877, 3945, 3895, 3958, 3970, 4014, 3914, 3974, 3983, 4024, 3994, 4032, 4038, 4062, 3934, 3990, 3997, 4035, 4006, 4041, 4046, 4068, 4018, 4050, 4053, 4073, 4058, 4076, 4078, 4088, 3957, 4005, 4013, 4045, 4022, 4051, 4056, 4074, 4031, 4057, 4061, 4077, 4066, 4080, 4082, 4090, 4040, 4064, 4067, 4081, 4071, 4083, 4085, 4091, 4075, 4086, 4087, 4092, 4089, 4093, 4094, 4095;

$Z_i$ (8192): 0, 1, 2, 6, 3, 8, 9, 20, 4, 10, 12, 24, 14, 28, 31, 55, 5, 13, 15, 29, 18, 34, 38, 64, 39, 44, 73, 50, 82, 90, 138, 7, 17, 19, 37, 22, 42, 45, 77, 27, 49, 54, 89, 60, 98, 105, 161, 33, 57, 101, 71, 112, 121, 181, 81, 125, 137, 201, 150, 219, 235, 329, 11, 23, 26, 47, 30, 53, 59, 95, 35, 61, 67, 107, 74, 117, 128, 190, 43, 72, 79, 123, 88, 136, 147, 216, 99, 151, 163, 237, 177, 256, 274, 381, 52, 86, 93, 144, 103, 157, 169, 246, 116, 175, 188, 271, 204, 291, 311, 428, 134, 198, 212, 301, 231, 325, 345, 470, 254, 354, 377, 508, 404, 542, 572, 746, 16, 32, 36, 62, 41, 70, 76, 120, 48, 80, 87, 135, 97, 149, 159, 233, 56, 91, 100, 152, 111, 167, 180, 259, 124, 185, 199, 284, 218, 308, 327, 447, 68, 109, 118, 178, 130, 194, 207, 296, 146, 215, 230, 324, 249, 349, 370, 501, 165, 239, 257, 358, 278, 385, 409, 547, 304, 418, 443, 590, 474, 628, 661, 851, 85, 133, 143, 211, 156, 229, 245, 343, 174, 253, 269, 375, 290, 402, 426, 569, 197, 281, 300, 413, 323, 442, 468, 621, 353, 479, 506, 667, 540, 708, 743, 949, 226, 319, 339, 463, 364, 493, 522, 687, 398, 535, 564, 737, 599, 778, 817, 1035, 438, 583, 615, 796, 653, 842, 883, 1111, 702, 900, 942, 1179, 991, 1236, 1287, 1572, 25, 46, 51, 84, 58, 94, 102, 155, 66, 106, 115, 173, 127, 189, 203, 289, 78, 122, 132, 196, 145, 214, 228, 322, 162, 236, 252, 352, 272, 379, 401, 539, 92, 142, 153, 225, 168, 244, 260, 363, 186, 268, 286, 397, 309, 425, 449, 598, 210, 299, 318, 437, 342, 467, 492, 652, 374, 505, 534, 701, 568, 742, 777, 990, 113, 170, 183, 263, 200, 285, 305, 419, 221, 312, 332, 453, 357, 484, 513, 675, 248, 348, 368, 499, 396, 533, 561, 734, 430, 575, 604, 785, 642, 830, 869, 1096, 282, 391, 414, 554, 444, 591, 623, 806, 480, 636, 669, 861, 710, 910, 952, 1191, 526, 693, 725, 930, 768, 980, 1022, 1273, 822, 1042, 1086, 1346, 1142, 1409, 1463, 1768, 141, 209, 224, 316, 243, 341, 362, 490, 267, 373, 395, 531, 424, 567, 596, 774, 298, 411, 435, 580, 465, 618, 649, 838, 504, 664, 698, 895, 740, 945, 986, 1230, 336, 459, 485, 643, 519, 683, 716, 918, 560, 732, 767, 978, 813, 1030, 1074, 1331, 611, 792, 831, 1051, 878, 1106, 1152, 1420, 937, 1173, 1222, 1498, 1281, 1565, 1621, 1943, 390, 525, 553, 723, 589, 766, 804, 1019, 635, 821, 859, 1083, 908, 1140, 1188, 1459, 691, 888, 927, 1163, 977, 1221, 1269, 1553, 1040, 1292, 1342, 1633, 1406, 1704, 1763, 2098, 759, 968, 1010, 1258, 1064, 1319, 1372, 1666, 1131, 1395, 1449, 1751, 1515, 1824, 1888, 2232, 1210, 1486, 1540, 1854, 1608, 1930, 1993, 2348, 1692, 2021, 2085, 2447, 2164, 2532, 2604, 2997, 40, 69, 75, 119, 83, 131, 140, 208, 96, 148, 158, 232, 172, 251, 266, 372, 110, 166, 179, 258, 195, 279, 297, 410, 217, 306, 326, 445, 351, 476, 503, 663, 129, 192, 205, 293, 223, 315, 335, 458, 247, 346, 367, 497, 394, 530, 559, 731, 276, 383, 406, 544, 434, 579, 610, 791, 471, 624, 657, 846, 697, 894, 936, 1172, 154, 227, 242, 340, 261, 365, 388, 523, 288, 400, 423, 566, 451, 601, 633, 819, 320, 439, 464, 617, 495, 655, 689, 886, 537, 704, 739, 944, 781, 994, 1038, 1290, 361, 489, 518, 682, 551, 721, 757, 966, 595, 773, 812, 1029, 857, 1081, 1129, 1393, 648, 837, 877, 1105, 925, 1161, 1208, 1484, 985, 1229, 1280, 1564, 1340, 1631, 1690, 2019, 191, 275, 292, 405, 314, 433, 456, 608, 344, 469, 494, 654, 528, 695, 727, 932, 382, 514, 543, 711, 578, 752, 789, 1002, 622, 805, 843, 1065, 892, 1121, 1168, 1437, 429, 573, 603, 783, 640, 827, 867, 1093, 688, 884, 924, 1159, 973, 1216, 1265, 1548, 747, 953, 996, 1241, 1047, 1299, 1353, 1644, 1112, 1373, 1427, 1726, 1492, 1798, 1862, 2203, 488, 647, 680, 875, 719, 922, 963, 1205, 771, 983, 1025, 1276, 1078, 1336, 1388, 1685, 835, 1055, 1102, 1362, 1157, 1425, 1480, 1786, 1227, 1504, 1560, 1875, 1627, 1950, 2014, 2370, 915, 1148, 1197, 1470, 1253, 1534, 1591, 1910, 1326, 1615, 1674, 2001, 1744, 2077, 2143, 2509, 1415, 1713, 1775, 2110, 1847, 2188, 2257, 2630, 1937, 2285, 2356, 2734, 2439, 2822, 2897, 3302, 241, 338, 360, 487, 387, 521, 549, 718, 421, 563, 593, 770, 631, 816, 854, 1077, 462, 614, 646, 834, 686, 882, 921, 1156, 736, 941, 982, 1226, 1034, 1286, 1335, 1626, 516, 679, 713, 914, 754, 962, 1005, 1252, 808, 1024, 1069, 1325, 1124, 1387, 1442, 1743, 874, 1101, 1147, 1414, 1204, 1479, 1533, 1846, 1275, 1559, 1614, 1936, 1684, 2013, 2076, 2438, 585, 761, 799, 1013, 844, 1066, 1114, 1375, 903, 1134, 1182, 1452, 1239, 1518, 1575, 1891, 971, 1214, 1262, 1545, 1322, 1612, 1670, 1998, 1399, 1697, 1755, 2090, 1828, 2169, 2236, 2609, 1058, 1312, 1366, 1659, 1429, 1728, 1790, 2126, 1507, 1815, 1880, 2223, 1954, 2303, 2375, 2754, 1601, 1922, 1985, 2339, 2061, 2422, 2491, 2879, 2155, 2523, 2594, 2987, 2680, 3078, 3154, 3569, 677, 871, 912, 1144, 960, 1201, 1249, 1529, 1021, 1271, 1321, 1610, 1384, 1680, 1738, 2071, 1098, 1358, 1411, 1709, 1475, 1781, 1841, 2182, 1555, 1869, 1932, 2280, 2008, 2363, 2432, 2815, 1193, 1465, 1521, 1831, 1586, 1904, 1969, 2320, 1668, 1995, 2059, 2419, 2136, 2502, 2574, 2965, 1770, 2105, 2171, 2539, 2251, 2624, 2697, 3095, 2350, 2728, 2802, 3204, 2890, 3295, 3373, 3792, 1309, 1597, 1655, 1980, 1724, 2056, 2122, 2486, 1812, 2151, 2218, 2589, 2299, 2675, 2749, 3149, 1917, 2265, 2333, 2711, 2415, 2800, 2873, 3279, 2518, 2906, 2981, 3389, 3072, 3484, 3563, 3985, 2044, 2402, 2474, 2859, 2557, 2946, 3024, 3433, 2660, 3056, 3134, 3547, 3225, 3640, 3720, 4143, 2785, 3187, 3264, 3681, 3355, 3775, 3854, 4279, 3468, 3888, 3969, 4392, 4064, 4487, 4566, 4981, 65, 104, 114, 171, 126, 187, 202, 287, 139, 206, 222, 313, 240, 337, 359, 486, 160, 234, 250, 350, 270, 376, 399, 536, 295, 408, 432, 577, 461, 613, 645, 833, 184, 265, 283, 393, 307, 422, 446, 594, 333, 455, 482, 639, 515, 678, 712, 913, 371, 502, 529, 696, 565, 738, 772, 984, 607, 788, 826, 1046, 873, 1100, 1146, 1413, 220, 310, 330, 450, 355, 481, 509, 670, 386, 520, 548, 717, 584, 760, 797, 1011, 427, 571, 600, 780, 638, 825, 863, 1089, 685, 881, 920, 1155, 970, 1213, 1260, 1543, 477, 632, 665, 856, 705, 904, 946, 1184, 753, 961, 1004, 1251, 1056, 1310, 1364, 1657, 818, 1037, 1080, 1339, 1136, 1402, 1455, 1759, 1203, 1478, 1532, 1845, 1599, 1920, 1983, 2337, 264, 369, 392, 527, 420, 562, 592, 769, 454, 605, 637, 823, 676, 870, 911, 1143, 500, 660, 694, 891, 735, 940, 981, 1225, 786, 999, 1043, 1295, 1097, 1357, 1410, 1708, 555, 726, 762, 972, 807, 1023, 1068, 1324, 862, 1087, 1135, 1400, 1192, 1464, 1520, 1830, 931, 1167, 1215, 1491, 1274, 1558, 1613, 1935, 1347, 1638, 1698, 2027, 1769, 2104, 2170, 2538, 630, 815, 853, 1076, 902, 1133, 1181, 1451, 959, 1200, 1248, 1528, 1307, 1595, 1653, 1978, 1033, 1285, 1334, 1625, 1398, 1696, 1754, 2089, 1474, 1780, 1840, 2181, 1915, 2263, 2331, 2709, 1123, 1386, 1441, 1742, 1506, 1814, 1879, 2222, 1585, 1903, 1968, 2319, 2042, 2400, 2473, 2858, 1683, 2012, 2075, 2437, 2154, 2522, 2593, 2986, 2250, 2623, 2696, 3094, 2783, 3185, 3263, 3680, 328, 448, 475, 629, 507, 668, 703, 901, 546, 715, 751, 958, 794, 1008, 1053, 1306, 597, 776, 814, 1032, 860, 1085, 1132, 1397, 917, 1151, 1199, 1473, 1256, 1538, 1594, 1914, 662, 852, 893, 1122, 943, 1180, 1228, 1505, 10101, 1247, 1298, 1584, 1360, 1652, 1711, 2041, 1075, 1333, 1385, 1682, 1450, 1753, 1813, 2153, 1527, 1839, 1902, 2249, 1977, 2330, 2399, 2782, 745, 951, 993, 1238, 1045, 1297, 1349, 1640, 1109, 1370, 1423, 1722, 1489, 1795, 1857, 2198, 1190, 1462, 1517, 1827, 1583, 1901, 1964, 2315, 1664, 1991, 2054, 2414, 2132, 2498, 2568, 2959, 1289, 1574, 1630, 1953, 1700, 2029, 2094, 2456, 1784, 2120, 2186, 2555, 2268, 2641, 2715, 3113, 1890, 2235, 2302, 2679, 2385, 2766, 2839, 3244, 2484, 2871, 2944, 3353, 3035, 3446, 3524, 3947, 850, 1073, 1120, 1382, 1177, 1447, 1502, 1809, 1245, 1525, 1581, 1898, 1649, 1974, 2038, 2395, 1330, 1620, 1678, 2006, 1749, 2083, 2148, 2515, 1836, 2176, 2244, 2616, 2326, 2703, 2777, 3178, 1436, 1736, 1797, 2134, 1873, 2215, 2283, 2657, 1962, 2312, 2383, 2763, 2467, 2851, 2926, 3332, 2069, 2430, 2500, 2888, 2586, 2978, 3053, 3465, 2689, 3086, 3164, 3578, 3256, 3672, 3751, 4175, 1570, 1886, 1948, 2297, 2025, 2381, 2451, 2834, 2116, 2480, 2550, 2939, 2636, 3030, 3107, 3518, 2230, 2602, 2673, 3070, 2761, 3162, 3238, 3654, 2866, 3271, 3347, 3766, 3440, 3861, 3940, 4364, 2368, 2747, 2820, 3223, 2910, 3315, 3394, 3813, 3017, 342, 3505, 3926, 3599, 4020, 4102, 4524, 3147, 3561, 3638, 4062, 3733, 4157, 4236, 4659, 3847, 4271, 4350, 4771, 4444, 4863, 4940, 5345, 416, 557, 587, 764, 626, 810, 848, 1071, 672, 865, 906, 1138, 955, 1195, 1243, 1523, 729, 934, 975, 1219, 1027, 1278, 1328, 1618, 1091, 1351, 1404, 1702, 1468, 1773, 1834, 2174, 802, 1017, 1062, 1317, 1118, 1380, 1434, 1734, 1186, 1457, 1513, 1822, 1579, 1896, 1960, 2310, 1267, 1551, 1606, 1928, 1676, 2004, 2067, 2428, 1761, 2096, 2162, 2530, 2242, 2614, 2687, 3084, 897, 1127, 1175, 1445, 1232, 1510, 1567, 1883, 1302, 1589, 1647, 1972, 1716, 2047, 2113, 2477, 1391, 1688, 1747, 2081, 1819, 2159, 7727, 2599, 1908, 2255, 2324, 2701, 2406, 2789, 2863, 3268, 1500, 1807, 1871, 2213, 1945, 2294, 2365, 2744, 2036, 2393, 2465, 2849, 2547, 2936, 3014, 3423, 2146, 2513, 2584, 2976, 2670, 3067, 3144, 3558, 2775, 3176, 3254, 3670, 3344, 3763, 3844, 4268, 1014, 1263, 1313, 1602, 1377, 1672, 1730, 2063, 1453, 1756, 1816, 2156, 1893, 2238, 2305, 2682, 1546, 1860, 1923, 2271, 1999, 2354, 2423, 2806, 2091, 2453, 2524, 2912, 2610, 3003, 3079, 3490, 1660, 1986, 2050, 2409, 2128, 2493, 2564, 2954, 2224, 2595, 2667, 3063, 2756, 3156, 3233, 3648, 2340, 2718, 2792, 3194, 2880, 3285, 3362, 3781, 2988, 3396, 3475, 3895, 3570, 3991, 4071, 4493, 1803, 2141, 2208, 2579, 2290, 2665, 2739, 3139, 2389, 2770, 2843, 3248, 2932, 3339, 3417, 3838, 2507, 2895, 2970, 3378, 3061, 3473, 3552, 3974, 3171, 3585, 3664, 4086, 3758, 4182, 4262, 4683, 2651, 3046, 3124, 3536, 3215, 3630, 3710, 4133, 3325, 3743, 3824, 4247, 3917, 4341, 4422, 4841, 3457, 3877, 3958, 4381, 4053, 4476, 4556, 4971, 4167, 4588, 4669, 5080, 4762, 5171, 5249, 5638, 1170, 1439, 1495, 1801, 1562, 1877, 1940, 2288, 1642, 1966, 2031, 2387, 2108, 2471, 2542, 2930, 1740, 2074, 2139, 2506, 2220, 2592, 2663, 3060, 2317, 2695, 2768, 3170, 2856, 3262, 3337, 3757, 1865, 2206, 2276, 2649, 2359, 2737, 2811, 3213, 2458, 2841, 2918, 3323, 3007, 3415, 3495, 3915, 2577, 2969, 3044, 3456, 3137, 3551, 3628, 4052, 3246, 3663, 3741, 4166, 3836, 4261, 4339, 4761, 2017, 2373, 2443, 2826, 2527, 2915, 2992, 3400, 2628, 3022, 3099, 3510, 3191, 3605, 3685, 4107, 2752, 3153, 3229, 3645, 3320, 3739, 3819, 4243, 3431, 3853, 3931, 4356, 4026, 4451, 4529, 4946, 2901, 3306, 3384, 3803, 3479, 3899, 3980, 4403, 3590, 4011, 4092, 4514, 4187, 4608, 4689, 5100, 3724, 4148, 4226, 4649, 4323, 4744, 4822, 5231, 4435, 4855, 4930, 5336, 5022, 5424, 5497, 5875, 2201, 2571, 2644, 3038, 2732, 3131, 3208, 3622, 2836, 3240, 3317, 3735, 3411, 3831, 3910, 4334, 2962, 3371, 3449, 3870, 3544, 3967, 4045, 4469, 3656, 4079, 4159, 4581, 4255, 4677, 4755, 5165, 3116, 3527, 3608, 4029, 3702, 4124, 4204, 4625, 3815, 4238, 4319, 4739, 4414, 4833, 4910, 5315, 3950, 4374, 4453, 4872, 4548, 4964, 5039, 5440, 4661, 5073, 5150, 5545, 5242, 5632, 5702, 6067, 3300, 3718, 3797, 4220, 3893, 4317, 4397, 4816, 4006, 4430, 4508, 4925, 4603, 5017, 5094, 5492, 4141, 4565, 4642, 5056, 4737, 5149, 5224, 5616, 4849, 5257, 5330, 5716, 5418, 5800, 5869, 6221, 4301, 4721, 4800, 5208, 4894, 5299, 5374, 5757, 5002, 5404, 5478, 5856, 5565, 5938, 6007, 6348, 5133, 5530, 5600, 5972, 5687, 6054, 6118, 6452, 5787, 6146, 6209, 6535, 6285, 6604, 6660, 6941, 108, 164, 176, 255, 193, 277, 294, 407, 213, 302, 321, 440, 347, 472, 498, 658, 238, 334, 356, 483, 384, 517, 545, 714, 415, 556, 586, 763, 625, 809, 847, 1070, 273, 380, 403, 541, 431, 576, 606, 787, 466, 619, 651, 840, 692, 889, 929, 1165, 512, 674, 709, 909, 750, 957, 1000, 1246, 801, 1016, 1061, 1316, 1117, 1379, 1433, 1733, 317, 436, 460, 612, 491, 650, 684, 879, 532, 699, 733, 938, 775, 987, 1031, 1282, 581, 756, 793, 1007, 839, 1060, 1107, 1368, 896, 1126, 1174, 1444, 1231, 1509, 1566, 1882, 644, 832, 872, 1099, 919, 1153, 1202, 1476, 979, 1223, 1272, 1556, 1332, 1622, 1681, 2009, 1052, 1305, 1359, 1651, 1421, 1720, 1782, 2118, 1499, 1806, 1870, 2212, 1944, 2293, 2364, 2743, 378, 510, 538, 706, 574, 748, 784, 997, 616, 798, 836, 1057, 885, 1113, 1160, 1428, 671, 864, 905, 1137, 954, 1194, 1242, 1522, 1012, 1261, 1311, 1600, 1374, 1669, 1727, 2060, 741, 947, 989, 1234, 1041, 1293, 1345, 1636, 1104, 1365, 1419, 1718, 1483, 1789, 1852, 2193, 1185, 1456, 1512, 1821, 1578, 1895, 1959, 2309, 1658, 1984, 2049, 2408, 2125, 2490, 2562, 2952, 829, 1049, 1095, 1355, 1150, 1417, 1472, 1777, 1218, 1494, 1550, 1864, 1617, 1939, 2003, 2358, 1301, 1588, 1646, 1971, 1715, 2046, 2112, 2476, 1800, 2138, 2205, 2576, 2287, 2662, 2736, 3136, 1408, 1706, 1767, 2102, 1838, 2178, 2248, 2620, 1927, 2275, 2346, 2724, 2427, 2810, 2886, 3291, 2035, 2392, 2464, 2848, 2546, 2935, 3013, 3422, 2648, 3043, 3122, 3534, 3212, 3627, 3708, 4131, 457, 609, 641, 828, 681, 876, 916, 1149, 728, 933, 974, 1217, 1026, 1277, 1327, 1616, 790, 1003, 1048, 1300, 1103, 1363, 1416, 1714, 1169, 1438, 1493, 1799, 1561, 1876, 1938, 2286, 868, 1094, 1141, 1407, 1198, 1471, 1526, 1837, 1266, 1549, 1605, 1926, 1675, 2002, 2066, 2426, 1354, 1645, 1705, 2034, 1776, 2111, 2177, 2545, 1863, 2204, 2274, 2647, 2357, 2735, 2809, 3211, 965, 1207, 1255, 1536, 1315, 1604, 1662, 1988, 1390, 1687, 1746, 2079, 1818, 2158, 2226, 2597, 1482, 1788, 1849, 2190, 1925, 2273, 2342, 2720, 2016, 2372, 2441, 2824, 2526, 2914, 2990, 3398, 1593, 1912, 1976, 2328, 2052, 2411, 2482, 2868, 2145, 2511, 2583, 2974, 2669, 3065, 3143, 3556, 2259, 2632, 2705, 3103, 2794, 3196, 3273, 3690, 2899, 3304, 3382, 3801, 3477, 3897, 3978, 4401, 1090, 1350, 1403, 1701, 1467, 1772, 1833, 2173, 1544, 1858, 1921, 2269, 1997, 2352, 2421, 2804, 1641, 1965, 2030, 2386, 2107, 2470, 2541, 2929, 2199, 2569, 2642, 3036, 2730, 3129, 3206, 3620, 1760, 2095, 2161, 2529, 2241, 2613, 2686, 3083, 2338, 2716, 2791, 3193, 2878, 3283, 3361, 3780, 2457, 2840, 2917, 3322, 3006, 3414, 3494, 3914, 3114, 3525, 3607, 4028, 3700, 4122, 4203, 4624, 1907, 2254, 2323, 2700, 2405, 2788, 2862, 3267, 2505, 2893, 2968, 3376, 3059, 3471, 3550, 3972, 2627, 3021, 3098, 3509, 3190, 3604, 3684, 4106, 3298, 3716, 3795, 4218, 3891, 4315, 4395, 4814, 2774, 3175, 3253, 3669, 3343, 3762, 3843, 4267, 3455, 3875, 3957, 4380, 4051, 4474, 4555, 4970, 3589, 4010, 4091, 4513, 4186, 4607, 4688, 5099, 4299, 4719, 4799, 5207, 4892, 5297, 5373, 5756, 570, 744, 779, 992, 824, 1044, 1088, 1348, 880, 1108, 1154, 1422, 1212, 1488, 1542, 1856, 950, 1189, 1237, 1516, 1296, 1582, 1639, 1963, 1369, 1663, 1721, 2053, 1794, 2131, 2197, 2567, 1036, 1288, 1338, 1629, 1401, 1699, 1758, 2093, 1477, 1783, 1844, 2185, 1919, 2267, 2336, 2714, 1573, 1889, 1952, 2301, 2028, 2384, 2455, 2838, 2119, 2483, 2554, 2943, 2640, 3034, 3112, 3523, 1145, 1412, 1466, 1771, 1530, 1842, 1905, 2252, 1611, 1933, 1996, 2351, 2072, 2433, 2503, 2891, 1710, 2040, 2106, 2469, 2183, 2552, 2625, 3019, 2281, 2655, 2729, 3128, 2816, 3219, 3296, 3714, 1832, 2172, 2240, 2612, 2321, 2698, 2772, 3173, 2420, 2803, 2877, 3282, 2966, 3374, 3453, 3873, 2540, 2928, 3005, 3413, 3096, 3507, 3587, 4008, 3205, 3619, 3699, 4121, 3793, 4216, 4297, 4717, 1284, 1569, 1624, 1947, 1695, 2024, 2088, 2450, 1779, 2115, 2180, 2549, 2262, 2635, 2708, 3106, 1885, 2229, 2296, 2672, 2380, 2760, 2833, 3237, 2479, 2865, 2938, 3346, 3029, 3439, 3517, 3939, 2011, 2367, 2436, 2819, 2521, 2909, 2985, 3393, 2622, 3016, 3093, 3504, 3184, 3598, 3679, 4101, 2746, 3146, 3222, 3637, 3314, 3732, 3812, 4235, 3425, 3846, 3925, 4349, 4019, 4443, 4523, 4939, 2168, 2536, 2608, 3001, 2693, 3090, 3168, 3582, 2798, 3200, 3277, 3694, 3368, 3787, 3867, 4291, 2924, 3330, 3409, 3829, 3501, 3922, 4003, 4427, 3614, 4036, 4116, 4539, 4210, 4632, 4711, 5123, 3077, 3488, 3568, 3989, 3661, 4083, 4164, 4585, 3773, 4196, 4278, 4698, 4371, 4790, 4870, 5275, 3908, 4332, 4412, 4831, 4505, 4922, 4999, 5401, 4617, 5031, 5109, 5506, 5198, 5591, 5663, 6031, 1461, 1765, 1826, 2166, 1900, 2246, 2314, 2691, 1990, 2344, 2413, 2796, 2497, 2884, 2958, 3366, 2100, 2462, 2534, 2922, 2618, 3011, 3088, 3499, 2722, 3120, 3198, 3612, 3289, 3706, 3785, 4208, 2234, 2606, 2678, 3075, 2765, 3166, 3243, 3659, 2870, 3275, 3352, 3771, 3445, 3865, 3946, 4369, 2999, 3407, 3486, 3906, 3580, 4001, 4081, 4503, 3692, 4114, 4194, 4615, 4289, 4709, 4788, 5196, 2398, 2780, 2854, 3259, 2941, 3349, 3428, 3849, 3051, 3462, 3541, 3963, 3634, 4057, 4137, 4560, 3181, 3595, 3675, 4097, 3768, 4192, 4273, 4694, 3882, 4306, 4386, 4805, 4480, 4898, 4975, 5378, 3335, 3754, 3834, 4258, 3928, 4352, 4432, 4851, 4042, 4465, 4545, 4960, 4638, 5051, 5129, 5525, 4178, 4599, 4679, 5090, 4773, 5182, 5258, 5647, 4883, 5288, 5363, 5746, 5451, 5830, 5900, 6249, 2601, 2994, 3069, 3481, 3161, 3575, 3653, 4076, 3270, 3687, 3765, 4189, 3860, 4284, 4363, 4783, 3402, 3821, 3901, 4325, 3996, 4419, 4498, 4915, 4109, 4531, 4610, 5024, 4704, 5115, 5191, 5584, 3560, 3982, 4061, 4484, 4156, 4578, 4658, 5070, 4270, 4691, 4770, 5179, 4862, 5268, 5344, 5728, 4405, 4824, 4901, 5306, 4992, 5394, 5468, 5846, 5102, 5499, 5572, 5944, 5656, 6024, 6090, 6425, 3749, 4173, 4253, 4675, 4346, 4767, 4846, 5254, 4460, 4878, 4955, 5359, 5046, 5446, 5520, 5896, 4594, 5008, 5086, 5484, 5176, 5570, 5643, 6012, 5283, 5671, 5742, 6104, 5825, 6181, 6245, 6568, 4753, 5163, 5240, 5630, 5327, 5713, 5784, 6143, 5432, 5812, 5883, 6233, 5963, 6307, 6371, 6680, 5557, 5930, 5999, 6340, 6077, 6413, 6474, 6773, 6168, 6497, 6556, 6847, 6623, 6908, 6958, 7203, 724, 928, 969, 1211, 1020, 1270, 1320, 1609, 1084, 1343, 1396, 1693, 1460, 1764, 1825, 2165, 1164, 1432, 1487, 1793, 1554, 1868, 1931, 2279, 1634, 1957, 2022, 2378, 2099, 2461, 2533, 2921, 1259, 1541, 1598, 1918, 1667, 1994, 2058, 2418, 1752, 2086, 2152, 2519, 2233, 2605, 2677, 3074, 1855, 2196, 2266, 2639, 2349, 2727, 2801, 3203, 2448, 2831, 2907, 3312, 2998, 3406, 3485, 3905, 1383, 1679, 1737, 2070, 1810, 2149, 2216, 2587, 1899, 2245, 2313, 2690, 2396, 2778, 2852, 3257, 2007, 2362, 2431, 2814, 2516, 2904, 2979, 3387, 2617, 3010, 3087, 3498, 3179, 3593, 3673, 4095, 2135, 2501, 2573, 2964, 2658, 3054, 3133, 3546, 2764, 3165, 3242, 3658, 3333, 3752, 3833, 4257, 2889, 3294, 3372, 3791, 3466, 3886, 3968, 4391, 3579, 4000, 4080, 4502, 4176, 4597, 4678, 5089, 1537, 1850, 1913, 2260, 1989, 2343, 2412, 2795, 2080, 2442, 2512, 2900, 2598, 2991, 3066, 3478, 2191, 2560, 2633, 3027, 2721, 3119, 3197, 3611, 2825, 3228, 3305, 3723, 3399, 3818, 3898, 4322, 2329, 2706, 2781, 3182, 2869, 3274, 3351, 3770, 2975, 3383, 3463, 3883, 3557, 3979, 4059, 4482, 3104, 3515, 3596, 4017, 3691, 4113, 4193, 4614, 3802, 4225, 4307, 4727, 4402, 4821, 4899, 5304, 2496, 2883, 2957, 3365, 3049, 3460, 3539, 3961, 3159, 3573, 3651, 4074, 3746, 4170, 4250, 4672, 3288, 3705, 3784, 4207, 3880, 4304, 4384, 4803, 3994, 4417, 4496, 4913, 4591, 5005, 5083, 5481, 3444, 3864, 3945, 4368, 4040, 4463, 4544, 4959, 4154, 4576, 4656, 5068, 4750, 5160, 5238, 5628, 4288, 4708, 4787, 5195, 4881, 5286, 5362, 5745, 4990, 5392, 5466, 5844, 5554, 5927, 5997, 6338, 1732, 2065, 2130, 2495, 2210, 2581, 2653, 3048, 2307, 2684, 2758, 3158, 2845, 3250, 3327, 3745, 2425, 2808, 2882, 3287, 2972, 3380, 3459, 3879, 3081, 3492, 3572, 3993, 3666, 4088, 4169, 4590, 2566, 2956, 3033, 3443, 3126, 3538, 3617, 4039, 3235, 3650, 3730, 4153, 3826, 4249, 4329, 4749, 3364, 3783, 3863, 4287, 3960, 4383, 4462, 4880, 4073, 4495, 4575, 4989, 4671, 5082, 5159, 5553, 2741, 3141, 3217, 3632, 3309, 3727, 3806, 4229, 3419, 3840, 3919, 4343, 4014, 4438, 4517, 4933, 3554, 3976, 4055, 4478, 4150, 4573, 4651, 5064, 4264, 4685, 4764, 5173, 4857, 5264, 5338, 5723, 3712, 4135, 4214, 4636, 4310, 4730, 4810, 5218, 4424, 4843, 4919, 5324, 5011, 5412, 5487, 5864, 4558, 4973, 5049, 5449, 5141, 5537, 5609, 5980, 5251, 5640, 5710, 6074, 5794, 6152, 6216, 6541, 2950, 3359, 3437, 3858, 3531, 3954, 4033, 4457, 3644, 4068, 4147, 4570, 4242, 4665, 4743, 5154, 3778, 4201, 4282, 4702, 4377, 4796, 4875, 5280, 4490, 4907, 4984, 5386, 5076, 5474, 5548, 5921, 3937, 4361, 4441, 4860, 4536, 4952, 5028, 5429, 4648, 5061, 5139, 5535, 5230, 5621, 5692, 6058, 4781, 5189, 5266, 5654, 5356, 5739, 5809, 6165, 5460, 5838, 5909, 6257, 5991, 6332, 6395, 6701, 4128, 4552, 4629, 5043, 4724, 5136, 5211, 5603, 4837, 5246, 5319, 5706, 5407, 5790, 5859, 6212, 4967, 5370, 5443, 5822, 5532, 5907, 5974, 6317, 5635, 6004, 6070, 6406, 6148, 6479, 6537, 6830, 5120, 5517, 5588, 5960, 5674, 6041, 6107, 6441, 5776, 6136, 6199, 6526, 6275, 6595, 6652, 6934, 5893, 6242, 6304, 6620, 6380, 6688, 6743, 7013, 6468, 6767, 6820, 7081, 6883, 7137, 7182, 7396, 1981, 2334, 2403, 2786, 2488, 2875, 2948, 3357, 2590, 2982, 3057, 3469, 3151, 3565, 3642, 4066, 2712, 3110, 3188, 3602, 3280, 3697, 3776, 4199, 3390, 3809, 3889, 4313, 3986, 4409, 4488, 4905, 2860, 3265, 3341, 3760, 3435, 3856, 3935, 4359, 3548, 3970, 4049, 4472, 4145, 4568, 4646, 5059, 3682, 4104, 4184, 4605, 4280, 4700, 4779, 5187, 4393, 4812, 4890, 5295, 4982, 5384, 5458, 5836, 3040, 3451, 3529, 3952, 3624, 4047, 4126, 4550, 3737, 4161, 4240, 4663, 4336, 4757, 4835, 5244, 3871, 4295, 4375, 4794, 4470, 4888, 4965, 5368, 4582, 4996, 5074, 5472, 5166, 5560, 5633, 6002, 4031, 4455, 4534, 4950, 4627, 5041, 5118, 5515, 4741, 5152, 5228, 5619, 5317, 5704, 5774, 6134, 4873, 5278, 5354, 5737, 5441, 5820, 5891, 6240, 5546, 5919, 5989, 6330, 6068, 6404, 6466, 6765, 3260, 3676, 3755, 4179, 3851, 4275, 4354, 4775, 3964, 4387, 4466, 4884, 4562, 4977, 5053, 5453, 4098, 4520, 4600, 5014, 4695, 5106, 5183, 5576, 4806, 5214, 5289, 5677, 5379, 5762, 5831, 6186, 4259, 4680, 4759, 5168, 4853, 5260, 5334, 5719, 4961, 5364, 5438, 5817, 5527, 5902, 5970, 6313, 5091, 5489, 5562, 5935, 5648, 6016, 6082, 6417, 5747, 6109, 6173, 6502, 6250, 6572, 6628, 6912, 4449, 4867, 4944, 5349, 5036, 5436, 5510, 5887, 5146, 5541, 5613, 5984, 5699, 6064, 6129, 6462, 5272, 5660, 5732, 6094, 5815, 6171, 6236, 6559, 5914, 6262, 6325, 6639, 6400, 6706, 6761, 7029, 5422, 5803, 5873, 6224, 5954, 6299, 6362, 6672, 6051, 6389, 6450, 6751, 6520, 6815, 6868, 7124, 6159, 6488, 6548, 6839, 6615, 6900, 6951, 7196, 6695, 6971, 7020, 7256, 7076, 7304, 7346, 7535, 3521, 3943, 4023, 4447, 4119, 4542, 4620, 5034, 4232, 4654, 4733, 5144, 4828, 5236, 5310, 5697, 4366, 4786, 4865, 5271, 4957, 5361, 5434, 5814, 5066, 5465, 5539, 5913, 5626, 5996, 6062, 6399, 4526, 4942, 5019, 5420, 5111, 5508, 5580, 5952, 5220, 5611, 5683, 6049, 5767, 6127, 6191, 6518, 5347, 5731, 5801, 6158, 5885, 6235, 6297, 6614, 5982, 6324, 6387, 6694, 6460, 6760, 6813, 7075, 4715, 5127, 5202, 5595, 5293, 5681, 5751, 6113, 5398, 5781, 5850, 6204, 5933, 6280, 6343, 6656, 5523, 5899, 5966, 6310, 6047, 6386, 6446, 6748, 6140, 6472, 6530, 6824, 6599, 6887, 6937, 7185, 5666, 6034, 6099, 6434, 6176, 6505, 6563, 6854, 6267, 6588, 6644, 6927, 6710, 6985, 7033, 7268, 6374, 6683, 6737, 7008, 6802, 7066, 7112, 7336, 6877, 7132, 7176, 7391, 7227, 7436, 7471, 7641, 4936, 5341, 5415, 5797, 5503, 5880, 5948, 6294, 5606, 5977, 6044, 6383, 6123, 6456, 6514, 6810, 5725, 6088, 6154, 6484, 6230, 6554, 6611, 6897, 6319, 6634, 6690, 6967, 6756, 7025, 7072, 7301, 5866, 6218, 6282, 6601, 6356, 6667, 6722, 6995, 6443, 6745, 6799, 7063, 6862, 7119, 7163, 7380, 6543, 6835, 6888, 7141, 6947, 7193, 7235, 7442, 7015, 7252, 7293, 7491, 7342, 7532, 7564, 7718, 6028, 6368, 6429, 6733, 6500, 6797, 6850, 7109, 6584, 6873, 6923, 7173, 6982, 7224, 7265, 7469, 6677, 6956, 7004, 7243, 7061, 7292, 7333, 7525, 7128, 7350, 7388, 7571, 7433, 7609, 7639, 7779, 6786, 7052, 7099, 7325, 7152, 7371, 7409, 7589, 7215, 7426, 7461, 7633, 7501, 7667, 7695, 7825, 7284, 7484, 7518, 7680, 7557, 7713, 7739, 7860, 7603, 7750, 7774, 7888, 7802, 7911, 7929, 8009, 182, 262, 280, 389, 303, 417, 441, 588, 331, 452, 478, 634, 511, 673, 707, 907, 366, 496, 524, 690, 558, 730, 765, 976, 602, 782, 820, 1039, 866, 1092, 1139, 1405, 412, 552, 582, 758, 620, 803, 841, 1063, 666, 858, 899, 1130, 948, 1187, 1235, 1514, 722, 926, 967, 1209, 1018, 1268, 1318, 1607, 1082, 1341, 1394, 1691, 1458, 1762, 1823, 2163, 473, 627, 659, 849, 700, 898, 939, 1176, 749, 956, 998, 1244, 1050, 1303, 1356, 1648, 811, 1028, 1072, 1329, 1128, 1392, 1446, 1748, 1196, 1469, 1524, 1835, 1590, 1909, 1973, 2325, 890, 1119, 1166, 1435, 1224, 1501, 1557, 1872, 1294, 1580, 1637, 1961, 1707, 2037, 2103, 2466, 1381, 1677, 1735, 2068, 1808, 2147, 2214, 2585, 1897, 2243, 2311, 2688, 2394, 2776, 2850, 3255, 550, 720, 755, 964, 800, 1015, 1059, 1314, 855, 1079, 1125, 1389, 1183, 1454, 1508, 1817, 923, 1158, 1206, 1481, 1264, 1547, 1603, 1924, 1337, 1628, 1686, 2015, 1757, 2092, 2157, 2525, 1006, 1254, 1304, 1592, 1367, 1661, 1719, 2051, 1443, 1745, 1805, 2144, 1881, 2225, 2292, 2668, 1535, 1848, 1911, 2258, 1987, 2341, 2410, 2793, 2078, 2440, 2510, 2898, 2596, 2989, 3064, 3476, 1116, 1378, 1431, 1731, 1497, 1804, 1867, 2209, 1577, 1894, 1956, 2306, 2033, 2390, 2460, 2844, 1673, 2000, 2064, 2424, 2142, 2508, 2580, 2971, 2239, 2611, 2683, 3080, 2771, 3172, 3249, 3665, 1792, 2129, 2195, 2565, 2278, 2652, 2726, 3125, 2377, 2757, 2830, 3234, 2920, 3326, 3405, 3825, 2494, 2881, 2955, 3363, 3047, 3458, 3537, 3959, 3157, 3571, 3649, 4072, 3744, 4168, 4248, 4670, 656, 845, 887, 1115, 935, 1171, 1220, 1496, 995, 1240, 1291, 1576, 1352, 1643, 1703, 2032, 1067, 1323, 1376, 1671, 1440, 1741, 1802, 2140, 1519, 1829, 1892, 2237, 1967, 2318, 2388, 2769, 1162, 1430, 1485, 1791, 1552, 1866, 1929, 2277, 1632, 1955, 2020, 2376, 2097, 2459, 2531, 2919, 1729, 2062, 2127, 2492, 2207, 2578, 2650, 3045, 2304, 2681, 2755, 3155, 2842, 3247, 3324, 3742, 1279, 1563, 1619, 1941, 1689, 2018, 2082, 2444, 1774, 2109, 2175, 2543, 2256, 2629, 2702, 3100, 1878, 2221, 2289, 2664, 2374, 2753, 2827, 3230, 2472, 2857, 2931, 3338, 3023, 3432, 3511, 3932, 2005, 2360, 2429, 2812, 2514, 2902, 2977, 3385, 2615, 3008, 3085, 3496, 3177, 3591, 3671, 4093, 2738, 3138, 3214, 3629, 3307, 3725, 3804, 4227, 3416, 3837, 3916, 4340, 4012, 4436, 4515, 4931, 1426, 1725, 1787, 2123, 1861, 2202, 2272, 2645, 1951, 2300, 2371, 2750, 2454, 2837, 2913, 3318, 2057, 2417, 2487, 2874, 2572, 2963, 3039, 3450, 2676, 3073, 3150, 3564, 3241, 3657, 3736, 4160, 2189, 2558, 2631, 3025, 2719, 3117, 3195, 3609, 2823, 3226, 3303, 3721, 3397, 3816, 3896, 4320, 2947, 3356, 3434, 3855, 3528, 3951, 4030, 4454, 3641, 4065, 4144, 4567, 4239, 4662, 4740, 5151, 2355, 2733, 2807, 3209, 2896, 3301, 3379, 3798, 3004, 3412, 3491, 3911, 3586, 4007, 4087, 4509, 3132, 3545, 3623, 4046, 3719, 4142, 4221, 4643, 3832, 4256, 4335, 4756, 4431, 4850, 4926, 5331, 3286, 3703, 3782, 4205, 3878, 4302, 4382, 4801, 3992, 4415, 4494, 4911, 4589, 5003, 5081, 5479, 4125, 4549, 4626, 5040, 4722, 5134, 5209, 5601, 4834, 5243, 5316, 5703, 5405, 5788, 5857, 6210, 795, 1009, 1054, 1308, 1110, 1371, 1424, 1723, 1178, 1448, 1503, 1811, 1571, 1887, 1949, 2298, 1257, 1539, 1596, 1916, 1665, 1992, 2055, 2415, 1750, 2084, 2150, 2517, 2231, 2603, 2674, 3071, 1361, 1654, 1712, 2043, 1785, 2121, 2187, 2556, 1874, 2217, 2284, 2659, 2369, 2748, 2821, 3224, 1979, 2332, 2401, 2784, 2485, 2872, 2945, 3354, 2588, 2980, 3055, 3467, 3148, 3562, 3639, 4063, 1490, 1796, 1859, 2200, 1934, 2282, 2353, 2731, 2026, 2382, 2452, 2835, 2537, 2925, 3002, 3410, 2133, 2499, 2570, 2961, 2656, 3052, 3130, 3543, 2762, 3163, 3239, 3655, 3331, 3750, 3830, 4254, 2270, 2643, 2717, 3115, 2805, 3207, 3284, 3701, 2911, 3316, 3395, 3814, 3489, 3909, 3990, 4413, 3037, 3448, 3526, 3949, 3621, 4044, 4123, 4547, 3734, 4158, 4237, 4660, 4333, 4754, 4832, 5241, 1650, 1975, 2039, 2397, 2117, 2481, 2551, 2940, 2211, 2582, 2654, 3050, 2742, 3142, 3218, 3633, 2327, 2704, 2779, 3180, 2867, 3272, 3348, 3767, 2973, 3381, 3461, 3881, 3555, 3977, 4056, 4479, 2468, 2853, 2927, 3334, 3018, 3427, 3506, 3927, 3127, 3540, 3618, 4041, 3713, 4136, 4215, 4637, 3258, 3674, 3753, 4177, 3848, 4272, 4351, 4772, 3962, 4385, 4464, 4882, 4559, 4974, 5050, 5450, 2638, 3032, 3109, 3520, 3202, 3616, 3696, 4118, 3311, 3729, 3808, 4231, 3904, 4328, 4408, 4827, 3442, 3862, 3942, 4365, 4038, 4461, 4541, 4956, 4152, 4574, 4653, 5065, 4748, 5158, 5235, 5625, 3601, 4022, 4103, 4525, 4198, 4619, 4699, 5110, 4312, 4732, 4811, 5219, 4904, 5309, 5383, 5766, 4446, 4864, 4941, 5346, 5033, 5433, 5507, 5884, 5143, 5538, 5610, 5981, 5696, 6061, 6126, 6459, 1853, 2194, 2264, 2637, 2347, 2725, 2799, 3201, 2446, 2829, 2905, 3310, 2996, 3404, 3483, 3903, 2563, 2953, 3031, 3441, 3123, 3535, 3615, 4037, 3232, 3647, 3728, 4151, 3823, 4246, 4327, 4747, 2710, 3108, 3186, 3600, 3278, 3695, 3774, 4197, 3388, 3807, 3887, 4311, 3984, 4407, 4486, 4903, 3519, 3941, 4021, 4445, 4117, 4540, 4618, 5032, 4230, 4652, 4731, 5142, 4826, 5234, 5308, 5695, 2887, 3292, 3370, 3789, 3464, 3884, 3966, 4389, 3577, 3998, 4078, 4500, 4174, 4595, 4676, 5087, 3709, 4132, 4212, 4634, 4308, 4728, 4808, 5216, 4421, 4840, 4917, 5322, 5009, 5410, 5485, 5862, 3869, 4293, 4373, 4792, 4468, 4886, 4963, 5366, 4580, 4994, 5072, 5470, 5164, 5558, 5631, 6000, 4713, 5125, 5200, 5593, 5291, 5679, 5749, 6111, 5396, 5779, 5848, 6202, 5931, 6278, 6341, 6654, 3102, 3513, 3594, 4015, 3689, 4111, 4191, 4612, 3800, 4223, 4305, 4725, 4400, 4819, 4897, 5302, 3934, 4358, 4439, 4858, 4533, 4949, 5026, 5427, 4645, 5058, 5137, 5533, 5227, 5618, 5690, 6056, 4096, 4518, 4598, 5012, 4693, 5104, 5181, 5574, 4804, 5212, 5287, 5675, 5377, 5760, 5829, 6184, 4934, 5339, 5413, 5795, 5501, 5878, 5946, 6292, 5604, 5975, 6042, 6381, 6121, 6454, 6512, 6808, 4286, 4706, 4785, 5193, 4879, 5284, 5360, 5743, 4988, 5390, 5464, 5842, 5552, 5925, 5995, 6336, 5117, 5514, 5586, 5958, 5672, 6039, 6105, 6439, 5773, 6133, 6197, 6524, 6273, 6593, 6650, 6932, 5270, 5658, 5730, 6092, 5813, 6169, 6234, 6557, 5912, 6260, 6323, 6637, 6398, 6704, 6759, 7027, 6026, 6366, 6427, 6731, 6498, 6795, 6848, 7107, 6582, 6871, 6921, 7171, 6980, 7222, 7263, 7467, 988, 1233, 1283, 1568, 1344, 1635, 1694, 2023, 1418, 1717, 1778, 2114, 1851, 2192, 2261, 2634, 1511, 1820, 1884, 2228, 1958, 2308, 2379, 2759, 2048, 2407, 2478, 2864, 2561, 2951, 3028, 3438, 1623, 1946, 2010, 2366, 2087, 2449, 2520, 2908, 2179, 2548, 2621, 3015, 2707, 3105, 3183, 3597, 2295, 2671, 2745, 3145, 2832, 3236, 3313, 3731, 2937, 3345, 3424, 3845, 3516, 3938, 4018, 4442, 1766, 2101, 2167, 2535, 2247, 2619, 2692, 3089, 2345, 2723, 2797, 3199, 2885, 3290, 3367, 3786, 2463, 2847, 2923, 3329, 3012, 3421, 3500, 3921, 3121, 3533, 3613, 4035, 3707, 4130, 4209, 4631, 2607, 3000, 3076, 3487, 3167, 3581, 3660, 4082, 3276, 3693, 3772, 4195, 3866, 4290, 4370, 4789, 3408, 3828, 3907, 4331, 4002, 4426, 4504, 4921, 4115, 4538, 4616, 5030, 4710, 5122, 5197, 5590, 1942, 2291, 2361, 2740, 2445, 2828, 2903, 3308, 2544, 2933, 3009, 3418, 3101, 3512, 3592, 4013, 2666, 3062, 3140, 3553, 3231, 3646, 3726, 4149, 3340, 3759, 3839, 4263, 3933, 4357, 4437, 4856, 2813, 3216, 3293, 3711, 3386, 3805, 3885, 4309, 3497, 3918, 3999, 4423, 4094, 4516, 4596, 5010, 3631, 4054, 4134, 4557, 4228, 4650, 4729, 5140, 4342, 4763, 4842, 5250, 4932, 5337, 5411, 5793, 2995, 3403, 3482, 3902, 3576, 3997, 4077, 4499, 3688, 4110, 4190, 4611, 4285, 4705, 4784, 5192, 3822, 4245, 4326, 4746, 4420, 4839, 4916, 5321, 4532, 4948, 5025, 5426, 5116, 5513, 5585, 5957, 3983, 4406, 4485, 4902, 4579, 4993, 5071, 5469, 4692, 5103, 5180, 5573, 5269, 5657, 5729, 6091, 4825, 5233, 5307, 5694, 5395, 5778, 5847, 6201, 5500, 5877, 5945, 6291, 6025, 6365, 6426, 6730, 2160, 2528, 2600, 2993, 2685, 3082, 3160, 3574, 2790, 3192, 3269, 3686, 3360, 3779, 3859, 4283, 2916, 3321, 3401, 3820, 3493, 3913, 3995, 4418, 3606, 4027, 4108, 4530, 4202, 4623, 4703, 5114, 3068, 3480, 3559, 3981, 3652, 4075, 4155, 4577, 3764, 4188, 4269, 4690, 4362, 4782, 4861, 5267, 3900, 4324, 4404, 4823, 4497, 4914, 4991, 5393, 4609, 5023, 5101, 5498, 5190, 5583, 5655, 6023, 3252, 3668, 3748, 4172, 3842, 4266, 4345, 4766, 3956, 4379, 4459, 4877, 4554, 4969, 5045, 5445, 4090, 4512, 4593, 5007, 4687, 5098, 5175, 5569, 4798, 5206, 5282, 5670, 5372, 5755, 5824, 6180, 4252, 4674, 4752, 5162, 4845, 5253, 5326, 5712, 4954, 5358, 5431, 5811, 5519, 5895, 5962, 6306, 5085, 5483, 5556, 5929, 5642, 6011, 6076, 6412, 5741, 6103, 6167, 6496, 6244, 6567, 6622, 6907, 3474, 3894, 3975, 4398, 4070, 4492, 4572, 4986, 4183, 4604, 4684, 5095, 4778, 5186, 5263, 5651, 4318, 4738, 4817, 5225, 4909, 5314, 5388, 5771, 5018, 5419, 5493, 5870, 5579, 5951, 6019, 6359, 4477, 4895, 4972, 5375, 5063, 5462, 5536, 5910, 5172, 5566, 5639, 6008, 5722, 6085, 6151, 6481, 5300, 5688, 5758, 6119, 5840, 6195, 6258, 6580, 5939, 6286, 6349, 6661, 6420, 6725, 6779, 7046, 4668, 5079, 5157, 5551, 5248, 5637, 5708, 6072, 5353, 5736, 5807, 6163, 5890, 6239, 6302, 6618, 5477, 5855, 5924, 6272, 6006, 6347, 6408, 6714, 6098, 6433, 6492, 6790, 6562, 6853, 6903, 7155, 5624, 5994, 6060, 6397, 6138, 6470, 6528, 6822, 6228, 6552, 6609, 6895, 6675, 6954, 7002, 7241, 6335, 6649, 6703, 6979, 6769, 7037, 7083, 7311, 6843, 7103, 7147, 7367, 7199, 7412, 7447, 7621, 2435, 2818, 2894, 3299, 2984, 3392, 3472, 3892, 3092, 3503, 3584, 4005, 3678, 4100, 4181, 4602, 3221, 3636, 3717, 4140, 3811, 4234, 4316, 4736, 3924, 4348, 4429, 4848, 4522, 4938, 5016, 5417, 3377, 3796, 3876, 4300, 3973, 4396, 4475, 4893, 4085, 4507, 4587, 5001, 4682, 5093, 5170, 5564, 4219, 4641, 4720, 5132, 4815, 5223, 5298, 5686, 4924, 5329, 5403, 5786, 5491, 5868, 5937, 6284, 3567, 3988, 4069, 4491, 4163, 4584, 4666, 5077, 4277, 4697, 4777, 5185, 4869, 5274, 5351, 5734, 4411, 4830, 4908, 5313, 4998, 5400, 5475, 5853, 5108, 5505, 5578, 5950, 5662, 6030, 6096, 6431, 4571, 4985, 5062, 5461, 5155, 5549, 5622, 5992, 5262, 5650, 5721, 6084, 5805, 6161, 6226, 6550, 5387, 5770, 5839, 6194, 5922, 6270, 6333, 6647, 6018, 6358, 6419, 6724, 6490, 6788, 6841, 7101, 3790, 4213, 4294, 4714, 4390, 4809, 4887, 5292, 4501, 4918, 4995, 5397, 5088, 5486, 5559, 5932, 4635, 5048, 5126, 5522, 5217, 5608, 5680, 6046, 5323, 5709, 5780, 6139, 5863, 6215, 6279, 6598, 4793, 5201, 5277, 5665, 5367, 5750, 5819, 6175, 5471, 5849, 5918, 6266, 6001, 6342, 6403, 6709, 5594, 5965, 6031, 6373, 6112, 6445, 6504, 6801, 6203, 6529, 6587, 6876, 6655, 6936, 6984, 7226, 4980, 5382, 5456, 5834, 5544, 5917, 5987, 6328, 5646, 6014, 6080, 6415, 6157, 6486, 6546, 6837, 5765, 6125, 6189, 6516, 6265, 6586, 6642, 6925, 6354, 6665, 6720, 6993, 6784, 7050, 7097, 7323, 5905, 6253, 6315, 6630, 6392, 6698, 6753, 7022, 6477, 6775, 6828, 7088, 6891, 7143, 7188, 7401, 6575, 6864, 6914, 7165, 6974, 7217, 7258, 7463, 7042, 7275, 7315, 7510, 7363, 7550, 7582, 7734, 4060, 4483, 4564, 4979, 4657, 5069, 5148, 5543, 4769, 5178, 5256, 5645, 5343, 5727, 5799, 6156, 4900, 5305, 5381, 5764, 5467, 5845, 5916, 6264, 5571, 5943, 6013, 6353, 6089, 6424, 6485, 6783, 5055, 5455, 5529, 5904, 5615, 5986, 6053, 6391, 5715, 6079, 6145, 6476, 6220, 6545, 6603, 6890, 5833, 6188, 6252, 6574, 6327, 6641, 6697, 6973, 6414, 6719, 6774, 7041, 6836, 7096, 7142, 7362, 5239, 5629, 5701, 6066, 5783, 6142, 6207, 6533, 5882, 6232, 6296, 6613, 6370, 6679, 6735, 7006, 5998, 6339, 6402, 6708, 6473, 6772, 6826, 7087, 6555, 6846, 6898, 7150, 6957, 7202, 7244, 7450, 6131, 6464, 6522, 6817, 6591, 6880, 6930, 7179, 6669, 6949, 6997, 7237, 7054, 7286, 7327, 7520, 6763, 7031, 7078, 7306, 7134, 7355, 7393, 7575, 7194, 7407, 7443, 7617, 7485, 7653, 7681, 7813, 5448, 5827, 5898, 6247, 5979, 6321, 6385, 6692, 6073, 6409, 6471, 6770, 6540, 6832, 6886, 7139, 6182, 6510, 6569, 6859, 6635, 6919, 6968, 7212, 6715, 6989, 7038, 7272, 7092, 7319, 7359, 7547, 6309, 6625, 6682, 6960, 6747, 7017, 7065, 7295, 6823, 7084, 7131, 7352, 7184, 7398, 7435, 7610, 6909, 7160, 7204, 7416, 7253, 7458, 7492, 7659, 7312, 7507, 7541, 7700, 7579, 7731, 7755, 7874, 6458, 6758, 6812, 7074, 6875, 7130, 7175, 7390, 6945, 7191, 7234, 7441, 7282, 7482, 7517, 7679, 7026, 7262, 7302, 7499, 7351, 7540, 7572, 7725, 7404, 7585, 7615, 7760, 7650, 7788, 7811, 7918, 7121, 7344, 7382, 7566, 7428, 7605, 7635, 7776, 7477, 7646, 7674, 7807, 7708, 7835, 7857, 7953, 7533, 7693, 7719, 7844, 7751, 7870, 7889, 7978, 7784, 7897, 7914, 7998, 7936, 8015, 8027, 8083, 1250, 1531, 1587, 1906, 1656, 1982, 2045, 2404, 1739, 2073, 2137, 2504, 2219, 2591, 2661, 3058, 1843, 2184, 2253, 2626, 2335, 2713, 2787, 3189, 2434, 2817, 2892, 3297, 2983, 3391, 3470, 3890, 1970, 2322, 2391, 2773, 2475, 2861, 2934, 3342, 2575, 2967, 3042, 3454, 3135, 3549, 3626, 4050, 2699, 3097, 3174, 3588, 3266, 3683, 3761, 4185, 3375, 3794, 3874, 4298, 3971, 4394, 4473, 4891, 2124, 2489, 2559, 2949, 2646, 3041, 3118, 3530, 2751, 3152, 3227, 3643, 3319, 3738, 3817, 4241, 2876, 3281, 3358, 3777, 3452, 3872, 3953, 4376, 3566, 3987, 4067, 4489, 4162, 4583, 4664, 5075, 3026, 3436, 3514, 3936, 3610, 4032, 4112, 4535, 3722, 4146, 4224, 4647, 4321, 4742, 4820, 5229, 3857, 4281, 4360, 4780, 4456, 4874, 4951, 5355, 4569, 4983, 5060, 5459, 5153, 5547, 5620, 5990, 2316, 2694, 2767, 3169, 2855, 3261, 3336, 3756, 2960, 3369, 3447, 3868, 3542, 3965, 4043, 4467, 3091, 3502, 3583, 4004, 3677, 4099, 4180, 4601, 3788, 4211, 4292, 4712, 4388, 4807, 4885, 5290, 3245, 3662, 3740, 4165, 3835, 4260, 4338, 4760, 3948, 4372, 4452, 4871, 4546, 4962, 5038, 5439, 4084, 4506, 4586, 5000, 4681, 5092, 5169, 5563, 4791, 5199, 5276, 5664, 5365, 5748, 5818, 6174, 3430, 3852, 3930, 4355, 4025, 4450, 4528, 4945, 4139, 4563, 4640, 5054, 4735, 5147, 5222, 5614, 4276, 4696, 4776, 5184, 4868, 5273, 5350, 5733, 4978, 5380, 5454, 5832, 5542, 5915, 5985, 6326, 4434, 4854, 4929, 5335, 5021, 5423, 5496, 5874, 5131, 5528, 5599, 5971, 5685, 6052, 6117, 6451, 5261, 5649, 5720, 6083, 5804, 6160, 6225, 6549, 5903, 6251, 6314, 6629, 6390, 6696, 6752, 7021, 2553, 2942, 3020, 3429, 3111, 3522, 3603, 4024, 3220, 3635, 3715, 4138, 3810, 4233, 4314, 4734, 3350, 3769, 3850, 4274, 3944, 4367, 4448, 4866, 4058, 4481, 4561, 4976, 4655, 5067, 5145, 5540, 3508, 3929, 4009, 4433, 4105, 4527, 4606, 5020, 4217, 4639, 4718, 5130, 4813, 5221, 5296, 5684, 4353, 4774, 4852, 5259, 4943, 5348, 5421, 5802, 5052, 5452, 5526, 5901, 5612, 5983, 6050, 6388, 3698, 4120, 4200, 4621, 4296, 4716, 4795, 5203, 4410, 4829, 4906, 5311, 4997, 5399, 5473, 5851, 4543, 4958, 5035, 5435, 5128, 5524, 5596, 5967, 5237, 5627, 5698, 6063, 5782, 6141, 6205, 6531, 4701, 5112, 5188, 5581, 5279, 5667, 5738, 6100, 5385, 5768, 5837, 6192, 5920, 6268, 6331, 6645, 5509, 5886, 5953, 6298, 6035, 6375, 6435, 6738, 6128, 6461, 6519, 6814, 6589, 6878, 6928, 7177, 3923, 4347, 4428, 4847, 4521, 4937, 5015, 5416, 4633, 5047, 5124, 5521, 5215, 5607, 5678, 6045, 4768, 5177, 5255, 5644, 5342, 5726, 5798, 6155, 5447, 5826, 5897, 6246, 5978, 6320, 6384, 6691, 4923, 5328, 5402, 5785, 5490, 5867, 5936, 6283, 5592, 5964, 6032, 6372, 6110, 6444, 6503, 6800, 5714, 6078, 6144, 6475, 6219, 6544, 6602, 6889, 6308, 6624, 6681, 6959, 6746, 7016, 7064, 7294, 5107, 5504, 5577, 5949, 5661, 6029, 6095, 6430, 5763, 6124, 6187, 6515, 6263, 6585, 6640, 6924, 5881, 6231, 6295, 6612, 6369, 6678, 6734, 7005, 6457, 6757, 6811, 7073, 6874, 7129, 7174, 7389, 6017, 6357, 6418, 6723, 6489, 6787, 6840, 7100, 6573, 6863, 6913, 7164, 6972, 7216, 7257, 7462, 6668, 6948, 6996, 7236, 7053, 7285, 7326, 7519, 7120, 7343, 7381, 7565, 7427, 7604, 7634, 7775, 2846, 3251, 3328, 3747, 3420, 3841, 3920, 4344, 3532, 3955, 4034, 4458, 4129, 4553, 4630, 5044, 3667, 4089, 4171, 4592, 4265, 4686, 4765, 5174, 4378, 4797, 4876, 5281, 4968, 5371, 5444, 5823, 3827, 4251, 4330, 4751, 4425, 4844, 4920, 5325, 4537, 4953, 5029, 5430, 5121, 5518, 5589, 5961, 4673, 5084, 5161, 5555, 5252, 5641, 5711, 6075, 5357, 5740, 5810, 6166, 5894, 6243, 6305, 6621, 4016, 4440, 4519, 4935, 4613, 5027, 5105, 5502, 4726, 5138, 5213, 5605, 5303, 5691, 5761, 6122, 4859, 5265, 5340, 5724, 5428, 5808, 5879, 6229, 5534, 5908, 5976, 6318, 6057, 6394, 6455, 6755, 5013, 5414, 5488, 5865, 5575, 5947, 6015, 6355, 5676, 6043, 6108, 6442, 6185, 6513, 6571, 6861, 5796, 6153, 6217, 6542, 6293, 6610, 6666, 6946, 6382, 6689, 6744, 7014, 6809, 7071, 7118, 7341, 4244, 4667, 4745, 5156, 4838, 5247, 5320, 5707, 4947, 5352, 5425, 5806, 5512, 5889, 5956, 6301, 5078, 5476, 5550, 5923, 5636, 6005, 6071, 6407, 5735, 6097, 6162, 6491, 6238, 6561, 6617, 6902, 5232, 5623, 5693, 6059, 5777, 6137, 6200, 6527, 5876, 6227, 6290, 6608, 6364, 6674, 6729, 7001, 5993, 6334, 6396, 6702, 6469, 6768, 6821, 7082, 6551, 6842, 6894, 7146, 6953, 7198, 7240, 7446, 5409, 5792, 5861, 6214, 5942, 6289, 6352, 6664, 6038, 6378, 6438, 6741, 6509, 6806, 6858, 7116, 6150, 6480, 6539, 6831, 6607, 6893, 6944, 7190, 6686, 6963, 7011, 7248, 7069, 7298, 7339, 7529, 6277, 6597, 6653, 6935, 6718, 6992, 7040, 7274, 6794, 7059, 7106, 7331, 7159, 7377, 7415, 7594, 6885, 7138, 7183, 7397, 7233, 7440, 7476, 7645, 7290, 7488, 7523, 7684, 7562, 7716, 7743, 7863, 4511, 4928, 5006, 5408, 5097, 5495, 5568, 5941, 5205, 5598, 5669, 6037, 5754, 6116, 6179, 6508, 5333, 5718, 5791, 6149, 5872, 6223, 6288, 6606, 5969, 6312, 6377, 6685, 6449, 6750, 6805, 7068, 5482, 5860, 5928, 6276, 6010, 6351, 6411, 6717, 6102, 6437, 6495, 6793, 6566, 6857, 6906, 7158, 6213, 6538, 6596, 6884, 6663, 6943, 6991, 7232, 6740, 7010, 7058, 7289, 7115, 7338, 7376, 7561, 5653, 6021, 6087, 6422, 6164, 6493, 6553, 6844, 6256, 6578, 6633, 6917, 6700, 6976, 7024, 7260, 6361, 6671, 6727, 6999, 6791, 7056, 7104, 7329, 6867, 7123, 7168, 7384, 7219, 7429, 7465, 7636, 6483, 6781, 6834, 7094, 6896, 7148, 7192, 7405, 6966, 7210, 7251, 7456, 7300, 7497, 7531, 7691, 7048, 7280, 7321, 7515, 7368, 7554, 7586, 7737, 7422, 7599, 7629, 7771, 7664, 7799, 7822, 7927, 5854, 6208, 6271, 6592, 6346, 6659, 6713, 6988, 6432, 6736, 6789, 7055, 6852, 7111, 7154, 7373, 6534, 6827, 6881, 7135, 6940, 7187, 7230, 7438, 7007, 7245, 7287, 7486, 7335, 7526, 7559, 7714, 6648, 6931, 6978, 7221, 7036, 7271, 7310, 7506, 7102, 7328, 7366, 7553, 7411, 7591, 7620, 7764, 7180, 7394, 7431, 7607, 7474, 7643, 7671, 7805, 7521, 7682, 7710, 7836, 7741, 7861, 7881, 7971, 6778, 7045, 7091, 7318, 7145, 7365, 7403, 7584, 7207, 7419, 7453, 7626, 7495, 7662, 7689, 7820, 7278, 7479, 7513, 7676, 7552, 7709, 7736, 7858, 7597, 7745, 7769, 7884, 7798, 7908, 7926, 8007, 7358, 7546, 7578, 7730, 7614, 7759, 7783, 7896, 7655, 7792, 7815, 7921, 7841, 7941, 7957, 8031, 7705, 7832, 7854, 7951, 7878, 7969, 7985, 8052, 7904, 7989, 8004, 8065, 8020, 8077, 8087, 8126, 3210, 3625, 3704, 4127, 3799, 4222, 4303, 4723, 3912, 4337, 4416, 4836, 4510, 4927, 5004, 5406, 4048, 4471, 4551, 4966, 4644, 5057, 5135, 5531, 4758, 5167, 5245, 5634, 5332, 5717, 5789, 6147, 4206, 4628, 4707, 5119, 4802, 5210, 5285, 5673, 4912, 5318, 5391, 5775, 5480, 5858, 5926, 6274, 5042, 5442, 5516, 5892, 5602, 5973, 6040, 6379, 5705, 6069, 6135, 6467, 6211, 6536, 6594, 6882, 4399, 4818, 4896, 5301, 4987, 5389, 5463, 5841, 5096, 5494, 5567, 5940, 5652, 6020, 6086, 6421, 5226, 5617, 5689, 6055, 5772, 6132, 6196, 6523, 5871, 6222, 6287, 6605, 6360, 6670, 6726, 6998, 5376, 5759, 5828, 6183, 5911, 6259, 6322, 6636, 6009, 6350, 6410, 6716, 6482, 6780, 6833, 7093, 6120, 6453, 6511, 6807, 6581, 6870, 6920, 7170, 6662, 6942, 6990, 7231, 7047, 7279, 7320, 7514, 4622, 5037, 5113, 5511, 5204, 5597, 5668, 6036, 5312, 5700, 5769, 6130, 5852, 6206, 6269, 6590, 5437, 5816, 5888, 6237, 5968, 6311, 6376, 6684, 6065, 6401, 6463, 6762, 6532, 6825, 6879, 7133, 5582, 5955, 6022, 6363, 6101, 6436, 6494, 6792, 6193, 6521, 6579, 6869, 6646, 6929, 6977, 7220, 6300, 6616, 6673, 6952, 6739, 7009, 7057, 7288, 6816, 7077, 7125, 7347, 7178, 7392, 7430, 7606, 5753, 6115, 6178, 6507, 6255, 6577, 6632, 6916, 6345, 6658, 6712, 6987, 6777, 7044, 7090, 7317, 6448, 6749, 6804, 7067, 6866, 7122, 7167, 7383, 6939, 7186, 7229, 7437, 7277, 7478, 7512, 7675, 6565, 6856, 6905, 7157, 6965, 7209, 7250, 7455, 7035, 7270, 7309, 7505, 7357, 7545, 7577, 7729, 7114, 7337, 7375, 7560, 7421, 7598, 7628, 7770, 7473, 7642, 7670, 7804, 7704, 7831, 7853, 7950, 4889, 5294, 5369, 5752, 5457, 5835, 5906, 6254, 5561, 5934, 6003, 6344, 6081, 6416, 6478, 6776, 5682, 6048, 6114, 6447, 6190, 6517, 6576, 6865, 6281, 6600, 6657, 6938, 6721, 6994, 7043, 7276, 5821, 6177, 6241, 6564, 6316, 6631, 6687, 6964, 6405, 6711, 6766, 7034, 6829, 7089, 7136, 7356, 6506, 6803, 6855, 7113, 6915, 7166, 7208, 7420, 6986, 7228, 7269, 7472, 7316, 7511, 7544, 7703, 5988, 6329, 6393, 6699, 6465, 6764, 6818, 7079, 6547, 6838, 6892, 7144, 6950, 7195, 7238, 7444, 6643, 6926, 6975, 7218, 7032, 7267, 7307, 7503, 7098, 7324, 7364, 7551, 7408, 7588, 7618, 7762, 6754, 7023, 7070, 7299, 7126, 7348, 7386, 7569, 7189, 7402, 7439, 7613, 7480, 7648, 7677, 7809, 7259, 7464, 7496, 7663, 7537, 7697, 7722, 7847, 7583, 7735, 7758, 7877, 7786, 7899, 7916, 8000, 6172, 6501, 6560, 6851, 6627, 6911, 6962, 7206, 6707, 6983, 7030, 7266, 7086, 7314, 7354, 7543, 6798, 7062, 7110, 7334, 7162, 7379, 7418, 7596, 7225, 7434, 7470, 7640, 7509, 7673, 7702, 7830, 6901, 7153, 7197, 7410, 7247, 7452, 7487, 7654, 7305, 7502, 7536, 7696, 7574, 7727, 7752, 7871, 7372, 7558, 7590, 7740, 7625, 7768, 7791, 7903, 7668, 7803, 7826, 7930, 7851, 7949, 7964, 8037, 7019, 7255, 7297, 7494, 7345, 7534, 7567, 7720, 7400, 7581, 7612, 7757, 7647, 7785, 7808, 7915, 7460, 7632, 7661, 7797, 7694, 7824, 7845, 7944, 7733, 7856, 7876, 7968, 7898, 7986, 7999, 8062, 7528, 7688, 7715, 7840, 7746, 7865, 7885, 7974, 7781, 7894, 7912, 7996, 7933, 8012, 8025, 8081, 7819, 7925, 7940, 8019, 7959, 8033, 8043, 8095, 7983, 8051, 8060, 8108, 8072, 8116, 8122, 8151, 5194, 5587, 5659, 6027, 5744, 6106, 6170, 6499, 5843, 6198, 6261, 6583, 6337, 6651, 6705, 6981, 5959, 6303, 6367, 6676, 6440, 6742, 6796, 7060, 6525, 6819, 6872, 7127, 6933, 7181, 7223, 7432, 6093, 6428, 6487, 6785, 6558, 6849, 6899, 7151, 6638, 6922, 6970, 7214, 7028, 7264, 7303, 7500, 6732, 7003, 7051, 7283, 7108, 7332, 7370, 7556, 7172, 7387, 7425, 7602, 7468, 7638, 7666, 7801, 6248, 6570, 6626, 6910, 6693, 6969, 7018, 7254, 6771, 7039, 7085, 7313, 7140, 7360, 7399, 7580, 6860, 7117, 7161, 7378, 7213, 7424, 7459, 7631, 7273, 7475, 7508, 7672, 7548, 7706, 7732, 7855, 6961, 7205, 7246, 7451, 7296, 7493, 7527, 7687, 7353, 7542, 7573, 7726, 7611, 7756, 7780, 7893, 7417, 7595, 7624, 7767, 7660, 7796, 7818, 7924, 7701, 7829, 7850, 7948, 7875, 7967, 7982, 8050, 6423, 6728, 6782, 7049, 6845, 7105, 7149, 7369, 6918, 7169, 7211, 7423, 7261, 7466, 7498, 7665, 7000, 7239, 7281, 7481, 7330, 7522, 7555, 7711, 7385, 7568, 7600, 7747, 7637, 7777, 7800, 7909, 7095, 7322, 7361, 7549, 7406, 7587, 7616, 7761, 7457, 7630, 7658, 7795, 7692, 7823, 7843, 7943, 7516, 7678, 7707, 7834, 7738, 7859, 7879, 7970, 7772, 7886, 7906, 7991, 7928, 8008, 8021, 8078, 7201, 7414, 7449, 7623, 7490, 7657, 7686, 7817, 7539, 7699, 7724, 7849, 7754, 7873, 7892, 7981, 7593, 7742, 7766, 7882, 7794, 7905, 7923, 8005, 7828, 7931, 7947, 8023, 7966, 8038, 8049, 8099, 7652, 7790, 7812, 7919, 7839, 7939, 7955, 8029, 7869, 7963, 7977, 8046, 7995, 8059, 8069, 8113, 7902, 7988, 8002, 8064, 8018, 8076, 8085, 8125, 8036, 8089, 8097, 8133, 8107, 8140, 8145, 8166, 6619, 6904, 6955, 7200, 7012, 7249, 7291, 7489, 7080, 7308, 7349, 7538, 7395, 7576, 7608, 7753, 7156, 7374, 7413, 7592, 7454, 7627, 7656, 7793, 7504, 7669, 7698, 7827, 7728, 7852, 7872, 7965, 7242, 7448, 7483, 7651, 7524, 7685, 7712, 7838, 7570, 7723, 7749, 7868, 7778, 7891, 7910, 7994, 7622, 7765, 7789, 7901, 7816, 7922, 7938, 8017, 7848, 7946, 7962, 8035, 7980, 8048, 8058, 8106, 7340, 7530, 7563, 7717, 7601, 7748, 7773, 7887, 7644, 7782, 7806, 7913, 7833, 7934, 7952, 8026, 7690, 7821, 7842, 7942, 7867, 7961, 7976, 8045, 7895, 7984, 7997, 8061, 8013, 8073, 8082, 8123, 7744, 7864, 7883, 7973, 7907, 7992, 8006, 8067, 7932, 8011, 8024, 8080, 8039, 8091, 8100, 8135, 7958, 8032, 8042, 8094, 8056, 8104, 8111, 8143, 8071, 8115, 8121, 8150, 8129, 8155, 8159, 8175, 7445, 7619, 7649, 7787, 7683, 7814, 7837, 7937, 7721, 7846, 7866, 7960, 7890, 7979, 7993, 8057, 7763, 7880, 7900, 7987, 7920, 8003, 8016, 8075, 7945, 8022, 8034, 8088, 8047, 8098, 8105, 8139, 7810, 7917, 7935, 8014, 7954, 8028, 8040, 8092, 7975, 8044, 8055, 8103, 8068, 8112, 8119, 8148, 8001, 8063, 8074, 8117, 8084, 8124, 8130, 8156, 8096, 8132, 8138, 8161, 8144, 8165, 8168, 8180, 7862, 7956, 7972, 8041, 7990, 8054, 8066, 8110, 8010, 8070, 8079, 8120, 8090, 8128, 8134, 8158, 8030, 8086, 8093, 8131, 8102, 8137, 8142, 8164, 8114, 8146, 8149, 8169, 8154, 8172, 8174, 8184, 8053, 8101, 8109, 8141, 8118, 8147, 8152, 8170, 8127, 8153, 8157, 8173, 8162, 8176, 8178, 8186, 8136, 8160, 8163, 8177, 8167, 8179, 8181, 8187, 8171, 8182, 8183, 8188, 8185, 8189, 8190, 8191;

$Z_i$ (16384): 0, 1, 2, 6, 3, 8, 9, 20, 4, 10, 12, 24, 14, 28, 31, 55, 5, 13, 15, 29, 18, 34, 38, 64, 21, 39, 44, 73, 50, 82, 90, 138, 7, 17, 19, 37, 22, 42, 45, 77, 27, 49, 54, 89, 60, 98, 105, 161, 33, 57, 63, 101, 71, 112, 121, 181, 81, 125, 137, 201, 150, 219, 235, 330, 11, 23, 26, 47, 30, 53, 59, 95, 35, 61, 67, 107, 74, 117, 128, 190, 43, 72, 79, 123, 88, 136, 147, 216, 99, 151, 163, 237, 177, 256, 274, 382, 52, 86, 93, 144, 103, 157, 169, 246, 116, 175, 188, 271, 204, 291, 311, 429, 134, 198, 212, 301, 231, 326, 346, 254, 355, 378, 512, 405, 547, 577, 759, 16, 32, 36, 62, 41, 70, 76, 120, 48, 80, 87, 135, 97, 149, 159, 233, 56, 91, 100, 152, 111, 167, 180, 259, 124, 185, 199, 284, 218, 308, 328, 449, 68, 109, 118, 178, 130, 194, 207, 296, 146, 215, 230, 325, 249, 350, 371, 505, 165, 239, 257, 359, 278, 386, 410, 552, 304, 419, 445, 596, 477, 635, 670, 870, 85, 133, 143, 211, 156, 229, 245, 344, 174, 253, 269, 376, 290, 403, 427, 574, 197, 281, 300, 414, 324, 444, 471, 628, 354, 482, 510, 676, 545, 719, 756, 974, 226, 320, 340, 466, 365, 497, 526, 697, 399, 540, 569, 750, 605, 793, 833, 1067, 440, 589, 622, 812, 662, 861, 904, 1150, 713, 922, 967, 1224, 1020, 1287, 1343, 1663, 25, 46, 51, 84, 58, 94, 102, 155, 66, 106, 115, 173, 127, 189, 203, 289, 78, 122, 132, 196, 145, 214, 228, 323, 162, 236, 252, 353, 272, 380, 402, 544, 92, 142, 153, 225, 168, 244, 260, 364, 186, 268, 286, 398, 309, 426, 451, 604, 210, 299, 319, 439, 343, 470, 496, 661, 375, 509, 539, 712, 573, 755, 792, 1019, 113, 170, 183, 263, 200, 285, 305, 420, 221, 312, 333, 455, 358, 487, 517, 684, 248, 349, 369, 503, 397, 538, 566, 747, 431, 580, 610, 800, 650, 848, 889, 1134, 282, 392, 415, 559, 446, 597, 630, 822, 483, 643, 678, 880, 721, 932, 977, 1236, 531, 704, 738, 955, 783, 1009, 1054, 1329, 839, 1075, 1123, 1409, 1184, 1480, 1540, 1889, 141, 209, 224, 317, 243, 342, 363, 494, 267, 374, 396, 536, 425, 572, 602, 789, 298, 412, 437, 586, 468, 625, 658, 857, 508, 673, 709, 917, 753, 970, 1015, 1281, 337, 462, 489, 652, 523, 693, 728, 942, 565, 745, 782, 1007, 829, 1062, 1110, 1393, 618, 808, 850, 1086, 899, 1145, 1196, 1493, 962, 1218, 1273, 1581, 1337, 1656, 1721, 2095, 391, 529, 558, 735, 595, 780, 820, 1050, 642, 837, 878, 1119, 930, 1181, 1233, 1535, 701, 909, 951, 1207, 1005, 1271, 1324, 1643, 1072, 1348, 1404, 1733, 1476, 1815, 1883, 2278, 773, 995, 1041, 1312, 1099, 1379, 1438, 1771, 1171, 1463, 1524, 1869, 1598, 1954, 2028, 2439, 1259, 1567, 1629, 1991, 1706, 2080, 2154, 2583, 1801, 2186, 2263, 2704, 2358, 2810, 2900, 3406, 40, 69, 75, 119, 83, 131, 140, 208, 96, 148, 158, 232, 172, 251, 266, 373, 110, 166, 179, 258, 195, 279, 297, 411, 217, 306, 327, 447, 352, 479, 507, 672, 129, 192, 205, 293, 223, 316, 336, 461, 247, 347, 368, 501, 395, 535, 564, 744, 276, 384, 407, 549, 436, 585, 617, 807, 474, 631, 666, 865, 708, 916, 961, 1217, 154, 227, 242, 341, 261, 366, 389, 527, 288, 401, 424, 571, 453, 607, 640, 835, 321, 441, 467, 624, 499, 664, 699, 907, 542, 715, 752, 969, 796, 1023, 1070, 1346, 362, 493, 522, 692, 556, 733, 771, 993, 601, 788, 828, 1061, 876, 1117, 1169, 1461, 657, 856, 898, 1144, 949, 1205, 1257, 1565, 1014, 1280, 1336, 1655, 1402, 1731, 1799, 2184, 191, 275, 292, 406, 315, 435, 459, 615, 345, 472, 498, 663, 533, 706, 740, 957, 383, 518, 548, 722, 584, 766, 805, 1032, 629, 821, 862, 1100, 914, 1161, 1213, 1511, 430, 578, 609, 798, 648, 845, 887, 1131, 698, 905, 948, 1203, 1001, 1266, 1320, 1638, 760, 978, 1025, 1292, 1081, 1357, 1417, 1746, 1151, 1439, 1500, 1841, 1574, 1925, 2000, 2406, 492, 656, 690, 896, 731, 946, 990, 1253, 786, 1012, 1057, 1332, 1114, 1398, 1456, 1793, 854, 1090, 1141, 1427, 1201, 1498, 1560, 1910, 1278, 1587, 1651, 2014, 1727, 2102, 2178, 2608, 938, 1191, 1244, 1549, 1306, 1621, 1686, 2056, 1387, 1714, 1781, 2164, 1861, 2253, 2333, 2782, 1487, 1826, 1898, 2293, 1982, 2387, 2472, 2934, 2088, 2506, 2593, 3066, 2694, 3178, 3277, 3814, 241, 339, 361, 491, 388, 525, 554, 730, 422, 568, 599, 785, 638, 832, 873, 1113, 465, 621, 655, 853, 696, 903, 945, 1200, 749, 966, 1011, 1277, 1066, 1342, 1397, 1726, 520, 689, 724, 937, 768, 989, 1035, 1305, 824, 1056, 1104, 1386, 1164, 1455, 1516, 1860, 895, 1140, 1190, 1486, 1252, 1559, 1620, 1981, 1331, 1650, 1713, 2087, 1792, 2177, 2252, 2693, 591, 775, 815, 1044, 863, 1101, 1153, 1441, 925, 1174, 1227, 1527, 1290, 1601, 1666, 2031, 999, 1264, 1317, 1635, 1383, 1711, 1776, 2160, 1468, 1807, 1874, 2269, 1959, 2364, 2444, 2906, 1093, 1372, 1431, 1763, 1502, 1843, 1915, 2312, 1590, 1944, 2019, 2428, 2106, 2526, 2614, 3089, 1698, 2071, 2144, 2572, 2234, 2674, 2759, 3253, 2347, 2799, 2887, 3393, 2995, 3512, 3612, 4179, 687, 892, 935, 1187, 987, 1249, 1302, 1616, 1053, 1327, 1382, 1709, 1452, 1788, 1855, 2247, 1137, 1423, 1483, 1822, 1555, 1905, 1976, 2381, 1646, 2008, 2083, 2500, 2172, 2601, 2687, 3170, 1239, 1543, 1605, 1963, 1680, 2049, 2124, 2548, 1774, 2157, 2232, 2671, 2325, 2774, 2863, 3366, 1892, 2287, 2367, 2819, 2464, 2926, 3018, 3535, 2586, 3058, 3154, 3681, 3268, 3804, 3911, 4497, 1369, 1693, 1759, 2138, 1839, 2228, 2307, 2752, 1941, 2342, 2423, 2881, 2522, 2989, 3083, 3605, 2065, 2482, 2565, 3037, 2667, 3151, 3245, 3782, 2793, 3288, 3386, 3932, 3505, 4062, 4171, 4774, 2214, 2649, 2737, 3226, 2841, 3340, 3442, 3992, 2972, 3485, 3587, 4150, 3708, 4280, 4394, 5010, 3131, 3658, 3761, 4338, 3885, 4472, 4585, 5215, 4041, 4635, 4752, 5388, 4891, 5534, 5659, 6334, 65, 104, 114, 171, 126, 187, 202, 287, 139, 206, 222, 314, 240, 338, 360, 490, 160, 234, 250, 351, 270, 377, 400, 541, 295, 409, 434, 583, 464, 620, 654, 852, 184, 265, 283, 394, 307, 423, 448, 600, 334, 458, 485, 647, 519, 688, 723, 936, 372, 506, 534, 707, 570, 751, 787, 1013, 614, 804, 844, 1080, 894, 1139, 1189, 1485, 220, 310, 331, 452, 356, 484, 513, 679, 387, 524, 553, 729, 590, 774, 813, 1042, 428, 576, 606, 795, 646, 843, 883, 1127, 695, 902, 944, 1199, 998, 1263, 1315, 1633, 480, 639, 674, 875, 716, 926, 971, 1229, 767, 988, 1034, 1304, 1091, 1370, 1429, 1761, 834, 1069, 1116, 1401, 1177, 1472, 1531, 1879, 1251, 1558, 1619, 1980, 1696, 2069, 2142, 2570, 264, 370, 393, 532, 421, 557, 598, 784, 456, 611, 644, 840, 685, 890, 933, 1185, 504, 669, 705, 913, 748, 965, 1010, 1276, 801, 1028, 1076, 1352, 1135, 1421, 1481, 1820, 560, 739, 776, 1000, 823, 1055, 1103, 1385, 881, 1124, 1175, 1469, 1237, 1541, 1603, 1961, 956, 1212, 1265, 1573, 1330, 1649, 2086, 1410, 1739, 1808, 2193, 1890, 2285, 2365, 2817, 637, 831, 872, 1112, 924, 1173, 1226, 1526, 985, 1247, 1300, 1614, 1366, 1690, 1756, 2135, 1065, 1341, 1396, 1725, 1467, 1806, 1873, 2268, 1553, 1903, 1974, 2379, 2062, 2479, 2562, 3034, 1163, 1454, 1515, 1859, 1589, 1943, 2018, 2427, 1678, 2047, 2122, 2546, 2211, 2646, 2734, 3223, 1791, 2176, 2251, 2692, 2346, 2798, 2886, 3392, 2462, 2924, 3016, 3533, 3128, 3655, 3758, 4335, 329, 450, 478, 636, 511, 677, 714, 923, 551, 726, 765, 984, 810, 1038, 1088, 1365, 603, 791, 830, 1064, 879, 1122, 1172, 1466, 940, 1194, 1246, 1552, 1309, 1626, 1689, 2061, 671, 871, 915, 1162, 968, 1225, 1279, 1588, 1031, 1299, 1356, 1677, 1425, 1755, 1824, 2210, 1111, 1395, 1453, 1790, 1525, 1872, 1942, 2345, 1613, 1973, 2046, 2461, 2134, 2561, 2645, 3127, 758, 976, 1022, 1289, 1079, 1355, 1413, 1742, 1148, 1435, 1496, 1836, 1571, 1921, 1995, 2400, 1235, 1539, 1600, 1958, 1676, 2045, 2118, 2542, 1768, 2151, 2225, 2664, 2319, 2768, 2855, 3358, 1345, 1665, 1730, 2105, 1811, 2196, 2274, 2715, 1908, 2304, 2385, 2838, 2486, 2948, 3042, 3559, 2030, 2443, 2525, 2994, 2627, 3106, 3200, 3733, 2749, 3242, 3337, 3882, 3457, 4011, 4118, 4719, 869, 1108, 1160, 1449, 1222, 1521, 1585, 1937, 1296, 1609, 1673, 2040, 1751, 2129, 2206, 2639, 1391, 1719, 1785, 2169, 1866, 2260, 2338, 2789, 1968, 2372, 2454, 2915, 2554, 3025, 3119, 3645, 1510, 1852, 1924, 2322, 2012, 2419, 2504, 2968, 2115, 2537, 2624, 3101, 2727, 3214, 3313, 3853, 2244, 2684, 2771, 3265, 2877, 3382, 3481, 4037, 3007, 3523, 3626, 4192, 3748, 4324, 4437, 5057, 1661, 2025, 2100, 2519, 2191, 2621, 2709, 3193, 2299, 2743, 2832, 3330, 2941, 3449, 3551, 4109, 2436, 2897, 2986, 3502, 3098, 3623, 3724, 4299, 3234, 3770, 3873, 4459, 4001, 4595, 4708, 5344, 2606, 3080, 3176, 3705, 3293, 3830, 3938, 4525, 3431, 3980, 4090, 4687, 4222, 4826, 4946, 5590, 3602, 4168, 4277, 4888, 4411, 5030, 5149, 5805, 4572, 5201, 5321, 5985, 5466, 6136, 6262, 6957, 417, 562, 593, 778, 633, 826, 867, 1106, 681, 885, 928, 1179, 980, 1241, 1294, 1607, 742, 959, 1003, 1269, 1059, 1334, 1389, 1717, 1129, 1415, 1474, 1813, 1546, 1895, 1966, 2370, 818, 1048, 1097, 1377, 1158, 1447, 1508, 1850, 1231, 1533, 1596, 1952, 1671, 2038, 2113, 2535, 1322, 1641, 1704, 2078, 1783, 2167, 2242, 2682, 1881, 2276, 2356, 2808, 2452, 2913, 3005, 3521, 919, 1167, 1220, 1519, 1283, 1593, 1658, 2022, 1360, 1683, 1749, 2127, 1829, 2217, 2296, 2740, 1459, 1797, 1864, 2258, 1949, 2353, 2433, 2894, 2053, 2469, 2552, 3023, 2654, 3137, 3231, 3767, 1583, 1935, 2010, 2417, 2097, 2516, 2603, 3077, 2204, 2637, 2725, 3212, 2829, 3327, 3428, 3977, 2336, 2787, 2875, 3380, 2983, 3499, 3599, 4165, 3117, 3643, 3746, 4322, 3870, 4456, 4569, 5198, 1045, 1318, 1373, 1699, 1443, 1778, 1845, 2236, 1528, 1875, 1945, 2348, 2033, 2446, 2528, 2997, 1636, 1998, 2072, 2489, 2161, 2590, 2675, 3158, 2270, 2711, 2800, 3295, 2907, 3413, 3513, 4069, 1764, 2145, 2221, 2658, 2314, 2761, 2850, 3351, 2429, 2888, 2980, 3494, 3091, 3614, 3718, 4291, 2573, 3045, 3141, 3668, 3254, 3790, 3896, 4482, 3394, 3940, 4051, 4645, 4180, 4782, 4902, 5544, 1930, 2330, 2411, 2868, 2511, 2977, 3071, 3592, 2631, 3110, 3204, 3737, 3320, 3862, 3968, 4559, 2779, 3274, 3371, 3917, 3491, 4048, 4156, 4759, 3635, 4202, 4312, 4923, 4447, 5068, 5187, 5844, 2960, 3471, 3573, 4134, 3695, 4266, 4379, 4994, 3843, 4425, 4540, 5165, 4674, 5307, 5431, 6098, 4025, 4619, 4735, 5371, 4875, 5518, 5642, 6317, 5044, 5693, 5821, 6500, 5970, 6655, 6788, 7491, 1215, 1513, 1577, 1928, 1653, 2016, 2091, 2509, 1744, 2120, 2198, 2629, 2290, 2732, 2822, 3318, 1857, 2250, 2328, 2778, 2425, 2885, 2975, 3490, 2544, 3015, 3108, 3634, 3221, 3757, 3860, 4446, 2003, 2409, 2495, 2958, 2596, 3069, 3165, 3693, 2717, 3202, 3303, 3841, 3419, 3966, 4077, 4672, 2866, 3370, 3469, 4024, 3590, 4155, 4264, 4874, 3735, 4311, 4423, 5043, 4557, 5186, 5305, 5969, 2182, 2612, 2699, 3183, 2805, 3300, 3400, 3946, 2931, 3438, 3540, 4097, 3664, 4231, 4344, 4955, 3087, 3611, 3713, 4287, 3838, 4421, 4534, 5160, 3988, 4582, 4695, 5331, 4836, 5478, 5600, 6274, 3282, 3819, 3926, 4513, 4056, 4650, 4768, 5404, 4210, 4813, 4933, 5576, 5077, 5726, 5855, 6534, 4399, 5017, 5136, 5791, 5281, 5943, 6069, 6758, 5452, 6122, 6247, 6942, 6402, 7100, 7231, 7942, 2404, 2859, 2952, 3461, 3063, 3582, 3686, 4255, 3196, 3727, 3833, 4414, 3960, 4549, 4664, 5296, 3362, 3908, 4015, 4609, 4145, 4748, 4864, 5507, 4302, 4913, 5033, 5682, 5176, 5833, 5959, 6644, 3563, 4122, 4236, 4841, 4368, 4981, 5103, 5754, 4528, 5152, 5276, 5936, 5419, 6085, 6214, 6906, 4723, 5359, 5482, 6152, 5629, 6304, 6432, 7130, 5808, 6487, 6620, 7320, 6775, 7478, 7612, 8324, 3811, 4390, 4504, 5126, 4642, 5272, 5395, 6059, 4805, 5443, 5566, 6237, 5717, 6392, 6523, 7220, 5006, 5656, 5780, 6460, 5932, 6617, 6747, 7450, 6111, 6802, 6931, 7638, 7088, 7798, 7930, 8643, 5249, 5907, 6035, 6721, 6188, 6878, 7011, 7717, 6368, 7063, 7197, 7906, 7355, 8064, 8201, 8911, 6590, 7291, 7422, 8134, 7583, 8296, 8428, 9139, 7772, 8485, 8618, 9327, 8776, 9483, 9613, 10303, 108, 164, 176, 255, 193, 277, 294, 408, 213, 302, 322, 442, 348, 475, 502, 667, 238, 335, 357, 486, 385, 521, 550, 725, 416, 561, 592, 777, 632, 825, 866, 1105, 273, 381, 404, 546, 433, 582, 613, 803, 469, 626, 660, 859, 703, 911, 954, 1210, 516, 683, 720, 931, 764, 983, 1030, 1298, 817, 1047, 1096, 1376, 1157, 1446, 1507, 1849, 318, 438, 463, 619, 495, 659, 694, 900, 537, 710, 746, 963, 790, 1016, 1063, 1338, 587, 770, 809, 1037, 858, 1095, 1146, 1433, 918, 1166, 1219, 1518, 1282, 1592, 1657, 2021, 653, 851, 893, 1138, 943, 1197, 1250, 1556, 1008, 1274, 1328, 1647, 1394, 1722, 1789, 2173, 1087, 1364, 1424, 1754, 1494, 1834, 1906, 2302, 1582, 1934, 2009, 2416, 2096, 2515, 2602, 3076, 379, 514, 543, 717, 579, 761, 799, 1026, 623, 814, 855, 1092, 906, 1152, 1204, 1501, 680, 884, 927, 1178, 979, 1240, 1293, 1606, 1043, 1316, 1371, 1697, 1440, 1775, 1842, 2233, 754, 972, 1018, 1285, 1074, 1350, 1408, 1737, 1143, 1430, 1491, 1831, 1564, 1914, 1988, 2393, 1230, 1532, 1595, 1951, 1670, 2037, 2112, 2534, 1762, 2143, 2219, 2656, 2311, 2758, 2847, 3348, 847, 1083, 1133, 1419, 1193, 1489, 1551, 1900, 1268, 1576, 1640, 2002, 1716, 2090, 2166, 2595, 1359, 1682, 1748, 2126, 1828, 2216, 2295, 2739, 1927, 2327, 2408, 2865, 2508, 2974, 3068, 3589, 1479, 1818, 1888, 2283, 1972, 2376, 2460, 2921, 2077, 2494, 2580, 3052, 2681, 3164, 3262, 3798, 2203, 2636, 2724, 3211, 2828, 3326, 3427, 3976, 2957, 3468, 3570, 4131, 3692, 4263, 4376, 4991, 460, 616, 649, 846, 691, 897, 939, 1192, 741, 958, 1002, 1267, 1058, 1333, 1388, 1715, 806, 1033, 1082, 1358, 1142, 1428, 1488, 1827, 1214, 1512, 1575, 1926, 1652, 2015, 2089, 2507, 888, 1132, 1183, 1478, 1245, 1550, 1612, 1971, 1321, 1639, 1703, 2076, 1782, 2165, 2241, 2680, 1418, 1747, 1817, 2202, 1899, 2294, 2375, 2827, 2001, 2407, 2493, 2956, 2594, 3067, 3163, 3691, 992, 1255, 1308, 1623, 1375, 1701, 1766, 2147, 1458, 1795, 1863, 2255, 1948, 2351, 2432, 2891, 1562, 1912, 1984, 2389, 2074, 2491, 2575, 3047, 2180, 2610, 2696, 3180, 2803, 3298, 3397, 3943, 1688, 2058, 2133, 2558, 2223, 2660, 2747, 3238, 2335, 2784, 2874, 3377, 2982, 3496, 3598, 4162, 2474, 2936, 3029, 3546, 3143, 3670, 3774, 4351, 3279, 3816, 3923, 4510, 4053, 4647, 4765, 5401, 1128, 1414, 1473, 1812, 1545, 1894, 1965, 2369, 1634, 1996, 2070, 2487, 2159, 2588, 2673, 3156, 1743, 2119, 2197, 2628, 2289, 2731, 2821, 3317, 2401, 2856, 2949, 3458, 3060, 3579, 3683, 4252, 1880, 2275, 2355, 2807, 2451, 2912, 3004, 3520, 2571, 3043, 3139, 3666, 3252, 3788, 3894, 4480, 2716, 3201, 3302, 3840, 3418, 3965, 4076, 4671, 3560, 4119, 4233, 4838, 4365, 4978, 5100, 5751, 2052, 2467, 2551, 3021, 2653, 3135, 3230, 3765, 2777, 3271, 3369, 3914, 3489, 4045, 4154, 4756, 2929, 3436, 3538, 4095, 3662, 4229, 4342, 4953, 3807, 4386, 4500, 5122, 4639, 5269, 5392, 6056, 3116, 3641, 3745, 4320, 3869, 4454, 4568, 5196, 4023, 4616, 4733, 5368, 4873, 5515, 5640, 6314, 4208, 4811, 4931, 5574, 5075, 5724, 5853, 6532, 5245, 5903, 6031, 6717, 6185, 6875, 7008, 7714, 575, 757, 794, 1021, 842, 1078, 1126, 1412, 901, 1147, 1198, 1495, 1262, 1570, 1632, 1994, 975, 1234, 1288, 1599, 1354, 1675, 1741, 2117, 1434, 1767, 1835, 2224, 1920, 2318, 2399, 2854, 1068, 1344, 1400, 1729, 1471, 1810, 1878, 2273, 1557, 1907, 1979, 2384, 2068, 2485, 2569, 3041, 1664, 2029, 2104, 2524, 2195, 2626, 2714, 3199, 2303, 2748, 2837, 3336, 2947, 3456, 3558, 4117, 1188, 1484, 1544, 1893, 1617, 1977, 2050, 2465, 1710, 2084, 2158, 2587, 2248, 2688, 2775, 3269, 1823, 2209, 2288, 2730, 2382, 2835, 2927, 3434, 2501, 2965, 3059, 3578, 3171, 3700, 3805, 4384, 1964, 2368, 2450, 2911, 2549, 3019, 3114, 3639, 2672, 3155, 3251, 3787, 3367, 3912, 4021, 4614, 2820, 3316, 3417, 3964, 3536, 4093, 4206, 4809, 3682, 4251, 4364, 4977, 4498, 5120, 5243, 5901, 1340, 1660, 1724, 2099, 1805, 2190, 2267, 2708, 1902, 2298, 2378, 2831, 2478, 2940, 303, 3550, 2024, 2435, 2518, 2985, 2620, 3097, 3192, 3723, 2742, 3233, 3329, 3872, 3448, 4000, 4108, 4707, 2175, 2605, 2691, 3175, 2797, 3292, 3391, 3937, 2923, 3430, 3532, 4089, 3654, 4221, 4334, 4945, 3079, 3601, 3704, 4276, 3829, 4410, 4524, 5148, 3979, 4571, 4686, 5320, 4825, 5465, 5589, 6261, 2363, 2815, 2905, 3411, 3013, 3529, 3632, 4198, 3148, 3675, 3779, 4356, 3904, 4490, 4605, 5234, 3310, 3850, 3957, 4546, 4085, 4682, 4800, 5438, 4243, 4850, 4968, 5614, 5111, 5764, 5891, 6573, 3511, 4067, 4178, 4780, 4309, 4919, 5041, 5689, 4469, 5089, 5212, 5868, 5355, 6018, 6148, 6837, 4661, 5293, 5416, 6082, 5561, 6232, 6363, 7058, 5739, 6416, 6548, 7246, 6703, 7404, 7540, 8251, 1538, 1886, 1957, 2361, 2044, 2458, 2541, 3011, 2150, 2578, 2663, 3146, 2767, 3260, 3357, 3902, 2281, 2722, 2813, 3308, 2919, 3425, 3527, 4083, 3050, 3568, 3673, 4241, 3796, 4374, 4488, 5109, 2442, 2903, 2993, 3509, 3105, 3630, 3732, 4307, 3241, 3777, 3881, 4467, 4010, 4603, 4718, 5353, 3409, 3955, 4065, 4659, 4196, 4798, 4917, 5559, 4354, 4966, 5087, 5737, 5232, 5889, 6016, 6701, 2644, 3124, 3219, 3753, 3334, 3877, 3984, 4576, 3478, 4032, 4141, 4742, 4272, 4881, 5000, 5648, 3650, 4217, 4329, 4940, 4463, 5084, 5205, 5862, 4626, 5256, 5378, 6042, 5524, 6194, 6323, 7017, 3858, 4442, 4555, 5182, 4691, 5325, 5448, 6116, 4860, 5501, 5625, 6298, 5774, 6452, 6584, 7283, 5062, 5711, 5838, 6517, 5989, 6674, 6806, 7509, 6171, 6861, 6992, 7698, 7150, 7858, 7993, 8704, 2896, 3402, 3501, 4058, 3622, 4188, 4298, 4909, 3769, 4346, 4458, 5079, 4594, 5223, 5343, 6007, 3948, 4536, 4652, 5283, 4790, 5427, 5551, 6221, 4957, 5602, 5728, 6404, 5879, 6560, 6691, 7391, 4167, 4770, 4887, 5530, 5029, 5678, 5804, 6483, 5200, 5857, 5984, 6669, 6135, 6825, 6956, 7662, 5406, 6071, 6199, 6890, 6352, 7046, 7179, 7887, 6536, 7233, 7368, 8077, 7527, 8237, 8372, 9081, 4434, 5053, 5173, 5829, 5316, 5979, 6106, 6796, 5492, 6161, 6288, 6982, 6443, 7140, 7273, 7983, 5702, 6377, 6508, 7205, 6664, 7364, 7499, 8209, 6850, 7554, 7687, 8398, 7848, 8560, 8694, 9400, 5956, 6640, 6772, 7474, 6926, 7632, 7767, 8479, 7114, 7822, 7957, 8668, 8116, 8827, 8963, 9664, 7340, 8049, 8184, 8894, 8344, 9053, 9188, 9885, 8533, 9241, 9374, 10068, 9531, 10221, 10350, 11014, 736, 952, 996, 1260, 1051, 1325, 1380, 1707, 1120, 1405, 1464, 1802, 1536, 1884, 1955, 2359, 1208, 1505, 1568, 1918, 1644, 2006, 2081, 2498, 1734, 2109, 2187, 2617, 2279, 2720, 2811, 3306, 1313, 1630, 1694, 2066, 1772, 2155, 2230, 2669, 1870, 2264, 2343, 2794, 2440, 2901, 2991, 3507, 1992, 2397, 2483, 2945, 2584, 3056, 3152, 3679, 2705, 3189, 3289, 3826, 3407, 3953, 4063, 4657, 1450, 1786, 1853, 2245, 1938, 2339, 2420, 2878, 2042, 2456, 2539, 3009, 2641, 3121, 3216, 3750, 2170, 2599, 2685, 3168, 2790, 3285, 3383, 3929, 2917, 3423, 3525, 4081, 3647, 4214, 4326, 4937, 2323, 2772, 2861, 3364, 2969, 3482, 3584, 4147, 3103, 3628, 3730, 4305, 3855, 4439, 4552, 5179, 3266, 3802, 3909, 4495, 4038, 4632, 4749, 5385, 4194, 4796, 4915, 5557, 5059, 5708, 5835, 6514, 1624, 1985, 2059, 2475, 2148, 2576, 2661, 3144, 2256, 2697, 2785, 3280, 2892, 3398, 3497, 4054, 2390, 2844, 2937, 3445, 3048, 3566, 3671, 4239, 3181, 3711, 3817, 4397, 3944, 4532, 1648, 5279, 2559, 1030, 3125, 3651, 3239, 3775, 3879, 4465, 3378, 3924, 4033, 4627, 4163, 4766, 4883, 5526, 3547, 4105, 4218, 4822, 4352, 4964, 5085, 5735, 4511, 5134, 5257, 5916, 5402, 6067, 6195, 6886, 2765, 3258, 3355, 3900, 3475, 4029, 4138, 4739, 3619, 4185, 4295, 4906, 4430, 5049, 5169, 5825, 3794, 4372, 4486, 5107, 4623, 5253, 5375, 6039, 4787, 5424, 5548, 6218, 5698, 6373, 6504, 7201, 4008, 4601, 4716, 5351, 4857, 5498, 5622, 6295, 5026, 5675, 5801, 6480, 5952, 6636, 6768, 7470, 5230, 5887, 6014, 6699, 6168, 6858, 6989, 7695, 6349, 7043, 7176, 7884, 7336, 8045, 8180, 8890, 1847, 2238, 2316, 2763, 2413, 2870, 2962, 3473, 2531, 3000, 3094, 3617, 3207, 3740, 3846, 4428, 2677, 3160, 3256, 3792, 3373, 3919, 4027, 4621, 3516, 4072, 4183, 4785, 4315, 4926, 5047, 5696, 2852, 3353, 3454, 4006, 3575, 4136, 4248, 4855, 3720, 4293, 4407, 5024, 4542, 5167, 5289, 5950, 3898, 4484, 4599, 5228, 4737, 5373, 5496, 6166, 4904, 5546, 5673, 6347, 5823, 6502, 6634, 7334, 3073, 3594, 3697, 4268, 3822, 4402, 4516, 5139, 3972, 4563, 4678, 5311, 4818, 5457, 5581, 6252, 4158, 4761, 4877, 5520, 5019, 5669, 5793, 6473, 5191, 5848, 5974, 6659, 6126, 6817, 6946, 7653, 4381, 4996, 5117, 5770, 5262, 5921, 6049, 6736, 5434, 6101, 6228, 6921, 6383, 7078, 7211, 7920, 5644, 6319, 6448, 7146, 6604, 7305, 7437, 8149, 6791, 7494, 7627, 8339, 7787, 8500, 8632, 9341, 3345, 3890, 3997, 4590, 4127, 4728, 4846, 5487, 4285, 4896, 5015, 5664, 5158, 5814, 5941, 6625, 4476, 5096, 5219, 5875, 5363, 6026, 6156, 6845, 5538, 6207, 6338, 7031, 6492, 7188, 7324, 8032, 4704, 5339, 5462, 6131, 5610, 6283, 6412, 7109, 5789, 6468, 6600, 7300, 6756, 7458, 7592, 8304, 6003, 6687, 6821, 7523, 6977, 7682, 7817, 8528, 7165, 7872, 8009, 8719, 8168, 8877, 9013, 9712, 4987, 5635, 5760, 6438, 5912, 6595, 6726, 7427, 6092, 6782, 6912, 7618, 7069, 7778, 7911, 8623, 6309, 7003, 7135, 7843, 7295, 8005, 8138, 8849, 7484, 8194, 8329, 9038, 8490, 9199, 9331, 10026, 6569, 7268, 7400, 8111, 7562, 8273, 8406, 9116, 7752, 8464, 8597, 9306, 8757, 9463, 9593, 10283, 7978, 8689, 8822, 9526, 8984, 9685, 9815, 10497, 9173, 9870, 10001, 10676, 10156, 10827, 10950, 11588, 2139, 2566, 2650, 3132, 2754, 3247, 3342, 3887, 2882, 3387, 3486, 4042, 3607, 4173, 4282, 4893, 3038, 3555, 3659, 4226, 3783, 4360, 4473, 5093, 3933, 4520, 4636, 5266, 4775, 5411, 5535, 6204, 3227, 3762, 3867, 4452, 3994, 4587, 4702, 5337, 4151, 4753, 4871, 5513, 5012, 5661, 5787, 6466, 4339, 4950, 5073, 5722, 5216, 5872, 6001, 6685, 5389, 6053, 6183, 6873, 6335, 7028, 7163, 7870, 3463, 4017, 4124, 4725, 4257, 4866, 4983, 5631, 4417, 5036, 5155, 5811, 5299, 5962, 6088, 6778, 4610, 5239, 5360, 6023, 5508, 6178, 6305, 6999, 5684, 6358, 6489, 7185, 6646, 7346, 7480, 8190, 4843, 5484, 5608, 6281, 5756, 6434, 6566, 7265, 5938, 6622, 6754, 7456, 6908, 7614, 7749, 8461, 6153, 6842, 6975, 7680, 7131, 7839, 7975, 8686, 7321, 8029, 8166, 8875, 8325, 9034, 9170, 9867, 3754, 4330, 4443, 5063, 4578, 5207, 5327, 5991, 4743, 5379, 5502, 6172, 5650, 6325, 6454, 7152, 4941, 5585, 6387, 5863, 6543, 6675, 7374, 6043, 6730, 6862, 7566, 7018, 7725, 7859, 8570, 5183, 5839, 5967, 6651, 6118, 6808, 6939, 7645, 6299, 6993, 7126, 7834, 7285, 7995, 8129, 8840, 6518, 7215, 7351, 8060, 7510, 8219, 8356, 9064, 7699, 8410, 8546, 9254, 8705, 9410, 9543, 10232, 5474, 6143, 6270, 6964, 6424, 7121, 7254, 7964, 6612, 7312, 7445, 8156, 7604, 8316, 8450, 9160, 6832, 7535, 7669, 8379, 7829, 8541, 8675, 9381, 8020, 8731, 8865, 9567, 9025, 9725, 9857, 10536, 7096, 7804, 7939, 8650, 8097, 8808, 8944, 9645, 8291, 9001, 9135, 9833, 9292, 9988, 10119, 10791, 8515, 9222, 9357, 10050, 9512, 10202, 10332, 10996, 9700, 10384, 10513, 11169, 10663, 11312, 11435, 12046, 4114, 4713, 4831, 5471, 4973, 5619, 5744, 6421, 5144, 5798, 5926, 6609, 6077, 6765, 6896, 7601, 5348, 6012, 6140, 6830, 6292, 6987, 7118, 7827, 6477, 7174, 7309, 8018, 7467, 8178, 8313, 9023, 5595, 6267, 6398, 7094, 6553, 7251, 7385, 8095, 6741, 7442, 7578, 8289, 7736, 8447, 8582, 9290, 6961, 7667, 7802, 8514, 7961, 8673, 8806, 9511, 8153, 8863, 8999, 9699, 9157, 9855, 9986, 10662, 5897, 6579, 6709, 7410, 6868, 7572, 7705, 8416, 7053, 7761, 7894, 8606, 8055, 8766, 8900, 9602, 7278, 7989, 8121, 8833, 8283, 8995, 9126, 9826, 8473, 9183, 9315, 10011, 9472, 10166, 10292, 10960, 7546, 8257, 8391, 9101, 8551, 9259, 9392, 10086, 8741, 9447, 9578, 10268, 9734, 10418, 10546, 11202, 8968, 9670, 9800, 10483, 9956, 10635, 10759, 11407, 10141, 10813, 10936, 11575, 11081, 11715, 11829, 12420, 6257, 6951, 7083, 7792, 7241, 7951, 8084, 8796, 7432, 8143, 8278, 8989, 8437, 9147, 9279, 9976, 7657, 8368, 8504, 9212, 8662, 9369, 9501, 10192, 8853, 9556, 9689, 10374, 9844, 10524, 10652, 11302, 7925, 8637, 8772, 9478, 8930, 9632, 9764, 10448, 9121, 9820, 9952, 10630, 10105, 10778, 10902, 11543, 9345, 10039, 10170, 10840, 10320, 10985, 11108, 11739, 10501, 11158, 11281, 11902, 11423, 12035, 12148, 12716, 8246, 8957, 9089, 9789, 9249, 9946, 10075, 10749, 9438, 10132, 10258, 10927, 10410, 11073, 11193, 11821, 9658, 10345, 10472, 11131, 10624, 11277, 11397, 12012, 10803, 11447, 11566, 12170, 11706, 12303, 12412, 12961, 9920, 10599, 10725, 11374, 10872, 11514, 11632, 12234, 11049, 11684, 11799, 12392, 11933, 12518, 12623, 13158, 11253, 11876, 11990, 12570, 12123, 12694, 12797, 13318, 12282, 12840, 12942, 13450, 13060, 13558, 13647, 14091, 182, 262, 280, 390, 303, 418, 443, 594, 332, 454, 481, 641, 515, 682, 718, 929, 367, 500, 528, 700, 563, 743, 779, 1004, 608, 797, 836, 1071, 886, 1130, 1180, 1475, 413, 557, 588, 772, 627, 819, 860, 1098, 675, 877, 921, 1170, 973, 1232, 1286, 1597, 734, 950, 994, 1258, 1049, 1323, 1378, 1705, 1118, 1403, 1462, 1800, 1534, 1882, 1953, 2357, 476, 634, 668, 868, 711, 920, 964, 1221, 762, 981, 1027, 1295, 1084, 1361, 1420, 1750, 827, 1060, 1107, 1390, 1168, 1460, 1520, 1865, 1242, 1547, 1608, 1967, 1684, 2054, 2128, 2553, 912, 1159, 1211, 1509, 1275, 1584, 1648, 2011, 1351, 1672, 1738, 2114, 1819, 2205, 2284, 2726, 1448, 1784, 1851, 2243, 1936, 2337, 2418, 2876, 2039, 2453, 2536, 3006, 2638, 3118, 3213, 3747, 555, 732, 769, 991, 816, 1046, 1094, 1374, 874, 1115, 1165, 1457, 1228, 1529, 1591, 1946, 947, 1202, 1254, 1561, 1319, 1637, 1700, 2073, 1399, 1728, 1794, 2179, 1876, 2271, 2349, 2801, 1036, 1307, 1363, 1687, 1432, 1765, 1833, 2222, 1517, 1862, 1933, 2334, 2020, 2430, 2514, 2981, 1622, 1983, 2057, 2473, 2146, 2574, 2659, 3142, 2254, 2695, 2783, 3278, 2889, 3395, 3495, 4052, 1155, 1444, 1504, 1846, 1579, 1931, 2005, 2412, 1668, 2034, 2108, 2529, 2200, 2632, 2719, 3205, 1779, 2162, 2237, 2676, 2331, 2780, 2869, 3372, 2447, 2908, 2998, 3514, 3111, 3636, 3738, 4313, 1917, 2315, 2396, 2851, 2497, 2961, 3055, 3574, 2616, 3092, 3188, 3719, 3305, 3844, 3952, 4541, 2762, 3255, 3352, 3897, 3472, 4026, 4135, 4736, 3615, 4181, 4292, 4903, 4426, 5045, 5166, 5822, 665, 864, 908, 1154, 960, 1216, 1270, 1578, 1024, 1291, 1347, 1667, 1416, 1745, 1814, 2199, 1102, 1384, 1442, 1777, 1514, 1858, 1929, 2329, 1602, 1960, 2032, 2445, 2121, 2545, 2630, 3109, 1206, 1503, 1566, 1916, 1642, 2004, 2079, 2496, 1732, 2107, 2185, 2615, 2277, 2718, 2809, 3304, 1844, 2235, 2313, 2760, 2410, 2867, 2959, 3470, 2527, 2996, 3090, 3613, 3203, 3736, 3842, 4424, 1335, 1654, 1718, 2092, 1798, 2183, 2259, 2700, 1896, 2291, 2371, 2823, 2470, 2932, 3024, 3541, 2017, 2426, 2510, 2976, 2613, 3088, 3184, 3714, 2733, 3222, 3319, 3861, 3439, 3989, 4098, 4696, 2168, 2597, 2683, 3166, 2788, 3283, 3381, 3927, 2914, 3420, 3522, 4078, 3644, 4211, 4323, 4934, 3070, 3591, 3694, 4265, 3820, 4400, 4514, 5137, 3967, 4558, 4673, 5306, 4814, 5453, 5577, 6248, 1499, 1840, 1911, 2308, 1999, 2405, 2490, 2953, 2103, 2523, 2609, 3084, 2712, 3197, 3296, 3834, 2229, 2668, 2753, 3246, 2860, 3363, 3462, 4016, 2990, 3506, 3606, 4172, 3728, 4303, 4415, 5034, 2388, 2842, 2935, 3443, 3046, 3564, 3669, 4237, 3179, 3709, 3815, 4395, 3941, 4529, 4646, 5277, 3341, 3886, 3993, 4586, 4123, 4724, 4842, 5483, 4281, 4892, 5011, 5660, 5153, 5809, 5937, 6621, 2591, 3064, 3159, 3687, 3275, 3812, 3918, 4505, 3414, 3961, 4070, 4665, 4203, 4806, 4924, 5567, 3583, 4146, 4256, 4865, 4391, 5007, 5127, 5781, 4550, 5177, 5297, 5960, 5444, 6112, 6238, 6932, 3791, 4369, 4483, 5104, 4620, 5250, 5372, 6036, 4783, 5420, 5545, 6215, 5694, 6369, 6501, 7198, 4982, 5630, 5755, 6433, 5908, 6591, 6722, 7423, 6086, 6776, 6907, 7613, 7064, 7773, 7907, 8619, 811, 1040, 1089, 1368, 1149, 1437, 1497, 1838, 1223, 1523, 1586, 1940, 1662, 2027, 2101, 2521, 1311, 1628, 1692, 2064, 1770, 2153, 2227, 2666, 1868, 2262, 2341, 2792, 2438, 2899, 2988, 3504, 1426, 1758, 1825, 2213, 1909, 2306, 2386, 2840, 2013, 2422, 2505, 2971, 2607, 3082, 3177, 3707, 2137, 2564, 2648, 3130, 2751, 3244, 3339, 3884, 2880, 3385, 3484, 4040, 3604, 4170, 4279, 4890, 1572, 1923, 1997, 2403, 2085, 2503, 2589, 3062, 2192, 2623, 2710, 3195, 2816, 3312, 3412, 3959, 2321, 2770, 2858, 3361, 2967, 3480, 3581, 4144, 3100, 3625, 3726, 4301, 3852, 4436, 4548, 5175, 2488, 2951, 3044, 3562, 3157, 3685, 3789, 4367, 3294, 3832, 3939, 4527, 4068, 4663, 4781, 5418, 3460, 4014, 4121, 4722, 4254, 4863, 4980, 5628, 4413, 5032, 5151, 5807, 5295, 5958, 6084, 6774, 1753, 2132, 2208, 2643, 2301, 2746, 2834, 3333, 2415, 2873, 2964, 3477, 3075, 3597, 3699, 4271, 2557, 3028, 3123, 3649, 3237, 3773, 3876, 4462, 3376, 3922, 4031, 4625, 4161, 4764, 4880, 5523, 2729, 3218, 3315, 3857, 3433, 3983, 4092, 4690, 3577, 4140, 4250, 4859, 4383, 4999, 5119, 5773, 3752, 4328, 4441, 5061, 4575, 5204, 5324, 5988, 4741, 5377, 5500, 6170, 5647, 6322, 6451, 7149, 2944, 3453, 3554, 4113, 3678, 4247, 4359, 4972, 3825, 4406, 4519, 5143, 4656, 5288, 5410, 6076, 4005, 4598, 4712, 5347, 4854, 5495, 5618, 6291, 5023, 5672, 5797, 6476, 5949, 6633, 6764, 7466, 4225, 4830, 4949, 5594, 5092, 5743, 5871, 6552, 5265, 5925, 6052, 6740, 6203, 6895, 7027, 7735, 5470, 6139, 6266, 6960, 6420, 7117, 7250, 7960, 6608, 7308, 7441, 8152, 7600, 8312, 8446, 9156, 1990, 2395, 2481, 2943, 2582, 3054, 3150, 3677, 2703, 3187, 3287, 3824, 3405, 3951, 4061, 4655, 2849, 3350, 3451, 4003, 3572, 4133, 4245, 4852, 3717, 4290, 4404, 5021, 4539, 5164, 5286, 5947, 3036, 3553, 3657, 4224, 3781, 4358, 4471, 5091, 3931, 4518, 4634, 5264, 4773, 5409, 5533, 6202, 4111, 4710, 4828, 5468, 4970, 5616, 5741, 6418, 5141, 5795, 5923, 6606, 6074, 6762, 6893, 7598, 3264, 3800, 3907, 4493, 4036, 4630, 4747, 5383, 4191, 4793, 4912, 5554, 5056, 5705, 5832, 6511, 4378, 4993, 5114, 5767, 5260, 5919, 6047, 6734, 5430, 6097, 6224, 6917, 6380, 7075, 7208, 7917, 4608, 5237, 5358, 6021, 5506, 6176, 6303, 6997, 5681, 6355, 6486, 7182, 6643, 7343, 7477, 8187, 5894, 6576, 6706, 7407, 6866, 7570, 7703, 8414, 7049, 7757, 7890, 8602, 8052, 8763, 8897, 9599, 3545, 4103, 4216, 4820, 4350, 4962, 5083, 5733, 4509, 5132, 5255, 5914, 5400, 6065, 6193, 6884, 4701, 5336, 5459, 6128, 5607, 6280, 6409, 7106, 5786, 6465, 6597, 7297, 6753, 7455, 7589, 8301, 4939, 5583, 5710, 6385, 5861, 6541, 6673, 7372, 6041, 6728, 6860, 7564, 7016, 7723, 7857, 8568, 6254, 6948, 7080, 7789, 7238, 7948, 8081, 8793, 7429, 8140, 8275, 8986, 8434, 9144, 9276, 9973, 5227, 5884, 6011, 6696, 6165, 6855, 6986, 7692, 6346, 7040, 7173, 7881, 7333, 8042, 8177, 8887, 6565, 7264, 7396, 8107, 7559, 8270, 8403, 9113, 7748, 8460, 8593, 9302, 8754, 9460, 9590, 10280, 6829, 7532, 7666, 8376, 7826, 8538, 8672, 9378, 8017, 8728, 8862, 9564, 9022, 9722, 9854, 10533, 8242, 8953, 9085, 9785, 9246, 9943, 10072, 10746, 9434, 10128, 10254, 10923, 10407, 11070, 11190, 11818, 1017, 1284, 1339, 1659, 1407, 1736, 1804, 2189, 1490, 1830, 1901, 2297, 1987, 2392, 2477, 2939, 1594, 1950, 2023, 2434, 2111, 2533, 2619, 3096, 2218, 2655, 2741, 3232, 2846, 3347, 3447, 3999, 1723, 2098, 2174, 2604, 2266, 2707, 2796, 3291, 2377, 2830, 2922, 3429, 3032, 3549, 3653, 4220, 2517, 2984, 3078, 3600, 3191, 3722, 3828, 4409, 3328, 3871, 3978, 4570, 4107, 4706, 4824, 5464, 1887, 2282, 2362, 2814, 2459, 2920, 3012, 3528, 2579, 3051, 3147, 3674, 3261, 3797, 3903, 4489, 2723, 3210, 3309, 3849, 3426, 3975, 4084, 4681, 3569, 4130, 4242, 4849, 4375, 4990, 5110, 5763, 2904, 3410, 3510, 4066, 3631, 4197, 4308, 4918, 3778, 4355, 4468, 5088, 4604, 5233, 5354, 6017, 3956, 4545, 4660, 5292, 4799, 5437, 5560, 6231, 4967, 5613, 5738, 6415, 5890, 6572, 6702, 7403, 2093, 2512, 2598, 3072, 2701, 3185, 3284, 3821, 2824, 3321, 3421, 3969, 3542, 4099, 4212, 4815, 2978, 3492, 3593, 4157, 3715, 4288, 4401, 5018, 3863, 4448, 4560, 5188, 4697, 5332, 5454, 6123, 3167, 3696, 3801, 4380, 3928, 4515, 4631, 5261, 4079, 4675, 4794, 5432, 4935, 5578, 5706, 6381, 4267, 4876, 4995, 5643, 5138, 5792, 5920, 6603, 5308, 5971, 6099, 6789, 6249, 6943, 7076, 7785, 3403, 3949, 4059, 4653, 4189, 4791, 4910, 5552, 4347, 4958, 5080, 5729, 5224, 5880, 6008, 6692, 4537, 5162, 5284, 5945, 5428, 6095, 6222, 6915, 5603, 6276, 6405, 7102, 6561, 7260, 7392, 8103, 4771, 5407, 5531, 6200, 5679, 6353, 6484, 7180, 5858, 6537, 6670, 7369, 6826, 7528, 7663, 8373, 6072, 6760, 6891, 7596, 7047, 7755, 7888, 8600, 7234, 7944, 8078, 8790, 8238, 8949, 9082, 9782, 2354, 2806, 2895, 3401, 3003, 3519, 3621, 4187, 3138, 3665, 3768, 4345, 3893, 4479, 4593, 5222, 3301, 3839, 3947, 4535, 4075, 4670, 4789, 5426, 4232, 4837, 4956, 5601, 5099, 5750, 5878, 6559, 3500, 4057, 4166, 4769, 4297, 4908, 5028, 5677, 4457, 5078, 5199, 5856, 5342, 6006, 6134, 6824, 4651, 5282, 5405, 6070, 5550, 6220, 6351, 7045, 5727, 6403, 6535, 7232, 6690, 7390, 7526, 8236, 3744, 4319, 4433, 5052, 4567, 5195, 5315, 5978, 4732, 5367, 5491, 6160, 5639, 6313, 6442, 7139, 4930, 5573, 5701, 6376, 5852, 6531, 6663, 7363, 6030, 6716, 6849, 7553, 7007, 7713, 7847, 8559, 5172, 5828, 5955, 6639, 6105, 6795, 6925, 7631, 6287, 6981, 7113, 7821, 7272, 7982, 8115, 8826, 6507, 7204, 7339, 8048, 7498, 8208, 8343, 9052, 7686, 8397, 8532, 9240, 8693, 9399, 9530, 10220, 4049, 4643, 4760, 5396, 4900, 5542, 5668, 6342, 5069, 5718, 5845, 6524, 5997, 6681, 6814, 7516, 5273, 5933, 6060, 6748, 6211, 6903, 7035, 7743, 6393, 7089, 7221, 7931, 7380, 8090, 8225, 8936, 5519, 6189, 6318, 7012, 6472, 7169, 7304, 8013, 6656, 7356, 7492, 8202, 7650, 8361, 8498, 9206, 6879, 7584, 7718, 8429, 7876, 8588, 8723, 9429, 8065, 8777, 8912, 9614, 9069, 9769, 9902, 10581, 5819, 6497, 6630, 7329, 6786, 7488, 7622, 8333, 6971, 7676, 7811, 8522, 7971, 8682, 8815, 9519, 7193, 7902, 8037, 8749, 8198, 8908, 9042, 9742, 8386, 9096, 9229, 9927, 9388, 10082, 10209, 10879, 7463, 8173, 8309, 9018, 8468, 9177, 9310, 10005, 8656, 9363, 9496, 10187, 9651, 10338, 10466, 11125, 8882, 9585, 9717, 10402, 9874, 10553, 10680, 11329, 10056, 10731, 10856, 11499, 11002, 11638, 11755, 12349, 2690, 3174, 3272, 3809, 3390, 3936, 4046, 4640, 3531, 4088, 4200, 4803, 4333, 4944, 5066, 5715, 3703, 4275, 4388, 5004, 4523, 5147, 5270, 5930, 4685, 5319, 5441, 6109, 5588, 6260, 6390, 7086, 3915, 4502, 4617, 5247, 4757, 5393, 5516, 6186, 4921, 5564, 5691, 6366, 5842, 6521, 6653, 7353, 5124, 5778, 5905, 6588, 6057, 6745, 6876, 7581, 6235, 6929, 7061, 7770, 7218, 7928, 8062, 8774, 4177, 4779, 4898, 5540, 5040, 5688, 5816, 6494, 5211, 5867, 5995, 6679, 6147, 6836, 6968, 7673, 5415, 6081, 6209, 6901, 6362, 7057, 7190, 7899, 6547, 7245, 7378, 8088, 7539, 8250, 8383, 9093, 5666, 6340, 6470, 7167, 6627, 7326, 7460, 8170, 6812, 7514, 7648, 8359, 7808, 8519, 8653, 9360, 7033, 7741, 7874, 8586, 8034, 8746, 8879, 9582, 8223, 8934, 9067, 9767, 9226, 9924, 10053, 10728, 4494, 5116, 5238, 5896, 5384, 6048, 6177, 6867, 5555, 6226, 6356, 7051, 6512, 7209, 7344, 8053, 5769, 6447, 6578, 7277, 6735, 7436, 7571, 8282, 6919, 7625, 7759, 8471, 7918, 8630, 8764, 9470, 6022, 6708, 6841, 7545, 6998, 7704, 7838, 8550, 7183, 7892, 8028, 8740, 8188, 8898, 9033, 9733, 7409, 8120, 8256, 8967, 8415, 9125, 9258, 9955, 8604, 9313, 9446, 10140, 9600, 10290, 10417, 11080, 6331, 7024, 7158, 7865, 7317, 8025, 8161, 8870, 7505, 8214, 8350, 9058, 8510, 9217, 9351, 10044, 7731, 8442, 8576, 9284, 8736, 9442, 9572, 10262, 8924, 9626, 9757, 10441, 9914, 10593, 10718, 11367, 8001, 8711, 8845, 9548, 9006, 9705, 9837, 10517, 9194, 9890, 10022, 10696, 10175, 10844, 10969, 11605, 9416, 10110, 10237, 10906, 10389, 11053, 11173, 11802, 10568, 11224, 11344, 11963, 11486, 12097, 12207, 12773, 4886, 5529, 5654, 6329, 5803, 6482, 6615, 7315, 5983, 6668, 6800, 7503, 6955, 7661, 7796, 8508, 6198, 6889, 7022, 7729, 7178, 7886, 8023, 8734, 7367, 8076, 8212, 8922, 8371, 9080, 9215, 9912, 6458, 7156, 7289, 7999, 7448, 8159, 8294, 9004, 7636, 8348, 8483, 9192, 8641, 9349, 9481, 10173, 7863, 8574, 8709, 9414, 8868, 9570, 9703, 10387, 9056, 9755, 9888, 10566, 10042, 10716, 10842, 11484, 6771, 7473, 7608, 8320, 7766, 8478, 8612, 9321, 7956, 8667, 8801, 9506, 8962, 9663, 9794, 10477, 8183, 8893, 9029, 9729, 9187, 9884, 10016, 10691, 9373, 10067, 10196, 10866, 10349, 11013, 11135, 11765, 8454, 9164, 9296, 9992, 9453, 10147, 10273, 10941, 9637, 10325, 10452, 11112, 10604, 11258, 11378, 11994, 9861, 10540, 10667, 11316, 10818, 11461, 11579, 12182, 10989, 11625, 11742, 12336, 11880, 12467, 12573, 13110, 7145, 7853, 7988, 8699, 8148, 8858, 8994, 9694, 8337, 9046, 9181, 9878, 9339, 10033, 10164, 10834, 8564, 9272, 9404, 10098, 9560, 10250, 10378, 11042, 9746, 10430, 10557, 11213, 10707, 11356, 11476, 12087, 8832, 9536, 9669, 10355, 9825, 10506, 10634, 11285, 10009, 10684, 10812, 11455, 10958, 11595, 11714, 12309, 10225, 10894, 11018, 11653, 11162, 11791, 11905, 12491, 11333, 11952, 12066, 12641, 12197, 12763, 12865, 13381, 9153, 9850, 9982, 10658, 10137, 10808, 10932, 11571, 10315, 10980, 11103, 11734, 11248, 11871, 11985, 12565, 10529, 11186, 11307, 11928, 11451, 12062, 12174, 12741, 11616, 12219, 12328, 12885, 12458, 13004, 13102, 13597, 10784, 11429, 11548, 12153, 11689, 12287, 12396, 12946, 11850, 12438, 12546, 13084, 12671, 13201, 13297, 13772, 12040, 12617, 12720, 13247, 12844, 13361, 13453, 13915, 12984, 13490, 13579, 14031, 13685, 14126, 14202, 14587, 1303, 1618, 1681, 2051, 1760, 2140, 2215, 2651, 1856, 2249, 2326, 2776, 2424, 2883, 2973, 3487, 1978, 2383, 2466, 2928, 2567, 3039, 3133, 3660, 2689, 3172, 3270, 3806, 3388, 3934, 4043, 4637, 2125, 2550, 2635, 3115, 2738, 3228, 3325, 3868, 2864, 3368, 3467, 4022, 3588, 4152, 4262, 4872, 3020, 3537, 3640, 4207, 3763, 4340, 4453, 5074, 3913, 4499, 4615, 5244, 4754, 5390, 5514, 6184, 2309, 2755, 2843, 3343, 2954, 3464, 3565, 4125, 3085, 3608, 3710, 4283, 3836, 4418, 4531, 5156, 3248, 3784, 3888, 4474, 4018, 4611, 4726, 5361, 4174, 4776, 4894, 5536, 5037, 5685, 5812, 6490, 3444, 3995, 4104, 4703, 4238, 4844, 4963, 5609, 4396, 5013, 5133, 5788, 5278, 5939, 6066, 6755, 4588, 5217, 5338, 6002, 5485, 6154, 6282, 6976, 5662, 6336, 6467, 7164, 6623, 7322, 7457, 8167, 2543, 3014, 3107, 3633, 3220, 3755, 3859, 4444, 3359, 3905, 4012, 4606, 4142, 4744, 4861, 5503, 3530, 4086, 4199, 4801, 4331, 4942, 5064, 5713, 4491, 5112, 5235, 5892, 5380, 6044, 6173, 6863, 3734, 4310, 4422, 5042, 4556, 5184, 5304, 5968, 4720, 5356, 5479, 6149, 5626, 6300, 6429, 7127, 4920, 5562, 5690, 6364, 5840, 6519, 6652, 7352, 6019, 6704, 6838, 7541, 6994, 7700, 7835, 8547, 3986, 4579, 4693, 5328, 4834, 5475, 5598, 6271, 5002, 5651, 5776, 6455, 5929, 6613, 6744, 7446, 5208, 5864, 5992, 6676, 6144, 6833, 6965, 7670, 6326, 7019, 7153, 7860, 7313, 8021, 8157, 8866, 5450, 6119, 6245, 6940, 6400, 7097, 7229, 7940, 6586, 7286, 7418, 8130, 7580, 8292, 8425, 9136, 6809, 7511, 7646, 8357, 7805, 8516, 8651, 9358, 7996, 8706, 8841, 9544, 9002, 9701, 9834, 10514, 2836, 3335, 3435, 3985, 3556, 4115, 4227, 4832, 3701, 4273, 4385, 5001, 4521, 5145, 5267, 5927, 3878, 4464, 4577, 5206, 4714, 5349, 5472, 6141, 4882, 5525, 5649, 6324, 5799, 6478, 6610, 7310, 4094, 4692, 4810, 5449, 4951, 5596, 5723, 6399, 5121, 5775, 5902, 6585, 6054, 6742, 6874, 7579, 5326, 5990, 6117, 6807, 6268, 6962, 7095, 7803, 6453, 7151, 7284, 7994, 7443, 8154, 8290, 9000, 4361, 4974, 5094, 5745, 5240, 5898, 6024, 6710, 5412, 6078, 6205, 6897, 6359, 7054, 7186, 7895, 5620, 6293, 6422, 7119, 6580, 7279, 7411, 8122, 6766, 7468, 7602, 8314, 7762, 8474, 8607, 9316, 5873, 6554, 6686, 7386, 6843, 7547, 7681, 8392, 7029, 7737, 7871, 8583, 8030, 8742, 8876, 9579, 7252, 7962, 8096, 8807, 8258, 8969, 9102, 9801, 8448, 9158, 9291, 9987, 9448, 10142, 10269, 10937, 4683, 5317, 5439, 6107, 5586, 6258, 6388, 7084, 5765, 6444, 6574, 7274, 6731, 7433, 7567, 8279, 5980, 6665, 6797, 7500, 6952, 7658, 7793, 8505, 7141, 7849, 7984, 8695, 8144, 8854, 8990, 9690, 6233, 6927, 7059, 7768, 7216, 7926, 8061, 8773, 7405, 8117, 8252, 8964, 8411, 9122, 9255, 9953, 7633, 8345, 8480, 9189, 8638, 9346, 9479, 10171, 8828, 9532, 9665, 10351, 9821, 10502, 10631, 11282, 6544, 7242, 7375, 8085, 7536, 8247, 8380, 9090, 7726, 8438, 8571, 9280, 8732, 9439, 9568, 10259, 7952, 8663, 8797, 9502, 8958, 9659, 9790, 10473, 9148, 9845, 9977, 10653, 10133, 10804, 10928, 11567, 8220, 8931, 9065, 9765, 9223, 9921, 10051, 10726, 9411, 10106, 10233, 10903, 10385, 11050, 11170, 11800, 9633, 10321, 10449, 11109, 10600, 11254, 11375, 11991, 10779, 11424, 11544, 12149, 11685, 12283, 12393, 12943, 3209, 3743, 3848, 4432, 3974, 4566, 4680, 5314, 4129, 4731, 4848, 5490, 4989, 5638, 5762, 6441, 4318, 4929, 5051, 5700, 5194, 5851, 5977, 6662, 5366, 6029, 6159, 6848, 6312, 7006, 7138, 7846, 4544, 5171, 5291, 5954, 5436, 6104, 6230, 6924, 5612, 6286, 6414, 7112, 6571, 7271, 7402, 8114, 5827, 6506, 6638, 7338, 6794, 7497, 7630, 8342, 6980, 7685, 7820, 8531, 7981, 8692, 8825, 9529, 4821, 5461, 5584, 5734, 6411, 6542, 7240, 5915, 6599, 6729, 7431, 6885, 7591, 7724, 8436, 6130, 6820, 6950, 7656, 7108, 7816, 7950, 8661, 7299, 8008, 8142, 8852, 8303, 9012, 9146, 9843, 6386, 7082, 7214, 7924, 7373, 8083, 8218, 8929, 7565, 8277, 8409, 9120, 8569, 9278, 9409, 10104, 7791, 8503, 8636, 9344, 8795, 9500, 9631, 10319, 8988, 9688, 9819, 10500, 9975, 10651, 10777, 11422, 5161, 5818, 5944, 6629, 6094, 6785, 6914, 7621, 6275, 6970, 7101, 7810, 7259, 7970, 8102, 8814, 6496, 7192, 7328, 8036, 7487, 8197, 8332, 9041, 7675, 8385, 8521, 9228, 8681, 9387, 9518, 10208, 6759, 7462, 7595, 8308, 7754, 8467, 8599, 9309, 7943, 8655, 8789, 9495, 8948, 9650, 9781, 10465, 8172, 8881, 9017, 9716, 9176, 9873, 10004, 10679, 9362, 10055, 10186, 10855, 10337, 11001, 11124, 11754, 7072, 7782, 7914, 8627, 8073, 8786, 8919, 9622, 8265, 8977, 9108, 9808, 9268, 9966, 10094, 10768, 8494, 9202, 9335, 10029, 9491, 10182, 10310, 10975, 9678, 10363, 10490, 11147, 10643, 11293, 11414, 12026, 8760, 9467, 9596, 10287, 9752, 10437, 10563, 11220, 9938, 10617, 10742, 11391, 10890, 11532, 11649, 12251, 10160, 10830, 10954, 11591, 11098, 11729, 11845, 12433, 11270, 11891, 12006, 12584, 12139, 12707, 12812, 13330, 5572, 6244, 6375, 7071, 6530, 7228, 7362, 8072, 6715, 7417, 7552, 8264, 7712, 8424, 8558, 9267, 6938, 7644, 7780, 8492, 7938, 8649, 8784, 9489, 8128, 8839, 8975, 9676, 9134, 9832, 9964, 10641, 7203, 7913, 8047, 8759, 8207, 8918, 9051, 9751, 8396, 9107, 9239, 9937, 9398, 10093, 10219, 10889, 8625, 9333, 9465, 10158, 9620, 10308, 10435, 11096, 9806, 10488, 10615, 11268, 10766, 11412, 11530, 12137, 7522, 8232, 8367, 9076, 8527, 9235, 9368, 10062, 8718, 9424, 9555, 10245, 9711, 10396, 10523, 11180, 8943, 9644, 9776, 10459, 9933, 10611, 10737, 11385, 10118, 10790, 10914, 11554, 11060, 11694, 11809, 12401, 9211, 9908, 10038, 10712, 10191, 10861, 10984, 11620, 10373, 11037, 11157, 11786, 11301, 11922, 12034, 12611, 10587, 11241, 11361, 11978, 11504, 12113, 12223, 12787, 11672, 12271, 12379, 12931, 12508, 13051, 13147, 13638, 7901, 8614, 8748, 9455, 8907, 9610, 9741, 10426, 9095, 9796, 9926, 10606, 10081, 10756, 10878, 11521, 9323, 10018, 10149, 10820, 10300, 10966, 11089, 11721, 10479, 11137, 11260, 11882, 11404, 12017, 12130, 12699, 9584, 10275, 10401, 11065, 10552, 11209, 11328, 11948, 10730, 11380, 11498, 12109, 11637, 12240, 12348, 12904, 10943, 11581, 11699, 12296, 11836, 12425, 12532, 13072, 11996, 12575, 12681, 13210, 12803, 13322, 13417, 13881, 9898, 10577, 10703, 11352, 10851, 11494, 11611, 12214, 11026, 11662, 11776, 12370, 11913, 12500, 12603, 13140, 11233, 11857, 11971, 12552, 12105, 12677, 12780, 13302, 12263, 12822, 12924, 13433, 13045, 13544, 13633, 14078, 11472, 12083, 12193, 12759, 12323, 12880, 12979, 13485, 12477, 13023, 13120, 13614, 13234, 13718, 13802, 14231, 12658, 13189, 13284, 13761, 13396, 13863, 13946, 14357, 13526, 13981, 14063, 14461, 14157, 14546, 14614, 14947, 3688, 4258, 4370, 4984, 4506, 5128, 5251, 5909, 4667, 5300, 5422, 6089, 5569, 6240, 6371, 7066, 4867, 5509, 5632, 6306, 5782, 6461, 6592, 7292, 5963, 6647, 6779, 7481, 6934, 7640, 7775, 8487, 5105, 5757, 5885, 6567, 6037, 6723, 6856, 7560, 6216, 6909, 7041, 7750, 7199, 7908, 8043, 8755, 6435, 7132, 7266, 7976, 7424, 8135, 8271, 8982, 7615, 8326, 8462, 9171, 8620, 9328, 9461, 10154, 5397, 6061, 6190, 6880, 6343, 7036, 7170, 7877, 6527, 7224, 7359, 8068, 7519, 8228, 8364, 9072, 6749, 7451, 7585, 8297, 7744, 8456, 8589, 9298, 7934, 8645, 8780, 9485, 8939, 9640, 9772, 10455, 7013, 7719, 7854, 8565, 8014, 8724, 8859, 9561, 8204, 8914, 9048, 9748, 9208, 9904, 10035, 10709, 8430, 9140, 9273, 9970, 9430, 10124, 10251, 10920, 9616, 10304, 10432, 11093, 10583, 11237, 11358, 11975, 5747, 6425, 6556, 7255, 6712, 7413, 7549, 8260, 6899, 7605, 7739, 8451, 7897, 8609, 8744, 9450, 7122, 7830, 7965, 8676, 8124, 8835, 8971, 9672, 8317, 9026, 9161, 9858, 9318, 10013, 10144, 10815, 7387, 8098, 8233, 8945, 8393, 9103, 9236, 9934, 8584, 9293, 9425, 10120, 9580, 10270, 10397, 11061, 8809, 9513, 9646, 10333, 9802, 10484, 10612, 11265, 9989, 10664, 10792, 11436, 10938, 11576, 11695, 12292, 7709, 8420, 8555, 9263, 8715, 9420, 9552, 10241, 8904, 9606, 9738, 10422, 9895, 10573, 10700, 11348, 9130, 9828, 9960, 10637, 10114, 10786, 10910, 11550, 10296, 10962, 11085, 11717, 11229, 11853, 11967, 12548, 9395, 10089, 10216, 10886, 10370, 11033, 11154, 11783, 10549, 11205, 11325, 11945, 11469, 12079, 12190, 12756, 10762, 11408, 11527, 12134, 11668, 12267, 12376, 12928, 11832, 12421, 12529, 13069, 12654, 13185, 13281, 13758, 6179, 6869, 7000, 7706, 7159, 7866, 8002, 8712, 7347, 8056, 8191, 8901, 8352, 9060, 9196, 9892, 7573, 8284, 8417, 9127, 8577, 9285, 9417, 10111, 8767, 9473, 9603, 10293, 9759, 10443, 10570, 11226, 7840, 8552, 8687, 9393, 8846, 9549, 9683, 10368, 9035, 9735, 9868, 10547, 10023, 10697, 10825, 11467, 9260, 9957, 10087, 10760, 10238, 10907, 11031, 11666, 10419, 11082, 11203, 11830, 11345, 11964, 12077, 12652, 8162, 8871, 9007, 9706, 9166, 9863, 9994, 10669, 9353, 10046, 10177, 10846, 10328, 10992, 11115, 11745, 9573, 10263, 10390, 11054, 10542, 11198, 11318, 11938, 10720, 11369, 11488, 12099, 11628, 12230, 12339, 12895, 9838, 10518, 10647, 11297, 10796, 11440, 11560, 12164, 10970, 11606, 11725, 12319, 11861, 12448, 12556, 13093, 11174, 11803, 11917, 12503, 12051, 12627, 12731, 13257, 12208, 12774, 12875, 13391, 12994, 13499, 13588, 14039, 8542, 9250, 9382, 10076, 9539, 10228, 10358, 11021, 9726, 10411, 10537, 11194, 10688, 11337, 11458, 12069, 9947, 10625, 10750, 11398, 10897, 11538, 11656, 12257, 11074, 11707, 11822, 12413, 11956, 12538, 12644, 13177, 10203, 10873, 10997, 11633, 11142, 11771, 11887, 12473, 11313, 11934, 12047, 12624, 12179, 12746, 12849, 13366, 11515, 12124, 12235, 12798, 12364, 12918, 13018, 13521, 12519, 13061, 13159, 13648, 13271, 13750, 13836, 14260, 10509, 11165, 11288, 11908, 11431, 12042, 12155, 12722, 11599, 12201, 12312, 12868, 12441, 12987, 13086, 13581, 11794, 12387, 12494, 13039, 12619, 13154, 13249, 13731, 12767, 13290, 13384, 13853, 13493, 13952, 14033, 14436, 12021, 12598, 12703, 13230, 12826, 13343, 13437, 13899, 12968, 13474, 13565, 14017, 13670, 14111, 14189, 14574, 13134, 13627, 13713, 14152, 13815, 14242, 14316, 14688, 13935, 14348, 14421, 14779, 14506, 14853, 14913, 15207, 6697, 7398, 7533, 8244, 7693, 8404, 8539, 9247, 7882, 8595, 8729, 9436, 8888, 9591, 9723, 10408, 8109, 8820, 8955, 9656, 9114, 9813, 9944, 10622, 9304, 9999, 10130, 10801, 10281, 10948, 11071, 11704, 8377, 9087, 9221, 9919, 9379, 10073, 10201, 10871, 9565, 10256, 10383, 11048, 10534, 11191, 11311, 11932, 9787, 10470, 10598, 11252, 10747, 11395, 11513, 12122, 10925, 11564, 11683, 12281, 11819, 12410, 12517, 13059, 8700, 9405, 9537, 10226, 9695, 10379, 10507, 11163, 9880, 10559, 10686, 11335, 10836, 11478, 11597, 12199, 10099, 10772, 10895, 11536, 11043, 11678, 11792, 12385, 11215, 11840, 11954, 12536, 12089, 12662, 12765, 13288, 10356, 11019, 11141, 11770, 11286, 11906, 12020, 12597, 11456, 12067, 12178, 12745, 12310, 12866, 12967, 13473, 11654, 12255, 12363, 12917, 12492, 13037, 13133, 13626, 12642, 13175, 13270, 13749, 13382, 13851, 13934, 14347, 9077, 9778, 9909, 10589, 10063, 10738, 10862, 11505, 10246, 10916, 11038, 11674, 11181, 11810, 11923, 12509, 10461, 11120, 11243, 11866, 11386, 12001, 12114, 12685, 11556, 12160, 12273, 12831, 12402, 12951, 13052, 13550, 10713, 11363, 11482, 12094, 11621, 12224, 12333, 12890, 11787, 12381, 12488, 13034, 12612, 13148, 13243, 13726, 11980, 12560, 12667, 13197, 12788, 13309, 13404, 13870, 12933, 13441, 13535, 13989, 13639, 14083, 14163, 14551, 11009, 11645, 11761, 12355, 11898, 12484, 12590, 13126, 12058, 12634, 12737, 13263, 12859, 13375, 13467, 13928, 12246, 12807, 12909, 13420, 13029, 13530, 13619, 14066, 13168, 13655, 13743, 14176, 13845, 14267, 14342, 14709, 12463, 13009, 13107, 13602, 13222, 13705, 13791, 14220, 13357, 13828, 13912, 14328, 14010, 14414, 14486, 14835, 13512, 13969, 14051, 14451, 14144, 14535, 14603, 14938, 14253, 14631, 14698, 15021, 14773, 15086, 15140, 15401, 9524, 10214, 10343, 11007, 10495, 11152, 11275, 11896, 10674, 11323, 11445, 12056, 11586, 12188, 12301, 12857, 10884, 11525, 11643, 12244, 11781, 12374, 12482, 13027, 11943, 12527, 12632, 13166, 12754, 13279, 13373, 13843, 11129, 11759, 11875, 12462, 12010, 12588, 12693, 13221, 12168, 12735, 12839, 13356, 12959, 13465, 13557, 14009, 12353, 12907, 13008, 13511, 13124, 13617, 13704, 14143, 13261, 13741, 13827, 14252, 13926, 14340, 14413, 14772, 11418, 12030, 12143, 12711, 12277, 12835, 12937, 13445, 12429, 12975, 13076, 13571, 13193, 13677, 13765, 14195, 12607, 13143, 13238, 13721, 13352, 13823, 13907, 14323, 13481, 13942, 14023, 14427, 14118, 14512, 14580, 14918, 12816, 13334, 13428, 13891, 13538, 13992, 14073, 14470, 13662, 14103, 14182, 14567, 14273, 14648, 14714, 15034, 13806, 14234, 14308, 14681, 14397, 14758, 14820, 15127, 14498, 14846, 14906, 15201, 14977, 15262, 15310, 15545, 11750, 12344, 12453, 12999, 12580, 13116, 13214, 13697, 12727, 13254, 13348, 13820, 13458, 13920, 14003, 14408, 12900, 13413, 13504, 13962, 13610, 14059, 14137, 14529, 13736, 14171, 14247, 14626, 14335, 14704, 14768, 15082, 13097, 13592, 13681, 14122, 13783, 14212, 14289, 14663, 13903, 14320, 14394, 14756, 14479, 14829, 14891, 15188, 14043, 14444, 14516, 14861, 14596, 14932, 14991, 15274, 14692, 15016, 15073, 15344, 15135, 15397, 15442, 15656, 13326, 13798, 13884, 14301, 13985, 14390, 14464, 14814, 14097, 14492, 14562, 14901, 14643, 14972, 15030, 15306, 14227, 14610, 14675, 15002, 14752, 15069, 15122, 15386, 14841, 15145, 15197, 15449, 15258, 15501, 15542, 15738, 14376, 14738, 14803, 15111, 14877, 15174, 15227, 15473, 14961, 15247, 15298, 15534, 15354, 15581, 15620, 15802, 15057, 15331, 15377, 15602, 15430, 15646, 15681, 15853, 15492, 15697, 15732, 15895, 15771, 15926, 15951, 16070, 313, 432, 457, 612, 488, 651, 686, 891, 530, 702, 737, 953, 781, 1006, 1052, 1326, 581, 763, 802, 1029, 849, 1085, 1136, 1422, 910, 1156, 1209, 1506, 1272, 1580, 1645, 2007, 645, 841, 882, 1125, 934, 1186, 1238, 1542, 997, 1261, 1314, 1631, 1381, 1708, 1773, 2156, 1077, 1353, 1411, 1740, 1482, 1821, 1891, 2286, 1569, 1919, 1993, 2398, 2082, 2499, 2585, 3057, 727, 941, 986, 1248, 1039, 1310, 1367, 1691, 1109, 1392, 1451, 1787, 1522, 1867, 1939, 2340, 1195, 1492, 1554, 1904, 1627, 1989, 2063, 2480, 1720, 2094, 2171, 2600, 2261, 2702, 2791, 3286, 1301, 1615, 1679, 2048, 1757, 2136, 2212, 2647, 1854, 2246, 2324, 2773, 2421, 2879, 2970, 3483, 1975, 2380, 2463, 2925, 2563, 3035, 3129, 3656, 2686, 3169, 3267, 3803, 3384, 3930, 4039, 4633, 838, 1073, 1121, 1406, 1182, 1477, 1537, 1885, 1256, 1563, 1625, 1986, 1702, 2075, 2149, 2577, 1349, 1669, 1735, 2110, 1816, 2201, 2280, 2721, 1913, 2310, 2391, 2845, 2492, 2955, 3049, 3567, 1465, 1803, 1871, 2265, 1956, 2360, 2441, 2902, 2060, 2476, 2560, 3031, 2662, 3145, 3240, 3776, 2188, 2618, 2706, 3190, 2812, 3307, 3408, 3954, 2938, 3446, 3548, 4106, 3672, 4240, 4353, 4965, 1611, 1970, 2043, 2457, 2131, 2556, 2642, 3122, 2240, 2679, 2766, 3259, 2872, 3375, 3476, 4030, 2374, 2826, 2918, 3424, 3027, 3544, 3648, 4215, 3162, 3690, 3795, 4373, 3921, 4508, 4624, 5254, 2540, 3010, 3104, 3629, 3217, 3751, 3856, 4440, 3356, 3901, 4009, 4602, 4139, 4740, 4858, 5499, 3526, 4082, 4195, 4797, 4327, 4938, 5060, 5709, 4487, 5108, 5231, 5888, 5376, 6040, 6169, 6859, 982, 1243, 1297, 1610, 1362, 1685, 1752, 2130, 1445, 1780, 1848, 2239, 1932, 2332, 2414, 2871, 1548, 1897, 1969, 2373, 2055, 2471, 2555, 3026, 2163, 2592, 2678, 3161, 2781, 3276, 3374, 3920, 1674, 2041, 2116, 2538, 2207, 2640, 2728, 3215, 2317, 2764, 2853, 3354, 2963, 3474, 3576, 4137, 2455, 2916, 3008, 3524, 3120, 3646, 3749, 4325, 3257, 3793, 3899, 4485, 4028, 4622, 4738, 5374, 1832, 2220, 2300, 2744, 2394, 2848, 2942, 3450, 2513, 2979, 3074, 3595, 3186, 3716, 3823, 4403, 2657, 3140, 3235, 3771, 3349, 3895, 4002, 4596, 3493, 4050, 4159, 4762, 4289, 4901, 5020, 5670, 2833, 3331, 3432, 3981, 3552, 4110, 4223, 4827, 3698, 4269, 4382, 4997, 4517, 5140, 5263, 5922, 3874, 4460, 4573, 5202, 4709, 5345, 5467, 6137, 4878, 5521, 5645, 6320, 5794, 6474, 6605, 7306, 2036, 2449, 2532, 3001, 2634, 3113, 3208, 3741, 2757, 3250, 3346, 3891, 3466, 4020, 4128, 4729, 2910, 3416, 3517, 4073, 3638, 4205, 4316, 4927, 3786, 4363, 4477, 5097, 4613, 5242, 5364, 6027, 3095, 3618, 3721, 4294, 3847, 4429, 4543, 5168, 3998, 4591, 4705, 5340, 4847, 5488, 5611, 6284, 4184, 4786, 4905, 5547, 5048, 5697, 5824, 6503, 5220, 5876, 6004, 6688, 6157, 6846, 6978, 7683, 3324, 3866, 3973, 4564, 4102, 4700, 4819, 5458, 4261, 4870, 4988, 5636, 5131, 5785, 5913, 6596, 4451, 5072, 5192, 5849, 5335, 6000, 6127, 6818, 5512, 6182, 6310, 7004, 6464, 7162, 7296, 8006, 4679, 5312, 5435, 6102, 5582, 6253, 6384, 7079, 5761, 6439, 6570, 7269, 6727, 7428, 7563, 8274, 5975, 6660, 6792, 7495, 6947, 7654, 7788, 8501, 7136, 7844, 7979, 8690, 8139, 8850, 8985, 9686, 1176, 1470, 1530, 1877, 1604, 1962, 2035, 2448, 1695, 2067, 2141, 2568, 2231, 2670, 2756, 3249, 1809, 2194, 2272, 2713, 2366, 2818, 2909, 3415, 2484, 2946, 3040, 3557, 3153, 3680, 3785, 4362, 1947, 2350, 2431, 2890, 2530, 2999, 3093, 3616, 2652, 3134, 3229, 3764, 3344, 3889, 3996, 4589, 2802, 3297, 3396, 3942, 3515, 4071, 4182, 4784, 3661, 4228, 4341, 4952, 4475, 5095, 5218, 5874, 2123, 2547, 2633, 3112, 2735, 3224, 3322, 3864, 2862, 3365, 3465, 4019, 3585, 4148, 4259, 4868, 3017, 3534, 3637, 4204, 3759, 4336, 4449, 5070, 3910, 4496, 4612, 5241, 4750, 5386, 5510, 6180, 3206, 3739, 3845, 4427, 3970, 4561, 4676, 5309, 4126, 4727, 4845, 5486, 4985, 5633, 5758, 6436, 4314, 4925, 5046, 5695, 5189, 5846, 5972, 6657, 5362, 6025, 6155, 6844, 6307, 7001, 7133, 7841, 2344, 2795, 2884, 3389, 2992, 3508, 3609, 4175, 3126, 3652, 3756, 4332, 3880, 4466, 4580, 5209, 3290, 3827, 3935, 4522, 4064, 4658, 4777, 5413, 4219, 4823, 4943, 5587, 5086, 5736, 5865, 6545, 3488, 4044, 4153, 4755, 4284, 4895, 5014, 5663, 4445, 5065, 5185, 5841, 5329, 5993, 6120, 6810, 4638, 5268, 5391, 6055, 5537, 6206, 6337, 7030, 5714, 6389, 6520, 7217, 6677, 7376, 7512, 8221, 3731, 4306, 4419, 5038, 4553, 5180, 5301, 5964, 4717, 5352, 5476, 6145, 5623, 6296, 6426, 7123, 4916, 5558, 5686, 6360, 5836, 6515, 6648, 7348, 6015, 6700, 6834, 7537, 6990, 7696, 7831, 8543, 5157, 5813, 5940, 6624, 6090, 6780, 6910, 7616, 6272, 6966, 7098, 7806, 7256, 7966, 8099, 8810, 6491, 7187, 7323, 8031, 7482, 8192, 8327, 9036, 7671, 8381, 8517, 9224, 8677, 9383, 9514, 10204, 2625, 3102, 3198, 3729, 3314, 3854, 3962, 4551, 3455, 4007, 4116, 4715, 4249, 4856, 4975, 5621, 3627, 4193, 4304, 4914, 4438, 5058, 5178, 5834, 4600, 5229, 5350, 6013, 5497, 6167, 6294, 6988, 3835, 4416, 4530, 5154, 4666, 5298, 5421, 6087, 4833, 5473, 5597, 6269, 5746, 6423, 6555, 7253, 5035, 5683, 5810, 6488, 5961, 6645, 6777, 7479, 6142, 6831, 6963, 7668, 7120, 7828, 7963, 8674, 4091, 4688, 4807, 5445, 4947, 5591, 5719, 6394, 5118, 5771, 5899, 6581, 6050, 6737, 6870, 7574, 5322, 5986, 6113, 6803, 6263, 6958, 7090, 7799, 6449, 7147, 7280, 7990, 7438, 8150, 8285, 8996, 5568, 6239, 6370, 7065, 6525, 7222, 7357, 8066, 6711, 7412, 7548, 8259, 7707, 8418, 8553, 9261, 6933, 7639, 7774, 8486, 7932, 8644, 8778, 9484, 8123, 8834, 8970, 9671, 9128, 9827, 9958, 10636, 4408, 5025, 5146, 5800, 5290, 5951, 6079, 6767, 5463, 6132, 6259, 6953, 6413, 7110, 7243, 7953, 5674, 6348, 6479, 7175, 6635, 7335, 7469, 8179, 6822, 7524, 7659, 8369, 7818, 8529, 8664, 9370, 5928, 6611, 6743, 7444, 6898, 7603, 7738, 8449, 7085, 7794, 7927, 8639, 8086, 8798, 8932, 9634, 7311, 8019, 8155, 8864, 8315, 9024, 9159, 9856, 8506, 9213, 9347, 10040, 9503, 10193, 10322, 10986, 6229, 6922, 7055, 7763, 7212, 7921, 8057, 8768, 7401, 8112, 8248, 8959, 8407, 9117, 9251, 9948, 7628, 8340, 8475, 9184, 8633, 9342, 9474, 10167, 8823, 9527, 9660, 10346, 9816, 10498, 10626, 11278, 7896, 8608, 8743, 9449, 8902, 9604, 9736, 10420, 9091, 9791, 9922, 10601, 10077, 10751, 10874, 11516, 9317, 10012, 10143, 10814, 10294, 10961, 11083, 11716, 10474, 11132, 11255, 11877, 11399, 12013, 12125, 12695, 1436, 1769, 1837, 2226, 1922, 2320, 2402, 2857, 2026, 2437, 2520, 2987, 2622, 3099, 3194, 3725, 2152, 2581, 2665, 3149, 2769, 3263, 3360, 3906, 2898, 3404, 3503, 4060, 3624, 4190, 4300, 4911, 2305, 2750, 2839, 3338, 2950, 3459, 3561, 4120, 3081, 3603, 3706, 4278, 3831, 4412, 4526, 5150, 3243, 3780, 3883, 4470, 4013, 4607, 4721, 5357, 4169, 4772, 4889, 5532, 5031, 5680, 5806, 6485, 2502, 2966, 3061, 3580, 3173, 3702, 3808, 4387, 3311, 3851, 3958, 4547, 4087, 4684, 4802, 5440, 3479, 4035, 4143, 4746, 4274, 4885, 5003, 5653, 4435, 5055, 5174, 5831, 5318, 5982, 6108, 6799, 3684, 4253, 4366, 4979, 4501, 5123, 5246, 5904, 4662, 5294, 5417, 6083, 5563, 6234, 6365, 7060, 4862, 5505, 5627, 6302, 5777, 6457, 6587, 7288, 5957, 6642, 6773, 7476, 6928, 7635, 7769, 8482, 2745, 3236, 3332, 3875, 3452, 4004, 4112, 4711, 3596, 4160, 4270, 4879, 4405, 5022, 5142, 5796, 3772, 4349, 4461, 5082, 4597, 5226, 5346, 6010, 4763, 5399, 5522, 6192, 5671, 6345, 6475, 7172, 3982, 4574, 4689, 5323, 4829, 5469, 5593, 6265, 4998, 5646, 5772, 6450, 5924, 6607, 6739, 7440, 5203, 5860, 5987, 6672, 6138, 6828, 6959, 7665, 6321, 7015, 7148, 7856, 7307, 8016, 8151, 8861, 4246, 4853, 4971, 5617, 5115, 5768, 5895, 6577, 5287, 5948, 6075, 6763, 6225, 6918, 7050, 7758, 5494, 6164, 6290, 6985, 6446, 7144, 7276, 7987, 6632, 7332, 7465, 8176, 7624, 8336, 8470, 9180, 5742, 6419, 6551, 7249, 6707, 7408, 7544, 8255, 6894, 7599, 7734, 8445, 7891, 8603, 8739, 9445, 7116, 7825, 7959, 8671, 8119, 8831, 8966, 9668, 8311, 9021, 9155, 9853, 9312, 10008, 10139, 10811, 3053, 3571, 3676, 4244, 3799, 4377, 4492, 5113, 3950, 4538, 4654, 5285, 4792, 5429, 5553, 6223, 4132, 4734, 4851, 5493, 4992, 5641, 5766, 6445, 5163, 5820, 5946, 6631, 6096, 6787, 6916, 7623, 4357, 4969, 5090, 5740, 5236, 5893, 6020, 6705, 5408, 6073, 6201, 6892, 6354, 7048, 7181, 7889, 5615, 6289, 6417, 7115, 6575, 7275, 7406, 8118, 6761, 7464, 7597, 8310, 7756, 8469, 8601, 9311, 4629, 5259, 5382, 6046, 5528, 6197, 6328, 7021, 5704, 6379, 6510, 7207, 6667, 7366, 7502, 8211, 5918, 6602, 6733, 7435, 6888, 7594, 7728, 8440, 7074, 7784, 7916, 8629, 8075, 8788, 8921, 9624, 6175, 6865, 6996, 7702, 7155, 7862, 7998, 8708, 7342, 8051, 8186, 8896, 8347, 9055, 9191, 9887, 7569, 8281, 8413, 9124, 8573, 9282, 9413, 10108, 8762, 9469, 9598, 10289, 9754, 10439, 10565, 11222, 4961, 5606, 5732, 6408, 5883, 6564, 6695, 7395, 6064, 6752, 6883, 7588, 7039, 7747, 7880, 8592, 6279, 6974, 7105, 7814, 7263, 7974, 8106, 8818, 7454, 8165, 8300, 9010, 8459, 9169, 9301, 9997, 6540, 7237, 7371, 8080, 7531, 8241, 8375, 9084, 7722, 8433, 8567, 9275, 8727, 9433, 9563, 10253, 7947, 8659, 8792, 9498, 8952, 9654, 9784, 10468, 9143, 9841, 9972, 10649, 10127, 10799, 10922, 11562, 6854, 7558, 7691, 8402, 7852, 8563, 8698, 9403, 8041, 8753, 8886, 9589, 9045, 9745, 9877, 10556, 8269, 8981, 9112, 9812, 9271, 9969, 10097, 10771, 9459, 10153, 10279, 10947, 10429, 11092, 11212, 11839, 8537, 9245, 9377, 10071, 9535, 10224, 10354, 11017, 9721, 10406, 10532, 11189, 10683, 11332, 11454, 12065, 9942, 10621, 10745, 11394, 10893, 11535, 11652, 12254, 11069, 11703, 11817, 12409, 11951, 12535, 12640, 13174, 3440, 3990, 4100, 4698, 4234, 4839, 4959, 5604, 4392, 5008, 5129, 5783, 5274, 5934, 6062, 6750, 4583, 5213, 5333, 5998, 5480, 6150, 6277, 6972, 5657, 6332, 6462, 7160, 6618, 7318, 7452, 8163, 4816, 5455, 5579, 6250, 5730, 6406, 6538, 7235, 5910, 6593, 6724, 7425, 6881, 7586, 7720, 8431, 6124, 6815, 6944, 7651, 7103, 7812, 7945, 8657, 7293, 8003, 8136, 8847, 8298, 9008, 9141, 9839, 5101, 5752, 5881, 6562, 6032, 6718, 6851, 7555, 6212, 6904, 7037, 7745, 7194, 7903, 8038, 8750, 6430, 7128, 7261, 7972, 7419, 8131, 8266, 8978, 7610, 8322, 8457, 9167, 8615, 9324, 9456, 10150, 6693, 7393, 7529, 8239, 7688, 8399, 8534, 9242, 7878, 8590, 8725, 9431, 8883, 9586, 9718, 10403, 8104, 8816, 8950, 9652, 9109, 9809, 9939, 10618, 9299, 9995, 10125, 10797, 10276, 10944, 11066, 11700, 5446, 6114, 6241, 6935, 6396, 7092, 7225, 7935, 6582, 7281, 7414, 8125, 7576, 8287, 8421, 9131, 6804, 7507, 7641, 8353, 7800, 8512, 8646, 9354, 7991, 8702, 8836, 9540, 8997, 9697, 9829, 10510, 7067, 7776, 7909, 8621, 8069, 8781, 8915, 9617, 8261, 8972, 9104, 9803, 9264, 9961, 10090, 10763, 8488, 9197, 9329, 10024, 9486, 10178, 10305, 10971, 9673, 10359, 10485, 11143, 10638, 11289, 11409, 12022, 7383, 8093, 8229, 8940, 8389, 9099, 9232, 9930, 8580, 9288, 9421, 10115, 9576, 10266, 10393, 11057, 8804, 9509, 9641, 10329, 9798, 10481, 10608, 11262, 9984, 10660, 10787, 11432, 10934, 11573, 11691, 12289, 9073, 9773, 9905, 10584, 10059, 10734, 10858, 11501, 10242, 10911, 11034, 11669, 11177, 11806, 11919, 12505, 10456, 11116, 11238, 11862, 11382, 11998, 12110, 12682, 11551, 12156, 12268, 12827, 12398, 12948, 13048, 13547, 5869, 6549, 6682, 7381, 6839, 7542, 7677, 8387, 7025, 7732, 7867, 8578, 8026, 8737, 8872, 9574, 7247, 7958, 8091, 8803, 8253, 8965, 9097, 9797, 8443, 9154, 9286, 9983, 9443, 10138, 10264, 10933, 7517, 8226, 8362, 9070, 8523, 9230, 9364, 10057, 8713, 9418, 9550, 10239, 9707, 10391, 10519, 11175, 8937, 9639, 9770, 10454, 9928, 10607, 10732, 11381, 10112, 10785, 10908, 11549, 11055, 11690, 11804, 12397, 7836, 8548, 8683, 9389, 8842, 9545, 9679, 10364, 9031, 9731, 9864, 10543, 10019, 10693, 10821, 11463, 9256, 9954, 10083, 10757, 10234, 10904, 11027, 11663, 10415, 11079, 11199, 11827, 11341, 11961, 12073, 12649, 9520, 10210, 10339, 11003, 10491, 11148, 11271, 11892, 10670, 11319, 11441, 12052, 11582, 12184, 12297, 12853, 10880, 11522, 11639, 12241, 11777, 12371, 12478, 13024, 11939, 12524, 12628, 13163, 12750, 13276, 13369, 13840, 8216, 8926, 9061, 9760, 9219, 9916, 10047, 10721, 9407, 10101, 10229, 10898, 10381, 11045, 11166, 11795, 9628, 10317, 10444, 11105, 10595, 11250, 11370, 11987, 10774, 11420, 11539, 12145, 11680, 12279, 12388, 12939, 9893, 10571, 10698, 11346, 10847, 11489, 11607, 12209, 11022, 11657, 11772, 12365, 11909, 12495, 12599, 13135, 11227, 11852, 11965, 12547, 12100, 12673, 12775, 13298, 12258, 12818, 12919, 13429, 13040, 13540, 13628, 14074, 10199, 10869, 10993, 11629, 11139, 11768, 11884, 12470, 11309, 11930, 12043, 12620, 12176, 12743, 12846, 13363, 11511, 12121, 12231, 12795, 12361, 12916, 13015, 13519, 12515, 13058, 13155, 13645, 13268, 13748, 13833, 14258, 11746, 12340, 12449, 12995, 12577, 13113, 13211, 13694, 12723, 13250, 13344, 13816, 13455, 13917, 14000, 14405, 12896, 13410, 13500, 13959, 13607, 14057, 14134, 14527, 13732, 14168, 14243, 14623, 14332, 14702, 14765, 15080, 1796, 2181, 2257, 2698, 2352, 2804, 2893, 3399, 2468, 2930, 3022, 3539, 3136, 3663, 3766, 4343, 2611, 3086, 3182, 3712, 3299, 3837, 3945, 4533, 3437, 3987, 4096, 4694, 4230, 4835, 4954, 5599, 2786, 3281, 3379, 3925, 3498, 4055, 4164, 4767, 3642, 4209, 4321, 4932, 4455, 5076, 5197, 5854, 3818, 4398, 4512, 5135, 4649, 5280, 5403, 6068, 4812, 5451, 5575, 6246, 5725, 6401, 6533, 7230, 3002, 3518, 3620, 4186, 3742, 4317, 4431, 5050, 3892, 4478, 4592, 5221, 4730, 5365, 5489, 6158, 4074, 4669, 4788, 5425, 4928, 5571, 5699, 6374, 5098, 5749, 5877, 6558, 6028, 6714, 6847, 7551, 4296, 4907, 5027, 5676, 5170, 5826, 5953, 6637, 5341, 6005, 6133, 6823, 6285, 6979, 7111, 7819, 5549, 6219, 6350, 7044, 6505, 7202, 7337, 8046, 6689, 7389, 7525, 8235, 7684, 8395, 8530, 9238, 3273, 3810, 3916, 4503, 4047, 4641, 4758, 5394, 4201, 4804, 4922, 5565, 5067, 5716, 5843, 6522, 4389, 5005, 5125, 5779, 5271, 5931, 6058, 6746, 5442, 6110, 6236, 6930, 6391, 7087, 7219, 7929, 4618, 5248, 5370, 6034, 5517, 6187, 6316, 7010, 5692, 6367, 6499, 7196, 6654, 7354, 7490, 8200, 5906, 6589, 6720, 7421, 6877, 7582, 7716, 8427, 7062, 7771, 7905, 8617, 8063, 8775, 8910, 9612, 4899, 5541, 5667, 6341, 5817, 6495, 6628, 7327, 5996, 6680, 6813, 7515, 6969, 7674, 7809, 8520, 6210, 6902, 7034, 7742, 7191, 7900, 8035, 8747, 7379, 8089, 8224, 8935, 8384, 9094, 9227, 9925, 6471, 7168, 7303, 8012, 7461, 8171, 8307, 9016, 7649, 8360, 8497, 9205, 8654, 9361, 9494, 10185, 7875, 8587, 8722, 9428, 8880, 9583, 9715, 10400, 9068, 9768, 9901, 10580, 10054, 10729, 10854, 11497, 3610, 4176, 4286, 4897, 4420, 5039, 5159, 5815, 4581, 5210, 5330, 5994, 5477, 6146, 6273, 6967, 4778, 5414, 5539, 6208, 5687, 6361, 6493, 7189, 5866, 6546, 6678, 7377, 6835, 7538, 7672, 8382, 5016, 5665, 5790, 6469, 5942, 6626, 6757, 7459, 6121, 6811, 6941, 7647, 7099, 7807, 7941, 8652, 6339, 7032, 7166, 7873, 7325, 8033, 8169, 8878, 7513, 8222, 8358, 9066, 8518, 9225, 9359, 10052, 5303, 5966, 6093, 6783, 6243, 6937, 7070, 7779, 6428, 7125, 7258, 7968, 7416, 8127, 8263, 8974, 6650, 7350, 7485, 8195, 7643, 8355, 8491, 9200, 7833, 8545, 8679, 9385, 8838, 9542, 9675, 10361, 6913, 7619, 7753, 8465, 7912, 8624, 8758, 9464, 8101, 8812, 8947, 9648, 9106, 9805, 9936, 10614, 8330, 9039, 9174, 9871, 9332, 10027, 10157, 10828, 9516, 10206, 10335, 10999, 10487, 11145, 11267, 11889, 5655, 6330, 6459, 7157, 6616, 7316, 7449, 8160, 6801, 7504, 7637, 8349, 7797, 8509, 8642, 9350, 7023, 7730, 7864, 8575, 8024, 8735, 8869, 9571, 8213, 8923, 9057, 9756, 9216, 9913, 10043, 10717, 7290, 8000, 8133, 8844, 8295, 9005, 9138, 9836, 8484, 9193, 9326, 10021, 9482, 10174, 10302, 10968, 8710, 9415, 9547, 10236, 9704, 10388, 10516, 11172, 9889, 10567, 10695, 11343, 10843, 11485, 11604, 12206, 7609, 8321, 8455, 9165, 8613, 9322, 9454, 10148, 8802, 9507, 9638, 10326, 9795, 10478, 10605, 11259, 9030, 9730, 9862, 10541, 10017, 10692, 10819, 11462, 10197, 10867, 10990, 11626, 11136, 11766, 11881, 12468, 9297, 9993, 10123, 10795, 10274, 10942, 11064, 11698, 10453, 11113, 11236, 11860, 11379, 11995, 12108, 12680, 10668, 11317, 11439, 12050, 11580, 12183, 12295, 12852, 11743, 12337, 12447, 12993, 12574, 13111, 13209, 13693, 4034, 4628, 4745, 5381, 4884, 5527, 5652, 6327, 5054, 5703, 5830, 6509, 5981, 6666, 6798, 7501, 5258, 5917, 6045, 6732, 6196, 6887, 7020, 7727, 6378, 7073, 7206, 7915, 7365, 8074, 8210, 8920, 5504, 6174, 6301, 6995, 6456, 7154, 7287, 7997, 6641, 7341, 7475, 8185, 7634, 8346, 8481, 9190, 6864, 7568, 7701, 8412, 7861, 8572, 8707, 9412, 8050, 8761, 8895, 9597, 9054, 9753, 9886, 10564, 5802, 6481, 6614, 7314, 6769, 7471, 7606, 8318, 6954, 7660, 7795, 8507, 7954, 8665, 8799, 9504, 7177, 7885, 8022, 8733, 8181, 8891, 9027, 9727, 8370, 9079, 9214, 9911, 9371, 10065, 10194, 10864, 7447, 8158, 8293, 9003, 8452, 9162, 9294, 9990, 8640, 9348, 9480, 10172, 9635, 10323, 10450, 11110, 8867, 9569, 9702, 10386, 9859, 10538, 10665, 11314, 10041, 10715, 10841, 11483, 10987, 11623, 11740, 12334, 6163, 6853, 6984, 7690, 7143, 7851, 7986, 8697, 7331, 8040, 8175, 8885, 833, 9044, 9179, 9876, 7557, 8268, 8401, 9111, 8562, 9270, 9402, 10096, 8752, 9458, 9588, 10278, 9744, 10428, 10555, 11211, 7824, 8536, 8670, 9376, 8830, 9534, 9667, 10353, 9020, 9720, 9852, 10531, 10007, 10682, 10810, 11453, 9244, 9941, 10070, 10744, 10223, 10892, 11016, 11651, 10405, 11068, 11188, 11816, 11331, 11950, 12064, 12639, 8147, 8857, 8993, 9693, 9151, 9848, 9980, 10656, 9338, 10032, 10163, 10833, 10313, 10978, 11101, 11732, 9559, 10249, 10377, 11041, 10527, 11184, 11305, 11926, 10706, 11355, 11475, 12086, 11614, 12217, 12326, 12883, 9824, 10505, 10633, 11284, 10782, 11427, 11546, 12151, 10957, 11594, 11713, 12308, 11848, 12436, 12544, 13082, 11161, 11790, 11904, 12490, 12038, 12615, 12718, 13245, 12196, 12762, 12864, 13380, 12982, 13488, 13577, 14029, 6601, 7301, 7434, 8145, 7593, 8305, 8439, 9149, 7783, 8495, 8628, 9336, 8787, 9492, 9623, 10311, 8010, 8720, 8855, 9557, 9014, 9713, 9846, 10525, 9203, 9899, 10030, 10704, 10183, 10852, 10976, 11612, 8280, 8991, 9123, 9822, 9281, 9978, 10107, 10780, 9468, 10161, 10288, 10955, 10438, 11099, 11221, 11846, 9691, 10375, 10503, 11159, 10654, 11303, 11425, 12036, 10831, 11473, 11592, 12194, 11730, 12324, 12434, 12980, 8598, 9307, 9440, 10134, 9594, 10284, 10412, 11075, 9780, 10463, 10591, 11245, 10740, 11388, 11507, 12116, 10002, 10677, 10805, 11448, 10951, 11589, 11708, 12304, 11122, 11752, 11868, 12455, 12003, 12582, 12687, 13216, 10260, 10929, 11051, 11686, 11195, 11823, 11935, 12520, 11365, 11982, 12095, 12668, 12226, 12790, 12891, 13405, 11568, 12171, 12284, 12841, 12414, 12962, 13062, 13559, 12562, 13099, 13198, 13682, 13311, 13785, 13871, 14290, 8980, 9681, 9811, 10493, 9968, 10645, 10770, 11416, 10152, 10823, 10946, 11584, 11091, 11723, 11838, 12427, 10366, 11029, 11150, 11779, 11295, 11915, 12028, 12605, 11465, 12075, 12186, 12752, 12317, 12873, 12973, 13479, 10620, 11273, 11393, 12008, 11534, 12141, 12253, 12814, 11702, 12299, 12408, 12957, 12534, 13074, 13173, 13660, 11894, 12480, 12586, 13122, 12709, 13236, 13332, 13804, 12855, 13371, 13463, 13924, 13569, 14021, 14101, 14496, 10919, 11559, 11677, 12276, 11813, 12405, 12512, 13055, 11974, 12555, 12661, 13192, 12783, 13305, 13399, 13866, 12163, 12730, 12834, 13351, 12954, 13461, 13553, 14006, 13092, 13587, 13676, 14117, 13779, 14209, 14285, 14660, 12384, 12936, 13036, 13537, 13151, 13642, 13728, 14165, 13287, 13764, 13850, 14272, 13949, 14360, 14433, 14789, 13444, 13906, 13991, 14396, 14086, 14482, 14553, 14893, 14194, 14579, 14647, 14976, 14724, 15044, 15099, 15366, 4565, 5193, 5313, 5976, 5460, 6129, 6255, 6949, 5637, 6311, 6440, 7137, 6598, 7298, 7430, 8141, 5850, 6529, 6661, 7361, 6819, 7521, 7655, 8366, 7005, 7711, 7845, 8557, 8007, 8717, 8851, 9554, 6103, 6793, 6923, 7629, 7081, 7790, 7923, 8635, 7270, 7980, 8113, 8824, 8276, 8987, 9119, 9818, 7496, 8206, 8341, 9050, 8502, 9210, 9343, 10037, 8691, 9397, 9528, 10218, 9687, 10372, 10499, 11156, 6410, 7107, 7239, 7949, 7397, 8108, 8243, 8954, 7590, 8302, 8435, 9145, 8594, 9303, 9435, 10129, 7815, 8526, 8660, 9367, 8819, 9523, 9655, 10342, 9011, 9710, 9842, 10522, 9998, 10673, 10800, 11444, 8082, 8794, 8928, 9630, 9086, 9786, 9918, 10597, 9277, 9974, 10103, 10776, 10255, 10924, 11047, 11682, 9499, 10190, 10318, 10983, 10469, 11128, 11251, 11874, 10650, 11300, 11421, 12033, 11563, 12167, 12280, 12838, 6784, 7486, 7620, 8331, 7781, 8493, 8626, 9334, 7969, 8680, 8813, 9517, 8976, 9677, 9807, 10489, 8196, 8906, 9040, 9740, 9201, 9897, 10028, 10702, 9386, 10080, 10207, 10877, 10362, 11025, 11146, 11775, 8466, 9175, 9308, 10003, 9466, 10159, 10286, 10953, 9649, 10336, 10464, 11123, 10616, 11269, 11390, 12005, 9872, 10551, 10678, 11327, 10829, 11471, 11590, 12192, 11000, 11636, 11753, 12347, 11890, 12476, 12583, 13119, 8785, 9490, 9621, 10309, 9777, 10460, 10588, 11242, 9965, 10642, 10767, 11413, 10915, 11555, 11673, 12272, 10181, 10850, 10974, 11610, 11119, 11749, 11865, 12452, 11292, 11912, 12025, 12602, 12159, 12726, 12830, 13347, 10436, 11097, 11219, 11844, 11362, 11979, 12093, 12666, 11531, 12138, 12250, 12811, 12380, 12932, 13033, 13534, 11728, 12322, 12432, 12978, 12559, 13096, 13196, 13680, 12706, 13233, 13329, 13801, 13440, 13902, 13988, 14393, 7227, 7937, 8071, 8783, 8231, 8942, 9075, 9775, 8423, 9133, 9266, 9963, 9423, 10117, 10244, 10913, 8648, 9356, 9488, 10180, 9643, 10331, 10458, 11118, 9831, 10512, 10640, 11291, 10789, 11434, 11553, 12158, 8917, 9619, 9750, 10434, 9907, 10586, 10711, 11360, 10092, 10765, 10888, 11529, 11036, 11671, 11785, 12378, 10307, 10973, 11095, 11727, 11240, 11864, 11977, 12558, 11411, 12024, 12136, 12705, 12270, 12829, 12930, 13439, 9234, 9932, 10061, 10736, 10213, 10883, 11006, 11642, 10395, 11059, 11179, 11808, 11322, 11942, 12055, 12631, 10610, 11264, 11384, 12000, 11524, 12133, 12243, 12806, 11693, 12291, 12400, 12950, 12526, 13068, 13165, 13654, 10860, 11503, 11619, 12222, 11758, 12352, 12461, 13007, 11921, 12507, 12610, 13146, 12734, 13260, 13355, 13826, 12112, 12684, 12786, 13308, 12906, 13419, 13510, 13968, 13050, 13549, 13637, 14082, 13740, 14175, 14251, 14630, 9609, 10299, 10425, 11088, 10576, 11232, 11351, 11970, 10755, 11403, 11520, 12129, 11661, 12262, 12369, 12923, 10965, 11602, 11720, 12315, 11856, 12444, 12551, 13089, 12016, 12594, 12698, 1322, 12821, 13339, 13432, 13895, 11208, 11835, 11947, 12531, 12082, 12657, 12758, 13283, 12239, 12802, 12903, 13416, 13022, 13525, 13613, 14062, 12424, 12971, 13071, 13567, 13188, 13673, 13760, 14191, 13321, 13794, 13880, 14298, 13980, 14386, 14460, 14811, 11493, 12104, 12213, 12779, 12343, 12899, 12998, 13503, 12499, 13044, 13139, 13632, 13253, 13735, 13819, 14246, 12676, 13206, 13301, 13776, 13412, 13878, 13961, 14370, 13543, 13997, 14077, 14474, 14170, 14558, 14625, 14957, 12879, 13395, 13484, 13945, 13591, 14042, 14121, 14515, 13717, 14156, 14230, 14613, 14319, 14691, 14755, 15072, 13862, 14282, 14356, 14721, 14443, 14797, 14860, 15160, 14545, 14886, 14946, 15234, 15015, 15294, 15343, 15572, 7764, 8476, 8610, 9319, 8770, 9476, 9607, 10297, 8960, 9661, 9792, 10475, 9950, 10628, 10753, 11401, 9185, 9882, 10014, 10689, 10168, 10838, 10963, 11600, 10347, 11011, 11133, 11763, 11279, 11900, 12014, 12592, 9451, 10145, 10271, 10939, 10423, 11086, 11206, 11833, 10602, 11256, 11376, 11992, 11518, 12127, 12237, 12800, 10816, 11459, 11577, 12180, 11718, 12313, 12422, 12969, 11878, 12465, 12571, 13108, 12696, 13224, 13319, 13792, 9762, 10446, 10574, 11230, 10723, 11372, 11491, 12102, 10900, 11541, 11659, 12260, 11797, 12390, 12497, 13042, 11106, 11737, 11854, 12442, 11988, 12568, 12674, 13204, 12146, 12714, 12819, 13337, 12940, 13448, 13541, 13995, 11349, 11968, 12080, 12655, 12211, 12777, 12877, 13393, 12367, 12921, 13020, 13523, 13137, 13630, 13715, 14154, 12549, 13087, 13186, 13671, 13299, 13774, 13860, 14280, 13430, 13893, 13978, 14384, 14075, 14472, 14543, 14884, 10135, 10806, 10930, 11569, 11077, 11710, 11825, 12416, 11246, 11869, 11983, 12563, 12118, 12689, 12792, 13313, 11449, 12060, 12172, 12739, 12305, 12861, 12963, 13469, 12456, 13002, 13100, 13595, 13217, 13700, 13786, 14215, 11687, 12285, 12394, 12944, 12522, 13064, 13161, 13650, 12669, 13199, 13295, 13770, 13407, 13873, 13957, 14366, 12842, 13359, 13451, 13913, 13560, 14012, 14092, 14487, 13683, 14124, 14200, 14585, 14291, 14665, 14729, 15048, 11959, 12541, 12647, 13180, 12770, 13293, 13387, 13856, 12913, 13424, 13516, 13973, 13623, 14070, 14148, 14539, 13079, 13574, 13665, 14106, 13768, 14198, 14276, 14651, 13887, 14304, 14379, 14741, 14467, 14817, 14880, 15177, 13274, 13753, 13838, 14262, 13938, 14351, 14423, 14781, 14054, 14454, 14525, 14869, 14606, 14941, 14999, 15281, 14184, 14569, 14638, 14967, 14716, 15036, 15092, 15359, 14805, 15113, 15167, 15423, 15229, 15475, 15519, 15718, 10561, 11217, 11338, 11957, 11480, 12091, 12202, 12768, 11647, 12248, 12357, 12911, 12486, 13031, 13128, 13621, 11842, 12431, 12539, 13078, 12664, 13195, 13291, 13767, 12809, 13328, 13422, 13886, 13532, 13987, 14068, 14466, 12070, 12645, 12747, 13272, 12869, 13385, 13475, 13936, 13011, 13514, 13603, 14052, 13707, 14146, 14221, 14604, 13178, 13664, 13751, 14183, 13854, 14275, 14349, 14715, 13971, 14378, 14452, 14804, 14537, 14879, 14939, 15228, 12331, 12888, 12988, 13494, 13105, 13600, 13688, 14129, 13241, 13724, 13809, 14237, 13910, 14326, 14400, 14761, 13402, 13869, 13953, 14363, 14049, 14450, 14521, 14866, 14161, 14550, 14618, 14951, 14696, 15020, 15076, 15347, 13582, 14034, 14112, 14507, 14204, 14589, 14655, 14984, 14310, 14683, 14746, 15064, 14822, 15129, 15181, 15436, 14437, 14792, 14854, 15155, 14926, 15218, 15268, 15509, 15009, 15289, 15337, 15567, 15392, 15614, 15651, 15828, 12636, 13170, 13265, 13745, 13377, 13847, 13930, 14344, 13507, 13965, 14046, 14447, 14140, 14532, 14599, 14935, 13657, 14099, 14178, 14564, 14269, 14645, 14711, 15032, 14372, 14735, 14799, 15108, 14874, 15172, 15224, 15471, 13830, 14255, 14329, 14699, 14416, 14775, 14836, 15141, 14518, 14863, 14923, 15215, 14993, 15276, 15323, 15556, 14633, 14963, 15022, 15299, 15088, 15356, 15402, 15621, 15162, 15419, 15463, 15672, 15515, 15715, 15749, 15907, 14026, 14430, 14501, 14849, 14583, 14921, 14980, 15265, 14678, 15005, 15060, 15334, 15125, 15389, 15433, 15649, 14786, 15097, 15151, 15410, 15213, 15462, 15506, 15708, 15285, 15523, 15564, 15756, 15611, 15795, 15826, 15970, 14908, 15203, 15253, 15497, 15312, 15547, 15586, 15775, 15379, 15604, 15640, 15820, 15683, 15855, 15883, 16016, 15454, 15665, 15701, 15868, 15742, 15902, 15929, 16051, 15789, 15940, 15965, 16080, 15993, 16103, 16121, 16201, 2292, 2736, 2825, 3323, 2933, 3441, 3543, 4101, 3065, 3586, 3689, 4260, 3813, 4393, 4507, 5130, 3225, 3760, 3865, 4450, 3991, 4584, 4699, 5334, 4149, 4751, 4869, 5511, 5009, 5658, 5784, 6463, 3422, 3971, 4080, 4677, 4213, 4817, 4936, 5580, 4371, 4986, 5106, 5759, 5252, 5911, 6038, 6725, 4562, 5190, 5310, 5973, 5456, 6125, 6251, 6945, 5634, 6308, 6437, 7134, 6594, 7294, 7426, 8137, 3667, 4235, 4348, 4960, 4481, 5102, 5225, 5882, 4644, 5275, 5398, 6063, 5543, 6213, 6344, 7038, 4840, 5481, 5605, 6278, 5753, 6431, 6563, 7262, 5935, 6619, 6751, 7453, 6905, 7611, 7746, 8458, 5081, 5731, 5859, 6539, 6009, 6694, 6827, 7530, 6191, 6882, 7014, 7721, 7171, 7879, 8015, 8726, 6407, 7104, 7236, 7946, 7394, 8105, 8240, 8951, 7587, 8299, 8432, 9142, 8591, 9300, 9432, 10126, 3963, 4554, 4668, 5302, 4808, 5447, 5570, 6242, 4976, 5624, 5748, 6427, 5900, 6583, 6713, 7415, 5181, 5837, 5965, 6649, 6115, 6805, 6936, 7642, 6297, 6991, 7124, 7832, 7282, 7992, 8126, 8837, 5423, 6091, 6217, 6911, 6372, 7068, 7200, 7910, 6557, 7257, 7388, 8100, 7550, 8262, 8394, 9105, 6781, 7483, 7617, 8328, 7777, 8489, 8622, 9330, 7967, 8678, 8811, 9515, 8973, 9674, 9804, 10486, 5721, 6397, 6528, 7226, 6684, 7384, 7520, 8230, 6872, 7577, 7710, 8422, 7869, 8581, 8716, 9422, 7093, 7801, 7936, 8647, 8094, 8805, 8941, 9642, 8288, 8998, 9132, 9830, 9289, 9985, 10116, 10788, 7360, 8070, 8205, 8916, 8365, 9074, 9209, 9906, 8556, 9265, 9396, 10091, 9553, 10243, 10371, 11035, 8782, 9487, 9618, 10306, 9774, 10457, 10585, 11239, 9962, 10639, 10764, 11410, 10912, 11552, 11670, 12269, 4337, 4948, 5071, 5720, 5214, 5870, 5999, 6683, 5387, 6051, 6181, 6871, 6333, 7026, 7161, 7868, 5592, 6264, 6395, 7091, 6550, 7248, 7382, 8092, 6738, 7439, 7575, 8286, 7733, 8444, 8579, 9287, 5847, 6526, 6658, 7358, 6816, 7518, 7652, 8363, 7002, 7708, 7842, 8554, 8004, 8714, 8848, 9551, 7223, 7933, 8067, 8779, 8227, 8938, 9071, 9771, 8419, 9129, 9262, 9959, 9419, 10113, 10240, 10909, 6151, 6840, 6973, 7678, 7129, 7837, 7973, 8684, 7319, 8027, 8164, 8873, 8323, 9032, 9168, 9865, 7543, 8254, 8388, 9098, 8549, 9257, 9390, 10084, 8738, 9444, 9575, 10265, 9732, 10416, 10544, 11200, 7813, 8524, 8658, 9365, 8817, 9521, 9653, 10340, 9009, 9708, 9840, 10520, 9996, 10671, 10798, 11442, 9231, 9929, 10058, 10733, 10211, 10881, 11004, 11640, 10392, 11056, 11176, 11805, 11320, 11940, 12053, 12629, 6516, 7213, 7349, 8058, 7508, 8217, 8354, 9062, 7697, 8408, 8544, 9252, 8703, 9408, 9541, 10230, 7922, 8634, 8769, 9475, 8927, 9629, 9761, 10445, 9118, 9817, 9949, 10627, 10102, 10775, 10899, 11540, 8193, 8903, 9037, 9737, 9198, 9894, 10025, 10699, 9384, 10078, 10205, 10875, 10360, 11023, 11144, 11773, 9605, 10295, 10421, 11084, 10572, 11228, 11347, 11966, 10752, 11400, 11517, 12126, 11658, 12259, 12366, 12920, 8513, 9220, 9355, 10048, 9510, 10200, 10330, 10994, 9698, 10382, 10511, 11167, 10661, 11310, 11433, 12044, 9917, 10596, 10722, 11371, 10870, 11512, 11630, 12232, 11046, 11681, 11796, 12389, 11931, 12516, 12621, 13156, 10179, 10848, 10972, 11608, 11117, 11747, 11863, 12450, 11290, 11910, 12023, 12600, 12157, 12724, 12828, 13345, 11490, 12101, 12210, 12776, 12341, 12897, 12996, 13501, 12496, 13041, 13136, 13629, 13251, 13733, 13817, 14244, 4795, 5433, 5556, 6227, 5707, 6382, 6513, 7210, 5886, 6568, 6698, 7399, 6857, 7561, 7694, 8405, 6100, 6790, 6920, 7626, 7077, 7786, 7919, 8631, 7267, 7977, 8110, 8821, 8272, 8983, 9115, 9814, 6357, 7052, 7184, 7893, 7345, 8054, 8189, 8899, 7534, 8245, 8378, 9088, 8540, 9248, 9380, 10074, 7760, 8472, 8605, 9314, 8765, 9471, 9601, 10291, 8956, 9657, 9788, 10471, 9945, 10623, 10748, 11396, 6671, 7370, 7506, 8215, 7664, 8374, 8511, 9218, 7855, 8566, 8701, 9406, 8860, 9562, 9696, 10380, 8079, 8791, 8925, 9627, 9083, 9783, 9915, 10594, 9274, 9971, 10100, 10773, 10252, 10921, 11044, 11679, 8351, 9059, 9195, 9891, 9352, 10045, 10176, 10845, 9538, 10227, 10357, 11020, 10508, 11164, 11287, 11907, 9758, 10442, 10569, 11225, 10719, 11368, 11487, 12098, 10896, 11537, 11655, 12256, 11793, 12386, 12493, 13038, 7042, 7751, 7883, 8596, 8044, 8756, 8889, 9592, 8234, 8946, 9078, 9779, 9237, 9935, 10064, 10739, 8463, 9172, 9305, 10000, 9462, 10155, 10282, 10949, 9647, 10334, 10462, 11121, 10613, 11266, 11387, 12002, 8730, 9437, 9566, 10257, 9724, 10409, 10535, 11192, 9910, 10590, 10714, 11364, 10863, 11506, 11622, 12225, 10131, 10802, 10926, 11565, 11072, 11705, 11820, 12411, 11244, 11867, 11981, 12561, 12115, 12686, 12789, 13310, 9049, 9749, 9881, 10560, 10036, 10710, 10837, 11479, 10217, 10887, 11010, 11646, 11155, 11784, 11899, 12485, 10413, 11094, 11216, 11841, 11359, 11976, 12090, 12663, 11528, 12135, 12247, 12808, 12377, 12929, 13030, 13531, 10687, 11336, 11457, 12068, 11598, 12200, 12311, 12867, 11762, 12356, 12464, 13010, 12591, 13127, 13223, 13706, 11955, 12537, 12643, 13176, 12766, 13289, 13383, 13852, 12910, 13421, 13513, 13970, 13620, 14067, 14145, 14536, 7493, 8203, 8338, 9047, 8499, 9207, 9340, 10034, 8688, 9394, 9525, 10215, 9684, 10369, 10496, 11153, 8913, 9615, 9747, 10431, 9903, 10582, 10708, 11357, 10088, 10761, 10885, 11526, 11032, 11667, 11782, 12375, 9182, 9879, 10010, 10685, 10165, 10835, 10959, 11596, 10344, 11008, 11130, 11760, 11276, 11897, 12011, 12589, 10558, 11214, 11334, 11953, 11477, 12088, 12198, 12764, 11644, 12245, 12354, 12908, 12483, 13028, 13125, 13618, 9497, 10188, 10316, 10981, 10467, 11126, 11249, 11872, 10648, 11298, 11419, 12031, 11561, 12165, 12278, 12836, 10857, 11500, 11617, 12220, 11756, 12350, 12459, 13005, 11918, 12504, 12608, 13144, 12732, 13258, 13353, 13824, 11104, 11735, 11851, 12439, 11986, 12566, 12672, 13202, 12144, 12712, 12817, 13335, 12938, 13446, 13539, 13993, 12329, 12886, 12985, 13491, 13103, 13598, 13686, 14127, 13239, 13722, 13807, 14235, 13908, 14324, 14398, 14759, 9869, 10548, 10675, 11324, 10826, 11468, 11587, 12189, 10998, 11634, 11751, 12345, 11888, 12474, 12581, 13117, 11204, 11831, 11944, 12528, 12078, 12653, 12755, 13280, 12236, 12799, 12901, 13414, 13019, 13522, 13611, 14060, 11446, 12057, 12169, 12736, 12302, 12858, 12960, 13466, 12454, 13000, 13098, 13593, 13215, 13698, 13784, 14213, 12633, 13167, 13262, 13742, 13374, 13844, 13927, 14341, 13505, 13963, 14044, 14445, 14138, 14530, 14597, 14933, 11726, 12320, 12430, 12976, 12557, 13094, 13194, 13678, 12704, 13231, 13327, 13799, 13438, 13900, 13986, 14391, 12876, 13392, 13482, 13943, 13589, 14040, 14119, 14513, 13714, 14153, 14228, 14611, 14317, 14689, 14753, 15070, 13077, 13572, 13663, 14104, 13766, 14196, 14274, 14649, 13885, 14302, 14377, 14739, 14465, 14815, 14878, 15175, 14024, 14428, 14499, 14847, 14581, 14919, 14978, 15263, 14676, 15003, 15058, 15332, 15123, 15387, 15431, 15647, 5369, 6033, 6162, 6852, 6315, 7009, 7142, 7850, 6498, 7195, 7330, 8039, 7489, 8199, 8334, 9043, 6719, 7420, 7556, 8267, 7715, 8426, 8561, 9269, 7904, 8616, 8751, 9457, 8909, 9611, 9743, 10427, 6983, 7689, 7823, 8535, 7985, 8696, 8829, 9533, 8174, 8884, 9019, 9719, 9178, 9875, 10006, 10681, 8400, 9110, 9243, 9940, 9401, 10095, 10222, 10891, 9587, 10277, 10404, 11067, 10554, 11210, 11330, 11949, 7302, 8011, 8146, 8856, 8306, 9015, 9150, 9847, 8496, 9204, 9337, 10031, 9493, 10184, 10312, 10977, 8721, 9427, 9558, 10248, 9714, 10399, 10526, 11183, 9900, 10579, 10705, 11354, 10853, 11496, 11613, 12216, 8992, 9692, 9823, 10504, 9979, 10655, 10781, 11426, 10162, 10832, 10956, 11593, 11100, 11731, 11847, 12435, 10376, 11040, 11160, 11789, 11304, 11925, 12037, 12614, 11474, 12085, 12195, 12761, 12325, 12882, 12981, 13487, 7679, 8390, 8525, 9233, 8685, 9391, 9522, 10212, 8874, 9577, 9709, 10394, 9866, 10545, 10672, 11321, 9100, 9799, 9931, 10609, 10085, 10758, 10882, 11523, 10267, 10935, 11058, 11692, 11201, 11828, 11941, 12525, 9366, 10060, 10189, 10859, 10341, 11005, 11127, 11757, 10521, 11178, 11299, 11920, 11443, 12054, 12166, 12733, 10735, 11383, 11502, 12111, 11641, 12242, 12351, 12905, 11807, 12399, 12506, 13049, 12630, 13164, 13259, 13739, 9682, 10367, 10494, 11151, 10646, 11296, 11417, 12029, 10824, 11466, 11585, 12187, 11724, 12318, 12428, 12974, 11030, 11665, 11780, 12373, 11916, 12502, 12606, 13142, 12076, 12651, 12753, 13278, 12874, 13390, 13480, 13941, 11274, 11895, 12009, 12587, 12142, 12710, 12815, 13333, 12300, 12856, 12958, 13464, 13075, 13570, 13661, 14102, 12481, 13026, 13123, 13616, 13237, 13720, 13805, 14233, 13372, 13842, 13925, 14339, 14022, 14426, 14497, 14845, 8132, 8843, 8979, 9680, 9137, 9835, 9967, 10644, 9325, 10020, 10151, 10822, 10301, 10967, 11090, 11722, 9546, 10235, 10365, 11028, 10515, 11171, 11294, 11914, 10694, 11342, 11464, 12074, 11603, 12205, 12315, 12872, 9810, 10492, 10619, 11272, 10769, 11415, 11533, 12140, 10945, 11583, 11701, 12298, 11837, 12426, 12533, 13073, 11149, 11778, 11893, 12479, 12027, 12604, 12708, 13235, 12185, 12751, 12854, 13370, 12972, 13478, 13568, 14020, 10122, 10794, 10918, 11558, 11063, 11697, 11812, 12404, 11235, 11859, 11973, 12554, 12107, 12679, 12782, 13304, 11438, 12049, 12162, 12729, 12294, 12851, 12953, 13460, 12446, 12992, 13091, 13586, 13208, 13692, 13778, 14208, 11676, 12275, 12383, 12935, 12511, 13054, 13150, 13641, 12660, 13191, 13286, 13763, 13398, 13865, 13948, 14359, 12833, 13350, 13443, 13905, 13552, 14005, 14085, 14481, 13675, 14116, 14193, 14578, 14284, 14659, 14723, 15043, 10482, 11140, 11263, 11885, 11406, 12019, 12132, 12701, 11574, 12177, 12290, 12847, 12419, 12966, 13067, 13563, 11769, 12362, 12471, 13016, 12596, 13132, 13228, 13711, 12744, 13269, 13364, 13834, 13472, 13933, 14015, 14419, 11999, 12578, 12683, 13212, 12805, 13324, 13418, 13882, 12949, 13456, 13548, 14001, 13653, 14095, 14174, 14560, 13114, 13608, 13695, 14135, 13796, 14225, 14299, 14673, 13918, 14333, 14406, 14766, 14490, 14839, 14899, 15195, 12266, 12825, 12927, 13436, 13047, 13546, 13635, 14080, 13184, 13669, 13757, 14188, 13859, 14279, 14354, 14719, 13342, 13814, 13898, 14315, 13999, 14404, 14476, 14826, 14110, 14505, 14573, 14912, 14654, 14983, 15039, 15315, 13529, 13984, 14065, 14463, 14159, 14548, 14616, 14949, 14266, 14642, 14708, 15029, 14784, 15095, 15149, 15408, 14389, 14751, 14813, 15121, 14888, 15185, 15236, 15482, 14971, 15257, 15305, 15541, 15362, 15589, 15626, 15808, 8669, 9375, 9508, 10198, 9666, 10352, 10480, 11138, 9851, 10530, 10659, 11308, 10809, 11452, 11572, 12175, 10069, 10743, 10868, 11510, 11015, 11650, 11767, 12360, 11187, 11815, 11929, 12514, 12063, 12638, 12742, 13267, 10327, 10991, 11114, 11744, 11261, 11883, 11997, 12576, 11430, 12041, 12154, 12721, 12288, 12845, 12947, 13454, 11627, 12229, 12338, 12894, 12469, 13014, 13112, 13606, 12618, 13153, 13248, 13730, 13362, 13832, 13916, 14331, 10632, 11283, 11405, 12018, 11545, 12150, 12264, 12823, 11712, 12307, 12418, 12965, 12543, 13081, 13182, 13667, 11903, 12489, 12595, 13131, 12717, 13244, 13340, 13812, 12863, 13379, 13471, 13932, 13576, 14028, 14108, 14503, 12131, 12700, 12804, 13323, 12925, 13434, 13527, 13982, 13066, 13562, 13652, 14094, 13755, 14186, 14264, 14640, 13227, 13710, 13795, 14224, 13896, 14313, 14387, 14749, 14014, 14418, 14489, 14838, 14571, 14910, 14969, 15255, 10982, 11618, 11736, 12330, 11873, 12460, 12567, 13104, 12032, 12609, 12713, 13240, 12837, 13354, 13447, 13909, 12221, 12785, 12887, 13401, 13006, 13509, 13599, 14048, 13145, 13636, 13723, 14160, 13825, 14250, 14325, 14695, 12440, 12986, 13085, 13580, 13203, 13687, 13773, 14203, 13336, 13808, 13892, 14309, 13994, 14399, 14471, 14821, 13492, 13951, 14032, 14435, 14128, 14520, 14588, 14925, 14236, 14617, 14682, 15008, 14760, 15075, 15128, 15391, 12692, 13220, 13316, 13789, 13427, 13890, 13976, 14382, 13556, 14008, 14089, 14484, 14181, 14566, 14636, 14965, 13703, 14142, 14218, 14601, 14307, 14680, 14744, 15062, 14412, 14771, 14833, 15138, 14905, 15200, 15251, 15495, 13876, 14294, 14368, 14731, 14457, 14808, 14871, 15169, 14556, 14895, 14955, 15241, 15025, 15301, 15350, 15577, 14668, 14995, 15050, 15325, 15116, 15381, 15425, 15642, 15191, 15444, 15486, 15692, 15537, 15734, 15767, 15923, 11392, 12007, 12120, 12691, 12252, 12813, 12915, 13426, 12407, 12956, 13057, 13555, 13172, 13659, 13747, 14180, 12585, 13121, 13219, 13702, 13331, 13803, 13889, 14306, 13462, 13923, 14007, 14411, 14100, 14495, 14565, 14904, 12794, 13315, 13409, 13875, 13518, 13975, 14056, 14456, 13644, 14088, 14167, 14555, 14257, 14635, 14701, 15024, 13788, 14217, 14293, 14667, 14381, 14743, 14807, 15115, 14483, 14832, 14894, 15190, 14964, 15250, 15300, 15536, 13035, 13536, 13625, 14072, 13727, 14164, 14240, 14621, 13849, 14271, 14346, 14713, 14432, 14788, 14851, 15153, 13990, 14395, 14469, 14819, 14552, 14892, 14953, 15240, 14646, 14975, 15033, 15309, 15098, 15365, 15411, 15629, 14150, 14541, 14608, 14943, 14686, 15012, 15067, 15340, 14777, 15090, 15143, 15404, 15205, 15456, 15499, 15703, 14882, 15179, 15231, 15477, 15291, 15528, 15569, 15760, 15357, 15584, 15622, 15804, 15666, 15840, 15869, 16004, 13307, 13781, 13868, 14287, 13967, 14374, 14449, 14801, 14081, 14477, 14549, 14889, 14629, 14959, 15019, 15296, 14210, 14594, 14661, 14989, 14736, 15055, 15109, 15375, 14827, 15133, 15186, 15440, 15245, 15490, 15532, 15730, 14362, 14726, 14791, 15101, 14865, 15164, 15217, 15465, 14950, 15237, 15288, 15525, 15346, 15574, 15613, 15796, 15045, 15320, 15367, 15593, 15420, 15637, 15673, 15846, 15483, 15689, 15724, 15888, 15764, 15920, 15945, 16065, 14534, 14876, 14937, 15226, 15007, 15287, 15336, 15566, 15085, 15353, 15400, 15619, 15452, 15663, 15700, 15867, 15173, 15429, 15472, 15680, 15524, 15723, 15757, 15914, 15580, 15770, 15801, 15950, 15837, 15979, 16002, 16110, 15278, 15517, 15558, 15751, 15606, 15791, 15822, 15967, 15658, 15833, 15862, 15998, 15897, 16026, 16048, 16145, 15716, 15881, 15908, 16035, 15941, 16061, 16081, 16170, 15975, 16089, 16106, 16190, 16128, 16207, 16219, 16275, 6080, 6770, 6900, 7607, 7056, 7765, 7898, 8611, 7244, 7955, 8087, 8800, 8249, 8961, 9092, 9793, 7472, 8182, 8319, 9028, 8477, 9186, 9320, 10015, 8666, 9372, 9505, 10195, 9662, 10348, 10476, 11134, 7740, 8453, 8585, 9295, 8745, 9452, 9581, 10272, 8933, 9636, 9766, 10451, 9923, 10603, 10727, 11377, 9163, 9860, 9991, 10666, 10146, 10817, 10940, 11578, 10324, 10988, 11111, 11741, 11257, 11879, 11993, 12572, 8059, 8771, 8905, 9608, 9063, 9763, 9896, 10575, 9253, 9951, 10079, 10754, 10231, 10901, 11024, 11660, 9477, 10169, 10298, 10964, 10447, 11107, 11231, 11855, 10629, 11280, 11402, 12015, 11542, 12147, 12261, 12820, 9739, 10424, 10550, 11207, 10701, 11350, 11470, 12081, 10876, 11519, 11635, 12238, 11774, 12368, 12475, 13021, 11087, 11719, 11834, 12423, 11969, 12550, 12656, 13187, 12128, 12697, 12801, 13320, 12922, 13431, 13524, 13979, 8441, 9152, 9283, 9981, 9441, 10136, 10261, 10931, 9625, 10314, 10440, 11102, 10592, 11247, 11366, 11984, 9849, 10528, 10657, 11306, 10807, 11450, 11570, 12173, 10979, 11615, 11733, 12327, 11870, 12457, 12564, 13101, 10109, 10783, 10905, 11547, 11052, 11688, 11801, 12395, 11223, 11849, 11962, 12545, 12096, 12670, 12772, 13296, 11428, 12039, 12152, 12719, 12286, 12843, 12945, 13452, 12437, 12983, 13083, 13578, 13200, 13684, 13771, 14201, 10414, 11078, 11197, 11826, 11340, 11960, 12072, 12648, 11509, 12119, 12228, 12793, 12359, 12914, 13013, 13517, 11711, 12306, 12417, 12964, 12542, 13080, 13181, 13666, 12690, 13218, 13314, 13787, 13425, 13888, 13974, 14380, 11937, 12523, 12626, 13162, 12749, 13275, 13368, 13839, 12893, 13408, 13498, 13958, 13605, 14055, 14133, 14526, 13065, 13561, 13651, 14093, 13754, 14185, 14263, 14639, 13874, 14292, 14367, 14730, 14455, 14806, 14870, 15168, 8892, 9595, 9728, 10413, 9883, 10562, 10690, 11339, 10066, 10741, 10865, 11508, 11012, 11648, 11764, 12358, 10285, 10952, 11076, 11709, 11218, 11843, 11958, 12540, 11389, 12004, 12117, 12688, 12249, 12810, 12912, 13423, 10539, 11196, 11315, 11936, 11460, 12071, 12181, 12748, 11624, 12227, 12335, 12892, 12466, 13012, 13109, 13604, 11824, 12415, 12521, 13063, 12646, 13179, 13273, 13752, 12791, 13312, 13406, 13872, 13515, 13972, 14053, 14453, 10839, 11481, 11601, 12203, 11738, 12332, 12443, 12989, 11901, 12487, 12593, 13129, 12715, 13242, 13338, 13810, 12092, 12665, 12769, 13292, 12889, 13403, 13495, 13954, 13032, 13533, 13622, 14069, 13725, 14162, 14238, 14619, 12314, 12870, 12970, 13476, 13088, 13583, 13672, 14113, 13225, 13708, 13793, 14222, 13894, 14311, 14385, 14747, 13386, 13855, 13937, 14350, 14035, 14438, 14508, 14855, 14147, 14538, 14605, 14940, 14684, 15010, 15065, 15338, 11185, 11814, 11927, 12513, 12061, 12637, 12740, 13266, 12218, 12784, 12884, 13400, 13003, 13508, 13596, 14047, 12406, 12955, 13056, 13554, 13171, 13658, 13746, 14179, 13306, 13780, 13867, 14286, 13966, 14373, 14448, 14800, 12616, 13152, 13246, 13729, 13360, 13831, 13914, 14330, 13489, 13950, 14030, 14434, 14125, 14519, 14586, 14924, 13643, 14087, 14166, 14554, 14256, 14634, 14700, 15023, 14361, 14725, 14790, 15100, 14864, 15163, 15216, 15464, 12862, 13378, 13470, 13931, 13575, 14027, 14107, 14502, 13701, 14141, 14216, 14600, 14305, 14679, 14742, 15061, 13848, 14270, 14345, 14712, 14431, 14787, 14850, 15152, 14533, 14875, 14936, 15225, 15006, 15286, 15335, 15565, 14013, 14417, 14488, 14837, 14570, 14909, 14968, 15254, 14666, 14994, 15049, 15324, 15114, 15380, 15424, 15641, 14776, 15089, 15142, 15403, 15204, 15455, 15498, 15702, 15277, 15516, 15557, 15750, 15605, 15790, 15821, 15966, 9426, 10121, 10247, 10917, 10398, 11062, 11182, 11811, 10578, 11234, 11353, 11972, 11495, 12106, 12215, 12781, 10793, 11437, 11557, 12161, 11696, 12293, 12403, 12952, 11858, 12445, 12553, 13090, 12678, 13207, 13303, 13777, 11039, 11675, 11788, 12382, 11924, 12510, 12613, 13149, 12084, 12659, 12760, 13285, 12881, 13397, 13486, 13947, 12274, 12832, 12934, 13442, 13053, 13551, 13640, 14084, 13190, 13674, 13762, 14192, 13864, 14283, 14358, 14722, 11326, 11946, 12059, 12635, 12191, 12757, 12860, 13376, 12346, 12902, 13001, 13506, 13118, 13612, 13699, 14139, 12530, 13070, 13169, 13656, 13282, 13759, 13846, 14268, 13415, 13879, 13964, 14371, 14061, 14459, 14531, 14873, 12738, 13264, 13358, 13829, 13468, 13929, 14011, 14415, 13594, 14045, 14123, 14517, 14214, 14598, 14664, 14992, 13744, 14177, 14254, 14632, 14343, 14710, 14774, 15087, 14446, 14798, 14862, 15161, 14934, 15223, 15275, 15514, 11664, 12265, 12372, 12926, 12501, 13046, 13141, 13634, 12650, 13183, 13277, 13756, 13389, 13858, 13940, 14353, 12824, 13341, 13435, 13897, 13545, 13998, 14079, 14475, 13668, 14109, 14187, 14572, 14278, 14653, 14718, 15038, 13025, 13528, 13615, 14064, 13719, 14158, 14232, 14615, 13841, 14265, 14338, 14707, 14425, 14783, 14844, 15148, 13983, 14388, 14462, 14812, 14547, 14887, 14948, 15235, 14641, 14970, 15028, 15304, 15094, 15361, 15407, 15625, 13256, 13738, 13822, 14249, 13922, 14337, 14410, 14770, 14038, 14441, 14511, 14858, 14593, 14930, 14988, 15272, 14173, 14559, 14628, 14958, 14706, 15027, 15084, 15352, 14795, 15104, 15158, 15415, 15221, 15468, 15512, 15712, 14322, 14694, 14757, 15074, 14831, 15137, 15189, 15443, 14917, 15211, 15261, 15504, 15319, 15553, 15592, 15780, 15018, 15295, 15345, 15573, 15399, 15618, 15657, 15832, 15460, 15669, 15706, 15872, 15747, 15905, 15933, 16054, 12048, 12625, 12728, 13255, 12850, 13367, 13459, 13921, 12991, 13497, 13585, 14037, 13691, 14132, 14207, 14592, 13160, 13649, 13737, 14172, 13837, 14261, 14336, 14705, 13956, 14365, 14440, 14794, 14524, 14868, 14929, 15220, 13349, 13821, 13904, 14321, 14004, 14409, 14480, 14830, 14115, 14510, 14577, 14916, 14658, 14987, 15042, 15318, 14248, 14627, 14693, 15017, 14769, 15083, 15136, 15398, 14857, 15157, 15210, 15459, 15271, 15511, 15552, 15746, 13566, 14018, 14098, 14493, 14190, 14575, 14644, 14973, 14297, 14671, 14734, 15053, 14810, 15118, 15171, 15427, 14422, 14780, 14842, 15146, 14914, 15208, 15259, 15502, 14998, 15280, 15328, 15560, 15383, 15607, 15644, 15823, 14563, 14902, 14962, 15248, 15031, 15307, 15355, 15582, 15107, 15373, 15418, 15635, 15470, 15678, 15714, 15879, 15198, 15450, 15493, 15698, 15543, 15739, 15772, 15927, 15599, 15785, 15816, 15962, 15851, 15990, 16013, 16119, 13813, 14241, 14314, 14687, 14403, 14764, 14825, 15132, 14504, 14852, 14911, 15206, 14982, 15267, 15314, 15549, 14622, 14954, 15013, 15292, 15079, 15349, 15395, 15616, 15154, 15412, 15457, 15667, 15508, 15709, 15744, 15903, 14750, 15068, 15120, 15385, 15184, 15439, 15481, 15688, 15256, 15500, 15540, 15737, 15588, 15777, 15807, 15955, 15341, 15570, 15609, 15793, 15654, 15830, 15859, 15996, 15704, 15870, 15899, 16027, 15931, 16052, 16073, 16163, 14898, 15194, 15244, 15489, 15303, 15539, 15579, 15769, 15370, 15596, 15632, 15813, 15676, 15849, 15877, 16011, 15447, 15660, 15695, 15864, 15736, 15898, 15925, 16049, 15783, 15935, 15960, 16076, 15989, 16100, 16118, 16199, 15531, 15729, 15763, 15919, 15800, 15949, 15974, 16088, 15842, 15983, 16006, 16113, 16032, 16133, 16149, 16223, 15893, 16023, 16045, 16143, 16069, 16161, 16177, 16244, 16096, 16181, 16196, 16257, 16212, 16269, 16279, 16318, 10049, 10724, 10849, 11492, 10995, 11631, 11748, 12342, 11168, 11798, 11911, 12498, 12045, 12622, 12725, 13252, 11373, 11989, 12103, 12675, 12233, 12796, 12898, 13411, 12391, 12941, 13043, 13542, 13157, 13646, 13734, 14169, 11609, 12212, 12321, 12878, 12451, 12997, 13095, 13590, 12601, 13138, 13232, 13716, 13346, 13818, 13901, 14318, 12778, 13300, 13394, 13861, 13502, 13960, 14041, 14442, 13631, 14076, 14155, 14544, 14245, 14624, 14690, 15014, 11886, 12472, 12579, 13115, 12702, 13229, 13325, 13797, 12848, 13365, 13457, 13919, 13564, 14016, 14096, 14491, 13017, 13520, 13609, 14058, 13712, 14151, 14226, 14609, 13835, 14259, 14334, 14703, 14420, 14778, 14840, 15144, 13213, 13696, 13782, 14211, 13883, 14300, 14375, 14737, 14002, 14407, 14478, 14828, 14561, 14900, 14960, 15246, 14136, 14528, 14595, 14931, 14674, 15001, 15056, 15330, 14767, 15081, 15134, 15396, 15196, 15448, 15491, 15696, 12204, 12771, 12871, 13388, 12990, 13496, 13584, 14036, 13130, 13624, 13709, 14149, 13811, 14239, 14312, 14685, 13294, 13769, 13857, 14277, 13955, 14364, 14439, 14793, 14071, 14468, 14540, 14881, 14620, 14952, 15011, 15290, 13477, 13939, 14019, 14424, 14114, 14509, 14576, 14915, 14223, 14607, 14672, 15000, 14748, 15066, 15119, 15384, 14352, 14717, 14782, 15093, 14856, 15156, 15209, 15458, 14942, 15230, 15282, 15520, 15339, 15568, 15608, 15792, 13690, 14131, 14206, 14591, 14296, 14670, 14733, 15052, 14402, 14763, 14824, 15131, 14897, 15193, 15243, 15488, 14523, 14867, 14928, 15219, 14997, 15279, 15327, 15559, 15078, 15348, 15394, 15615, 15446, 15659, 15694, 15863, 14657, 14986, 15041, 15317, 15106, 15372, 15417, 15634, 15183, 15438, 15480, 15687, 15530, 15728, 15762, 15918, 15270, 15510, 15551, 15745, 15598, 15784, 15815, 15961, 15653, 15829, 15858, 15995, 15892, 16022, 16044, 16142, 12569, 13106, 13205, 13689, 13317, 13790, 13877, 14295, 13449, 13911, 13996, 14401, 14090, 14485, 14557, 14896, 13601, 14050, 14130, 14522, 14219, 14602, 14669, 14996, 14327, 14697, 14762, 15077, 14834, 15139, 15192, 15445, 13775, 14205, 14281, 14656, 14369, 14732, 14796, 15105, 14473, 14823, 14885, 15182, 14956, 15242, 15293, 15529, 14590, 14927, 14985, 15269, 15051, 15326, 15371, 15597, 15130, 15393, 15437, 15652, 15487, 15693, 15727, 15891, 13977, 14383, 14458, 14809, 14542, 14883, 14944, 15232, 14637, 14966, 15026, 15302, 15091, 15358, 15405, 15623, 14745, 15063, 15117, 15382, 15180, 15435, 15478, 15685, 15252, 15496, 15538, 15735, 15585, 15774, 15805, 15953, 14872, 15170, 15222, 15469, 15283, 15521, 15562, 15754, 15351, 15578, 15617, 15799, 15661, 15835, 15865, 16000, 15426, 15643, 15677, 15850, 15720, 15885, 15911, 16038, 15768, 15924, 15948, 16068, 15977, 16091, 16108, 16192, 14199, 14584, 14652, 14981, 14728, 15047, 15103, 15369, 14818, 15126, 15178, 15434, 15239, 15485, 15527, 15726, 14922, 15214, 15266, 15507, 15322, 15555, 15595, 15782, 15390, 15612, 15650, 15827, 15691, 15861, 15890, 16021, 15037, 15313, 15360, 15587, 15414, 15631, 15668, 15841, 15476, 15684, 15719, 15884, 15759, 15916, 15942, 16062, 15548, 15743, 15776, 15930, 15812, 15959, 15982, 16095, 15856, 15994, 16017, 16122, 16042, 16141, 16156, 16229, 15166, 15422, 15467, 15675, 15518, 15717, 15752, 15909, 15576, 15766, 15798, 15947, 15834, 15976, 15999, 16107, 15639, 15819, 15848, 15988, 15882, 16015, 16036, 16136, 15922, 16047, 16067, 16160, 16090, 16178, 16191, 16254, 15711, 15876, 15904, 16031, 15936, 16056, 16077, 16166, 15972, 16086, 16104, 16188, 16125, 16204, 16217, 16273, 16010, 16117, 16132, 16211, 16151, 16225, 16235, 16287, 16175, 16243, 16252, 16300, 16264, 16308, 16314, 16343, 12977, 13483, 13573, 14025, 13679, 14120, 14197, 14582, 13800, 14229, 14303, 14677, 14392, 14754, 14816, 15124, 13944, 14355, 14429, 14785, 14514, 14859, 14920, 15212, 14612, 14945, 15004, 15284, 15071, 15342, 15388, 15610, 14105, 14500, 14568, 14907, 14650, 14979, 15035, 15311, 14740, 15059, 15112, 15378, 15176, 15432, 15474, 15682, 14848, 15150, 15202, 15453, 15264, 15505, 15546, 15741, 15333, 15563, 15603, 15788, 15648, 15825, 15854, 15992, 14288, 14662, 14727, 15046, 14802, 15110, 15165, 15421, 14890, 15187, 15238, 15484, 15297, 15533, 15575, 15765, 14990, 15273, 15321, 15554, 15376, 15601, 15638, 15818, 15441, 15655, 15690, 15860, 15731, 15894, 15921, 16046, 15102, 15368, 15413, 15630, 15466, 15674, 15710, 15875, 15526, 15725, 15758, 15915, 15797, 15946, 15971, 16085, 15594, 15781, 15811, 15958, 15847, 15987, 16009, 16116, 15889, 16020, 16041, 16140, 16066, 16159, 16174, 16242, 14494, 14843, 14903, 15199, 14974, 15260, 15308, 15544, 15054, 15329, 15374, 15600, 15428, 15645, 15679, 15852, 15147, 15406, 15451, 15662, 15503, 15705, 15740, 15900, 15561, 15753, 15786, 15937, 15824, 15968, 15991, 16101, 15249, 15494, 15535, 15733, 15583, 15773, 15803, 15952, 15636, 15817, 15845, 15986, 15880, 16014, 16034, 16135, 15699, 15866, 15896, 16025, 15928, 16050, 16071, 16162, 15963, 16078, 16098, 16183, 16120, 16200, 16213, 16270, 15364, 15591, 15628, 15810, 15671, 15844, 15874, 16008, 15722, 15887, 15913, 16040, 15944, 16064, 16084, 16173, 15779, 15932, 15957, 16074, 15985, 16097, 16115, 16197, 16019, 16123, 16139, 16215, 16158, 16230, 16241, 16291, 15839, 15981, 16003, 16111, 16030, 16131, 16147, 16221, 16060, 16155, 16169, 16238, 16187, 16251, 16261, 16305, 16094, 16180, 16194, 16256, 16210, 16268, 16277, 16317, 16228, 16281, 16289, 16325, 16299, 16332, 16337, 16358, 14720, 15040, 15096, 15363, 15159, 15416, 15461, 15670, 15233, 15479, 15522, 15721, 15571, 15761, 15794, 15943, 15316, 15550, 15590, 15778, 15633, 15814, 15843, 15984, 15686, 15857, 15886, 16018, 15917, 16043, 16063, 16157, 15409, 15627, 15664, 15838, 15707, 15873, 15901, 16029, 15755, 15912, 15939, 16059, 15969, 16083, 16102, 16186, 15809, 15956, 15980, 16093, 16007, 16114, 16130, 16209, 16039, 16138, 16154, 16227, 16172, 16240, 16250, 16298, 15513, 15713, 15748, 15906, 15787, 15938, 15964, 16079, 15831, 15973, 15997, 16105, 16024, 16126, 16144, 16218, 15878, 16012, 16033, 16134, 16058, 16153, 16168, 16237, 16087, 16176, 16189, 16253, 16205, 16265, 16274, 16315, 15934, 16055, 16075, 16165, 16099, 16184, 16198, 16259, 16124, 16203, 16216, 16272, 16231, 16283, 16292, 16327, 16150, 16224, 16234, 16286, 16248, 16296, 16303, 16335, 16263, 16307, 16313, 16342, 16321, 16347, 16351, 16367, 15624, 15806, 15836, 15978, 15871, 16005, 16028, 16129, 15910, 16037, 16057, 16152, 16082, 16171, 16185, 16249, 15954, 16072, 16092, 16179, 16112, 16195, 16208, 16267, 16137, 16214, 16226, 16280, 16239, 16290, 16297, 16331, 16001, 16109, 16127, 16206, 16146, 16220, 16232, 16284, 16167, 16236, 16247, 16295, 16260, 16304, 16311, 16340, 16193, 16255, 16266, 16309, 16276, 16316, 16322, 16348, 16288, 16324, 16330, 16353, 16336, 16357, 16360, 16372, 16053, 16148, 16164, 16233, 16182, 16246, 16258, 16302, 16202, 16262, 16271, 16312, 16282, 16320, 16326, 16350, 16222, 16278, 16285, 16323, 16294, 16329, 16334, 16356, 16306, 16338, 16341, 16361, 16346, 16364, 16366, 16376, 16245, 16293, 16301, 16333, 16310, 16339, 16344, 16362, 16319, 16345, 16349, 16365, 16354, 16368, 16370, 16378, 16328, 16352, 16355, 16369, 16359, 16371, 16373, 16379, 16363, 16374, 16375, 16380, 16377, 16381, 16382, 16383;

$Z_i$(32768): 0, 1, 2, 6, 3, 8, 9, 20, 4, 10, 12, 24, 14, 28, 31, 55, 5, 13, 15, 29, 38, 64, 21, 39, 44, 73, 50, 82, 90, 138, 7, 17, 19, 37, 22, 42, 45, 77, 27, 49, 54, 89, 60, 98, 105, 161, 33, 57, 63, 101, 71, 112, 121, 181, 81, 125, 137, 201, 150, 219, 235, 330, 11, 23, 26, 47, 30, 53, 59, 95, 35, 61, 67, 107, 74, 117, 128, 190, 43, 72, 79, 123, 88, 136, 147, 216, 99, 151, 163, 237, 177, 256, 274, 382, 52, 86, 93, 144, 103, 157, 169, 246, 116, 175, 188, 271, 204, 291, 311, 429, 134, 198, 212, 301, 231, 326, 346, 473, 254, 355, 378, 512, 405, 547, 578, 761, 16, 32, 36, 62, 41, 70, 76, 120, 48, 80, 87, 135, 97, 149, 159, 233, 56, 91, 100, 152, 111, 167, 180, 259, 124, 185, 199, 284, 218, 308, 328, 449, 68, 109, 118, 178, 130, 194, 207, 296, 146, 215, 230, 325, 249, 350, 371, 505, 165, 239, 257, 359, 278, 386, 410, 553, 304, 419, 445, 597, 477, 636, 671, 875, 85, 133, 143, 211, 156, 229, 245, 344, 174, 253, 269, 376, 290, 403, 427, 575, 197, 281, 300, 414, 324, 444, 471, 629, 354, 482, 510, 677, 545, 720, 758, 980, 226, 320, 340, 466, 365, 497, 526, 698, 399, 540, 570, 752, 606, 796, 837, 1076, 440, 590, 623, 816, 663, 865, 909, 1162, 714, 927, 973, 1239, 1027, 1303, 1362, 1699, 25, 46, 51, 84, 58, 94, 102, 155, 66, 106, 115, 173, 127, 189, 203, 289, 78, 122, 132, 196, 145, 214, 228, 323, 162, 236, 252, 353, 272, 380, 402, 544, 92, 142, 153, 225, 168, 244, 260, 364, 186, 268, 286, 398, 309, 426, 451, 605, 210, 299, 319, 439, 343, 470, 496, 662, 375, 509, 539, 713, 574, 757, 795, 1026, 113, 170, 183, 263, 200, 285, 305, 420, 221, 312, 333, 455, 358, 487, 517, 685, 248, 349, 369, 503, 397, 538, 567, 749, 431, 581, 611, 803, 651, 852, 894, 1145, 282, 392, 415, 560, 446, 598, 631, 826, 483, 644, 679, 885, 722, 937, 983, 1251, 531, 705, 740, 961, 786, 1016, 1063, 1348, 843, 1084, 1134, 1431, 1197, 1505, 1569, 1940, 141, 209, 224, 317, 243, 342, 363, 494, 267, 374, 396, 536, 425, 573, 603, 792, 298, 412, 437, 587, 468, 626, 659, 861, 508, 674, 710, 922, 755, 976, 1022, 1297, 337, 462, 489, 653, 523, 694, 730, 948, 566, 747, 785, 1014, 833, 1071, 1121, 1415, 619, 812, 854, 1096, 904, 1157, 1210, 1520, 968, 1233, 1289, 1613, 1356, 1692, 1761, 2163, 391, 529, 559, 737, 596, 783, 824, 1059, 643, 841, 883, 1130, 935, 1194, 1248, 1564, 702, 914, 957, 1221, 1012, 1287, 1343, 1678, 1081, 1367, 1426, 1773, 1501, 1860, 1934, 2361, 776, 1002, 1050, 1331, 1109, 1400, 1462, 1815, 1184, 1488, 1553, 1920, 1630, 2010, 2090, 2539, 1275, 1598, 1664, 2051, 1745, 2146, 2227, 2698, 1846, 2261, 2346, 2833, 2449, 2950, 3052, 3629, 40, 69, 75, 119, 83, 131, 140, 208, 96, 148, 158, 232, 172, 251, 266, 373, 110, 166, 179, 258, 195, 279, 297, 411, 217, 306, 327, 447, 352, 479, 507, 673, 129, 192, 205, 293, 223, 316, 336, 461, 247, 347, 368, 501, 395, 535, 565, 746, 276, 384, 407, 550, 436, 586, 618, 811, 474, 632, 667, 870, 709, 921, 967, 1232, 154, 227, 242, 341, 261, 366, 389, 527, 288, 401, 424, 572, 453, 608, 641, 839, 321, 441, 467, 625, 499, 665, 700, 912, 542, 716, 754, 975, 799, 1030, 1079, 1365, 362, 493, 522, 693, 557, 735, 774, 1000, 602, 791, 832, 1070, 881, 1128, 1182, 1486, 658, 860, 903, 1156, 955, 1219, 1273, 1596, 1021, 1296, 1355, 1691, 1424, 1771, 1844, 2259, 191, 275, 292, 406, 315, 435, 459, 616, 345, 472, 498, 664, 533, 707, 742, 963, 383, 518, 548, 723, 585, 769, 808, 1040, 630, 825, 866, 1110, 919, 1174, 1227, 1539, 430, 579, 610, 801, 649, 849, 892, 1142, 699, 910, 954, 1217, 1008, 1282, 1339, 1673, 762, 984, 1032, 1309, 1090, 1377, 1439, 1788, 1163, 1463, 1527, 1890, 1605, 1980, 2060, 2504, 492, 657, 691, 901, 733, 952, 997, 1269, 789, 1019, 1066, 1351, 1125, 1420, 1481, 1838, 858, 1100, 1152, 1450, 1215, 1525, 1590, 1963, 1294, 1619, 1686, 2075, 1767, 2170, 2252, 2725, 944, 1205, 1260, 1579, 1325, 1656, 1725, 2121, 1409, 1754, 1826, 2238, 1912, 2336, 2424, 2921, 1513, 1873, 1950, 2379, 2041, 2482, 2575, 3091, 2155, 2613, 2709, 3241, 2822, 3368, 3481, 4105, 241, 339, 361, 491, 388, 525, 555, 732, 422, 569, 600, 788, 639, 836, 878, 1124, 465, 622, 656, 857, 697, 908, 951, 1214, 751, 972, 1018, 1293, 1075, 1361, 1419, 1766, 520, 690, 726, 943, 771, 996, 1044, 1324, 828, 1065, 1115, 1408, 1177, 1480, 1545, 1911, 900, 1151, 1204, 1512, 1268, 1589, 1655, 2040, 1350, 1685, 1753, 2154, 1837, 2251, 2335, 2821, 592, 778, 819, 1053, 868, 1112, 1166, 1466, 930, 1187, 1242, 1556, 1307, 1634, 1703, 2094, 1006, 1280, 1336, 1670, 1405, 1751, 1821, 2234, 1493, 1852, 1925, 2352, 2016, 2456, 2545, 3059, 1103, 1393, 1455, 1807, 1530, 1893, 1970, 2402, 1622, 2000, 2081, 2528, 2175, 2636, 2733, 3268, 1737, 2136, 2217, 2686, 2316, 2800, 2897, 3455, 2438, 2938, 3039, 3615, 3161, 3752, 3870, 4539, 688, 897, 940, 1200, 994, 1265, 1320, 1650, 1062, 1346, 1403, 1748, 1477, 1833, 1905, 2329, 1148, 1446, 1508, 1868, 1585, 1958, 2034, 2475, 1681, 2069, 2149, 2606, 2246, 2718, 2814, 3359, 1254, 1572, 1638, 2020, 1718, 2113, 2195, 2660, 1818, 2230, 2313, 2796, 2415, 2912, 3013, 3585, 1943, 2371, 2459, 2961, 2566, 3081, 3186, 3779, 2701, 3231, 3340, 3949, 3471, 4093, 4220, 4923, 1390, 1732, 1802, 2210, 1888, 2309, 2395, 2888, 1997, 2433, 2522, 3032, 2631, 3154, 3260, 3861, 2130, 2586, 2678, 3207, 2792, 3337, 3445, 4067, 2932, 3493, 3607, 4244, 3744, 4398, 4529, 5261, 2293, 2772, 2871, 3424, 2988, 3556, 3673, 4318, 3135, 3722, 3841, 4505, 3982, 4662, 4799, 5557, 3314, 3921, 4043, 4730, 4190, 4892, 5031, 5812, 4374, 5090, 5235, 6031, 5408, 6218, 6380, 7266, 65, 104, 114, 171, 126, 187, 202, 287, 139, 206, 222, 314, 240, 338, 360, 490, 160, 234, 250, 351, 270, 377, 400, 541, 295, 409, 434, 584, 464, 621, 655, 856, 184, 265, 283, 394, 307, 423, 448, 601, 334, 458, 485, 648, 519, 689, 725, 942, 372, 506, 534, 708, 571, 753, 790, 1020, 615, 807, 848, 1089, 899, 1150, 1203, 1511, 220, 310, 331, 452, 356, 484, 513, 680, 387, 524, 554, 731, 591, 777, 817, 1051, 428, 577, 607, 798, 647, 847, 888, 1138, 696, 907, 950, 1213, 1005, 1279, 1334, 1668, 480, 640, 675, 880, 717, 931, 977, 1244, 770, 995, 1043, 1323, 1101, 1391, 1453, 1805, 838, 1078, 1127, 1423, 1190, 1497, 1560, 1930, 1267, 1588, 1654, 2039, 1735, 2134, 2215, 2684, 264, 370, 393, 532, 421, 568, 599, 787, 456, 612, 645, 844, 686, 895, 938, 1198, 504, 670, 706, 918, 750, 971, 1017, 1292, 804, 1036, 1085, 1372, 1146, 1444, 1506, 1866, 561, 741, 779, 1007, 827, 1064, 1114, 1407, 886, 1135, 1188, 1494, 1252, 1570, 1636, 2018, 962, 1226, 1281, 1604, 1349, 1684, 1752, 2153, 1432, 1780, 1853, 2269, 1941, 2369, 2457, 2959, 638, 835, 877, 1123, 929, 1186, 1241, 1555, 992, 1263, 1318, 1648, 1387, 1729, 1799, 2207, 1074, 1360, 1418, 1765, 1492, 1851, 1924, 2351, 1583, 1956, 2032, 2473, 2127, 2583, 2675, 3204, 1176, 1479, 1544, 1910, 1621, 1999, 2080, 2527, 1716, 2111, 2193, 2658, 2290, 2769, 2868, 3421, 1836, 2250, 2334, 2820, 2437, 2937, 3038, 3614, 2564, 3079, 3184, 3777, 3311, 3918, 4040, 4727, 329, 450, 478, 637, 511, 678, 715, 928, 552, 728, 768, 991, 814, 1047, 1098, 1386, 604, 794, 834, 1073, 884, 1133, 1185, 1491, 946, 1208, 1262, 1582, 1328, 1661, 1728, 2126, 672, 876, 920, 1175, 974, 1240, 1295, 1620, 1039, 1317, 1376, 1715, 1448, 1798, 1871, 2289, 1122, 1417, 1478, 1835, 1554, 1923, 1998, 2436, 1647, 2031, 2110, 2563, 2206, 2674, 2768, 3310, 760, 982, 1029, 1305, 1088, 1375, 1435, 1783, 1160, 1459, 1523, 1884, 1602, 1976, 2055, 2497, 1250, 1568, 1632, 2014, 1714, 2109, 2188, 2653, 1812, 2224, 2305, 2788, 2409, 2906, 3004, 3576, 1364, 1701, 1770, 2173, 1856, 2272, 2357, 2845, 1961, 2391, 2480, 2984, 2590, 3107, 3213, 3808, 2092, 2543, 2634, 3159, 2747, 3286, 3394, 4011, 2884, 3441, 3552, 4186, 3690, 4339, 4468, 5196, 874, 1119, 1173, 1474, 1237, 1550, 1617, 1993, 1314, 1643, 1711, 2104, 1794, 2201, 2284, 2761, 1413, 1759, 1830, 2243, 1917, 2343, 2429, 2928, 2026, 2465, 2556, 3069, 2667, 3194, 3301, 3906, 1538, 1902, 1979, 2412, 2073, 2518, 2611, 3131, 2185, 2648, 2744, 3281, 2859, 3410, 3523, 4152, 2326, 2811, 2909, 3468, 3028, 3603, 3718, 4370, 3174, 3765, 3885, 4554, 4028, 4713, 4850, 5613, 1697, 2087, 2168, 2627, 2267, 2741, 2839, 3386, 2386, 2878, 2977, 3543, 3100, 3682, 3799, 4457, 2536, 3049, 3150, 3740, 3278, 3882, 4001, 4684, 3433, 4053, 4175, 4875, 4329, 5043, 5183, 5976, 2723, 3256, 3366, 3978, 3499, 4124, 4252, 4958, 3659, 4302, 4433, 5156, 4591, 5328, 5477, 6293, 3857, 4525, 4658, 5404, 4819, 5580, 5731, 6569, 5014, 5793, 5947, 6802, 6133, 7002, 7173, 8114, 417, 563, 594, 781, 634, 830, 872, 1117, 682, 890, 933, 1192, 987, 1257, 1312, 1641, 744, 965, 1010, 1285, 1068, 1353, 1411, 1757, 1140, 1437, 1499, 1858, 1576, 1947, 2024, 2463, 822, 1057, 1107, 1398, 1171, 1472, 1536, 1900, 1246, 1562, 1628, 2008, 1709, 2102, 2183, 2646, 1341, 1676, 1743, 2144, 1828, 2241, 2324, 2809, 1932, 2359, 2447, 2948, 2554, 3067, 3172, 3763, 924, 1180, 1235, 1548, 1299, 1625, 1694, 2084, 1381, 1722, 1792, 2199, 1877, 2297, 2383, 2875, 1484, 1842, 1915, 2341, 2005, 2444, 2533, 3046, 2118, 2572, 2665, 3192, 2778, 3321, 3430, 4050, 1615, 1991, 2071, 2516, 2165, 2624, 2720, 3253, 2282, 2759, 2857, 3408, 2974, 3540, 3656, 4299, 2427, 2926, 3026, 3601, 3147, 3737, 3854, 4522, 3299, 3904, 4026, 4711, 4172, 4872, 5011, 5790, 1054, 1337, 1394, 1738, 1468, 1823, 1895, 2318, 1557, 1926, 2001, 2439, 2096, 2547, 2638, 3163, 1671, 2058, 2137, 2593, 2235, 2706, 2801, 3345, 2353, 2841, 2939, 3501, 3060, 3638, 3753, 4407, 1808, 2218, 2301, 2782, 2404, 2899, 2999, 3569, 2529, 3040, 3144, 3732, 3270, 3872, 3994, 4675, 2687, 3216, 3325, 3933, 3456, 4077, 4203, 4905, 3616, 4254, 4385, 5103, 4540, 5272, 5421, 6232, 1986, 2421, 2510, 3019, 2619, 3141, 3247, 3847, 2752, 3291, 3399, 4016, 3532, 4163, 4289, 5000, 2918, 3478, 3591, 4227, 3729, 4382, 4512, 5243, 3895, 4566, 4699, 5447, 4862, 5627, 5777, 6618, 3122, 3707, 3825, 4487, 3967, 4645, 4781, 5537, 4140, 4836, 4976, 5750, 5141, 5930, 6088, 6953, 4356, 5071, 5215, 6010, 5388, 6197, 6358, 7243, 5597, 6422, 6588, 7488, 6783, 7697, 7879, 8861, 1230, 1542, 1609, 1984, 1689, 2078, 2159, 617, 1786, 2191, 2275, 2750, 2376, 2866, 2966, 3530, 1908, 2333, 2419, 2917, 2525, 3037, 3139, 3728, 2656, 3183, 3289, 3894, 3419, 4039, 4161, 4861, 2064, 2508, 2601, 3120, 2713, 3245, 3354, 3965, 2848, 3397, 3511, 4138, 3646, 4287, 4418, 5139, 3017, 3590, 3705, 4355, 3845, 4511, 4643, 5387, 4014, 4698, 4834, 5596, 4998, 5776, 5928, 6782, 2257, 2730, 2828, 3374, 2945, 3507, 3623, 4261, 3088, 3668, 3786, 4442, 3929, 4602, 4738, 5488, 3265, 3868, 3988, 4670, 4134, 4831, 4969, 5744, 4313, 5027, 5167, 5960, 5341, 6148, 6306, 7188, 3487, 4111, 4238, 4943, 4391, 5109, 5254, 6052, 4576, 5311, 5460, 6274, 5638, 6466, 6632, 7535, 4805, 5565, 5714, 6551, 5896, 6748, 6914, 7839, 6115, 6984, 7152, 8093, 7359, 8313, 8497, 9516, 2502, 3009, 3112, 3695, 3238, 3836, 3956, 4632, 3390, 4005, 4128, 4823, 4279, 4988, 5128, 5916, 3581, 4217, 4344, 5059, 4500, 5231, 5375, 6184, 4688, 5435, 5584, 6408, 5764, 6604, 6769, 7682, 3813, 4473, 4608, 5347, 4768, 5522, 5673, 6505, 4962, 5735, 5890, 6740, 6073, 6937, 7108, 8045, 5201, 5995, 6153, 7023, 6343, 7227, 7400, 8355, 6573, 7471, 7651, 8619, 7863, 8843, 9037, 10079, 4102, 4794, 4932, 5701, 5100, 5885, 6041, 6901, 5301, 6103, 6261, 7138, 6455, 7346, 7521, 8482, 5552, 6376, 6537, 7435, 6735, 7647, 7825, 8804, 6970, 7898, 8078, 9072, 8298, 9305, 9500, 10563, 5855, 6701, 6869, 7789, 7071, 8004, 8188, 9188, 7312, 8261, 8448, 9463, 8670, 9696, 9897, 10979, 7611, 8579, 8766, 9798, 8995, 10037, 10238, 11334, 9267, 10320, 10525, 11630, 10770, 11882, 12098, 13250, 108, 164, 176, 255, 193, 277, 294, 408, 213, 302, 322, 442, 348, 475, 502, 668, 238, 335, 357, 486, 385, 521, 551, 727, 416, 562, 593, 780, 633, 829, 871, 1116, 273, 381, 404, 546, 433, 583, 614, 806, 469, 627, 661, 863, 704, 916, 960, 1224, 516, 684, 721, 936, 767, 990, 1038, 1316, 821, 1056, 1106, 1397, 1170, 1471, 1535, 1899, 318, 438, 463, 620, 495, 660, 695, 905, 537, 748, 969, 793, 1023, 1072, 1357, 588, 773, 813, 1046, 862, 1105, 1158, 1457, 923, 1179, 1234, 1547, 1298, 1624, 1693, 2083, 654, 855, 898, 1149, 949, 1211, 1266, 1586, 1015, 1290, 1347, 1682, 1416, 1762, 1834, 2247, 1097, 1385, 1447, 1797, 1521, 1882, 1959, 2389, 1614, 1990, 2070, 2515, 2164, 2623, 2719, 3252, 379, 514, 543, 718, 580, 764, 802, 1034, 624, 818, 859, 1102, 911, 1165, 1218, 1529, 681, 889, 932, 1191, 986, 1256, 1311, 1640, 1052, 1335, 1392, 1736, 1465, 1820, 1892, 2315, 756, 978, 1025, 1301, 1083, 1370, 1430, 1778, 1155, 1454, 1518, 1879, 1595, 1969, 2048, 2490, 1245, 1561, 1627, 2007, 1708, 2101, 2182, 2645, 1806, 2216, 2299, 2780, 2401, 2896, 2996, 3566, 851, 1093, 1144, 1442, 1207, 1516, 1581, 1953, 1284, 1608, 1675, 2063, 1756, 2158, 2240, 2712, 1380, 1721, 1791, 2198, 1876, 2296, 2382, 2874, 1983, 2418, 2507, 3016, 2616, 3138, 3244, 3844, 1504, 1864, 1939, 2367, 2030, 2470, 2562, 3076, 2143, 2600, 2695, 3225, 2808, 3353, 3465, 4087, 2281, 2758, 2856, 3407, 2973, 3539, 3655, 4298, 3119, 3704, 3822, 4484, 3964, 4642, 4778, 5534, 460, 617, 650, 850, 692, 902, 945, 1206, 743, 964, 1009, 1283, 1067, 1352, 1410, 1755, 809, 1041, 1091, 1378, 1153, 1451, 1514, 1874, 1228, 1540, 1606, 1981, 1687, 2076, 2156, 2614, 893, 1143, 1196, 1503, 1261, 1580, 1646, 2029, 1340, 1674, 1742, 2142, 1827, 2239, 2323, 2807, 1440, 1789, 1862, 2279, 1951, 2380, 2468, 2971, 2061, 2505, 2598, 3117, 2710, 3242, 3351, 3962, 999, 1271, 1327, 1658, 1396, 1740, 1810, 2220, 1483, 1840, 1914, 2338, 2004, 2442, 2532, 3043, 1592, 1965, 2043, 2484, 2139, 2595, 2689, 3218, 2254, 2727, 2824, 3370, 2942, 3504, 3619, 4257, 1727, 2123, 2205, 2671, 2303, 2784, 2882, 3437, 2426, 2923, 3025, 3598, 3146, 3734, 3853, 4519, 2577, 3093, 3198, 3792, 3327, 3935, 4057, 4745, 3483, 4107, 4234, 4939, 4387, 5105, 5250, 6048, 1139, 1436, 1498, 1857, 1575, 1946, 2023, 2462, 1669, 2056, 2135, 2591, 2233, 2704, 2799, 3343, 1784, 2189, 2273, 2748, 2374, 2864, 2964, 3528, 2498, 3005, 3108, 3691, 3234, 3832, 3952, 4628, 1931, 2358, 2446, 2947, 2553, 3066, 3171, 3762, 2685, 3214, 3323, 3931, 3454, 4075, 4201, 4903, 2846, 3395, 3509, 4136, 3644, 4285, 4416, 5137, 3809, 4469, 4604, 5343, 4764, 5518, 5669, 6501, 2117, 2570, 2664, 3190, 2777, 3319, 3429, 4048, 2916, 3475, 3589, 4224, 3727, 4379, 4510, 5240, 3085, 3665, 3783, 4439, 3926, 4599, 4735, 5485, 4097, 4789, 4927, 5696, 5095, 5880, 6036, 6896, 3298, 3902, 4025, 4709, 4171, 4870, 5010, 5788, 4354, 5068, 5213, 6007, 5386, 6194, 6356, 7240, 4573, 5308, 5457, 6271, 5635, 6463, 6629, 7532, 5850, 6696, 6864, 7784, 7066, 7999, 8183, 9183, 576, 759, 797, 1028, 846, 1087, 1137, 1434, 906, 1159, 1212, 1522, 1278, 1601, 1667, 2054, 981, 1249, 1304, 1631, 1374, 1713, 1782, 2187, 1458, 1811, 1883, 2304, 1975, 2408, 2496, 3003, 1077, 1363, 1422, 1769, 1496, 1855, 1929, 2356, 1587, 1960, 2038, 2479, 2133, 2589, 2683, 3212, 1700, 2091, 2172, 2633, 2271, 2746, 2844, 3393, 2390, 2883, 2983, 3551, 3106, 3689, 3807, 4467, 1201, 1509, 1573, 1944, 1651, 2035, 2114, 2567, 1749, 2150, 2231, 2702, 2330, 2815, 2913, 3472, 1869, 2287, 2372, 2862, 2476, 2980, 3082, 3662, 2607, 3127, 3232, 3830, 3360, 3972, 4094, 4786, 2021, 2460, 2551, 3064, 2661, 3187, 3295, 3899, 2797, 3341, 3452, 4073, 3586, 4221, 4351, 5065, 2962, 3526, 3642, 4283, 3780, 4436, 4570, 5305, 3950, 4626, 4762, 5516, 4924, 5693, 5847, 6693, 1359, 1696, 1764, 2167, 1850, 2266, 2350, 2838, 1955, 2385, 2472, 2976, 2582, 3099, 3203, 3798, 2086, 2535, 2626, 3149, 2740, 3277, 3385, 4000, 2877, 3432, 3542, 4174, 3681, 4328, 4456, 5182, 2249, 2722, 2819, 3365, 2936, 3498, 3613, 4251, 3078, 3658, 3776, 4432, 3917, 4590, 4726, 5476, 3255, 3856, 3977, 4657, 4123, 4818, 4957, 5730, 4301, 5013, 5155, 5946, 5327, 6132, 6292, 7172, 2454, 2956, 3057, 3635, 3180, 3772, 3891, 4561, 3333, 3942, 4063, 4752, 4212, 4915, 5054, 5836, 3519, 4148, 4274, 4983, 4427, 5150, 5294, 6096, 4617, 5358, 5504, 6323, 5683, 6517, 6680, 7588, 3750, 4404, 4537, 5269, 4695, 5442, 5593, 6417, 4888, 5654, 5808, 6650, 5990, 6847, 7018, 7947, 5123, 5911, 6068, 6932, 6254, 7131, 7305, 8254, 6484, 7378, 7555, 8519, 7765, 8741, 8933, 9972, 1567, 1937, 2013, 2452, 2108, 2560, 2652, 3178, 2223, 2693, 2787, 3331, 2905, 3463, 3575, 4210, 2364, 2853, 2953, 3516, 3073, 3652, 3769, 4424, 3222, 3819, 3939, 4614, 4084, 4775, 4912, 5680, 2542, 3055, 3158, 3748, 3285, 3889, 4010, 4693, 3440, 4061, 4185, 4886, 4338, 5052, 5195, 5988, 3632, 4271, 4401, 5120, 4558, 5291, 5439, 6251, 4749, 5501, 5651, 6481, 5833, 6677, 6844, 7762, 2766, 3306, 3415, 4033, 3548, 4180, 4307, 5019, 3714, 4364, 4494, 5223, 4652, 5396, 5544, 6366, 3911, 4583, 4718, 5467, 4880, 5646, 5798, 6640, 5079, 5863, 6018, 6877, 6205, 7079, 7251, 8196, 4157, 4855, 4994, 5770, 5161, 5952, 6109, 6976, 5369, 6176, 6337, 7219, 6529, 7425, 7603, 8569, 5618, 6444, 6609, 7510, 6807, 7722, 7903, 8886, 7047, 7978, 8161, 9159, 8381, 9391, 9589, 10656, 3048, 3625, 1739, 4393, 3881, 4550, 4683, 5430, 4052, 4740, 4874, 5640, 5042, 5823, 5975, 6832, 4263, 4971, 5111, 5898, 5282, 6083, 6241, 7117, 5490, 6308, 6468, 7361, 6665, 7572, 7748, 8723, 4524, 5256, 5403, 6213, 5579, 6403, 6568, 7466, 5792, 6634, 6801, 7716, 7001, 7930, 8113, 9108, 6054, 6916, 7086, 8021, 7290, 8237, 8423, 9436, 7537, 8499, 8688, 9715, 8914, 9951, 10153, 11245, 4846, 5608, 5759, 6598, 5941, 6795, 6963, 7890, 6165, 7035, 7205, 8147, 7413, 8368, 8554, 9574, 6433, 7323, 7498, 8458, 7709, 8682, 8872, 9908, 7964, 8952, 9143, 10191, 9376, 10435, 10639, 11748, 6764, 7676, 7858, 8837, 8071, 9064, 9260, 10312, 8332, 9339, 9538, 10601, 9772, 10847, 11058, 12178, 8646, 9670, 9870, 10950, 10108, 11198, 11409, 12543, 10394, 11494, 11707, 12850, 11960, 13109, 13330, 14508, 738, 958, 1003, 1276, 1060, 1344, 1401, 1746, 1131, 1427, 1489, 1847, 1565, 1935, 2011, 2450, 1222, 1533, 1599, 1973, 1679, 2067, 2147, 2604, 1774, 2178, 2262, 2736, 2362, 2851, 2951, 3514, 1332, 1665, 1733, 2131, 1816, 2228, 2311, 2794, 1921, 2347, 2434, 2933, 2540, 3053, 3156, 3746, 2052, 2494, 2587, 3104, 2699, 3229, 3338, 3947, 2834, 3381, 3494, 4119, 3630, 4269, 4399, 5118, 1475, 1831, 1903, 2327, 1994, 2430, 2519, 3029, 2106, 2558, 2650, 3176, 2763, 3303, 3412, 4030, 2244, 2716, 2812, 3357, 2929, 3490, 3604, 4241, 3071, 3650, 3767, 4422, 3908, 4580, 4715, 5464, 2413, 2910, 3011, 3583, 3132, 3719, 3838, 4502, 3283, 3887, 4008, 4691, 4154, 4852, 4991, 5767, 3469, 4091, 4218, 4921, 4371, 5087, 5232, 6028, 4556, 5289, 5437, 6249, 5615, 6441, 6606, 7507, 1659, 2045, 2124, 2579, 2221, 2691, 2785, 3329, 2339, 2826, 2924, 3485, 3044, 3621, 3735, 4389, 2486, 2992, 3095, 3677, 3220, 3817, 3937, 4612, 3372, 3986, 4109, 4803, 4259, 4967, 5107, 5894, 2672, 3200, 3308, 3914, 3438, 4059, 4183, 4884, 3599, 4236, 4366, 5082, 4520, 5252, 5399, 6209, 3794, 4452, 4586, 5323, 4747, 5499, 5649, 6479, 4941, 5712, 5866, 6714, 6050, 6912, 7082, 8017, 2903, 3461, 3573, 4208, 3711, 4361, 4491, 5220, 3877, 4546, 4679, 5426, 4841, 5603, 5754, 6593, 4082, 4773, 4910, 5678, 5076, 5860, 6015, 6874, 5278, 6079, 6237, 7113, 6428, 7318, 7493, 8453, 4336, 5050, 5193, 5986, 5366, 6173, 6334, 7216, 5575, 6399, 6564, 7462, 6759, 7671, 7853, 8832, 5831, 6675, 6842, 7760, 7044, 7975, 8158, 9156, 7286, 8233, 8419, 9432, 8641, 9665, 9865, 10945, 1897, 2320, 2406, 2901, 2512, 3021, 3124, 3709, 2641, 3166, 3273, 3875, 3402, 4019, 4143, 4839, 2803, 3347, 3458, 4079, 3593, 4229, 4358, 5073, 3756, 4410, 4543, 5275, 4702, 5450, 5600, 6425, 3001, 3571, 3687, 4334, 3827, 4489, 4623, 5364, 3996, 4677, 4814, 5573, 4978, 5752, 5906, 6757, 4205, 4907, 5047, 5828, 5217, 6012, 6170, 7041, 5423, 6234, 6396, 7283, 6590, 7490, 7668, 8638, 3249, 3849, 3969, 4647, 4115, 4809, 4947, 5718, 4293, 5004, 5145, 5934, 5317, 6121, 6280, 7158, 4514, 5245, 5390, 6199, 5568, 6392, 6554, 7452, 5781, 6622, 6787, 7701, 6989, 7918, 8098, 9093, 4783, 5539, 5690, 6524, 5872, 6720, 6888, 7810, 6091, 6956, 7126, 8064, 7332, 8282, 8468, 9484, 6360, 7245, 7419, 8375, 7630, 8598, 8787, 9819, 7882, 8864, 9056, 10100, 9288, 10342, 10546, 11652, 3562, 4196, 4324, 5037, 4479, 5207, 5353, 6159, 4668, 5414, 5563, 6386, 5742, 6580, 6746, 7657, 4897, 5663, 5817, 6659, 6000, 6857, 7028, 7957, 6223, 7097, 7271, 8216, 7477, 8435, 8624, 9646, 5178, 5970, 6128, 6996, 6318, 7199, 7373, 8326, 6549, 7446, 7625, 8592, 7837, 8815, 9009, 10050, 6826, 7742, 7924, 8908, 8140, 9136, 9332, 10387, 8402, 9413, 9612, 10680, 9846, 10924, 11135, 12258, 5529, 6350, 6512, 7407, 6708, 7618, 7796, 8773, 6945, 7871, 8052, 9044, 8269, 9275, 9470, 10532, 7233, 8176, 8361, 9369, 8585, 9606, 9804, 10880, 8850, 9884, 10085, 11173, 10327, 11425, 11636, 12776, 7583, 8548, 8736, 9766, 8964, 10004, 10205, 11300, 9238, 10289, 10494, 11598, 10738, 11849, 12064, 13216, 9567, 10632, 10840, 11953, 11090, 12211, 12429, 13586, 11384, 12516, 12735, 13899, 12995, 14165, 14390, 15578, 2211, 2679, 2773, 3315, 2890, 3447, 3558, 4192, 3033, 3608, 3723, 4375, 3863, 4531, 4664, 5410, 3208, 3803, 3922, 4595, 4068, 4757, 4893, 5659, 4245, 4951, 5091, 5876, 5262, 6061, 6219, 7093, 3425, 4044, 4168, 4867, 4320, 5033, 5175, 5967, 4506, 5236, 5383, 6191, 5559, 6382, 6546, 7443, 4731, 5481, 5632, 6460, 5813, 6655, 6823, 7739, 6032, 6892, 7063, 7996, 7267, 8212, 8399, 9410, 3697, 4346, 4475, 5203, 4634, 5377, 5524, 6345, 4826, 5587, 5738, 6576, 5919, 6772, 6940, 7866, 5060, 5842, 5996, 6853, 6185, 7057, 7228, 8171, 6410, 7298, 7473, 8431, 7684, 8655, 8845, 9879, 5349, 6155, 6315, 7196, 6507, 7402, 7579, 8544, 6742, 7653, 7834, 8812, 8047, 9039, 9234, 10285, 7024, 7953, 8137, 9133, 8356, 9364, 9563, 10628, 8620, 9642, 9843, 10921, 10080, 11168, 11380, 12512, 4035, 4721, 4857, 5621, 5022, 5802, 5955, 6811, 5225, 6021, 6178, 7050, 6369, 7255, 7428, 8385, 5470, 6286, 6447, 7338, 6643, 7548, 7725, 8698, 6880, 7802, 7981, 8970, 8199, 9201, 9394, 10453, 5772, 6612, 6779, 7692, 6979, 7907, 8089, 9083, 7221, 8164, 8350, 9358, 8572, 9593, 9792, 10868, 7513, 8474, 8663, 9689, 8889, 9925, 10127, 11218, 9162, 10211, 10415, 11517, 10659, 11768, 11982, 13132, 6143, 7012, 7183, 8124, 7389, 8343, 8530, 9549, 7640, 8608, 8797, 9829, 9025, 10067, 10270, 11366, 7940, 8926, 9118, 10164, 9350, 10407, 10612, 11719, 9629, 10699, 10905, 12021, 11154, 12279, 12496, 13655, 8308, 9314, 9512, 10574, 9746, 10820, 11030, 12149, 10030, 11116, 11328, 12457, 11577, 12715, 12936, 14104, 10367, 11466, 11679, 12821, 11931, 13079, 13300, 14477, 12237, 13391, 13614, 14795, 13877, 15060, 15288, 16483, 4463, 5189, 5334, 6139, 5511, 6330, 6491, 7385, 5724, 6560, 6726, 7636, 6925, 7849, 8030, 9021, 5981, 6838, 7007, 7936, 7211, 8154, 8338, 9346, 7457, 8415, 8603, 9625, 8827, 9861, 10062, 11150, 6299, 7179, 7353, 8305, 7562, 8526, 8714, 9743, 7816, 8793, 8987, 10027, 9216, 10266, 10471, 11574, 8119, 9114, 9310, 10364, 9544, 10608, 10816, 11928, 9824, 10901, 11112, 12234, 11361, 12492, 12711, 13874, 6688, 7596, 7773, 8749, 7990, 8979, 9171, 10220, 8247, 9251, 9446, 10507, 9681, 107511, 10961, 12079, 8561, 9582, 9779, 10855, 10019, 11106, 11315, 12445, 10302, 11400, 11611, 12751, 11864, 13012, 13231, 14407, 8941, 9980, 10181, 11275, 10423, 11525, 11737, 12882, 10714, 11824, 12039, 13190, 12295, 13450, 13673, 14855, 11065, 12186, 12403, 13560, 12663, 13826, 14050, 15235, 12970, 14140, 14364, 15552, 14630, 15822, 16049, 17244, 7166, 8106, 8290, 9296, 8512, 9530, 9727, 10801, 8780, 9811, 10011, 11097, 10252, 11347, 11557, 12695, 9100, 10146, 10349, 11448, 10592, 11699, 11912, 13060, 10886, 12002, 12217, 13371, 12475, 13634, 13856, 15039, 9492, 10554, 10763, 11874, 11010, 12129, 12347, 13503, 11307, 12436, 12656, 13818, 12915, 14083, 14308, 15495, 11659, 12800, 13020, 14191, 13280, 14456, 14681, 15873, 13592, 14772, 14999, 16193, 15266, 16460, 16688, 17881, 9965, 11050, 11258, 12387, 11509, 12647, 12864, 14033, 11810, 12956, 13173, 14348, 13435, 14615, 14838, 16033, 12169, 13322, 13543, 14723, 13809, 14992, 15218, 16413, 14123, 15309, 15534, 16729, 15805, 17000, 17227, 18415, 12604, 13766, 13990, 15175, 14254, 15442, 15669, 16865, 14572, 15763, 15991, 17186, 16257, 17453, 17680, 18864, 14948, 16142, 16369, 17564, 16638, 17832, 18058, 19238, 16956, 18147, 18373, 19548, 18638, 19807, 20028, 21167, 182, 262, 280, 390, 303, 418, 443, 595, 332, 454, 481, 642, 515, 683, 719, 934, 367, 500, 528, 701, 564, 745, 782, 1011, 609, 800, 840, 1080, 891, 1141, 1193, 1500, 413, 558, 589, 775, 628, 823, 864, 1108, 676, 882, 926, 1183, 979, 1247, 1302, 1629, 736, 956, 1001, 1274, 1058, 1342, 1399, 1744, 1129, 1425, 1487, 1845, 1563, 1933, 2009, 2448, 476, 635, 669, 873, 712, 925, 970, 1236, 765, 988, 1035, 1313, 1094, 1382, 1443, 1793, 831, 1069, 1118, 1412, 1181, 1485, 1549, 1916, 1258, 1577, 1642, 2025, 1723, 2119, 2200, 2666, 917, 1172, 1225, 1537, 1291, 1616, 1683, 2072, 1371, 1710, 1779, 2184, 1865, 2283, 2368, 2858, 1473, 1829, 1901, 2325, 1992, 2428, 2517, 3027, 2103, 2555, 2647, 3173, 2760, 3300, 3409, 4027, 556, 734, 772, 998, 820, 1055, 1104, 1395, 879, 1126, 1178, 1482, 1243, 1558, 1623, 2002, 953, 1216, 1270, 1591, 1338, 1672, 1739, 2138, 1421, 1768, 1839, 2253, 1927, 2354, 2440, 2940, 1045, 1326, 1384, 1726, 1456, 1809, 1881, 2302, 1546, 1913, 1989, 2425, 2082, 2530, 2622, 3145, 1657, 2042, 2122, 2576, 2219, 2688, 2783, 3326, 2337, 2823, 2922, 3482, 3041, 3617, 3733, 4386, 1168, 1469, 1532, 1896, 1611, 1987, 2066, 2511, 1705, 2097, 2177, 2639, 2277, 2753, 2850, 3400, 1824, 2236, 2319, 2802, 2422, 2919, 3020, 3592, 2548, 3061, 3164, 3754, 3292, 3896, 4017, 4700, 1972, 2405, 2493, 3000, 2603, 3123, 3228, 3826, 2735, 3271, 3380, 3995, 3513, 4141, 4268, 4977, 2900, 3457, 3570, 4204, 3708, 4357, 4488, 5216, 3873, 4541, 4676, 5422, 4837, 5598, 5751, 6589, 666, 869, 913, 1167, 966, 1231, 1286, 1610, 1031, 1308, 1366, 1704, 1438, 1787, 1859, 2276, 1113, 1406, 1467, 1822, 1543, 1909, 1985, 2420, 1635, 2017, 2095, 2546, 2192, 2657, 2751, 3290, 1220, 1531, 1597, 1971, 1677, 2065, 2145, 2602, 1772, 2176, 2260, 2734, 2360, 2849, 2949, 3512, 1894, 2317, 2403, 2898, 2509, 3018, 3121, 3706, 2637, 3162, 3269, 3871, 3398, 4015, 4139, 4835, 1354, 1690, 1758, 2160, 1843, 2258, 2342, 2829, 1948, 2377, 2464, 2967, 2573, 3089, 3193, 3787, 2079, 2526, 2618, 3140, 2731, 3266, 3375, 3989, 2867, 3420, 3531, 4162, 3669, 4314, 4443, 5168, 2242, 2714, 2810, 3355, 2927, 3488, 3602, 4239, 3068, 3647, 3764, 4419, 3905, 4577, 4712, 5461, 3246, 3846, 3966, 4644, 4112, 4806, 4944, 5715, 4288, 4999, 5140, 5929, 5312, 6116, 6275, 7153, 1526, 1889, 1964, 2396, 2059, 2503, 2594, 3113, 2171, 2632, 2726, 3261, 2842, 3391, 3502, 4129, 2310, 2793, 2889, 3446, 3010, 3582, 3696, 4345, 3155, 3745, 3862, 4530, 4006, 4689, 4824, 5585, 2483, 2989, 3092, 3674, 3217, 3814, 3934, 4609, 3369, 3983, 4106, 4800, 4255, 4963, 5104, 5891, 3557, 4191, 4319, 5032, 4474, 5202, 5348, 6154, 4663, 5409, 5558, 6381, 5736, 6574, 6741, 7652, 2707, 3239, 3346, 3957, 3479, 4103, 4228, 4933, 3639, 4280, 4408, 5129, 4567, 5302, 5448, 6262, 3837, 4501, 4633, 5376, 4795, 5553, 5702, 6538, 4989, 5765, 5917, 6770, 6104, 6971, 7139, 8079, 4078, 4769, 4906, 5674, 5072, 5856, 6011, 6870, 5273, 6074, 6233, 7109, 6423, 7313, 7489, 8449, 5523, 6344, 6506, 7401, 6702, 7612, 7790, 8767, 6938, 7864, 8046, 9038, 8262, 9268, 9464, 10526, 815, 1049, 1099, 1389, 1161, 1461, 1524, 1887, 1238, 1552, 1618, 1996, 1698, 2089, 2169, 2630, 1330, 1663, 1731, 2129, 1814, 2226, 2308, 2791, 1919, 2345, 2432, 2931, 2538, 3051, 3153, 3743, 1449, 1801, 1872, 2292, 1962, 2394, 2481, 2987, 2074, 2521, 2612, 3134, 2724, 3259, 3367, 3981, 2209, 2677, 2771, 3313, 2887, 3444, 3555, 4189, 3031, 3606, 3721, 4373, 3860, 4528, 4661, 5407, 1603, 1978, 2057, 2501, 2152, 2610, 2705, 3237, 2268, 2743, 2840, 3389, 2958, 3522, 3637, 4278, 2411, 2908, 3008, 3580, 3130, 3717, 3835, 4499, 3280, 3884, 4004, 4687, 4151, 4849, 4987, 5763, 2592, 3111, 3215, 3812, 3344, 3955, 4076, 4767, 3500, 4127, 4253, 4961, 4406, 5127, 5271, 6072, 3694, 4343, 4472, 5200, 4631, 5374, 5521, 6342, 4822, 5583, 5734, 6572, 5915, 6768, 6936, 7862, 1796, 2204, 2286, 2765, 2388, 2881, 2979, 3547, 2514, 3024, 3126, 3713, 3251, 3852, 3971, 4651, 2670, 3197, 3305, 3910, 3436, 4056, 4179, 4879, 3597, 4233, 4363, 5078, 4518, 5249, 5395, 6204, 2861, 3414, 3525, 4156, 3661, 4306, 4435, 5160, 3829, 4493, 4625, 5368, 4785, 5543, 5692, 6528, 4032, 4717, 4854, 5617, 5018, 5797, 5951, 6806, 5222, 6017, 6175, 7046, 6365, 7250, 7424, 8380, 3103, 3686, 3802, 4462, 3946, 4622, 4756, 5510, 4118, 4813, 4950, 5723, 5117, 5905, 6060, 6924, 4333, 5046, 5188, 5980, 5363, 6169, 6329, 7210, 5572, 6395, 6559, 7456, 6756, 7667, 7848, 8826, 4594, 5333, 5480, 6298, 5658, 6490, 6654, 7561, 5875, 6725, 6891, 7815, 7092, 8029, 8211, 9215, 6138, 7006, 7178, 8118, 7384, 8337, 8525, 9543, 7635, 8602, 8792, 9823, 9020, 10061, 10265, 11360, 2050, 2492, 2585, 3102, 2697, 3227, 3336, 3945, 2832, 3379, 3492, 4117, 3628, 4267, 4397, 5116, 2998, 3568, 3684, 4331, 3824, 4486, 4620, 5361, 3993, 4674, 4811, 5570, 4975, 5749, 5903, 6754, 3206, 3801, 3920, 4593, 4066, 4755, 4891, 5657, 4243, 4949, 5089, 5874, 5260, 6059, 6217, 7091, 4459, 5185, 5330, 6135, 5507, 6326, 6487, 7381, 5720, 6556, 6722, 7632, 6921, 7845, 8026, 9017, 3467, 4089, 4216, 4919, 4369, 5085, 5230, 6026, 4553, 5286, 5434, 6246, 5612, 6438, 6603, 7504, 4780, 5536, 5687, 6521, 5869, 6717, 6885, 7807, 6087, 6952, 7122, 8060, 7328, 8278, 8464, 9480, 5058, 5840, 5994, 6851, 6183, 7055, 7226, 8169, 6407, 7295, 7470, 8428, 7681, 8652, 8842, 9876, 6684, 7592, 7769, 8745, 7986, 8975, 9167, 10216, 8242, 9246, 9441, 10502, 9676, 10748, 10956, 12074, 3791, 4449, 4582, 5319, 4744, 5496, 5645, 6475, 4938, 5709, 5862, 6710, 6047, 6909, 7078, 8013, 5174, 5966, 6123, 6991, 6314, 7195, 7368, 8321, 6545, 7442, 7620, 8587, 7833, 8811, 9004, 10045, 5466, 6282, 6443, 7334, 6639, 7544, 7721, 8694, 6876, 7798, 7977, 8966, 8195, 9197, 9390, 10449, 7160, 8100, 8284, 9290, 8506, 9524, 9721, 10795, 8775, 9806, 10006, 11092, 10247, 11342, 11552, 12690, 5827, 6671, 6837, 7755, 7040, 7971, 8153, 9151, 7282, 8229, 8414, 9427, 8637, 9661, 9860, 10940, 7578, 8543, 8730, 9760, 8959, 9999, 10199, 11294, 9233, 10284, 10488, 11592, 10733, 11844, 12058, 13210, 7935, 8921, 9113, 10159, 9345, 10402, 10607, 11714, 9624, 10694, 10900, 12016, 11149, 12274, 12491, 13650, 9958, 11043, 11251, 12380, 11502, 12640, 12857, 14026, 11804, 12950, 13167, 14342, 13429, 14609, 14832, 16027, 1024, 1300, 1358, 1695, 1429, 1777, 1849, 2265, 1517, 1878, 1954, 2384, 2047, 2489, 2581, 3098, 1626, 2006, 2085, 2534, 2181, 2644, 2739, 3276, 2298, 2779, 2876, 3431, 2995, 3565, 3680, 4327, 1763, 2166, 2248, 2721, 2349, 2837, 2935, 3497, 2471, 2975, 3077, 3657, 3202, 3797, 3916, 4589, 2625, 3148, 3254, 3855, 3384, 3999, 4122, 4817, 3541, 4173, 4300, 5012, 4455, 5181, 5326, 6131, 1938, 2366, 2453, 2955, 2561, 3075, 3179, 3771, 2694, 3224, 3332, 3941, 3464, 4086, 4211, 4914, 2855, 3406, 3518, 4147, 3654, 4297, 4426, 5149, 3821, 4483, 4616, 5357, 4777, 5533, 5682, 6516, 3056, 3634, 3749, 4403, 3890, 4560, 4694, 5441, 4062, 4751, 4887, 5653, 5053, 5835, 5989, 6846, 4273, 4982, 5122, 5910, 5293, 6095, 6253, 7130, 5503, 6322, 6483, 7377, 6679, 7587, 7764, 8740, 2161, 2620, 2715, 3248, 2830, 3377, 3489, 4114, 2968, 3533, 3648, 4290, 3788, 4445, 4578, 5314, 3142, 3730, 3848, 4513, 3991, 4672, 4808, 5567, 4164, 4863, 5001, 5778, 5170, 5962, 6118, 6986, 3356, 3968, 4090, 4782, 4240, 4946, 5086, 5871, 4420, 5142, 5287, 6089, 5462, 6277, 6439, 7330, 4646, 5389, 5538, 6359, 5717, 6553, 6719, 7629, 5931, 6784, 6954, 7880, 7155, 8095, 8280, 9286, 3626, 4265, 4394, 5113, 4551, 5284, 5431, 6243, 4741, 5492, 5641, 6470, 5824, 6667, 6833, 7750, 4973, 5747, 5900, 6751, 6085, 6950, 7119, 8057, 6310, 7191, 7363, 8316, 7574, 8539, 8725, 9755, 5257, 6056, 6214, 7088, 6404, 7292, 7467, 8425, 6635, 7539, 7717, 8690, 7931, 8916, 9109, 10155, 6918, 7842, 8023, 9014, 8239, 9243, 9438, 10499, 8501, 9519, 9717, 10791, 9953, 11038, 11247, 12376, 2445, 2946, 3047, 3624, 3170, 3761, 3880, 4549, 3322, 3930, 4051, 4739, 4200, 4902, 5041, 5822, 3508, 4135, 4262, 4970, 4415, 5136, 5281, 6082, 4603, 5342, 5489, 6307, 5668, 6500, 6664, 7571, 3738, 4392, 4523, 5255, 4682, 5429, 5578, 6402, 4873, 5639, 5791, 6633, 5974, 6831, 7000, 7929, 5110, 5897, 6053, 6915, 6240, 7116, 7289, 8236, 6467, 7360, 7536, 8498, 7747, 8722, 8913, 9950, 4024, 4708, 4845, 5607, 5009, 5787, 5940, 6794, 5212, 6006, 6164, 7034, 6355, 7239, 7412, 8367, 5456, 6270, 6432, 7322, 6628, 7531, 7708, 8681, 6863, 7783, 7963, 8951, 8182, 9182, 9375, 10434, 5758, 6597, 6763, 7675, 6962, 7889, 8070, 9063, 7204, 8146, 8331, 9338, 8553, 9573, 9771, 10846, 7497, 8457, 8645, 9669, 8871, 9907, 10107, 11197, 9142, 10190, 10393, 11493, 10638, 11747, 11959, 13108, 4383, 5101, 5244, 6042, 5419, 6230, 6391, 7278, 5628, 6456, 6619, 7522, 6819, 7735, 7915, 8899, 5886, 6736, 6902, 7826, 7104, 8041, 8223, 9227, 7347, 8299, 8483, 9501, 8708, 9737, 9935, 11020, 6198, 7072, 7244, 8189, 7451, 8409, 8597, 9619, 7698, 8671, 8862, 9898, 9090, 10136, 10340, 11439, 8005, 8996, 9189, 10239, 9420, 10481, 10687, 11797, 9697, 10771, 10980, 12099, 11227, 12356, 12574, 13736, 6586, 7485, 7663, 8632, 7877, 8858, 9050, 10093, 8133, 9129, 9323, 10378, 9559, 10624, 10830, 11943, 8443, 9458, 9654, 10726, 9892, 10974, 11181, 12308, 10175, 11269, 11477, 12615, 11731, 12876, 13091, 14266, 8821, 9854, 10056, 11143, 10295, 11392, 11604, 12743, 10582, 11689, 11903, 13051, 12158, 13311, 13533, 14713, 10932, 12050, 12266, 13421, 12524, 13685, 13907, 15091, 12831, 14000, 14223, 15411, 14488, 15680, 15906, 17102, 2818, 3364, 3476, 4100, 3612, 4250, 4380, 5098, 3775, 4431, 4564, 5299, 4725, 5475, 5625, 6453, 3976, 4656, 4792, 5550, 4956, 5729, 5883, 6733, 5154, 5945, 6101, 6968, 6291, 7171, 7344, 8296, 4225, 4930, 5069, 5853, 5241, 6039, 6195, 7069, 5445, 6259, 6420, 7310, 6616, 7519, 7695, 8668, 5699, 6535, 6699, 7609, 6899, 7823, 8002, 8993, 7136, 8076, 8259, 9265, 8480, 9498, 9694, 10768, 4536, 5268, 5416, 6227, 5592, 6416, 6582, 7481, 5807, 6649, 6816, 7732, 7017, 7946, 8129, 9125, 6067, 6931, 7101, 8038, 7304, 8253, 8439, 9454, 7554, 8518, 8705, 9734, 8932, 9971, 10171, 11265, 6388, 7275, 7448, 8406, 7659, 8628, 8817, 9850, 7912, 8896, 9087, 10133, 9319, 10374, 10578, 11685, 8220, 9224, 9417, 10478, 9650, 10722, 10928, 12046, 9932, 11017, 11224, 12353, 11473, 12611, 12827, 13996, 4920, 5689, 5841, 6687, 6027, 6887, 7056, 7989, 6247, 7124, 7296, 8245, 7505, 8466, 8653, 9679, 6523, 7418, 7595, 8560, 7809, 8786, 8978, 10018, 8062, 9054, 9249, 10300, 9482, 10544, 10751, 11862, 6852, 7772, 7952, 8940, 8170, 9170, 9363, 10422, 8429, 9444, 9641, 10713, 9877, 10959, 11167, 12294, 8748, 9778, 9979, 11064, 10219, 11314, 11524, 12662, 10505, 11609, 11823, 12969, 12077, 13229, 13449, 14629, 7262, 8207, 8392, 9403, 8615, 9637, 9836, 10914, 8881, 9917, 10117, 11208, 10359, 11458, 11669, 12811, 9209, 10259, 10462, 11565, 10707, 11817, 12030, 13181, 11000, 12119, 12335, 13491, 12594, 13756, 13978, 15163, 9600, 10668, 10874, 11990, 11123, 12246, 12463, 13622, 11418, 12553, 12770, 13937, 13029, 14201, 14425, 15615, 11777, 12923, 13140, 14315, 13400, 14580, 14803, 15998, 13714, 14897, 15121, 16317, 15388, 16585, 16810, 18005, 5402, 6212, 6374, 7260, 6567, 7465, 7645, 8613, 6800, 7715, 7896, 8879, 8112, 9107, 9303, 10357, 7085, 8020, 8204, 9206, 8422, 9435, 9634, 10704, 8687, 9714, 9914, 10997, 10152, 11244, 11455, 12591, 7433, 8390, 8577, 9598, 8802, 9834, 10035, 11121, 9070, 10115, 10318, 11416, 10561, 11667, 11880, 13027, 9399, 10458, 10664, 11773, 10910, 12026, 12242, 13396, 11204, 12331, 12549, 13710, 12807, 13974, 14197, 15384, 7857, 8836, 9031, 10073, 9259, 10311, 10517, 11622, 9537, 10600, 10809, 11921, 11057, 12177, 12395, 13552, 9869, 10949, 11160, 12285, 11408, 12542, 12761, 13927, 11706, 12849, 13068, 14241, 13329, 14507, 14731, 15925, 10276, 11372, 11583, 12721, 11834, 12981, 13199, 14374, 12137, 13289, 13510, 14689, 13774, 14957, 15182, 16377, 12502, 13661, 13883, 15066, 14150, 15336, 15561, 16756, 14464, 15654, 15880, 17075, 16150, 17346, 17571, 18756, 8374, 9384, 9581, 10648, 9818, 10895, 11105, 12227, 10098, 11188, 11398, 12532, 11650, 12791, 13010, 14181, 10442, 11545, 11756, 12902, 12010, 13161, 13380, 14560, 12315, 13471, 13693, 14876, 13958, 15143, 15368, 16565, 10854, 11969, 12185, 13338, 12444, 13602, 13825, 15007, 12749, 13915, 14139, 15325, 14405, 15594, 15821, 17015, 13117, 14292, 14515, 15707, 14781, 15976, 16200, 17397, 15099, 16295, 16521, 17717, 16789, 17984, 18206, 19386, 11355, 12485, 12704, 13867, 12964, 14133, 14357, 15545, 13271, 14447, 14671, 15863, 14939, 16133, 16359, 17554, 13643, 14825, 15049, 16245, 15318, 16514, 16739, 17934, 15637, 16833, 17058, 18250, 17329, 18517, 18739, 19908, 14092, 15277, 15503, 16697, 15772, 16967, 17194, 18382, 16091, 17286, 17512, 18696, 17780, 18963, 19186, 20343, 16470, 17666, 17889, 19072, 18157, 19337, 19556, 20708, 18473, 19648, 19864, 21010, 20125, 21263, 21472, 22567, 1321, 1652, 1719, 2115, 1803, 2212, 2294, 2774, 1906, 2331, 2416, 2914, 2523, 3034, 3136, 3724, 2036, 2477, 2568, 3083, 2680, 3209, 3316, 3923, 2816, 3361, 3473, 4095, 3609, 4246, 4376, 5092, 2196, 2662, 2756, 3296, 2872, 3426, 3537, 4169, 3014, 3587, 3702, 4352, 3842, 4507, 4640, 5384, 3188, 3781, 3900, 4571, 4045, 4732, 4868, 5633, 4222, 4925, 5066, 5848, 5237, 6033, 6192, 7064, 2397, 2891, 2990, 3559, 3114, 3698, 3815, 4476, 3262, 3864, 3984, 4665, 4131, 4827, 4965, 5739, 3448, 4069, 4193, 4894, 4347, 5061, 5204, 5997, 4532, 5263, 5411, 6220, 5588, 6411, 6577, 7474, 3675, 4321, 4450, 4610, 5350, 5497, 6316, 4801, 5560, 5710, 6547, 5892, 6743, 6910, 7835, 5034, 5814, 5968, 6824, 6156, 7025, 7197, 8138, 6383, 7268, 7444, 8400, 7654, 8621, 8813, 9844, 2654, 3181, 3287, 3892, 3417, 4036, 4159, 4858, 3577, 4213, 4340, 5055, 4496, 5226, 5371, 6179, 3773, 4428, 4562, 5295, 4722, 5471, 5622, 6448, 4916, 5684, 5837, 6681, 6022, 6881, 7051, 7982, 4012, 4696, 4832, 5594, 4996, 5773, 5926, 6780, 5197, 5991, 6149, 7019, 6339, 7222, 7396, 8351, 5443, 6255, 6418, 7306, 6613, 7514, 7693, 8664, 6848, 7766, 7948, 8934, 8165, 9163, 9359, 10416, 4310, 5023, 5164, 5956, 5338, 6144, 6303, 7184, 5547, 6370, 6532, 7429, 6730, 7641, 7820, 8798, 5803, 6644, 6812, 7726, 7013, 7941, 8125, 9119, 7256, 8200, 8386, 9395, 8609, 9630, 9830, 10906, 6112, 6980, 7149, 8090, 7356, 8309, 8494, 9513, 7606, 8573, 8761, 9793, 8990, 10031, 10233, 11329, 7908, 8890, 9084, 10128, 9315, 10368, 10575, 11680, 9594, 10660, 10869, 11983, 11117, 12238, 12458, 13615, 2981, 3549, 3663, 4308, 3804, 4464, 4596, 5335, 3973, 4653, 4787, 5545, 4952, 5725, 5877, 6727, 4181, 4881, 5020, 5799, 5190, 5982, 6140, 7008, 5397, 6206, 6367, 7252, 6561, 7458, 7637, 8604, 4437, 5162, 5306, 6110, 5482, 6300, 6461, 7354, 5694, 6530, 6694, 7604, 6893, 7817, 7997, 8988, 5953, 6808, 6977, 7904, 7180, 8120, 8306, 9311, 7426, 8382, 8570, 9590, 8794, 9825, 10028, 11113, 4758, 5512, 5660, 6492, 5843, 6689, 6854, 7774, 6062, 6926, 7094, 8031, 7299, 8248, 8432, 9447, 6331, 7212, 7386, 8339, 7597, 8562, 8750, 9780, 7850, 8828, 9022, 10063, 9252, 10303, 10508, 11612, 6656, 7563, 7740, 8715, 7954, 8942, 9134, 10182, 8213, 9217, 9411, 10472, 9643, 10715, 10922, 12040, 8527, 9545, 9744, 10817, 9981, 11066, 11276, 12404, 10267, 11362, 11575, 12712, 11825, 12971, 13191, 14365, 5151, 5942, 6097, 6964, 6287, 7167, 7339, 8291, 6518, 7414, 7589, 8555, 7803, 8781, 8971, 10012, 6796, 7710, 7891, 8873, 8107, 9101, 9297, 10350, 8369, 9377, 9575, 10640, 9812, 10887, 11098, 12218, 7132, 8072, 8255, 9261, 8475, 9493, 9690, 10764, 8742, 9773, 9973, 11059, 10212, 11308, 11518, 12657, 9065, 10109, 10313, 11410, 10555, 11660, 11875, 13021, 10848, 11961, 12179, 13331, 12437, 13593, 13819, 15000, 7549, 8513, 8699, 9728, 8927, 9966, 10165, 11259, 9202, 10253, 10454, 11558, 10700, 11811, 12022, 13174, 9531, 10593, 10802, 11913, 11051, 12170, 12388, 13544, 11348, 12476, 12696, 13857, 12957, 14124, 14349, 15535, 9926, 11011, 11219, 12348, 11467, 12605, 12822, 13991, 11769, 12916, 13133, 14309, 13392, 14573, 14796, 15992, 12130, 13281, 13504, 14682, 13767, 14949, 15176, 16370, 14084, 15267, 15496, 16689, 15764, 16957, 17187, 18374, 3404, 4022, 4145, 4843, 4295, 5007, 5147, 5938, 4481, 5210, 5355, 6162, 5531, 6353, 6514, 7410, 4706, 5454, 5605, 6430, 5785, 6626, 6792, 7706, 6004, 6861, 7032, 7961, 7237, 8180, 8365, 9373, 4980, 5756, 5908, 6761, 6093, 6960, 7128, 8068, 6320, 7202, 7375, 8329, 7585, 8551, 8738, 9769, 6595, 7495, 7673, 8643, 7887, 8869, 9061, 10105, 8144, 9140, 9336, 10391, 9571, 10636, 10844, 11957, 5320, 6125, 6283, 7163, 6476, 7370, 7545, 8509, 6711, 7622, 7799, 8777, 8014, 9006, 9198, 10249, 6993, 7921, 8103, 9097, 8323, 9329, 9527, 10589, 8589, 9609, 9808, 10883, 10047, 11132, 11344, 12472, 7335, 8287, 8471, 9489, 8695, 9724, 9922, 11007, 8967, 10008, 10208, 11304, 10450, 11554, 11765, 12912, 9293, 10346, 10551, 11656, 10798, 11909, 12126, 13277, 11094, 12214, 12433, 13589, 12692, 13853, 14080, 15263, 5745, 6584, 6749, 7661, 6948, 7875, 8055, 9048, 7189, 8131, 8314, 9321, 8537, 9557, 9753, 10828, 7483, 8441, 8630, 9652, 8856, 9890, 10091, 11179, 9127, 10173, 10376, 11475, 10622, 11729, 11941, 13089, 7840, 8819, 9012, 10054, 9241, 10293, 10497, 11602, 9517, 10580, 10789, 11901, 11036, 12156, 12374, 13531, 9852, 10930, 11141, 12264, 11390, 12522, 12741, 13905, 11687, 12829, 13049, 14221, 13309, 14486, 14711, 15904, 8273, 9280, 9474, 10537, 9709, 10784, 10991, 12111, 9992, 11079, 11286, 12416, 11538, 12677, 12894, 14063, 10333, 11430, 11642, 12781, 11895, 13041, 13262, 14436, 12200, 13352, 13573, 14752, 13839, 15020, 15247, 16440, 10742, 11854, 12068, 13221, 12325, 13482, 13704, 14888, 12632, 13795, 14019, 15205, 14284, 15472, 15700, 16896, 13001, 14170, 14396, 15583, 14661, 15851, 16081, 17274, 14978, 16171, 16400, 17594, 16667, 17859, 18088, 19266, 6268, 7147, 7320, 8271, 7529, 8492, 8679, 9707, 7781, 8759, 8949, 9990, 9180, 10231, 10432, 11536, 8087, 9080, 9277, 10329, 9510, 10571, 10781, 11891, 9790, 10865, 11076, 12196, 11326, 12454, 12674, 13835, 8455, 9472, 9667, 10740, 9905, 10989, 11195, 12323, 10188, 11284, 11491, 12630, 11745, 12892, 13106, 14282, 10534, 11638, 11851, 12997, 12108, 13258, 13479, 14657, 12413, 13569, 13792, 14974, 14060, 15243, 15469, 16663, 8905, 9943, 10143, 11236, 10384, 11485, 11696, 12840, 10677, 11788, 11999, 13151, 12255, 13411, 13631, 14814, 11028, 12146, 12365, 13520, 12623, 13784, 14009, 15193, 12934, 14101, 14326, 15512, 14591, 15781, 16009, 17203, 11445, 12582, 12797, 13965, 13057, 14231, 14453, 15644, 13368, 14549, 14769, 15965, 15036, 16233, 16457, 17654, 13744, 14925, 15150, 16344, 15419, 16614, 16840, 18033, 15740, 16933, 17160, 18348, 17429, 18614, 18838, 20003, 9456, 10519, 10724, 11836, 10972, 12092, 12306, 13463, 11267, 12397, 12613, 13776, 12874, 14044, 14264, 15453, 11624, 12763, 12983, 14152, 13244, 14418, 14643, 15833, 13554, 14733, 14959, 16152, 15229, 16422, 16649, 17841, 12048, 13201, 13419, 14600, 13683, 14867, 15089, 16286, 13998, 15184, 15409, 16606, 15678, 16875, 17100, 18292, 14376, 15563, 15791, 16985, 16061, 17254, 17481, 18665, 16379, 17573, 17800, 18982, 18068, 19246, 19469, 20620, 12565, 13728, 13948, 15134, 14213, 15402, 15626, 16823, 14531, 15724, 15947, 17144, 16215, 17413, 17636, 18822, 14911, 16103, 16330, 17523, 16599, 17792, 18018, 19197, 16919, 18109, 18334, 19508, 18600, 19769, 19989, 21128, 15357, 16555, 16778, 17974, 17046, 18239, 18461, 19637, 17368, 18557, 18779, 19948, 19042, 20205, 20422, 21551, 17750, 18931, 19155, 20312, 19418, 20570, 20787, 21901, 19729, 20875, 21090, 22195, 21340, 22437, 22642, 23686, 3958, 4635, 4770, 5525, 4934, 5704, 5857, 6704, 5131, 5920, 6076, 6941, 6264, 7142, 7315, 8265, 5378, 6186, 6346, 7229, 6540, 7437, 7614, 8581, 6773, 7685, 7867, 8846, 8082, 9075, 9271, 10323, 5675, 6508, 6672, 7580, 6871, 7792, 7972, 8961, 7110, 8048, 8230, 9235, 8450, 9466, 9662, 10735, 7403, 8357, 8545, 9564, 8769, 9800, 10001, 11087, 9040, 10081, 10286, 11381, 10528, 11632, 11846, 12992, 6043, 6904, 7073, 8007, 7279, 8225, 8410, 9422, 7525, 8487, 8674, 9701, 8902, 9939, 10139, 11231, 7828, 8806, 8998, 10039, 9229, 10280, 10483, 11587, 9505, 10566, 10775, 11885, 11024, 12142, 12360, 13515, 8190, 9191, 9385, 10444, 9620, 10689, 10896, 12012, 9900, 10983, 11190, 12318, 11441, 12577, 12793, 13961, 10241, 11336, 11547, 12685, 11799, 12945, 13163, 14338, 12102, 13252, 13474, 14652, 13739, 14920, 15146, 16340, 6495, 7390, 7566, 8531, 7777, 8754, 8945, 9985, 8034, 9026, 9220, 10271, 9450, 10512, 10718, 11829, 8344, 9351, 9550, 10613, 9785, 10860, 11071, 12191, 10068, 11155, 11367, 12497, 11617, 12756, 12976, 14145, 8717, 9747, 9945, 11031, 10184, 11279, 11487, 12626, 10474, 11578, 11790, 12937, 12042, 13194, 13413, 14594, 10821, 11932, 12150, 13301, 12408, 13564, 13788, 14970, 12716, 13878, 14105, 15289, 14369, 15556, 15785, 16979, 9176, 10226, 10428, 11531, 10674, 11784, 11996, 13147, 10966, 12085, 12300, 13456, 12560, 13722, 13943, 15128, 11321, 12449, 12669, 13830, 12930, 14097, 14322, 15508, 13237, 14411, 14636, 15826, 14905, 16097, 16324, 17517, 11741, 12887, 13102, 14278, 13365, 14545, 14766, 15962, 13677, 14860, 15083, 16280, 15352, 16549, 16773, 17969, 14055, 15238, 15465, 16659, 15736, 16929, 17157, 18345, 16054, 17247, 17475, 18659, 17744, 18925, 19150, 20307, 7058, 7991, 8172, 9172, 8394, 9405, 9602, 10670, 8656, 9682, 9880, 10962, 10120, 11211, 11421, 12556, 8980, 10020, 10221, 11316, 10464, 11567, 11779, 12925, 10754, 11865, 12080, 13232, 12338, 13494, 13717, 14900, 9365, 10424, 10629, 11738, 10876, 11992, 12208, 13362, 11169, 12296, 12513, 13674, 12772, 13939, 14162, 15349, 11526, 12664, 12883, 14051, 13142, 14317, 14541, 15732, 13451, 14631, 14856, 16050, 15123, 16319, 16545, 17740, 9838, 10916, 11125, 12248, 11376, 12508, 12725, 13889, 11672, 12814, 13032, 14204, 13294, 14471, 14694, 15887, 12032, 13183, 13402, 14582, 13667, 14849, 15072, 16268, 13981, 15166, 15391, 16588, 15661, 16857, 17082, 18274, 12465, 13624, 13847, 15030, 14113, 15299, 15525, 16720, 14427, 15617, 15843, 17038, 16113, 17309, 17534, 18719, 14805, 16000, 16225, 17421, 16494, 17690, 17914, 19096, 16812, 18007, 18229, 19408, 18496, 19671, 19887, 21032, 10408, 11510, 11720, 12865, 11975, 13125, 13344, 14523, 12280, 13436, 13656, 14839, 13922, 15107, 15331, 16528, 12648, 13810, 14034, 15219, 14300, 15487, 15715, 16910, 14616, 15806, 16034, 17228, 16303, 17496, 17724, 18906, 13080, 14255, 14478, 15670, 14744, 15939, 16164, 17361, 15061, 16258, 16484, 17681, 16751, 17947, 18170, 19351, 15443, 16639, 16866, 18059, 17135, 18325, 18549, 19721, 17454, 18639, 18865, 20029, 19129, 20287, 20506, 21629, 13607, 14788, 15012, 16207, 15282, 16477, 16702, 17896, 15600, 16796, 17020, 18212, 17292, 18480, 18701, 19870, 15983, 17178, 17404, 18591, 17673, 18857, 19079, 20240, 17991, 19170, 19392, 20545, 19655, 20803, 21016, 22124, 16432, 17628, 17852, 19035, 18120, 19300, 19520, 20672, 18434, 19610, 19827, 20974, 20087, 21226, 21436, 22532, 18813, 19980, 20197, 21332, 20456, 21583, 21791, 22873, 20761, 21876, 22084, 23152, 22329, 23387, 23582, 24582, 7756, 8732, 8922, 9961, 9152, 10201, 10403, 11505, 9428, 10490, 10695, 11806, 10941, 12060, 12275, 13431, 9762, 10836, 11046, 12165, 11296, 12425, 12643, 13805, 11594, 12731, 12952, 14119, 13212, 14386, 14611, 15801, 10160, 11254, 11463, 12601, 11715, 12860, 13076, 14251, 12017, 13169, 13388, 14569, 13651, 14834, 15057, 16254, 12383, 13539, 13763, 14945, 14029, 15214, 15439, 16635, 14344, 15530, 15760, 16953, 16029, 17223, 17450, 18635, 10649, 11758, 11970, 13120, 12228, 13382, 13603, 14784, 12534, 13696, 13917, 15102, 14183, 15371, 15596, 16792, 12904, 14072, 14295, 15482, 14562, 15753, 15979, 17174, 14879, 16071, 16298, 17491, 16568, 17761, 17987, 19166, 13339, 14518, 14740, 15935, 15008, 16203, 16429, 17625, 15326, 16523, 16747, 17943, 17016, 18208, 18431, 19607, 15710, 16905, 17131, 18321, 17400, 18587, 18810, 19977, 17719, 18901, 19125, 20283, 19388, 20541, 20758, 21873, 11238, 12368, 12584, 13747, 12842, 14012, 14233, 15422, 13153, 14329, 14551, 15743, 14816, 16012, 16235, 17432, 13524, 14702, 14929, 16121, 15197, 16391, 16618, 17811, 15516, 16709, 16937, 18127, 17207, 18394, 18618, 19787, 13967, 15153, 15378, 16576, 15646, 16843, 17068, 18261, 15967, 17163, 17390, 18578, 17656, 18841, 19064, 20226, 16348, 17541, 17770, 18951, 18037, 19216, 19439, 20591, 18352, 19526, 19749, 20895, 20007, 21146, 21360, 22457, 14500, 15693, 15917, 17114, 16186, 17384, 17608, 18794, 16505, 17702, 17924, 19107, 18191, 19372, 19590, 20742, 16888, 18079, 18304, 19479, 18571, 19741, 19961, 21101, 18885, 20047, 20266, 21396, 20526, 21647, 21858, 22934, 17338, 18527, 18749, 19919, 19014, 20177, 20394, 21524, 19327, 20483, 20700, 21819, 20953, 22064, 22271, 23333, 19700, 20847, 21062, 22168, 21313, 22411, 22616, 23661, 21608, 22695, 22899, 23932, 23134, 24155, 24346, 25303, 11949, 13099, 13318, 14497, 13582, 14763, 14988, 16183, 13895, 15080, 15305, 16502, 15574, 16770, 16996, 18188, 14274, 15461, 15689, 16884, 15958, 17153, 17380, 18567, 16276, 17471, 17698, 18881, 17965, 19146, 19368, 20522, 14719, 15914, 16139, 17336, 16409, 17605, 17829, 19012, 16725, 17921, 18144, 19325, 18411, 19587, 19804, 20951, 17110, 18300, 18524, 19697, 18790, 19957, 20174, 21310, 19103, 20262, 20480, 21605, 20738, 21854, 22061, 23131, 15256, 16451, 16677, 17871, 16947, 18139, 18363, 19539, 17265, 18453, 18676, 19845, 18943, 20106, 20324, 21454, 17647, 18831, 19054, 20215, 19319, 20474, 20691, 21809, 19628, 20778, 20991, 22100, 21244, 22346, 22549, 23598, 18097, 19277, 19497, 20649, 19758, 20906, 21118, 22224, 20064, 21203, 21413, 22509, 21663, 22750, 22950, 23982, 20433, 21560, 21768, 22851, 22017, 23089, 23286, 24302, 22306, 23365, 23559, 24561, 23790, 24779, 24959, 25881, 15895, 17092, 17317, 18506, 17586, 18772, 18994, 20157, 17903, 19087, 19307, 20464, 19569, 20722, 20934, 22046, 18284, 19461, 19681, 20829, 19941, 21083, 21295, 22394, 20248, 21380, 21591, 22679, 21840, 22918, 23118, 24140, 18726, 19896, 20113, 21252, 20373, 21503, 21711, 22797, 20678, 21798, 22006, 23080, 22251, 23314, 23509, 24515, 21041, 22148, 22354, 23411, 22597, 23643, 23836, 24822, 22880, 23914, 24106, 25077, 24329, 25287, 25464, 26352, 19258, 20415, 20631, 21751, 20888, 22000, 22207, 23270, 21185, 22290, 22492, 23544, 22733, 23775, 23966, 24945, 21544, 22635, 22836, 23872, 23074, 24100, 24288, 25249, 23351, 24362, 24548, 25493, 24766, 25699, 25869, 26729, 21959, 23034, 23231, 24250, 23465, 24472, 24656, 25597, 23737, 24730, 24911, 25837, 25123, 26035, 26201, 27039, 24063, 25036, 25214, 26119, 25424, 26315, 26477, 27293, 25667, 26541, 26701, 27500, 26885, 27670, 27812, 28518, 313, 432, 457, 613, 488, 652, 687, 896, 530, 703, 739, 959, 784, 1013, 1061, 1345, 582, 766, 805, 1037, 853, 1095, 1147, 1445, 915, 1169, 1223, 1534, 1288, 1612, 1680, 2068, 646, 845, 887, 1136, 939, 1199, 1253, 1571, 1004, 1277, 1333, 1666, 1402, 1747, 1817, 2229, 1086, 1373, 1433, 1781, 1507, 1867, 1942, 2370, 1600, 1974, 2053, 2495, 2148, 2605, 2700, 3230, 729, 947, 993, 1264, 1048, 1329, 1388, 1730, 1120, 1414, 1476, 1832, 1551, 1918, 1995, 2431, 1209, 1519, 1584, 1957, 1662, 2049, 2128, 2584, 1760, 2162, 2245, 2717, 2344, 2831, 2930, 3491, 1319, 1649, 1717, 2112, 1800, 2208, 2291, 2770, 1904, 2328, 2414, 2911, 2520, 3030, 3133, 3720, 2033, 2474, 2565, 3080, 2676, 3205, 3312, 3919, 2813, 3358, 3470, 4092, 3605, 4242, 4372, 5088, 842, 1082, 1132, 1428, 1195, 1502, 1566, 1936, 1272, 1594, 1660, 2046, 1741, 2141, 2222, 2692, 1368, 1706, 1775, 2179, 1861, 2278, 2363, 2852, 1967, 2399, 2487, 2993, 2597, 3116, 3221, 3818, 1490, 1848, 1922, 2348, 2012, 2451, 2541, 3054, 2125, 2580, 2673, 32411, 2786, 3330, 3439, 4060, 2263, 2737, 2835, 3382, 2952, 3515, 3631, 4270, 3096, 3678, 3795, 4451, 3938, 4613, 4748, 5500, 1645, 2028, 2107, 2559, 2203, 2669, 2764, 3304, 2322, 2806, 2904, 3462, 3023, 3596, 3712, 4362, 2467, 2970, 3072, 3651, 3196, 3790, 3909, 4581, 3350, 3961, 4083, 4774, 4232, 4937, 5077, 5861, 2651, 3177, 3284, 3888, 3413, 4031, 4155, 4853, 3574, 4209, 4337, 5051, 4492, 5221, 5367, 6174, 3768, 4423, 4557, 5290, 4716, 5465, 5616, 6442, 4911, 5679, 5832, 6676, 6016, 6875, 7045, 7976, 989, 1259, 1315, 1644, 1383, 1724, 1795, 2202, 1470, 1825, 1898, 2321, 1988, 2423, 2513, 3022, 1578, 1949, 2027, 2466, 2120, 2574, 2668, 3195, 2237, 2708, 2804, 3348, 2920, 3480, 3594, 4230, 1712, 2105, 2186, 2649, 2285, 2762, 2860, 3411, 2407, 2902, 3002, 3572, 3125, 3710, 3828, 4490, 2557, 3070, 3175, 3766, 3302, 3907, 4029, 4714, 3459, 4080, 4206, 4908, 4359, 5074, 5218, 6013, 1880, 2300, 2387, 2879, 2491, 2997, 3101, 3683, 2621, 3143, 3250, 3850, 3378, 3992, 4116, 4810, 2781, 3324, 3434, 4054, 3567, 4202, 4330, 5044, 3731, 4384, 4515, 5246, 4673, 5420, 5569, 6393, 2978, 3544, 3660, 4303, 3800, 4458, 4592, 5329, 3970, 4648, 4784, 5540, 4948, 5719, 5873, 6721, 4176, 4876, 5015, 5794, 5184, 5977, 6134, 7003, 5391, 6200, 6361, 7246, 6555, 7453, 7631, 8599, 2099, 2550, 2642, 3167, 2755, 3294, 3403, 4020, 2894, 3451, 3563, 4197, 3701, 4350, 4480, 5208, 3063, 3641, 3757, 4411, 3898, 4569, 4703, 5451, 4072, 4761, 4898, 5664, 5064, 5846, 6001, 6858, 3274, 3876, 3997, 4678, 4144, 4840, 4979, 5753, 4325, 5038, 5179, 5971, 5354, 6160, 6319, 7200, 4544, 5276, 5424, 6235, 5601, 6426, 6591, 7491, 5818, 6660, 6827, 7743, 7029, 7958, 8141, 9137, 3536, 4167, 4294, 5005, 4448, 5173, 5318, 6122, 4639, 5382, 5530, 6351, 5708, 6544, 6709, 7619, 4866, 5631, 5782, 6623, 5965, 6822, 6990, 7919, 6190, 7062, 7234, 8177, 7441, 8398, 8586, 9607, 5146, 5935, 6092, 6957, 6281, 7159, 7333, 8283, 6513, 7408, 7584, 8549, 7797, 8774, 8965, 10005, 6788, 7702, 7883, 8865, 8099, 9094, 9289, 10343, 8362, 9370, 9568, 10633, 9805, 10881, 11091, 12212, 1189, 1495, 1559, 1928, 1637, 2019, 2098, 2549, 1734, 2132, 2213, 2681, 2312, 2795, 2892, 3449, 1854, 2270, 2355, 2843, 2458, 2960, 3062, 3640, 2588, 3105, 3210, 3805, 3339, 3948, 4070, 4759, 2003, 2441, 2531, 3042, 2640, 3165, 3272, 3874, 2775, 3317, 3427, 4046, 3560, 4194, 4322, 5035, 2941, 3503, 3618, 4256, 3755, 4409, 4542, 5274, 3924, 4597, 4733, 5483, 4895, 5661, 5815, 6657, 2194, 2659, 2754, 3293, 2869, 3422, 3534, 4165, 3012, 3584, 3699, 4348, 3839, 4503, 4636, 5379, 3185, 3778, 3897, 4568, 4041, 4728, 4864, 5629, 4219, 4922, 5062, 5844, 5233, 6029, 6187, 7059, 3401, 4018, 4142, 4838, 4291, 5002, 5143, 5932, 4477, 5205, 5351, 6157, 5526, 6347, 6509, 7404, 4701, 5449, 5599, 6424, 5779, 6620, 6785, 7699, 5998, 6855, 7026, 7955, 7230, 8173, 8358, 9366, 2435, 2934, 3035, 3610, 3157, 3747, 3865, 4533, 3309, 3915, 4037, 4723, 4184, 4885, 5024, 5804, 3495, 4120, 4247, 4953, 4400, 5119, 5264, 6063, 4587, 5324, 5472, 6288, 5650, 6480, 6645, 7550, 3725, 4377, 4508, 5238, 4666, 5412, 5561, 6384, 4859, 5623, 5774, 6614, 5957, 6813, 6981, 7909, 5093, 5878, 6034, 6894, 6221, 7095, 7269, 8214, 6449, 7340, 7515, 8476, 7727, 8700, 8891, 9927, 4009, 4692, 4828, 5589, 4992, 5768, 5921, 6774, 5194, 5987, 6145, 7014, 6335, 7217, 7391, 8345, 5438, 6250, 6412, 7300, 6607, 7508, 7686, 8657, 6843, 7761, 7942, 8928, 8159, 9157, 9352, 10409, 5740, 6578, 6744, 7655, 6942, 7868, 8049, 9041, 7185, 8126, 8310, 9316, 8532, 9551, 9748, 10822, 7475, 8433, 8622, 9644, 8847, 9881, 10082, 11170, 9120, 10166, 10369, 11468, 10614, 11721, 11933, 13081, 2745, 3282, 3392, 4007, 3524, 4153, 4281, 4990, 3688, 4335, 4465, 5191, 46245365, 5513, 6332, 3886, 4555, 4690, 5436, 4851, 5614, 5766, 6605, 5048, 5829, 5983, 6839, 6171, 7042, 7213, 8155, 4130, 4825, 4964, 5737, 5130, 5918, 6075, 6939, 5336, 6141, 6301, 7181, 6493, 7387, 7564, 8528, 5586, 6409, 6575, 7472, 6771, 7683, 7865, 8844, 7009, 7937, 8121, 9115, 8340, 9347, 9546, 10609, 4434, 5157, 5303, 6105, 5478, 6294, 6457, 7348, 5691, 6525, 6690, 7598, 6889, 7811, 7992, 8981, 5948, 6803, 6972, 7899, 7174, 8115, 8300, 9306, 7420, 8376, 8563, 9583, 8788, 9820, 10021, 11107, 6263, 7140, 7314, 8263, 7523, 8484, 8672, 9698, 7775, 8751, 8943, 9982, 9173, 10222, 10425, 11527, 8080, 9073, 9269, 10321, 9502, 10564, 10772, 11883, 9781, 10856, 11067, 12187, 11317, 12446, 12665, 13827, 4815, 5574, 5726, 6562, 5907, 6758, 6927, 7851, 6129, 6997, 7168, 8108, 7374, 8327, 8514, 9532, 6397, 7284, 7459, 8416, 7669, 8639, 8829, 9862, 7925, 8909, 9102, 10147, 9333, 10388, 10594, 11700, 6728, 7638, 7818, 8795, 8032, 9023, 9218, 10268, 8292, 9298, 9494, 10556, 9729, 10803, 11012, 12131, 8605, 9626, 9826, 10902, 10064, 11151, 11363, 12493, 10351, 11449, 11661, 12801, 11914, 13061, 13282, 14457, 7127, 8065, 8249, 9253, 8469, 9485, 9683, 10755, 8737, 9767, 9967, 11052, 10206, 11301, 11511, 12649, 9057, 10101, 10304, 11401, 10547, 11653, 11866, 13013, 10841, 11954, 12171, 13323, 12430, 13587, 13811, 14993, 9448, 10509, 10716, 11826, 10963, 12081, 12297, 13452, 11260, 12389, 12606, 13768, 12866, 14035, 14256, 15444, 11613, 12752, 12972, 14141, 13233, 14408, 14632, 15823, 13545, 14724, 14950, 16143, 15220, 16414, 16640, 17833, 1460, 1813, 1886, 2307, 1977, 2410, 2500, 3007, 2088, 2537, 2629, 3152, 2742, 3279, 3388, 4003, 2225, 2696, 2790, 3335, 2907, 3466, 3579, 4215, 3050, 3627, 3742, 4396, 3883, 4552, 4686, 5433, 2393, 2886, 2986, 3554, 3110, 3693, 3811, 4471, 3258, 3859, 3980, 4660, 4126, 4821, 4960, 5733, 3443, 4065, 4188, 4890, 4342, 5057, 5199, 5993, 4527, 5259, 5406, 6216, 5582, 6406, 6571, 7469, 2609, 3129, 3236, 3834, 3363, 3975, 4099, 4791, 3521, 4150, 4277, 4986, 4430, 5153, 5298, 6100, 3716, 4368, 4498, 5229, 4655, 5401, 5549, 6373, 4848, 5611, 5762, 6602, 5944, 6799, 6967, 7895, 3954, 4630, 4766, 5520, 4929, 5698, 5852, 6698, 5126, 5914, 6071, 6935, 6258, 7135, 7309, 8258, 5373, 6182, 6341, 7225, 6534, 7432, 7608, 8576, 6767, 7680, 7861, 8841, 8075, 9069, 9264, 10317, 2880, 3435, 3546, 4178, 3685, 4332, 4461, 5187, 3851, 4517, 4650, 5394, 4812, 5571, 5722, 6558, 4055, 4743, 4878, 5644, 5045, 5826, 5979, 6836, 5248, 6046, 6203, 7077, 6394, 7281, 7455, 8413, 4305, 5017, 5159, 5950, 5332, 6137, 6297, 7177, 5542, 6364, 6527, 7423, 6724, 7634, 7814, 8791, 5796, 6638, 6805, 7720, 7005, 7934, 8117, 9112, 7249, 8194, 8379, 9389, 8601, 9623, 9822, 10899, 4621, 5362, 5509, 6328, 5688, 6522, 6686, 7594, 5904, 6755, 6923, 7847, 7123, 8061, 8244, 9248, 6168, 7039, 7209, 8152, 7417, 8373, 8559, 9580, 7666, 8636, 8825, 9859, 9053, 10097, 10299, 11397, 6489, 7383, 7560, 8524, 7771, 8747, 8939, 9978, 8028, 9019, 9214, 10264, 9443, 10504, 10712, 11822, 8336, 9344, 9542, 10606, 9777, 11063, 12184, 10060, 11148, 11359, 12490, 11608, 12748, 12968, 14138, 3226, 3823, 3944, 4619, 4088, 4779, 4918, 5686, 4266, 4974, 5115, 5902, 5285, 6086, 6245, 7121, 4485, 5214, 5360, 6167, 5535, 6357, 6520, 7416, 5748, 6587, 6753, 7665, 6951, 7878, 8059, 9052, 4754, 5506, 5656, 6486, 5839, 6683, 6850, 7768, 6058, 6920, 7090, 8025, 7294, 8241, 8427, 9440, 6325, 7207, 7380, 8334, 7591, 8557, 8744, 9775, 7844, 8823, 9016, 10058, 9245, 10297, 10501, 11606, 5084, 5868, 6025, 6884, 6211, 7084, 7259, 8203, 6437, 7327, 7503, 8463, 7714, 8686, 8878, 9913, 6716, 7627, 7806, 8784, 8019, 9011, 9205, 10256, 8277, 9284, 9479, 10542, 9713, 10788, 10996, 12116, 7054, 7985, 8168, 9166, 8389, 9398, 9597, 10663, 8651, 9675, 9875, 10955, 10114, 11203, 11415, 12548, 8974, 10015, 10215, 11311, 10457, 11561, 11772, 12919, 10747, 11859, 12073, 13226, 12330, 13487, 13709, 14893, 5495, 6313, 6474, 7367, 6670, 7577, 7754, 8729, 6908, 7832, 8012, 9003, 8228, 9232, 9426, 10487, 7194, 8136, 8320, 9327, 8542, 9562, 9759, 10834, 8810, 9842, 10044, 11130, 10283, 11379, 11591, 12729, 7543, 8505, 8693, 9720, 8920, 9957, 10158, 11250, 9196, 10246, 10448, 11551, 10693, 11803, 12015, 13166, 9523, 10586, 10794, 11906, 11042, 12162, 12379, 13536, 11341, 12470, 12689, 13851, 12949, 14117, 14341, 15528, 7970, 8958, 9150, 10198, 9383, 10441, 10647, 11755, 9660, 10732, 10939, 12057, 11187, 12314, 12531, 13692, 9998, 11085, 11293, 12423, 11544, 12683, 12901, 14070, 11843, 12990, 13209, 14384, 13470, 14650, 14875, 16069, 10401, 11501, 11713, 12856, 11968, 13116, 13337, 14514, 12273, 13428, 13649, 14831, 13914, 15098, 15324, 16520, 12639, 13802, 14025, 15211, 14291, 15479, 15706, 16902, 14608, 15799, 16026, 17221, 16294, 17489, 17716, 18899, 3671, 4316, 4446, 5171, 4606, 5345, 5493, 6311, 4797, 5555, 5705, 6541, 5888, 6738, 6905, 7829, 5029, 5810, 5963, 6820, 6151, 7021, 7192, 8134, 6378, 7264, 7438, 8395, 7649, 8617, 8807, 9839, 5315, 6119, 6278, 7156, 6471, 7364, 7540, 8502, 6705, 7615, 7793, 8770, 8008, 8999, 9192, 10242, 6987, 7916, 8096, 9091, 8317, 9324, 9520, 10583, 8582, 9603, 9801, 10877, 10040, 11126, 11337, 12466, 5671, 6503, 6668, 7575, 6866, 7786, 7967, 8955, 7106, 8043, 8226, 9230, 8445, 9460, 9657, 10729, 7398, 8353, 8540, 9560, 8763, 9795, 9995, 11082, 9035, 10077, 10281, 11377, 10522, 11627, 11840, 12987, 7751, 8726, 8917, 9954, 9146, 10194, 10397, 11497, 9423, 10484, 10690, 11800, 10935, 12053, 12269, 13424, 9756, 10831, 11039, 12159, 11289, 12419, 12635, 13798, 11588, 12726, 12946, 14114, 13205, 14380, 14604, 15795, 6107, 6974, 7143, 8083, 7351, 8303, 8488, 9506, 7601, 8567, 8755, 9786, 8985, 10025, 10227, 11322, 7901, 8884, 9076, 10121, 9308, 10362, 10567, 11673, 9587, 10654, 10861, 11976, 11110, 12232, 12450, 13608, 8266, 9272, 9467, 10529, 9702, 10776, 10984, 12103, 9986, 11072, 11280, 12409, 11532, 12670, 12888, 14056, 10324, 11422, 11633, 12773, 11886, 13033, 13253, 14428, 12192, 13345, 13565, 14745, 13831, 15013, 15239, 16433, 8712, 9741, 9940, 11025, 10179, 11273, 11482, 12620, 10469, 11572, 11785, 12931, 12037, 13188, 13408, 4588, 10814, 11926, 12143, 13295, 12401, 13558, 13781, 14964, 12709, 13872, 14098, 15283, 14362, 15550, 15778, 16973, 11232, 12361, 12578, 13740, 12836, 14005, 14227, 15415, 13148, 14323, 14546, 15737, 14811, 16006, 16230, 17426, 13516, 14695, 14921, 16114, 15189, 16384, 16610, 17804, 15509, 16703, 16930, 18121, 17200, 18388, 18611, 19781, 6652, 7557, 7736, 8709, 7950, 8936, 9130, 10176, 8209, 9211, 9406, 10465, 9639, 10709, 10917, 12033, 8521, 9540, 9738, 10812, 9975, 11061, 11270, 12399, 10261, 11357, 11568, 12706, 11819, 12966, 13184, 14359, 8900, 9936, 10137, 11228, 10379, 11478, 11690, 12832, 10671, 11780, 11993, 13143, 12249, 13403, 13625, 14806, 11021, 12140, 12357, 13513, 12616, 13778, 14001, 15186, 12926, 14094, 14318, 15505, 14583, 15774, 16001, 17196, 9361, 10418, 10625, 11732, 10871, 11985, 12203, 13355, 11165, 12290, 12509, 13668, 12767, 13932, 14157, 15342, 11520, 12659, 12877, 14046, 13135, 14311, 14534, 15726, 13445, 14626, 14850, 16045, 15116, 16313, 16538, 17734, 11944, 13092, 13312, 14489, 13576, 14755, 14981, 16174, 13890, 15073, 15300, 16495, 15568, 16762, 16990, 18180, 14267, 15455, 15681, 16877, 15950, 17146, 17371, 18559, 16269, 17465, 17691, 18875, 17957, 19139, 19360, 20515, 9920, 11003, 11212, 12339, 11461, 12597, 12815, 13982, 11763, 12909, 13126, 14301, 13386, 14566, 14789, 15984, 12122, 13274, 13495, 14674, 13759, 14942, 15167, 16362, 14077, 15261, 15488, 16682, 15757, 16951, 17179, 18367, 12557, 13718, 13940, 15124, 14205, 15392, 15618, 16813, 14524, 15716, 15940, 17136, 16208, 17405, 17629, 18814, 14901, 16094, 16320, 17514, 16589, 17783, 18008, 19188, 16911, 18102, 18326, 19501, 18592, 19762, 19981, 21121, 13074, 14247, 14472, 15662, 14738, 15931, 16158, 17353, 15055, 16251, 16478, 17674, 16745, 17940, 18164, 19344, 15435, 16632, 16858, 18052, 17127, 18318, 18541, 19714, 17447, 18633, 18858, 20023, 19122, 20281, 20499, 21623, 15888, 17083, 17310, 18497, 17579, 18763, 18987, 20148, 17897, 19080, 19301, 20457, 19563, 20715, 20928, 22039, 18275, 19453, 19672, 20821, 19932, 21075, 21286, 22386, 20241, 21374, 21584, 22673, 21833, 22912, 23111, 24134, 1841, 2256, 2340, 2827, 2443, 2944, 3045, 3622, 2571, 3087, 3191, 3785, 3320, 3928, 4049, 4737, 2729, 3264, 3373, 3987, 3506, 4133, 4260, 4968, 3667, 4312, 4441, 5166, 4601, 5340, 5487, 6305, 2925, 3486, 3600, 4237, 3736, 4390, 4521, 5253, 3903, 4575, 4710, 5459, 4871, 5637, 5789, 6631, 4110, 4804, 4942, 5713, 5108, 5895, 6051, 6913, 5310, 6114, 6273, 7151, 6465, 7358, 7534, 8496, 3168, 3759, 3878, 4547, 4021, 4705, 4842, 5604, 4198, 4900, 5039, 5820, 5209, 6003, 6161, 7031, 4413, 5134, 5279, 6080, 5453, 6267, 6429, 7319, 5666, 6498, 6662, 7569, 6860, 7780, 7960, 8948, 4680, 5427, 5576, 6400, 5755, 6594, 6760, 7672, 5972, 6829, 6998, 7927, 7201, 8143, 8328, 9335, 6238, 7114, 7287, 8234, 7494, 8454, 8642, 9666, 7745, 8720, 8911, 9948, 9139, 10187, 10390, 11490, 3477, 4101, 4226, 4931, 4381, 5099, 5242, 6040, 4565, 5300, 5446, 6260, 5626, 6454, 6617, 7520, 4793, 5551, 5700, 6536, 5884, 6734, 6900, 7824, 6102, 6969, 7137, 8077, 7345, 8297, 8481, 9499, 5070, 5854, 6009, 6868, 6196, 7070, 7242, 8187, 6421, 7311, 7487, 8447, 7696, 8669, 8860, 9896, 6700, 7610, 7788, 8765, 8003, 8994, 9187, 10237, 8260, 9266, 9462, 10524, 9695, 10769, 10978, 12097, 5417, 6228, 6389, 7276, 6583, 7482, 7660, 8629, 6817, 7733, 7913, 8897, 8130, 9126, 9320, 10375, 7102, 8039, 8221, 9225, 8440, 9455, 9651, 10723, 8706, 9735, 9933, 11018, 10172, 11266, 11474, 12612, 7449, 8407, 8595, 9617, 8818, 9851, 10053, 11140, 9088, 10134, 10338, 11437, 10579, 11686, 11900, 13048, 9418, 10479, 10685, 11795, 10929, 12047, 12263, 13418, 11225, 12354, 12572, 13734, 12828, 13997, 14220, 15408, 3867, 4535, 4669, 5415, 4830, 5591, 5743, 6581, 5026, 5806, 5959, 6815, 6147, 7016, 7187, 8128, 5266, 6065, 6224, 7098, 6414, 7302, 7478, 8436, 6647, 7552, 7729, 8702, 7944, 8930, 9122, 10168, 5564, 6387, 6550, 7447, 6747, 7658, 7838, 8816, 6983, 7911, 8092, 9086, 8312, 9318, 9515, 10577, 7272, 8217, 8403, 9414, 8625, 9647, 9847, 10925, 8893, 9929, 10130, 11221, 10371, 11470, 11682, 12824, 5924, 6777, 6946, 7872, 7146, 8086, 8270, 9276, 7394, 8348, 8535, 9554, 8758, 9789, 9989, 11075, 7689, 8660, 8851, 9885, 9079, 10124, 10328, 11426, 9355, 10412, 10617, 11724, 10864, 11979, 12195, 13348, 8053, 9045, 9239, 10290, 9471, 10533, 10739, 11850, 9751, 10825, 11034, 12153, 11283, 12412, 12629, 13791, 10086, 11174, 11385, 12517, 11637, 12777, 12996, 14166, 11936, 13084, 13304, 14481, 13568, 14748, 14973, 16167, 6375, 7261, 7434, 8391, 7646, 8614, 8803, 9835, 7897, 8880, 9071, 10116, 9304, 10358, 10562, 11668, 8205, 9207, 9400, 10459, 9635, 10705, 10911, 12027, 9915, 10998, 11205, 12332, 11456, 12592, 12808, 13975, 8578, 9599, 9797, 10873, 10036, 11122, 11333, 12462, 10319, 11417, 11629, 12769, 11881, 13028, 13249, 14424, 10665, 11774, 11987, 13137, 12243, 13397, 13619, 14800, 12550, 13711, 13934, 15118, 14198, 15385, 15612, 16807, 9032, 10074, 10277, 11373, 10518, 11623, 11835, 12982, 10810, 11922, 12138, 13290, 12396, 13553, 13775, 14958, 11161, 12286, 12503, 13662, 12762, 13928, 14151, 15337, 13069, 14242, 14465, 15655, 14732, 15926, 16151, 17347, 11584, 12722, 12942, 14110, 13200, 14375, 14599, 15790, 13511, 14690, 14917, 16110, 15183, 16378, 16605, 17799, 13884, 15067, 15294, 16489, 15562, 16757, 16984, 18175, 15881, 17076, 17304, 18491, 17572, 18757, 18981, 20143, 4367, 5083, 5227, 6023, 5400, 6210, 6371, 7257, 5610, 6436, 6600, 7501, 6798, 7713, 7893, 8876, 5867, 6715, 6882, 7804, 7083, 8018, 8201, 9203, 7326, 8276, 8461, 9477, 8685, 9712, 9911, 10994, 6180, 7052, 7223, 8166, 7430, 8387, 8574, 9595, 7678, 8649, 8839, 9873, 9067, 10112, 10315, 11413, 7983, 8972, 9164, 10213, 9396, 10455, 10661, 11770, 9673, 10745, 10953, 12071, 11201, 12328, 12546, 13707, 6565, 7463, 7642, 8610, 7854, 8833, 9027, 10069, 8110, 9105, 9300, 10354, 9534, 10597, 10805, 11917, 8420, 9433, 9631, 10701, 9866, 10946, 11156, 12281, 10150, 11242, 11452, 12588, 11703, 12846, 13064, 14237, 8799, 9831, 10032, 11118, 10272, 11368, 11579, 12717, 10558, 11664, 11877, 13024, 12133, 13285, 13506, 14685, 10907, 12023, 12239, 13393, 12498, 13657, 13879, 15062, 12804, 13971, 14194, 15381, 14460, 15650, 15876, 17071, 7038, 7969, 8150, 9148, 8372, 9382, 9578, 10645, 8635, 9659, 9857, 10937, 10096, 11186, 11395, 12529, 8957, 9997, 10196, 11291, 10440, 11543, 11753, 12899, 10731, 11842, 12055, 13207, 12313, 13469, 13690, 14873, 9342, 10399, 10604, 11711, 10851, 11966, 12182, 13635, 11146, 12271, 12488, 13647, 12746, 13912, 14136, 15322, 11499, 12637, 12854, 14023, 13114, 14289, 14512, 15704, 13426, 14606, 14829, 16024, 15096, 16292, 16518, 17714, 9816, 10893, 11102, 12224, 11352, 12482, 12700, 13863, 11648, 12789, 13007, 14178, 13268, 14444, 14667, 15859, 12008, 13159, 13377, 14557, 13640, 14822, 15045, 16241, 13956, 15141, 15365, 16562, 15634, 16830, 17054, 18246, 12441, 13599, 13822, 15004, 14088, 15273, 15499, 16693, 14402, 15591, 15818, 17012, 16087, 17282, 17508, 18692, 14778, 15973, 16197, 17394, 16466, 17662, 17885, 19068, 16786, 17981, 18203, 19383, 18469, 19644, 19860, 21006, 7626, 8593, 8782, 9813, 9010, 10051, 10254, 11349, 9283, 10336, 10540, 11645, 10787, 11898, 12114, 13265, 9613, 10681, 10888, 12003, 11136, 12259, 12477, 13635, 11433, 12568, 12784, 13951, 13044, 14216, 14439, 15629, 10013, 11099, 11309, 12438, 11559, 12697, 12917, 14085, 11857, 13004, 13224, 14399, 13485, 14664, 14891, 16084, 12219, 13372, 13594, 14773, 13858, 15040, 15268, 16461, 14173, 15360, 15586, 16781, 15854, 17049, 17277, 18464, 10495, 11599, 11812, 12958, 12065, 13217, 13437, 14617, 12372, 13528, 13751, 14933, 14016, 15201, 15426, 16622, 12736, 13900, 14125, 15310, 14391, 15579, 15807, 17001, 14706, 15899, 16125, 17321, 16395, 17590, 17815, 18998, 13175, 14350, 14574, 15765, 14840, 16035, 16259, 17455, 15157, 16352, 16579, 17773, 16847, 18041, 18264, 19442, 15536, 16730, 16958, 18148, 17229, 18416, 18640, 19808, 17545, 18730, 18954, 20116, 19220, 20377, 20594, 21714, 11084, 12205, 12421, 13578, 12682, 13844, 14068, 15252, 12989, 14159, 14382, 15570, 14649, 15840, 16067, 17261, 13357, 14536, 14757, 15952, 15025, 16220, 16445, 17641, 15344, 16540, 16764, 17959, 17033, 18224, 18447, 19622, 13800, 14983, 15209, 16404, 15477, 16672, 16900, 18092, 15797, 16992, 17219, 18407, 17487, 18672, 18897, 20060, 16176, 17373, 17598, 18783, 17864, 19047, 19270, 20426, 18182, 19362, 19581, 20732, 19839, 20985, 21197, 22300, 14335, 15522, 15749, 16943, 16018, 17213, 17438, 18624, 16337, 17531, 17757, 18939, 18025, 19205, 19425, 20578, 16715, 17909, 18133, 19313, 18400, 19575, 19793, 20940, 18714, 19882, 20100, 21238, 20361, 21490, 21698, 22784, 17169, 18358, 18582, 19753, 18847, 20013, 20230, 21364, 19162, 20320, 20537, 21659, 20794, 21909, 22115, 23182, 19532, 20684, 20899, 22010, 21152, 22257, 22461, 23513, 21448, 22543, 22744, 23784, 22984, 24015, 24202, 25168, 5006, 5784, 5937, 6791, 6124, 6992, 7162, 8102, 6352, 7236, 7409, 8364, 7621, 8588, 8776, 9807, 6625, 7528, 7705, 8678, 7920, 8904, 9096, 10142, 8179, 9179, 9372, 10431, 9608, 10676, 10882, 11998, 6959, 7886, 8067, 9060, 8286, 9292, 9488, 10550, 8550, 9570, 9768, 10843, 10007, 11093, 11303, 12432, 8868, 9904, 10104, 11194, 10345, 11444, 11655, 12796, 10635, 11744, 11956, 13105, 12213, 13367, 13588, 14768, 7369, 8322, 8508, 9526, 8731, 9761, 9960, 11045, 9005, 10046, 10248, 11343, 10489, 11593, 11805, 12951, 9328, 10383, 10588, 11695, 10835, 11948, 12164, 13317, 11131, 12254, 12471, 13630, 12730, 13894, 14118, 15304, 9723, 10797, 11006, 12125, 11253, 12382, 12600, 13762, 11553, 12691, 12911, 14079, 13168, 14343, 14568, 15759, 11908, 13056, 13276, 14452, 13538, 14718, 14944, 16138, 13852, 15035, 15262, 16456, 15529, 16724, 16952, 18143, 7874, 8855, 9047, 10090, 9279, 10332, 10536, 11641, 9556, 10621, 10827, 11940, 11078, 12199, 12415, 13572, 9889, 10971, 11178, 12305, 11429, 12564, 12780, 13947, 11728, 12873, 13088, 14263, 13351, 14530, 14751, 15946, 10292, 11389, 11601, 12740, 11853, 13000, 13220, 14395, 12155, 13308, 13530, 14710, 13794, 14977, 15204, 16399, 12521, 13682, 13904, 15088, 14169, 15356, 15582, 16777, 14485, 15677, 15903, 17099, 16170, 17367, 17593, 18778, 10783, 11894, 12110, 13261, 12367, 13523, 13746, 14928, 12676, 13838, 14062, 15246, 14328, 15515, 15742, 16936, 13040, 14212, 14435, 15625, 14701, 15894, 16120, 17316, 15019, 16214, 16439, 17635, 16708, 17902, 18126, 19306, 13481, 14660, 14887, 16080, 15152, 16347, 16575, 17769, 15471, 16666, 16895, 18087, 17162, 18351, 18577, 19748, 15850, 17045, 17273, 18460, 17540, 18725, 18950, 20112, 17858, 19041, 19265, 20421, 19525, 20677, 20894, 22005, 8491, 9509, 9706, 10780, 9942, 11027, 11235, 12364, 10230, 11325, 11535, 12673, 11787, 12933, 13150, 14325, 10570, 11676, 11890, 13037, 12145, 13297, 13519, 14698, 12453, 13611, 13834, 15016, 14100, 15285, 15511, 16705, 10988, 12107, 12322, 13478, 12581, 13743, 13964, 15149, 12891, 14059, 14281, 15468, 14548, 15739, 15964, 17159, 13257, 14432, 14656, 15847, 14924, 16117, 16343, 17537, 15242, 16436, 16662, 17855, 16932, 18123, 18347, 19522, 11484, 12622, 12839, 14008, 13098, 14273, 14496, 15688, 13410, 14590, 14813, 16008, 15079, 16275, 16501, 17697, 13783, 14966, 15192, 16387, 15460, 16656, 16883, 18076, 15780, 16975, 17202, 18390, 17470, 18656, 18880, 20044, 14230, 15418, 15643, 16839, 15913, 17109, 17335, 18523, 16232, 17428, 17653, 18837, 17920, 19102, 19324, 20479, 16613, 17807, 18032, 19212, 18299, 19476, 19696, 20844, 18613, 19783, 20002, 21142, 20261, 21393, 21604, 22692, 12091, 13243, 13462, 14642, 13727, 14910, 15133, 16329, 14043, 15228, 15452, 16648, 15723, 16918, 17143, 18333, 14417, 15606, 15832, 17026, 16102, 17297, 17522, 18706, 16421, 17616, 17840, 19022, 18108, 19287, 19507, 20658, 14866, 16060, 16285, 17480, 16554, 17749, 17973, 19154, 16874, 18067, 18291, 19468, 18556, 19728, 19947, 21089, 17253, 18440, 18664, 19832, 18930, 20092, 20311, 21440, 19245, 20401, 20619, 21738, 20874, 21985, 22194, 23256, 15401, 16598, 16822, 18017, 17091, 18283, 18505, 19680, 17412, 18599, 18821, 19988, 19086, 20247, 20463, 21590, 17791, 18974, 19196, 20353, 19460, 20613, 20828, 21941, 19768, 20915, 21127, 22232, 21379, 22476, 22678, 23721, 18238, 19417, 19636, 20786, 19895, 21040, 21251, 22353, 20204, 21339, 21550, 22641, 21797, 22879, 23079, 24105, 20569, 21690, 21900, 22976, 22147, 23212, 23410, 24418, 22436, 23489, 23685, 24679, 23913, 24894, 25076, 25989, 9256, 10308, 10513, 11618, 10759, 11870, 12086, 13238, 11054, 12174, 12391, 13548, 12652, 13814, 14038, 15223, 11405, 12539, 12757, 13923, 13016, 14187, 14412, 15601, 13326, 14504, 14727, 15921, 14995, 16189, 16416, 17611, 11830, 12977, 13195, 14370, 13457, 14637, 14861, 16055, 13770, 14953, 15178, 16373, 15447, 16643, 16869, 18062, 14146, 15332, 15557, 16752, 15827, 17021, 17248, 18435, 16146, 17342, 17567, 18752, 17835, 19017, 19240, 20396, 12343, 13499, 13723, 14906, 13986, 15171, 15397, 16594, 14304, 15491, 15719, 16914, 15987, 17182, 17408, 18595, 14677, 15869, 16098, 17293, 16365, 17560, 17787, 18970, 16684, 17877, 18104, 19283, 18369, 19544, 19764, 20911, 15129, 16325, 16550, 17745, 16818, 18013, 18234, 19413, 17139, 18329, 18552, 19724, 18817, 19984, 20200, 21335, 17518, 18702, 18926, 20088, 19192, 20349, 20565, 21686, 19503, 20654, 20870, 21981, 21123, 22228, 22432, 23485, 12961, 14130, 14353, 15541, 14621, 15812, 16039, 17234, 14936, 16130, 16355, 17550, 16626, 17820, 18045, 19225, 15315, 16511, 16735, 17930, 17005, 18196, 18420, 19595, 17326, 18514, 18735, 19904, 19002, 20164, 20381, 21510, 15768, 16963, 17190, 18378, 17459, 18645, 18869, 20033, 17776, 18959, 19182, 20339, 19446, 20599, 20815, 21928, 18153, 19333, 19552, 20704, 19812, 20958, 21170, 22274, 20121, 21259, 21468, 22563, 21718, 22803, 23002, 24032, 16308, 17502, 17729, 18912, 17996, 19176, 19397, 20551, 18312, 19488, 19708, 20856, 19968, 21109, 21320, 22419, 18685, 19853, 20073, 21211, 20332, 21461, 21671, 22757, 20639, 21758, 21967, 23041, 22214, 23276, 23472, 24478, 19134, 20293, 20510, 21633, 20766, 21882, 22088, 23156, 21069, 22176, 22381, 23436, 22622, 23668, 23860, 24844, 21421, 22516, 22718, 23759, 22957, 23988, 24176, 25143, 23238, 24256, 24442, 25395, 24662, 25602, 25772, 26640, 13701, 14884, 15108, 16304, 15375, 16572, 16797, 17992, 15697, 16892, 17118, 18308, 17387, 18574, 18797, 19964, 16076, 17270, 17497, 18681, 17765, 18947, 19171, 20328, 18083, 19262, 19483, 20635, 19744, 20891, 21104, 22210, 16529, 17725, 17948, 19130, 18213, 19393, 19611, 20762, 18531, 19704, 19922, 21065, 20180, 21316, 21526, 22618, 18907, 20069, 20288, 21417, 20546, 21667, 21877, 22953, 20851, 21963, 22171, 23234, 22414, 23468, 23663, 24658, 17065, 18257, 18481, 19656, 18746, 19915, 20133, 21271, 19061, 20222, 20440, 21567, 20697, 21815, 22023, 23095, 19434, 20587, 20804, 21918, 21058, 22165, 22371, 23427, 21355, 22453, 22656, 23701, 22895, 23929, 24119, 25090, 19871, 21017, 21227, 22330, 21479, 22574, 22773, 23813, 21774, 22857, 23056, 24083, 23291, 24307, 24492, 25442, 22125, 23191, 23388, 24397, 23622, 24619, 24801, 25731, 23892, 24875, 25055, 25970, 25267, 26168, 26332, 27158, 17708, 18891, 19113, 20272, 19377, 20531, 20747, 21863, 19689, 20837, 21049, 22156, 21302, 22401, 22604, 23650, 20053, 21191, 21402, 22498, 21652, 22738, 22939, 23971, 21948, 23022, 23219, 24238, 23454, 24460, 24644, 25585, 20489, 21614, 21823, 22903, 22069, 23139, 23336, 24349, 22361, 23418, 23612, 24610, 23842, 24828, 25008, 25926, 22701, 23743, 23936, 24915, 24160, 25128, 25306, 26204, 24425, 25379, 25552, 26434, 25756, 26625, 26782, 27575, 21000, 22109, 22315, 23374, 22557, 23606, 23798, 24787, 22843, 23879, 24070, 25043, 24294, 25255, 25430, 26321, 23175, 24196, 24383, 25340, 24604, 25547, 25718, 26590, 24861, 25789, 25957, 26813, 26156, 26996, 27147, 27911, 23567, 24569, 24751, 25686, 24966, 25888, 26054, 26902, 25220, 26125, 26289, 27119, 26482, 27298, 27445, 28182, 25513, 26399, 26559, 27369, 26747, 27543, 27686, 28402, 26966, 27746, 27884, 28585, 28047, 28733, 28854, 29460, 2378, 2870, 2969, 3535, 3090, 3672, 3789, 4447, 3240, 3840, 3959, 4637, 4104, 4798, 4935, 5706, 3423, 4042, 4166, 4865, 4317, 5030, 5172, 5964, 4504, 5234, 5380, 6188, 5556, 6379, 6542, 7439, 3649, 4292, 4421, 5144, 4579, 5316, 5463, 6279, 4771, 5527, 5676, 6510, 5858, 6706, 6872, 7794, 5003, 5780, 5933, 6786, 6120, 6988, 7157, 8097, 6348, 7231, 7405, 8359, 7616, 8583, 8771, 9802, 3932, 4607, 4742, 5494, 4904, 5672, 5825, 6669, 5102, 5889, 6044, 6906, 6231, 7107, 7280, 8227, 5346, 6152, 6312, 7193, 6504, 7399, 7576, 8541, 6739, 7650, 7830, 8808, 8044, 9036, 9231, 10282, 5642, 6472, 6636, 7541, 6834, 7752, 7932, 8918, 7074, 8009, 8191, 9193, 8411, 9424, 9621, 10691, 7365, 8318, 8503, 9521, 8727, 9757, 9955, 11040, 9000, 10041, 10243, 11338, 10485, 11589, 11801, 12947, 4282, 4993, 5132, 5922, 5304, 6108, 6265, 7144, 5515, 6336, 6496, 7392, 6692, 7602, 7778, 8756, 5769, 6608, 6775, 7687, 6975, 7902, 8084, 9077, 7218, 8160, 8346, 9353, 8568, 9588, 9787, 10862, 6077, 6943, 7111, 8050, 7316, 8267, 8451, 9468, 7567, 8533, 8718, 9749, 8946, 9987, 10185, 11281, 7869, 8848, 9042, 10083, 9273, 10325, 10530, 11634, 9552, 10615, 10823, 11934, 11073, 12193, 12410, 13566, 6459, 7352, 7526, 8489, 7738, 8713, 8903, 9941, 7995, 8986, 9177, 10228, 9409, 10470, 10675, 11786, 8304, 9309, 9507, 10568, 9742, 10815, 11026, 12144, 10026, 11111, 11323, 12451, 11573, 12710, 12932, 14099, 8675, 9703, 9901, 10985, 10140, 11233, 11442, 12579, 10429, 11533, 11742, 12889, 11997, 13149, 13366, 14547, 10777, 11887, 12104, 13254, 12362, 13517, 13741, 14922, 12671, 13832, 14057, 15240, 14324, 15510, 15738, 16931, 4729, 5479, 5630, 6458, 5811, 6653, 6821, 7737, 6030, 6890, 7060, 7993, 7265, 8210, 8396, 9407, 6295, 7175, 7349, 8301, 7558, 8522, 8710, 9739, 7812, 8789, 8982, 10022, 9212, 10262, 10466, 11569, 6621, 7524, 7700, 8673, 7917, 8901, 9092, 10138, 8174, 9174, 9367, 10426, 9604, 10672, 10878, 11994, 8485, 9503, 9699, 10773, 9937, 11022, 11229, 12358, 10223, 11318, 11528, 12666, 11781, 12927, 13144, 14319, 7022, 7951, 8135, 9131, 8354, 9362, 9561, 10626, 8618, 9640, 9840, 10918, 10078, 11166, 11378, 12510, 8937, 9976, 10177, 11271, 10419, 11521, 11733, 12878, 10710, 11820, 12034, 13185, 12291, 13446, 13669, 14851, 9325, 10380, 10584, 11691, 10832, 11945, 12160, 13313, 11127, 12250, 12467, 13626, 12727, 13891, 14115, 15301, 11479, 12617, 12833, 14002, 13093, 14268, 14490, 15682, 13404, 14584, 14807, 16002, 15074, 16270, 16496, 17692, 7509, 8470, 8658, 9684, 8885, 9921, 10122, 11213, 9158, 10207, 10410, 11512, 10655, 11764, 11977, 13127, 9486, 10548, 10756, 11867, 11004, 12123, 12340, 13496, 11302, 12431, 12650, 13812, 12910, 14078, 14302, 15489, 9882, 10964, 11171, 12298, 11423, 12558, 12774, 13941, 11722, 12867, 13082, 14257, 13346, 14525, 14746, 15941, 12082, 13234, 13453, 14633, 13719, 14902, 15125, 16321, 14036, 15221, 15445, 16641, 15717, 16912, 17137, 18327, 10363, 11462, 11674, 12816, 11927, 13075, 13296, 14473, 12233, 13387, 13609, 14790, 13873, 15056, 15284, 16479, 12598, 13760, 13983, 15168, 14248, 15436, 15663, 16859, 14567, 15758, 15985, 17180, 16252, 17448, 17675, 18859, 13034, 14206, 14429, 15619, 14696, 15889, 16115, 17311, 15014, 16209, 16434, 17630, 16704, 17898, 18122, 19302, 15393, 16590, 16814, 18009, 17084, 18276, 18498, 19673, 17406, 18593, 18815, 19982, 19081, 20242, 20458, 21585, 5288, 6090, 6248, 7125, 6440, 7331, 7506, 8467, 6673, 7581, 7757, 8733, 7973, 8962, 9153, 10202, 6955, 7881, 8063, 9055, 8281, 9287, 9483, 10545, 8546, 9565, 9763, 10837, 10002, 11088, 11297, 12426, 7297, 8246, 8430, 9445, 8654, 9680, 9878, 10960, 8923, 9962, 10161, 11255, 10404, 11506, 11716, 12861, 9250, 10301, 10506, 11610, 10752, 11863, 12078, 13230, 11047, 12166, 12384, 13540, 12644, 13806, 14030, 15215, 7718, 8691, 8882, 9918, 9110, 10156, 10360, 11459, 9386, 10445, 10650, 11759, 10897, 12013, 12229, 13383, 9718, 10792, 11001, 12120, 11248, 12377, 12595, 13757, 11548, 12686, 12905, 14073, 13164, 14339, 14563, 15754, 10118, 11209, 11419, 12554, 11670, 12812, 13030, 14202, 11971, 13121, 13340, 14519, 13604, 14785, 15009, 16204, 12336, 13492, 13715, 14898, 13979, 15164, 15389, 16586, 14296, 15483, 15711, 16906, 15980, 17175, 17401, 18588, 8231, 9236, 9429, 10491, 9663, 10736, 10942, 12061, 9946, 11032, 11239, 12369, 11488, 12627, 12843, 14013, 10287, 11382, 11595, 12732, 11847, 12993, 13213, 14387, 12151, 13302, 13525, 14703, 13789, 14971, 15198, 16392, 10696, 11807, 12018, 13170, 12276, 13432, 13652, 14835, 12585, 13748, 13968, 15154, 14234, 15423, 15647, 16844, 12953, 14120, 14345, 15531, 14612, 15802, 16030, 17224, 14930, 16122, 16349, 17542, 16619, 17812, 18038, 19217, 11191, 12319, 12535, 13697, 12794, 13962, 14184, 15372, 13103, 14279, 14501, 15694, 14767, 15963, 16187, 17385, 13475, 14653, 14880, 16072, 15147, 16341, 16569, 17762, 15466, 16660, 16889, 18080, 17158, 18346, 18572, 19742, 13918, 15103, 15327, 16524, 15597, 16793, 17017, 18209, 15918, 17115, 17339, 18528, 17609, 18795, 19015, 20178, 16299, 17492, 17720, 18902, 17988, 19167, 19389, 20542, 18305, 19480, 19701, 20848, 19962, 21102, 21314, 22412, 8863, 9899, 10099, 11189, 10341, 11440, 11651, 12792, 10630, 11739, 11950, 13100, 12209, 13363, 13583, 14764, 10981, 12100, 12316, 13472, 12575, 13737, 13959, 15144, 12884, 14052, 14275, 15462, 14542, 15733, 15959, 17154, 11399, 12533, 12750, 13916, 13011, 14182, 14406, 15595, 13319, 14498, 14720, 15915, 14989, 16184, 16410, 17606, 13694, 14877, 15100, 16296, 15369, 16566, 16790, 17985, 15690, 16885, 17111, 18301, 17381, 18568, 18791, 19958, 11904, 13052, 13272, 14448, 13534, 14714, 14940, 16134, 13848, 15031, 15257, 16452, 15526, 16721, 16948, 18140, 14224, 15412, 15638, 16834, 15907, 17103, 17330, 18518, 16226, 17422, 17648, 18832, 17915, 19097, 19320, 20475, 14672, 15864, 16092, 17287, 16360, 17555, 17781, 18964, 16678, 17872, 18098, 19278, 18364, 19540, 19759, 20907, 17059, 18251, 18474, 19649, 18740, 19909, 20126, 21264, 19055, 20216, 20434, 21561, 20692, 21810, 22018, 23090, 12514, 13675, 13896, 15081, 14163, 15350, 15575, 16771, 14479, 15671, 15896, 17093, 16165, 17362, 17587, 18773, 14857, 16051, 16277, 17472, 16546, 17741, 17966, 19147, 16867, 18060, 18285, 19462, 18550, 19722, 19942, 21084, 15306, 16503, 16726, 17922, 16997, 18189, 18412, 19588, 17318, 18507, 18727, 19897, 18995, 20158, 20374, 21504, 17699, 18882, 19104, 20263, 19369, 20523, 20739, 21855, 19682, 20830, 21042, 22149, 21296, 22395, 22598, 23644, 15844, 17039, 17266, 18454, 17535, 18720, 18944, 20107, 17853, 19036, 19259, 20416, 19521, 20673, 20889, 22001, 18230, 19409, 19629, 20779, 19888, 21033, 21245, 22347, 20198, 21333, 21545, 22636, 21792, 22874, 23075, 24101, 18677, 19846, 20065, 21204, 20325, 21455, 21664, 22751, 20632, 21752, 21960, 23035, 22208, 23271, 23466, 24473, 20992, 22101, 22307, 23366, 22550, 23599, 23791, 24780, 22837, 23873, 24064, 25037, 24289, 25250, 25425, 26316, 6008, 6867, 7037, 7968, 7241, 8186, 8371, 9381, 7486, 8446, 8634, 9658, 8859, 9895, 10095, 11185, 7787, 8764, 8956, 9996, 9186, 10236, 10439, 11542, 9461, 10523, 10730, 11841, 10977, 12096, 12312, 13468, 8149, 9147, 9341, 10398, 9577, 10644, 10850, 11965, 9856, 10936, 11145, 12270, 11394, 12528, 12745, 13911, 10195, 11290, 11498, 12636, 11752, 12898, 13113, 14288, 12054, 13206, 13425, 14605, 13689, 14872, 15095, 16291, 8594, 9616, 9815, 10892, 10052, 11139, 11351, 12481, 10337, 11436, 11647, 12788, 11899, 13047, 13267, 14443, 10684, 11794, 12007, 13158, 12262, 13417, 13639, 14821, 12571, 13733, 13955, 15140, 14219, 15407, 15633, 16829, 11101, 12223, 12440, 13598, 12699, 13862, 14087, 15272, 13006, 14177, 14401, 15590, 14666, 15858, 16086, 17281, 13376, 14556, 14777, 15972, 15044, 16240, 16465, 17661, 15364, 16561, 16785, 17980, 17053, 18245, 18468, 19643, 9132, 10180, 10382, 11483, 10627, 11736, 11947, 13097, 10920, 12038, 12253, 13409, 12511, 13672, 13893, 15078, 11274, 12402, 12621, 13782, 12881, 14049, 14272, 15459, 13189, 14363, 14589, 15779, 14854, 16048, 16274, 17469, 11693, 12837, 13054, 14228, 13315, 14494, 14716, 15911, 13629, 14812, 15034, 16231, 15303, 16500, 16723, 17919, 14006, 15190, 15416, 16611, 15686, 16881, 17107, 18297, 16007, 17201, 17427, 18612, 17696, 18879, 19101, 20260, 12206, 13360, 13580, 14761, 13845, 15028, 15254, 16449, 14160, 15347, 15572, 16768, 15841, 17036, 17263, 18451, 14539, 15730, 15956, 17151, 16223, 17419, 17645, 18829, 16543, 17738, 17963, 19144, 18227, 19406, 19626, 20776, 14985, 16180, 16406, 17602, 16674, 17868, 18094, 19274, 16994, 18186, 18409, 19585, 18674, 19843, 20062, 21201, 17377, 18564, 18787, 19954, 19051, 20212, 20430, 21557, 19366, 20520, 20736, 21852, 20989, 22098, 22304, 23363, 9796, 10872, 11083, 12204, 11332, 12461, 12681, 13843, 11628, 12768, 12988, 14158, 13248, 14423, 14648, 15839, 11986, 13136, 13356, 14535, 13618, 14799, 15024, 16219, 13933, 15117, 15343, 16539, 15611, 16806, 17032, 18223, 12420, 13577, 13799, 14982, 14067, 15251, 15476, 16671, 14381, 15569, 15796, 16991, 16066, 17260, 17486, 18671, 14756, 15951, 16175, 17372, 16444, 17640, 17863, 19046, 16763, 17958, 18181, 19361, 18446, 19621, 19838, 20984, 12941, 14109, 14334, 15521, 14598, 15789, 16017, 17212, 14916, 16109, 16336, 17530, 16604, 17798, 18024, 19204, 15293, 16488, 16714, 17908, 16983, 18174, 18399, 19574, 17303, 18490, 18713, 19881, 18980, 20142, 20360, 21489, 15748, 16942, 17168, 18357, 17437, 18623, 18846, 20012, 17756, 18938, 19161, 20319, 19424, 20577, 20793, 21908, 18132, 19312, 19531, 20683, 19792, 20939, 21151, 22256, 20099, 21237, 21447, 22542, 21697, 22783, 22983, 24014, 13559, 14739, 14965, 16159, 15234, 16428, 16655, 17848, 15551, 16746, 16974, 18165, 17243, 18430, 18655, 19823, 15932, 17128, 17354, 18542, 17622, 18807, 19029, 20191, 17941, 19123, 19345, 20500, 19605, 20756, 20969, 22079, 16385, 17580, 17805, 18988, 18074, 19253, 19474, 20626, 18389, 19564, 19782, 20929, 20043, 21181, 21392, 22488, 18764, 19933, 20149, 21287, 20408, 21537, 21744, 22829, 20716, 21834, 22040, 23112, 22285, 23346, 23539, 24543, 16925, 18116, 18341, 19516, 18606, 19776, 19996, 21136, 18921, 20083, 20303, 21432, 20560, 21681, 21892, 22968, 19294, 20450, 20666, 21785, 20922, 22033, 22240, 23302, 21221, 22324, 22527, 23577, 22767, 23807, 23999, 24976, 19736, 20883, 21096, 22202, 21347, 22445, 22648, 23693, 21643, 22729, 22930, 23962, 23166, 24187, 24374, 25331, 21993, 23067, 23263, 24281, 23497, 24503, 24686, 25626, 23770, 24761, 24940, 25864, 25154, 26064, 26228, 27064, 10603, 11710, 11924, 13072, 12181, 13334, 13556, 14736, 12487, 13646, 13869, 15052, 14135, 15321, 15547, 16742, 12853, 14022, 14245, 15433, 14511, 15703, 15929, 17125, 14828, 16023, 16248, 17444, 16517, 17713, 17937, 19119, 13292, 14469, 14692, 15885, 14961, 16155, 16381, 17576, 15279, 16474, 16699, 17893, 16969, 18160, 18384, 19559, 15659, 16855, 17080, 18272, 17350, 18538, 18760, 19929, 17670, 18854, 19076, 20237, 19340, 20495, 20711, 21829, 13821, 15003, 15231, 16425, 15498, 16692, 16921, 18112, 15817, 17011, 17240, 18427, 17507, 18691, 18917, 20079, 16196, 17393, 17619, 18804, 17884, 19067, 19290, 20446, 18202, 19382, 19602, 20753, 19859, 21005, 21217, 22320, 16651, 17844, 18070, 19249, 18336, 19511, 19731, 20878, 18651, 19819, 20039, 21177, 20298, 21427, 21638, 22724, 19025, 20187, 20404, 21533, 20661, 21780, 21988, 23062, 20965, 22075, 22281, 23342, 22522, 23572, 23765, 24756, 14450, 15641, 15866, 17062, 16136, 17333, 17557, 18743, 16455, 17652, 17875, 19059, 18142, 19323, 19542, 20695, 16837, 18030, 18254, 19431, 18521, 19694, 19912, 21055, 18836, 20001, 20220, 21353, 20478, 21603, 21813, 22893, 17289, 18477, 18698, 19867, 18966, 20129, 20345, 21475, 19281, 20438, 20652, 21772, 20909, 22021, 22226, 23289, 19652, 20800, 21013, 22121, 21267, 22367, 22570, 23618, 21565, 22654, 22855, 23890, 23093, 24117, 24305, 25265, 17826, 19009, 19232, 20389, 19494, 20646, 20862, 21974, 19802, 20949, 21162, 22267, 21411, 22507, 22710, 23752, 20171, 21307, 21518, 22610, 21765, 22848, 23048, 24075, 22059, 23129, 23328, 24341, 23557, 24559, 24743, 25678, 20606, 21726, 21934, 23009, 22182, 23245, 23441, 24448, 22471, 23523, 23716, 24709, 23945, 24924, 25103, 26015, 22811, 23848, 24039, 25014, 24263, 25225, 25401, 26294, 24527, 25474, 25647, 26523, 25848, 26710, 26866, 27653, 15208, 16403, 16630, 17824, 16899, 18091, 18316, 19492, 17218, 18406, 18630, 19800, 18896, 20059, 20278, 21409, 17597, 18782, 19006, 20168, 19269, 20425, 20643, 21762, 19580, 20731, 20946, 22056, 21196, 22299, 22504, 23554, 18050, 19230, 19451, 20604, 19712, 20860, 21073, 22180, 20020, 21160, 21371, 22469, 21620, 22708, 22909, 23943, 20386, 21515, 21723, 22808, 21971, 23045, 23242, 24260, 22264, 23325, 23520, 24524, 23749, 24740, 24921, 25845, 18581, 19752, 19972, 21113, 20229, 21363, 21574, 22664, 20536, 21658, 21869, 22946, 22114, 23181, 23379, 24389, 20898, 22009, 22218, 23280, 22460, 23512, 23708, 24701, 22743, 23783, 23977, 24954, 24201, 25167, 25345, 26241, 21324, 22423, 22626, 23672, 22864, 23900, 24090, 25063, 23145, 24167, 24355, 25313, 24574, 25519, 25691, 26565, 23476, 24482, 24666, 25606, 24882, 25809, 25977, 26831, 25134, 26044, 26210, 27046, 26404, 27226, 27374, 28118, 19210, 20367, 20584, 21705, 20842, 21954, 22162, 23226, 21141, 22246, 22451, 23504, 22691, 23733, 23927, 24907, 21495, 22589, 22790, 23829, 23027, 24056, 24244, 25208, 23308, 24323, 24510, 25459, 24725, 25662, 25833, 26697, 21915, 22991, 23188, 24209, 23424, 24432, 24616, 25559, 23699, 24693, 24873, 25801, 25088, 26001, 26166, 27006, 24021, 24997, 25174, 26082, 25385, 26279, 26440, 27259, 25633, 26510, 26668, 27470, 26854, 27642, 27782, 28491, 22406, 23460, 23656, 24651, 23884, 24867, 25048, 25963, 24151, 25119, 25299, 26197, 25504, 26390, 26552, 27362, 24465, 25417, 25591, 26471, 25794, 26661, 26818, 27609, 26030, 26880, 27035, 27808, 27213, 27971, 28108, 28788, 24834, 25763, 25932, 26789, 26130, 26972, 27124, 27890, 26362, 27186, 27335, 28082, 27509, 28241, 28372, 29026, 26631, 27436, 27581, 28307, 27751, 28463, 28590, 29222, 27947, 28642, 28765, 29380, 28909, 29510, 29616, 30139, 6929, 7855, 8035, 9028, 8251, 9257, 9451, 10514, 8516, 9535, 9731, 10806, 9969, 11055, 11262, 12392, 8834, 9867, 10070, 11157, 10309, 11406, 11619, 12758, 10598, 11704, 11918, 13065, 12175, 13327, 13549, 14728, 9221, 10273, 10475, 11580, 10719, 11831, 12043, 13196, 11014, 12134, 12350, 13507, 12608, 13771, 13993, 15179, 11369, 12499, 12718, 13880, 12978, 14147, 14371, 15558, 13286, 14461, 14686, 15877, 14954, 16147, 16374, 17568, 9686, 10760, 10967, 12087, 11215, 12344, 12561, 13724, 11514, 12653, 12869, 14039, 13129, 14305, 14527, 15720, 11871, 13017, 13239, 14413, 13500, 14678, 14907, 16099, 13815, 14996, 15224, 16417, 15492, 16685, 16915, 18105, 12301, 13458, 13678, 14862, 13944, 15130, 15353, 16551, 14259, 15448, 15673, 16870, 15943, 17140, 17364, 18553, 14638, 15828, 16056, 17249, 16326, 17519, 17746, 18927, 16644, 17836, 18063, 19241, 18330, 19504, 19725, 20871, 10257, 11353, 11562, 12701, 11815, 12962, 13178, 14354, 12117, 13269, 13488, 14668, 13754, 14937, 15160, 16356, 12483, 13641, 13864, 15046, 14131, 15316, 15542, 16736, 14445, 15635, 15860, 17055, 16131, 17327, 17551, 18736, 12920, 14089, 14312, 15500, 14577, 15769, 15995, 17191, 14894, 16088, 16314, 17509, 16582, 17777, 18002, 19183, 15274, 16467, 16694, 17886, 16964, 18154, 18379, 19553, 17283, 18470, 18693, 19861, 18960, 20122, 20340, 21469, 13441, 14622, 14844, 16040, 15112, 16309, 16533, 17730, 15430, 16627, 16851, 18046, 17122, 18313, 18535, 19709, 15813, 17006, 17235, 18421, 17503, 18686, 18913, 20074, 17821, 19003, 19226, 20382, 19489, 20640, 20857, 21968, 16263, 17460, 17685, 18870, 17952, 19135, 19355, 20511, 18268, 19447, 19666, 20816, 19926, 21070, 21281, 22382, 18646, 19813, 20034, 21171, 20294, 21422, 21634, 22719, 20600, 21719, 21929, 23003, 22177, 23239, 23437, 24443, 10947, 12066, 12282, 13438, 12540, 13702, 13924, 15109, 12847, 14017, 14238, 15427, 14505, 15698, 15922, 17119, 13218, 14392, 14618, 15808, 14885, 16077, 16305, 17498, 15202, 16396, 16623, 17816, 16893, 18084, 18309, 19484, 13658, 14841, 15063, 16260, 15333, 16530, 16753, 17949, 15651, 16848, 17072, 18265, 17343, 18532, 18753, 19923, 16036, 17230, 17456, 18641, 17726, 18908, 19131, 20289, 18042, 19221, 19443, 20595, 19705, 20852, 21066, 22172, 14188, 15376, 15602, 16798, 15870, 17066, 17294, 18482, 16190, 17388, 17612, 18798, 17878, 19062, 19284, 20441, 16573, 17766, 17993, 19172, 18258, 19435, 19657, 20805, 18575, 19745, 19965, 21105, 20223, 21356, 21568, 22657, 17022, 18214, 18436, 19612, 18703, 19872, 89, 21228, 19018, 20181, 20397, 21527, 20655, 21775, 21982, 23057, 19394, 20547, 20763, 21878, 21018, 22126, 22331, 23389, 21317, 22415, 22619, 23664, 22858, 23893, 24084, 25056, 14823, 16019, 16242, 17439, 16512, 17709, 17931, 19114, 16831, 18026, 18247, 19426, 18515, 19690, 19905, 21050, 17214, 18401, 18625, 19794, 18892, 20054, 20273, 21403, 19206, 20362, 20579, 21699, 20838, 21949, 22157, 23220, 17663, 18848, 19069, 20231, 19334, 20490, 20705, 21824, 19645, 20795, 21007, 22116, 21260, 22362, 22564, 23613, 20014, 21153, 21365, 22462, 21615, 22702, 22904, 23937, 21910, 22985, 23183, 24203, 23419, 24426, 24611, 25553, 18197, 19378, 19596, 20748, 19854, 21001, 21212, 22316, 20165, 21303, 21511, 22605, 21759, 22844, 23042, 24071, 20532, 21653, 21864, 22940, 22110, 23176, 23375, 24384, 22402, 23455, 23651, 24645, 23880, 24862, 25044, 25958, 20959, 22070, 22275, 23337, 22517, 23568, 23760, 24752, 22804, 23843, 24033, 25009, 24257, 25221, 25396, 26290, 23140, 24161, 24350, 25307, 24570, 25514, 25687, 26560, 24829, 25757, 25927, 26783, 26126, 26967, 27120, 27885, 11791, 12938, 13154, 14330, 13414, 14595, 14817, 16013, 13730, 14913, 15136, 16332, 15404, 16601, 16825, 18020, 14106, 15290, 15517, 16710, 15786, 16980, 17208, 18395, 16106, 17300, 17526, 18709, 17795, 18977, 19200, 20356, 14552, 15744, 15968, 17164, 16236, 17433, 17657, 18842, 16557, 17752, 17976, 19157, 18241, 19420, 19639, 20789, 16938, 18128, 18353, 19527, 18619, 19788, 20008, 21147, 18934, 20095, 20315, 21443, 20573, 21693, 21904, 22979, 15084, 16281, 16506, 17703, 16774, 17970, 18192, 19373, 17095, 18287, 18509, 19684, 18775, 19944, 20160, 21298, 17476, 18660, 18886, 20048, 19151, 20308, 20527, 21648, 19464, 20615, 20832, 21943, 21086, 22191, 22397, 23450, 17925, 19108, 19328, 20484, 19591, 20743, 20954, 22065, 19899, 21044, 21254, 22356, 21506, 22600, 22799, 23838, 20267, 21397, 21609, 22696, 21859, 22935, 23135, 24156, 22151, 23214, 23413, 24420, 23646, 24640, 24824, 25752, 15727, 16922, 17147, 18337, 17416, 18603, 18825, 19992, 17735, 18918, 19140, 20299, 19403, 20557, 20772, 21888, 18113, 19291, 19512, 20662, 19773, 20919, 21132, 22236, 20080, 21218, 21428, 22523, 21678, 22764, 22964, 23995, 18560, 19732, 19950, 21092, 20208, 21343, 21553, 22644, 20516, 21639, 21848, 22926, 22094, 23162, 23359, 24370, 20879, 21989, 22198, 23259, 22441, 23493, 23689, 24682, 22725, 23766, 23958, 24936, 24183, 25150, 25327, 26224, 19091, 20252, 20468, 21595, 20726, 21844, 22050, 23122, 21027, 22136, 22340, 23399, 22584, 23632, 23823, 24811, 21384, 22479, 22683, 23724, 22922, 23953, 24144, 25111, 23201, 24220, 24407, 25361, 24628, 25569, 25740, 26609, 21802, 22884, 23082, 24108, 23318, 24333, 24517, 25466, 23592, 24592, 24773, 25706, 24991, 25911, 26076, 26922, 23918, 24897, 25079, 25991, 25291, 26188, 26354, 27177, 25535, 26418, 26578, 27386, 26768, 27561, 27704, 28418, 16485, 17682, 17904, 19088, 18171, 19352, 19570, 20723, 18487, 19663, 19877, 21024, 20139, 21278, 21485, 22581, 18866, 20030, 20249, 21381, 20507, 21630, 21841, 22919, 20812, 21925, 22133, 23198, 22378, 23433, 23629, 24625, 19308, 20465, 20679, 21799, 20935, 22047, 22252, 23315, 21233, 22337, 22538, 23589, 22779, 23820, 24010, 24988, 21592, 22680, 22881, 23915, 23119, 24141, 24330, 25288, 23396, 24404, 24589, 25532, 24808, 25737, 25908, 26765, 19828, 20975, 21186, 22291, 21437, 22533, 22734, 23776, 21734, 22820, 23017, 24048, 23253, 24272, 24456, 25410, 22085, 23153, 23352, 24363, 23583, 24583, 24767, 25700, 23857, 24841, 25023, 25939, 25234, 26137, 26303, 27131, 22493, 23545, 23738, 24731, 23967, 24946, 25124, 26036, 24233, 25199, 25374, 26270, 25581, 26463, 26621, 27428, 24549, 25494, 25668, 26542, 25870, 26730, 26886, 27671, 26106, 26948, 27102, 27868, 27281, 28031, 28167, 28840, 20447, 21575, 21781, 22865, 22030, 23103, 23298, 24315, 22321, 23380, 23573, 24575, 23804, 24793, 24972, 25894, 22665, 23709, 23901, 24883, 24127, 25097, 25275, 26175, 24390, 25346, 25520, 26405, 25724, 26595, 26753, 27548, 23063, 24091, 24277, 25240, 24499, 25450, 25622, 26501, 24757, 25692, 25860, 26722, 26060, 26908, 27060, 27831, 25064, 25978, 26143, 26984, 26340, 27165, 27315, 28063, 26566, 27375, 27520, 28251, 27692, 28407, 28536, 29172, 23530, 24535, 24716, 25655, 24931, 25856, 26022, 26874, 25185, 26093, 26256, 27090, 26450, 27269, 27415, 28156, 25482, 26369, 26531, 27342, 26718, 27516, 27661, 28379, 26937, 27718, 27858, 28560, 28021, 28709, 28831, 29439, 25823, 26689, 26844, 27634, 27026, 27801, 27938, 28635, 27239, 27995, 28129, 28807, 28289, 28951, 29067, 29652, 27490, 28222, 28355, 29009, 28509, 29147, 29262, 29824, 28686, 29307, 29418, 29962, 29548, 30077, 30171, 30627, 12818, 13987, 14209, 15398, 14474, 15666, 15891, 17088, 14792, 15988, 16211, 17409, 16480, 17677, 17899, 19083, 15172, 16366, 16595, 17788, 16862, 18055, 18280, 19457, 17183, 18370, 18596, 19765, 18861, 20025, 20244, 21376, 15622, 16819, 17042, 18235, 17313, 18502, 18722, 19892, 17632, 18818, 19038, 20201, 19303, 20460, 20674, 21794, 18014, 19193, 19414, 20566, 19677, 20825, 21037, 22144, 19985, 21124, 21336, 22433, 21587, 22675, 22876, 23910, 16160, 17357, 17582, 18768, 17849, 19032, 19255, 20412, 18166, 19347, 19565, 20718, 19824, 20971, 21182, 22287, 18545, 19717, 19937, 21079, 20194, 21329, 21541, 22632, 20502, 21625, 21836, 22914, 22081, 23149, 23348, 24359, 18990, 20153, 20369, 21499, 20628, 21748, 21956, 23031, 20930, 22042, 22247, 23310, 22489, 23541, 23734, 24727, 21291, 22390, 22593, 23639, 22833, 23869, 24060, 25033, 23114, 24136, 24325, 25283, 24545, 25490, 25664, 26538, 16801, 17997, 18217, 19398, 18484, 19660, 19874, 21021, 18801, 19969, 20184, 21321, 20443, 21571, 21777, 22861, 19177, 20333, 20552, 21672, 20809, 21922, 22130, 23195, 21110, 22215, 22420, 23473, 22661, 23705, 23897, 24879, 19615, 20767, 20978, 22089, 21230, 22334, 22535, 23586, 21530, 22623, 22823, 23861, 23059, 24087, 24274, 25237, 21883, 22958, 23157, 24177, 23393, 24401, 24586, 25529, 23669, 24663, 24845, 25773, 25060, 25974, 26140, 26981, 20136, 21275, 21482, 22578, 21732, 22818, 23015, 24046, 22026, 23099, 23294, 24311, 23527, 24532, 24713, 25652, 22375, 23430, 23626, 24622, 23855, 24839, 25021, 25937, 24123, 25093, 25271, 26171, 25479, 26366, 26528, 27339, 22776, 23817, 24007, 24985, 24231, 25197, 25372, 26268, 24495, 25446, 25619, 26498, 25820, 26686, 26842, 27632, 24805, 25734, 25905, 26762, 26104, 26946, 27100, 27866, 26336, 27161, 27312, 28060, 27487, 28219, 28353, 29007, 17561, 18747, 18971, 20134, 19235, 20392, 20610, 21730, 19545, 20698, 20912, 22024, 21164, 22269, 22473, 23525, 19916, 21059, 21272, 22372, 21521, 22613, 22815, 23852, 21816, 22896, 23096, 24120, 23330, 24343, 24529, 25476, 20350, 21480, 21687, 22774, 21938, 23013, 23209, 24229, 22229, 23292, 23486, 24493, 23718, 24711, 24891, 25818, 22575, 23623, 23814, 24802, 24043, 25018, 25194, 26101, 24308, 25268, 25443, 26333, 25649, 26525, 26683, 27484, 20865, 21977, 22186, 23249, 22428, 23482, 23678, 24673, 22712, 23754, 23947, 24926, 24171, 25139, 25317, 26215, 23051, 24078, 24267, 25229, 24488, 25438, 25613, 26491, 24745, 25680, 25850, 26712, 26049, 26897, 27051, 27822, 23445, 24452, 24635, 25577, 24853, 25782, 25949, 26806, 25105, 26017, 26182, 27021, 26377, 27201, 27349, 28096, 25405, 26298, 26458, 27276, 26650, 27454, 27598, 28323, 26868, 27655, 27795, 28503, 27960, 28654, 28777, 29391, 21462, 22558, 22758, 23799, 22997, 24028, 24215, 25181, 23277, 24295, 24479, 25431, 24698, 25638, 25806, 26673, 23607, 24605, 24788, 25719, 25004, 25922, 26089, 26933, 25256, 26157, 26322, 27148, 26515, 27327, 27475, 28208, 23989, 24967, 25144, 26055, 25356, 26252, 26413, 27235, 25603, 26483, 26641, 27446, 26828, 27619, 27759, 28471, 25889, 26748, 26903, 27687, 27086, 27854, 27991, 28682, 27299, 28048, 28183, 28855, 28342, 28997, 29114, 29693, 24437, 25391, 25564, 26446, 768, 26637, 26794, 27587, 26005, 26858, 27010, 27786, 27190, 27951, 28086, 28769, 26285, 27115, 27265, 28017, 27442, 28179, 28313, 28971, 27646, 28365, 28495, 29134, 28646, 29271, 29384, 29931, 26604, 27411, 27556, 28285, 27727, 28441, 28568, 29203, 27923, 28621, 28744, 29362, 28888, 29492, 29598, 30124, 28152, 28827, 28947, 29544, 29088, 29670, 29773, 30279, 29250, 29813, 29913, 30402, 30029, 30503, 30587, 30991, 18457, 19633, 19849, 20996, 20109, 21248, 21457, 22553, 20418, 21547, 21754, 22839, 22002, 23076, 23272, 24290, 20783, 21897, 22105, 23171, 22350, 23407, 23602, 24600, 22638, 23682, 23875, 24857, 24102, 25073, 25251, 26152, 21207, 22311, 22512, 23563, 22753, 23794, 23984, 24962, 23037, 24066, 24252, 25216, 24474, 25426, 25598, 26478, 23370, 24379, 24565, 25509, 24783, 25714, 25884, 26743, 25039, 25953, 26121, 26962, 26317, 27143, 27294, 28043, 21707, 22793, 22993, 24024, 23228, 24247, 24434, 25388, 23505, 24511, 24694, 25634, 24908, 25834, 26002, 26855, 23832, 24818, 25000, 25918, 25211, 26116, 26282, 27112, 25460, 26348, 26511, 27323, 26698, 27497, 27643, 28362, 24211, 25177, 25352, 26248, 25561, 26443, 26601, 27408, 25802, 26669, 26824, 27615, 27007, 27783, 27920, 28618, 26085, 26929, 27082, 27850, 27262, 28014, 28149, 28824, 27471, 28204, 28338, 28993, 28492, 29131, 29247, 29810, 22294, 23355, 23548, 24552, 23778, 24769, 24948, 25872, 24051, 25026, 25202, 26109, 25412, 26305, 26465, 27283, 24366, 25322, 25497, 26382, 25702, 26574, 26732, 27528, 25942, 26798, 26951, 27731, 27133, 27898, 28033, 28720, 24734, 25671, 25839, 26703, 26038, 26888, 27040, 27813, 26273, 27105, 27253, 28007, 27430, 28169, 28301, 28961, 26545, 27354, 27502, 28233, 27673, 28389, 28519, 29156, 27871, 28572, 28696, 29317, 28842, 29449, 29556, 30085, 25162, 26072, 26236, 27072, 26429, 27250, 27397, 28140, 26656, 27460, 27604, 28329, 27772, 28483, 28609, 29240, 26918, 27700, 27841, 28544, 28004, 28693, 28816, 29425, 28195, 28866, 28985, 29578, 29124, 29702, 29804, 30306, 27221, 27979, 28113, 28793, 28272, 28936, 29052, 29639, 28458, 29103, 29217, 29785, 29351, 29904, 30000, 30479, 28671, 29293, 29405, 29950, 29534, 30064, 30159, 30616, 29683, 30198, 30289, 30730, 30394, 30822, 30897, 31257, 22973, 24005, 24192, 25160, 24415, 25370, 25543, 26427, 24676, 25617, 25785, 26654, 25986, 26840, 26992, 27770, 24982, 25902, 26070, 26916, 26265, 27097, 27248, 28002, 26495, 27309, 27458, 28193, 27629, 28350, 28481, 29122, 25336, 26234, 26395, 27219, 26586, 27395, 27539, 28270, 26809, 27602, 27742, 28456, 27907, 28607, 28729, 29349, 27070, 27839, 27977, 28669, 28138, 28814, 28934, 29532, 28327, 28983, 29101, 29681, 29238, 29802, 29902, 30392, 25747, 26617, 26775, 27569, 26958, 27739, 27878, 28580, 27172, 27934, 28070, 28754, 28229, 28898, 29016, 29607, 27423, 28162, 28297, 28957, 28452, 29097, 29214, 29782, 28630, 29257, 29371, 29920, 29500, 30035, 30132, 30593, 27711, 28426, 28553, 29189, 28703, 29325, 29433, 29978, 28874, 29479, 29585, 30112, 29709, 30223, 30312, 30752, 29075, 29658, 29761, 30268, 29882, 30375, 30461, 30882, 30018, 30493, 30577, 30982, 30674, 31065, 31134, 31461, 26219, 27056, 27205, 27965, 27382, 28126, 28258, 28924, 27590, 28316, 28444, 29091, 28597, 29229, 29339, 29894, 27827, 28532, 28659, 29283, 28804, 29415, 29524, 30056, 28974, 29568, 29673, 30189, 29795, 30298, 30386, 30815, 28100, 28782, 28901, 29504, 29041, 29630, 29731, 30243, 29206, 29776, 29874, 30369, 29991, 30472, 30553, 30963, 29396, 29942, 30039, 30512, 30152, 30610, 30690, 31079, 30282, 30723, 30801, 31174, 30892, 31252, 31315, 31613, 28414, 29064, 29179, 29752, 29314, 29872, 29969, 30453, 29470, 30010, 30104, 30570, 30215, 30667, 30745, 31128, 29649, 30168, 30261, 30705, 30367, 30799, 30876, 31239, 30487, 30904, 30977, 31326, 31060, 31398, 31457, 31734, 29852, 30350, 30435, 30860, 30535, 30948, 31017, 31363, 30651, 31047, 31114, 31445, 31193, 31512, 31565, 31826, 30785, 31160, 31226, 31538, 31303, 31603, 31656, 31900, 31388, 31675, 31725, 31957, 31782, 32004, 32043, 32218, 549, 724, 763, 985, 810, 1042, 1092, 1379, 867, 1111, 1164, 1464, 1229, 1541, 1607, 1982, 941, 1202, 1255, 1574, 1322, 1653, 1720, 2116, 1404, 1750, 1819, 2232, 1907, 2332, 2417, 2915, 1033, 1310, 1369, 1707, 1441, 1790, 1863, 2280, 1528, 1891, 1968, 2400, 2062, 2506, 2599, 3118, 1639, 2022, 2100, 2552, 2197, 2663, 2757, 3297, 2314, 2798, 2895, 3453, 3015, 3588, 3703, 4353, 1154, 1452, 1515, 1875, 1593, 1966, 2044, 2485, 1688, 2077, 2157, 2615, 2255, 2728, 2825, 3371, 1804, 2214, 2295, 2776, 2398, 2893, 2991, 3561, 2524, 3036, 3137, 3726, 3263, 3866, 3985, 4667, 1952, 2381, 2469, 2972, 2578, 3094, 3199, 3793, 2711, 3243, 3352, 3963, 3484, 4108, 4235, 4940, 2873, 3428, 3538, 4170, 3676, 4323, 4451, 5177, 3843, 4509, 4641, 5385, 4802, 5562, 5711, 6548, 1306, 1633, 1702, 2093, 1785, 2190, 2274, 2749, 1885, 2306, 2392, 2885, 2499, 3006, 3109, 3692, 2015, 2455, 2544, 3058, 2655, 3182, 3288, 3893, 2789, 3334, 3442, 4064, 3578, 4214, 4341, 5056, 2174, 2635, 2732, 3267, 2847, 3396, 3510, 4137, 2985, 3553, 3670, 4315, 3810, 4470, 4605, 5344, 3160, 3751, 3869, 4538, 4013, 4697, 4833, 5595, 4187, 4889, 5028, 5809, 5198, 5992, 6150, 7020, 2375, 2865, 2965, 3529, 3086, 3666, 3784, 4440, 3235, 3833, 3953, 4629, 4098, 4790, 4928, 5697, 3418, 4038, 4160, 4860, 4311, 5025, 5165, 5958, 4497, 5228, 5372, 6181, 5548, 6372, 6533, 7431, 3645, 4286, 4417, 5138, 4574, 5309, 5458, 6272, 4765, 5519, 5670, 6502, 5851, 6697, 6865, 7785, 4997, 5775, 5927, 6781, 6113, 6982, 7150, 8091, 6340, 7224, 7397, 8352, 7607, 8575, 8762, 9794, 1510, 1870, 1945, 2373, 2037, 2478, 2569, 3084, 2151, 2608, 2703, 3233, 2817, 3362, 3474, 4096, 2288, 2767, 2863, 3416, 2982, 3550, 3664, 4309, 3128, 3715, 3831, 4495, 3974, 4654, 4788, 5546, 2461, 2963, 3065, 3643, 3189, 3782, 3901, 4572, 3342, 3951, 4074, 4763, 4223, 4926, 5067, 5849, 3527, 4158, 4284, 4995, 4438, 5163, 5307, 6111, 4627, 5370, 5517, 6338, 5695, 6531, 6695, 7605, 2682, 3211, 3318, 3925, 3450, 4071, 4195, 4896, 3611, 4248, 4378, 5094, 4534, 5265, 5413, 6222, 3806, 4466, 4598, 5337, 4760, 5514, 5662, 6494, 4954, 5727, 5879, 6729, 6064, 6928, 7096, 8033, 4047, 4734, 4869, 5634, 5036, 5816, 5969, 6825, 5239, 6035, 6193, 7065, 6385, 7270, 7445, 8401, 5484, 6302, 6462, 7355, 6658, 7565, 7741, 8716, 6895, 7819, 7998, 8989, 8215, 9219, 9412, 10473, 2957, 3520, 3636, 4275, 3774, 4429, 4563, 5296, 3943, 4618, 4753, 5505, 4917, 5685, 5838, 6682, 4149, 4847, 4984, 5760, 5152, 5943, 6098, 6965, 5359, 6166, 6324, 7206, 6519, 7415, 7590, 8556, 4405, 5124, 5270, 6069, 5444, 6256, 6419, 7307, 5655, 6485, 6651, 7556, 6849, 7767, 7949, 8935, 5912, 6765, 6933, 7859, 7133, 8073, 8256, 9262, 7379, 8333, 8520, 9539, 8743, 9774, 9974, 11060, 4724, 5473, 5624, 6450, 5805, 6646, 6814, 7728, 6024, 6883, 7053, 7984, 7258, 8202, 8388, 9397, 6289, 7169, 7341, 8293, 7551, 8515, 8701, 9730, 7805, 8783, 8973, 10014, 9204, 10255, 10456, 11560, 6615, 7516, 7694, 8665, 7910, 8892, 9085, 10129, 8167, 9165, 9360, 10417, 9596, 10662, 10870, 11984, 8477, 9495, 9691, 10765, 9928, 11013, 11220, 12349, 10214, 11310, 11519, 12658, 11771, 12918, 13134, 14310, 1776, 2180, 2264, 2738, 2365, 2854, 2954, 3517, 2488, 2994, 3097, 3679, 3223, 3820, 3940, 4615, 2643, 3169, 3275, 3879, 3405, 4023, 4146, 4844, 3564, 4199, 4326, 5040, 4482, 5211, 5356, 6163, 2836, 3383, 3496, 4121, 3633, 4272, 4402, 5121, 3796, 4454, 4588, 5325, 4750, 5502, 5652, 6482, 3998, 4681, 4816, 5577, 4981, 5757, 5909, 6762, 5180, 5973, 6130, 6999, 6321, 7203, 7376, 8330, 3074, 3653, 3770, 4425, 3912, 4584, 4719, 5468, 4085, 4776, 4913, 5681, 5080, 5864, 6019, 6878, 4296, 5008, 5148, 5939, 5321, 6126, 6284, 7164, 5532, 6354, 6515, 7411, 6712, 7623, 7800, 8778, 4559, 5292, 5440, 6252, 5619, 6445, 6610, 7511, 5834, 6678, 6845, 7763, 7048, 7979, 8162, 9160, 6094, 6961, 7129, 8069, 7336, 8288, 8472, 9490, 7586, 8552, 8739, 9770, 8968, 10009, 10209, 11305, 3376, 3990, 4113, 4807, 4264, 4972, 5112, 5899, 4444, 5169, 5313, 6117, 5491, 6309, 6469, 7362, 4671, 5418, 5566, 6390, 5746, 6585, 6750, 7662, 5961, 6818, 6985, 7914, 7190, 8132, 8315, 9322, 4945, 5716, 5870, 6718, 6055, 6917, 7087, 8022, 6276, 7154, 7329, 8279, 7538, 8500, 8689, 9716, 6552, 7450, 7628, 8596, 7841, 8820, 9013, 10055, 8094, 9089, 9285, 10339, 9518, 10581, 10790, 11902, 5283, 6084, 6242, 7118, 6434, 7324, 7499, 8459, 6666, 7573, 7749, 8724, 7965, 8953, 9144, 10192, 6949, 7876, 8056, 9049, 8274, 9281, 9475, 10538, 8538, 9558, 9754, 10829, 9993, 11080, 11287, 12417, 7291, 8238, 8424, 9437, 8647, 9671, 9871, 10951, 8915, 9952, 10154, 11246, 10395, 11495, 11708, 12851, 9242, 10294, 10498, 11603, 10743, 11855, 12069, 13222, 11037, 12157, 12375, 13532, 12633, 13796, 14020, 15206, 3760, 4414, 4548, 5280, 4707, 5455, 5606, 6431, 4901, 5667, 5821, 6663, 6005, 6862, 7033, 7962, 5135, 5925, 6081, 6947, 6269, 7148, 7321, 8272, 6499, 7395, 7570, 8536, 7782, 8760, 8950, 9991, 5428, 6239, 6401, 7288, 6596, 7496, 7674, 8644, 6830, 7746, 7928, 8912, 8145, 9141, 9337, 10392, 7115, 8054, 8235, 9240, 8456, 9473, 9668, 10741, 8721, 9752, 9949, 11035, 10189, 11285, 11492, 12631, 5786, 6627, 6793, 7707, 6994, 7922, 8104, 9098, 7238, 8181, 8366, 9374, 8590, 9610, 9809, 10884, 7530, 8493, 8680, 9708, 8906, 9944, 10144, 11237, 9181, 10232, 10433, 11537, 10678, 11789, 12000, 13152, 7888, 8870, 9062, 10106, 9294, 10347, 10552, 11657, 9572, 10637, 10845, 11958, 11095, 12215, 12434, 13590, 9906, 10990, 11196, 12324, 11446, 12583, 12798, 13966, 11746, 12893, 13107, 14283, 13369, 14550, 14770, 15966, 6229, 7103, 727, 8222, 7484, 8442, 8631, 9653, 7734, 8707, 8898, 9934, 9128, 10174, 10377, 11476, 8040, 9033, 9226, 10278, 9457, 10520, 10725, 11837, 9736, 10811, 11019, 12139, 11268, 12398, 12614, 13777, 8408, 9419, 9618, 10686, 9853, 10931, 11142, 12265, 10135, 11226, 11438, 12573, 11688, 12830, 13050, 14222, 10480, 11585, 11796, 12943, 12049, 13202, 13420, 14601, 12355, 13512, 13735, 14918, 13999, 15185, 15410, 16607, 8857, 9891, 10092, 11180, 10334, 11431, 11643, 12782, 10623, 11730, 11942, 13090, 12201, 13353, 13574, 14753, 10973, 12093, 12307, 13464, 12566, 13729, 13949, 15135, 12875, 14045, 14265, 15454, 14532, 15725, 15948, 17145, 11391, 12523, 12742, 13906, 13002, 14171, 14397, 15584, 13310, 14487, 14712, 15905, 14979, 16172, 16401, 17595, 13684, 14868, 15090, 16287, 15358, 16556, 16779, 17975, 15679, 16876, 17101, 18293, 17369, 18558, 18780, 19949, 2140, 2596, 2690, 3219, 2805, 3349, 3460, 4081, 2943, 3505, 3620, 4258, 3758, 4412, 4545, 5277, 3115, 3700, 3816, 4478, 3960, 4638, 4772, 5528, 4132, 4829, 4966, 5741, 5133, 5923, 6078, 6944, 3328, 3936, 4058, 4746, 4207, 4909, 5049, 5830, 4388, 5106, 5251, 6049, 5425, 6236, 6398, 7285, 4611, 5352, 5498, 6317, 5677, 6511, 6674, 7582, 5893, 6745, 6911, 7836, 7112, 8051, 8232, 9237, 3595, 4231, 4360, 5075, 4516, 5247, 5392, 6201, 4704, 5452, 5602, 6427, 5783, 6624, 6789, 7703, 4936, 5707, 5859, 6707, 6045, 6907, 7075, 8010, 6266, 7145, 7317, 8268, 7527, 8490, 8676, 9704, 5219, 6014, 6172, 7043, 6362, 7247, 7421, 8377, 6592, 7492, 7670, 8640, 7884, 8866, 9058, 10102, 6873, 7795, 7974, 8963, 8192, 9194, 9387, 10446, 8452, 9469, 9664, 10737, 9902, 10986, 11192, 12320, 3927, 4600, 4736, 5486, 4899, 5665, 5819, 6661, 5096, 5881, 6037, 6897, 6225, 7099, 7273, 8218, 5339, 6146, 6304, 7186, 6497, 7393, 7568, 8534, 6731, 7643, 7821, 8800, 8036, 9029, 9222, 10274, 5636, 6464, 6630, 7533, 6828, 7744, 7926, 8910, 7067, 8000, 8184, 9184, 8404, 9415, 9614, 10682, 7357, 8311, 8495, 9514, 8719, 9750, 9947, 11033, 8991, 10033, 10234, 11330, 10476, 11581, 11792, 12939, 6002, 6859, 7030, 7959, 7235, 8178, 8363, 9371, 7479, 8437, 8626, 9648, 8852, 9886, 10087, 11175, 7779, 8757, 8947, 9988, 9178, 10229, 10430, 11534, 9452, 10515, 10720, 11832, 10968, 12088, 12302, 13459, 8142, 9138, 9334, 10389, 9569, 10634, 10842, 11955, 9848, 10926, 11137, 12260, 11386, 12518, 12737, 13901, 10186, 11282, 11489, 12628, 11743, 12890, 13104, 14280, 12044, 13197, 13415, 14596, 13679, 14863, 15085, 16282, 4349, 5063, 5206, 5999, 5381, 6189, 6349, 7232, 5590, 6413, 6579, 7476, 6776, 7688, 7870, 8849, 5845, 6691, 6856, 7776, 7061, 7994, 8175, 9175, 7301, 8250, 8434, 9449, 8659, 9685, 9883, 10965, 6158, 7027, 7198, 8139, 7406, 8360, 8547, 9566, 7656, 8623, 8814, 9845, 9043, 10084, 10288, 11383, 7956, 8944, 9135, 10183, 9368, 10427, 10631, 11740, 9645, 10717, 10923, 12041, 11172, 12299, 12515, 13676, 6543, 7440, 7617, 8584, 7831, 8809, 9001, 10042, 8085, 9078, 9274, 10326, 9508, 10569, 10778, 11888, 8397, 9408, 9605, 10673, 9841, 10919, 11128, 12251, 10123, 11214, 11424, 12559, 11675, 12817, 13035, 14207, 8772, 9803, 10003, 11089, 10244, 11339, 11549, 12687, 10531, 11635, 11848, 12994, 12105, 13255, 13476, 14654, 10879, 11995, 12210, 13364, 12468, 13627, 13849, 15032, 12775, 13942, 14164, 15351, 14430, 15620, 15845, 17040, 7015, 7943, 8127, 9121, 8347, 9354, 9553, 10616, 8611, 9632, 9832, 10908, 10071, 11158, 11370, 12500, 8929, 9968, 10167, 11261, 10411, 11513, 11723, 12868, 10702, 11813, 12024, 13176, 12283, 13439, 13659, 14842, 9317, 10370, 10576, 11681, 10824, 11935, 12152, 13303, 11119, 12240, 12459, 13616, 12719, 13881, 14107, 15291, 11469, 12607, 12823, 13992, 13083, 14258, 14480, 15672, 13394, 14575, 14797, 15993, 15064, 16261, 16486, 17683, 9788, 10863, 11074, 12194, 11324, 12452, 12672, 13833, 11620, 12759, 12979, 14148, 13240, 14414, 14639, 15829, 11978, 13128, 13347, 14526, 13610, 14791, 15015, 16210, 13925, 15110, 15334, 16531, 15603, 16799, 17023, 18215, 12411, 13567, 13790, 14972, 14058, 15241, 15467, 16661, 14372, 15559, 15787, 16981, 16057, 17250, 17477, 18661, 14747, 15942, 16166, 17363, 16435, 17631, 17854, 19037, 16754, 17950, 18172, 19353, 18437, 19613, 19829, 20976, 4882, 5647, 5800, 6641, 5984, 6840, 7010, 7938, 6207, 7080, 7253, 8197, 7460, 8417, 8606, 9627, 6477, 7371, 7546, 8510, 7758, 8734, 8924, 9963, 8015, 9007, 9199, 10250, 9430, 10492, 10697, 11808, 6809, 7723, 7905, 8887, 8122, 9116, 9312, 10365, 8383, 9392, 9591, 10657, 9827, 10903, 11114, 12235, 8696, 9725, 9923, 11008, 10162, 11256, 11464, 12602, 10451, 11555, 11766, 12913, 12019, 13171, 13389, 14570, 7214, 8156, 8341, 9348, 8564, 9584, 9782, 10857, 8830, 9863, 10065, 11152, 10305, 11402, 11614, 12753, 9154, 10203, 10405, 11507, 10651, 11760, 11972, 13122, 10943, 12062, 12277, 13433, 12536, 13698, 13919, 15104, 9547, 10610, 10818, 11929, 11068, 12188, 12405, 13561, 11364, 12494, 12713, 13875, 12973, 14142, 14366, 15553, 11717, 12862, 13077, 14252, 13341, 14520, 14741, 15936, 13653, 14836, 15058, 16255, 15328, 16525, 16748, 17944, 7711, 8683, 8874, 9909, 9103, 10148, 10352, 11450, 9378, 10436, 10641, 11749, 10889, 12004, 12220, 13373, 9710, 10785, 10992, 12112, 11240, 12370, 12586, 13749, 11539, 12678, 12895, 14064, 13155, 14331, 14553, 15745, 10110, 11199, 11411, 12544, 11662, 12802, 13022, 14192, 11962, 13110, 13332, 14509, 13595, 14774, 15001, 16194, 12326, 13483, 13705, 14889, 13969, 15155, 15379, 16577, 14285, 15473, 15701, 16897, 15969, 17165, 17391, 18579, 10595, 11701, 11915, 13062, 12172, 13324, 13546, 14725, 12478, 13636, 13859, 15041, 14126, 15311, 15537, 16731, 12844, 14014, 14235, 15424, 14502, 15695, 15919, 17116, 14818, 16014, 16237, 17434, 16507, 17704, 17926, 19109, 13283, 14458, 14683, 15874, 14951, 16144, 16371, 17565, 15269, 16462, 16690, 17882, 16959, 18149, 18375, 19549, 15648, 16845, 17069, 18262, 17340, 18529, 18750, 19920, 17658, 18843, 19065, 20227, 19329, 20485, 20701, 21820, 8324, 9330, 9528, 10590, 9764, 10838, 11048, 12167, 10048, 11133, 11345, 12473, 11596, 12733, 12954, 14121, 10385, 11486, 11697, 12841, 11951, 13101, 13320, 14499, 12256, 13412, 13632, 14815, 13897, 15082, 15307, 16504, 10799, 11910, 12127, 13278, 12385, 13541, 13764, 14946, 12693, 13854, 14081, 15264, 14346, 15532, 15761, 16954, 13058, 14232, 14454, 15645, 14721, 15916, 16140, 17337, 15037, 16234, 16458, 17655, 16727, 17923, 18145, 19326, 11298, 12427, 12645, 13807, 12906, 14074, 14297, 15484, 13214, 14388, 14613, 15803, 14881, 16073, 16300, 17493, 13584, 14765, 14990, 16185, 15258, 16453, 16679, 17873, 15576, 16772, 16998, 18190, 17267, 18455, 18678, 19847, 14031, 15216, 15440, 16636, 15712, 16907, 17132, 18322, 16031, 17225, 17451, 18636, 17721, 18903, 19126, 20284, 16411, 17607, 17830, 19013, 18099, 19279, 19498, 20650, 18413, 19589, 19805, 20952, 20066, 21205, 21414, 22510, 11896, 13042, 13263, 14437, 13526, 14704, 14931, 16123, 13840, 15021, 15248, 16441, 15518, 16711, 16939, 18129, 14214, 15403, 15627, 16824, 15897, 17094, 17319, 18508, 16216, 17414, 17637, 18823, 17905, 19089, 19309, 20466, 14662, 15852, 16082, 17275, 16350, 17543, 17771, 18952, 16668, 17860, 18089, 19267, 18354, 19528, 19750, 20896, 17047, 18240, 18462, 19638, 18728, 19898, 20114, 21253, 19043, 20206, 20423, 21552, 20680, 21800, 22007, 23081, 15199, 16393, 16620, 17813, 16890, 18081, 18306, 19481, 17209, 18396, 18620, 19789, 18887, 20049, 20268, 21398, 17588, 18774, 18996, 20159, 19260, 20417, 20633, 21753, 19571, 20724, 20936, 22048, 21187, 22292, 22494, 23546, 18039, 19218, 19440, 20592, 19702, 20849, 21063, 22169, 20009, 21148, 21361, 22458, 21610, 22697, 22900, 23933, 20375, 21505, 21712, 22798, 21961, 23036, 23232, 24251, 22253, 23316, 23510, 24516, 23739, 24732, 24912, 25838, 2628, 3151, 3257, 3858, 3387, 4002, 4125, 4820, 3545, 4177, 4304, 5016, 4460, 5186, 5331, 6136, 3741, 4395, 4526, 5258, 4685, 5432, 5581, 6405, 4877, 5643, 5795, 6637, 5978, 6835, 7004, 7933, 3979, 4659, 4796, 5554, 4959, 5732, 5887, 6737, 5158, 5949, 6106, 6973, 6296, 7176, 7350, 8302, 5405, 6215, 6377, 7263, 6570, 7468, 7648, 8616, 6804, 7719, 7900, 8883, 8116, 9111, 9307, 10361, 4276, 4985, 5125, 5913, 5297, 6099, 6257, 7134, 5508, 6327, 6488, 7382, 6685, 7593, 7770, 8746, 5761, 6601, 6766, 7679, 6966, 7894, 8074, 9068, 7208, 8151, 8335, 9343, 8558, 9579, 9776, 10852, 6070, 6934, 7105, 8042, 7308, 8257, 8444, 9459, 7559, 8523, 8711, 9740, 8938, 9977, 10178, 11272, 7860, 8840, 9034, 10076, 9263, 10316, 10521, 11626, 9541, 10605, 10813, 11925, 11062, 12183, 12400, 13557, 4649, 5393, 5541, 6363, 5721, 6557, 6723, 7633, 5936, 6790, 6958, 7885, 7161, 8101, 8285, 9291, 6202, 7076, 7248, 8193, 7454, 8412, 8600, 9622, 7704, 8677, 8867, 9903, 9095, 10141, 10344, 11443, 6526, 7422, 7600, 8566, 7813, 8790, 8984, 10024, 8066, 9059, 9255, 10307, 9487, 10549, 10758, 11869, 8378, 9388, 9586, 10653, 9821, 10898, 11109, 12231, 10103, 11193, 11404, 12538, 11654, 12795, 13015, 14186, 6922, 7846, 8027, 9018, 8243, 9247, 9442, 10503, 8507, 9525, 9722, 10796, 9959, 11044, 11252, 2381, 8824, 9858, 10059, 11147, 10298, 11396, 11607, 12747, 10587, 11694, 11907, 13055, 12163, 13316, 13537, 14717, 9213, 10263, 10468, 11571, 10711, 11821, 12036, 13187, 11005, 12124, 12342, 13498, 12599, 13761, 13985, 15170, 11358, 12489, 12708, 13871, 12967, 14137, 14361, 15549, 13275, 14451, 14676, 15868, 14943, 16137, 16364, 17559, 5114, 5901, 6057, 6919, 6244, 7120, 7293, 8240, 6473, 7366, 7542, 8504, 7753, 8728, 8919, 9956, 6752, 7664, 7843, 8822, 8058, 9051, 9244, 10296, 8319, 9326, 9522, 10585, 9758, 10833, 11041, 12161, 7089, 8024, 8208, 9210, 8426, 9439, 9638, 10708, 8692, 9719, 9919, 11002, 10157, 11249, 11460, 12596, 9015, 10057, 10260, 11356, 10500, 11605, 11818, 12965, 10793, 11905, 12121, 13273, 12378, 13535, 13758, 14941, 7502, 8462, 8650, 9674, 8877, 9912, 10113, 11202, 9149, 10197, 10400, 11500, 10646, 11754, 11967, 13115, 9478, 10541, 10746, 11858, 10995, 12115, 12329, 13486, 11292, 12422, 12638, 13801, 12900, 14069, 14290, 15478, 9874, 10954, 11164, 12289, 11414, 12547, 12766, 13931, 11712, 12855, 13073, 14246, 13336, 14513, 14737, 15930, 12072, 13225, 13444, 14625, 13708, 14892, 15115, 16312, 14024, 15210, 15434, 16631, 15705, 16901, 17126, 18317, 8011, 9002, 9195, 10245, 9425, 10486, 10692, 11802, 9705, 10779, 10987, 12106, 11234, 12363, 12580, 13742, 10043, 11129, 11340, 12469, 11590, 12728, 12948, 14116, 11889, 13036, 13256, 14431, 13518, 14697, 14923, 16116, 10447, 11550, 11762, 12908, 12014, 13165, 13385, 14565, 12321, 13477, 13700, 14883, 13963, 15148, 15374, 16571, 12688, 13850, 14076, 15260, 14340, 15527, 15756, 16950, 14655, 15846, 16075, 17269, 16342, 17536, 17764, 18946, 10938, 12056, 12272, 13427, 12530, 13691, 13913, 15097, 12838, 14007, 14229, 15417, 14495, 15687, 15912, 17108, 13208, 14383, 14607, 15798, 14874, 16068, 16293, 17488, 15191, 16386, 16612, 17806, 16882, 18075, 18298, 19475, 13648, 14830, 15054, 16250, 15323, 16519, 16744, 17939, 15642, 16838, 17064, 18256, 17334, 18522, 18745, 19914, 16025, 17220, 17446, 18632, 17715, 18898, 19121, 20280, 18031, 19211, 19433, 20586, 19695, 20843, 21057, 22164, 5703, 6539, 6703, 7613, 6903, 7827, 8006, 8997, 7141, 8081, 8264, 9270, 8486, 9504, 9700, 10774, 7436, 8393, 8580, 9601, 8805, 9837, 10038, 11124, 9074, 10119, 10322, 11420, 10565, 11671, 11884, 13031, 7791, 8768, 8960, 10000, 9190, 10240, 10443, 11546, 9465, 10527, 10734, 11845, 10982, 12101, 12317, 13473, 9799, 10875, 11086, 12207, 11335, 12464, 12684, 13846, 11631, 12771, 12991, 14161, 13251, 14426, 14651, 15842, 8224, 9228, 9421, 10482, 9655, 10727, 10933, 12051, 9938, 11023, 11230, 12359, 11480, 12618, 12834, 14003, 10279, 11375, 11586, 12724, 11838, 12985, 13203, 14378, 12141, 13293, 13514, 14693, 13779, 14962, 15187, 16382, 10688, 11798, 12011, 13162, 12267, 13422, 13644, 14826, 12576, 13738, 13960, 15145, 14225, 15413, 15639, 16835, 12944, 14112, 14337, 15524, 14602, 15793, 16021, 17216, 14919, 16112, 16339, 17533, 16608, 17802, 18028, 19208, 8753, 9784, 9984, 11070, 10225, 11320, 11530, 12668, 10511, 11616, 11828, 12975, 12084, 13236, 13455, 14635, 10859, 11974, 12190, 13343, 12448, 13606, 13829, 15011, 12755, 13921, 14144, 15330, 14410, 15599, 15825, 17019, 11278, 12407, 12625, 13787, 12886, 14054, 14277, 15464, 13193, 14368, 14593, 15784, 14859, 16053, 16279, 17474, 13563, 14743, 14969, 16163, 15237, 16431, 16658, 17851, 15555, 16750, 16978, 18169, 17246, 18433, 18658, 19826, 11783, 12929, 13146, 14321, 13406, 14586, 14809, 16004, 13721, 14904, 15127, 16323, 15395, 16592, 16816, 18011, 14096, 15281, 15507, 16701, 15776, 16971, 17198, 18386, 16096, 17291, 17516, 18700, 17785, 18968, 19190, 20347, 14544, 15735, 15961, 17156, 16228, 17424, 17650, 18834, 16548, 17743, 17968, 19149, 18232, 19411, 19631, 20781, 16928, 18119, 18344, 19519, 18609, 19779, 19999, 21139, 18924, 20086, 20306, 21435, 20563, 21684, 21895, 22971, 9404, 10463, 10669, 11778, 10915, 12031, 12247, 13401, 11210, 12337, 12555, 13716, 12813, 13980, 14203, 15390, 11566, 12705, 12924, 14093, 13182, 14358, 14581, 15773, 13493, 14673, 14899, 16093, 15165, 16361, 16587, 17782, 11991, 13141, 13361, 14540, 13623, 14804, 15029, 16224, 13938, 15122, 15348, 16544, 15616, 16811, 17037, 18228, 14316, 15504, 15731, 16926, 15999, 17195, 17420, 18607, 16318, 17513, 17739, 18922, 18006, 19187, 19407, 20561, 12507, 13666, 13888, 15071, 14155, 15340, 15566, 16760, 14470, 15660, 15886, 17081, 16156, 17351, 17577, 18761, 14848, 16044, 16267, 17464, 16536, 17733, 17955, 19138, 16856, 18051, 18273, 19452, 18539, 19713, 19930, 21074, 15298, 16493, 16719, 17913, 16988, 18178, 18404, 19578, 17308, 18495, 18718, 19886, 18985, 20146, 20365, 21493, 17689, 18874, 19095, 20256, 19358, 20514, 20729, 21847, 19670, 20820, 21031, 22140, 21284, 22385, 22587, 23635, 13124, 14299, 14522, 15714, 14787, 15982, 16206, 17403, 15106, 16302, 16527, 17723, 16795, 17990, 18211, 19391, 15486, 16681, 16909, 18101, 17177, 18366, 18590, 19761, 17495, 18680, 18905, 20068, 19169, 20327, 20544, 21666, 15938, 17134, 17360, 18548, 17627, 18812, 19034, 20196, 17946, 19128, 19350, 20505, 19609, 20760, 20973, 22083, 18324, 19500, 19720, 20868, 19979, 21120, 21331, 22420, 20286, 21416, 21628, 22715, 21875, 22952, 23151, 24173, 16476, 17672, 17895, 19078, 18162, 19342, 19561, 20713, 18479, 19654, 19869, 21015, 20131, 21269, 21477, 22572, 18856, 20022, 20239, 21373, 20497, 21622, 21831, 22911, 20802, 21917, 22123, 23190, 22369, 23426, 23620, 24618, 19299, 20455, 20671, 21790, 20926, 22037, 22244, 23306, 21225, 22328, 22531, 23581, 22771, 23811, 24003, 24980, 21582, 22672, 22872, 23908, 23109, 24133, 24321, 25281, 23386, 24396, 24581, 25526, 24799, 25730, 25900, 26759, 6451, 7342, 7517, 8478, 7730, 8703, 8894, 9930, 7987, 8976, 9168, 10217, 9401, 10460, 10666, 11775, 8294, 9301, 9496, 10559, 9732, 10807, 11015, 12135, 10016, 11103, 11312, 12442, 11563, 12702, 12921, 14090, 8666, 9692, 9893, 10975, 10131, 11222, 11434, 12569, 10420, 11522, 11734, 12879, 11988, 13138, 13358, 14537, 10766, 11878, 12094, 13246, 12351, 13508, 13731, 14914, 12660, 13823, 14047, 15232, 14313, 15501, 15728, 16923, 9123, 10169, 10372, 11471, 10618, 11725, 11937, 13085, 10912, 12028, 12244, 13398, 12504, 13663, 13885, 15068, 11263, 12393, 12609, 13772, 12870, 14040, 14260, 15449, 13179, 14355, 14578, 15770, 14845, 16041, 16264, 17461, 11683, 12825, 13045, 14217, 13305, 14482, 14707, 15900, 13620, 14801, 15026, 16221, 15295, 16490, 16716, 17910, 13994, 15180, 15405, 16602, 15674, 16871, 17096, 18288, 15996, 17192, 17417, 18604, 17686, 18871, 19092, 20253, 9677, 10749, 10957, 12075, 11206, 12333, 12551, 13712, 11503, 12641, 12858, 14027, 13118, 14293, 14516, 15708, 11860, 13008, 13227, 14403, 13489, 14669, 14895, 16089, 13803, 14986, 15212, 16407, 15480, 16675, 16903, 18095, 12292, 13447, 13670, 14852, 13935, 15119, 15345, 16541, 14249, 15437, 15664, 16860, 15933, 17129, 17355, 18543, 14627, 15819, 16046, 17241, 16315, 17510, 17736, 18919, 16633, 17827, 18053, 19233, 18319, 19495, 19715, 20863, 12809, 13976, 14199, 15386, 14466, 15656, 15882, 17077, 14782, 15977, 16201, 17398, 16471, 17667, 17890, 19073, 15161, 16357, 16583, 17778, 16852, 18047, 18269, 19448, 17172, 18361, 18585, 19756, 18851, 20017, 20234, 21368, 15613, 16808, 17034, 18225, 17305, 18492, 18715, 19883, 17623, 18808, 19030, 20192, 19295, 20451, 20667, 21786, 18003, 19184, 19404, 20558, 19667, 20817, 21028, 22137, 19975, 21116, 21327, 22426, 21578, 22668, 22868, 23904, 10355, 11453, 11665, 12805, 11919, 13066, 13287, 14462, 12225, 13378, 13600, 14779, 13865, 15047, 15275, 16468, 12589, 13752, 13972, 15158, 14239, 15428, 15652, 16849, 14558, 15750, 15974, 17170, 16243, 17440, 17664, 18849, 13025, 14195, 14421, 15609, 14687, 15878, 16107, 17301, 15005, 16198, 16426, 17620, 16695, 17887, 18114, 19292, 15382, 16580, 16804, 18000, 17073, 18266, 18488, 19664, 17395, 18583, 18805, 19973, 19070, 20232, 20448, 21576, 13550, 14729, 14955, 16148, 15225, 16418, 16645, 17837, 15543, 16737, 16965, 18155, 17236, 18422, 18647, 19814, 15923, 17120, 17344, 18533, 17613, 18799, 19019, 20182, 17932, 19115, 19335, 20491, 19597, 20749, 20960, 22071, 16375, 17569, 17796, 18978, 18064, 19242, 19465, 20616, 18380, 19554, 19774, 20920, 20035, 21172, 21385, 22480, 18754, 19924, 20140, 21279, 20398, 21528, 21735, 22821, 20706, 21825, 22031, 23104, 22276, 23338, 23531, 24536, 14179, 15366, 15592, 16787, 15861, 17056, 17284, 18471, 16181, 17378, 17603, 18788, 17869, 19052, 19275, 20431, 16563, 17758, 17982, 19163, 18248, 19427, 19646, 20796, 18565, 19737, 19955, 21097, 20213, 21348, 21558, 22649, 17013, 18204, 18428, 19603, 18694, 19862, 20081, 21219, 19010, 20172, 20390, 21519, 20647, 21766, 21975, 23049, 19384, 20538, 20754, 21870, 21008, 22117, 22322, 23381, 21308, 22407, 22611, 23657, 22849, 23885, 24076, 25049, 17552, 18737, 18961, 20123, 19227, 20383, 20601, 21720, 19537, 20689, 20904, 22015, 21157, 22261, 22466, 23517, 19906, 21051, 21261, 22363, 21512, 22606, 22805, 23844, 21807, 22889, 23087, 24113, 23322, 24337, 24521, 25470, 20341, 21470, 21679, 22765, 21930, 23004, 23202, 24221, 22222, 23284, 23480, 24486, 23712, 24704, 24886, 25812, 22565, 23614, 23805, 24794, 24034, 25010, 25186, 26094, 24300, 25261, 25436, 26327, 25642, 26519, 26677, 27479, 11182, 12309, 12525, 13686, 12785, 13952, 14174, 15361, 13094, 14269, 14491, 15683, 14758, 15953, 16177, 17374, 13465, 14645, 14869, 16063, 15137, 16333, 16558, 17753, 15456, 16652, 16878, 18071, 17148, 18338, 18561, 19733, 13908, 15092, 15319, 16515, 15587, 16782, 17009, 18200, 15908, 17104, 17331, 18519, 17599, 18784, 19007, 20169, 16288, 17483, 17711, 18894, 17977, 19158, 19380, 20534, 18294, 19471, 19692, 20840, 19951, 21093, 21305, 22404, 14440, 15630, 15855, 17050, 16126, 17322, 17546, 18731, 16446, 17642, 17865, 19048, 18134, 19314, 19533, 20685, 16826, 18021, 18242, 19421, 18510, 19685, 19900, 21045, 18826, 19993, 20209, 21344, 20469, 21596, 21803, 22885, 17278, 18465, 18689, 19857, 18955, 20117, 20336, 21465, 19271, 20427, 20644, 21763, 20900, 22011, 22219, 23281, 19640, 20790, 21003, 22112, 21255, 22357, 22560, 23609, 21554, 22645, 22846, 23882, 23083, 24109, 24297, 25258, 15075, 16271, 16497, 17693, 16765, 17960, 18183, 19363, 17085, 18277, 18499, 19674, 18765, 19934, 20150, 21288, 17466, 18652, 18876, 20040, 19141, 20300, 20517, 21640, 19454, 20607, 20822, 21935, 21076, 22183, 22387, 23442, 17916, 19098, 19321, 20476, 19582, 20733, 20947, 22057, 19889, 21034, 21246, 22348, 21496, 22590, 22791, 23830, 20257, 21389, 21601, 22689, 21849, 22927, 23127, 24149, 22141, 23206, 23405, 24413, 23636, 24632, 24816, 25745, 18448, 19623, 19840, 20986, 20101, 21239, 21449, 22544, 20409, 21538, 21745, 22830, 21994, 23068, 23264, 24282, 20773, 21889, 22095, 23163, 22341, 23400, 23593, 24593, 22629, 23675, 23866, 24850, 24094, 25067, 25243, 26146, 21198, 22301, 22505, 23555, 22745, 23785, 23978, 24955, 23028, 24057, 24245, 25209, 24466, 25418, 25592, 26472, 23360, 24371, 24557, 25502, 24774, 25707, 25877, 26737, 25030, 25946, 26114, 26956, 26309, 27137, 27288, 28038, 15836, 17029, 17257, 18443, 17527, 18710, 18935, 20096, 17845, 19026, 19250, 20405, 19513, 20663, 20880, 21990, 18220, 19401, 19618, 20770, 19878, 21025, 21234, 22338, 20188, 21325, 21534, 22627, 21782, 22866, 23064, 24092, 18668, 19835, 20057, 21194, 20316, 21444, 21656, 22741, 20623, 21741, 21952, 23025, 22199, 23260, 23458, 24463, 20981, 22092, 22297, 23358, 22539, 23590, 23781, 24772, 22826, 23864, 24054, 25029, 24278, 25241, 25415, 26308, 19201, 20357, 20574, 21694, 20833, 21944, 22152, 23215, 21133, 22237, 22442, 23494, 22684, 23725, 23919, 24898, 21486, 22582, 22780, 23821, 23018, 24049, 24234, 25200, 23299, 24316, 24500, 25451, 24717, 25656, 25824, 26690, 21905, 22980, 23179, 24199, 23414, 24421, 24607, 25549, 23690, 24683, 24865, 25792, 25080, 25992, 26159, 26998, 24011, 24989, 25165, 26075, 25375, 26271, 26431, 27252, 25623, 26502, 26659, 27463, 26845, 27635, 27774, 28485, 19820, 20966, 21178, 22282, 21429, 22524, 22726, 23767, 21727, 22812, 23010, 24040, 23246, 24264, 24449, 25402, 22076, 23146, 23343, 24356, 23574, 24576, 24758, 25693, 23849, 24835, 25015, 25933, 25226, 26131, 26295, 27125, 22485, 23536, 23731, 24723, 23959, 24937, 25117, 26028, 24226, 25191, 25368, 26263, 25574, 26455, 26615, 27421, 24540, 25487, 25660, 26536, 25861, 26723, 26878, 27665, 26098, 26942, 27095, 27863, 27273, 28025, 28160, 28835, 22965, 23996, 24184, 25151, 24408, 25362, 25536, 26419, 24670, 25610, 25779, 26647, 25981, 26834, 26987, 27764, 24973, 25895, 26061, 26909, 26257, 27091, 27240, 27996, 26488, 27304, 27451, 28188, 27623, 28346, 28475, 29118, 25328, 26225, 25388, 27211, 26579, 27387, 27533, 28263, 26803, 27595, 27737, 28450, 27902, 28601, 28725, 29344, 27061, 27832, 27969, 28663, 28130, 28808, 28927, 29527, 28320, 28978, 29095, 29677, 29232, 29798, 29897, 30389, 3307, 3913, 4034, 4720, 4182, 4883, 5021, 5801, 4365, 5081, 5224, 6020, 5398, 6208, 6368, 7254, 4585, 5322, 5469, 6285, 5648, 6478, 6642, 7547, 5865, 6713, 6879, 7801, 7081, 8016, 8198, 9200, 4856, 5620, 5771, 6611, 5954, 6810, 6978, 7906, 6177, 7049, 7220, 8163, 7427, 8384, 8571, 9592, 6446, 7337, 7512, 8473, 7724, 8697, 8888, 9924, 7980, 8969, 9161, 10210, 9393, 10452, 10658, 11767, 5192, 5985, 6142, 7011, 6333, 7215, 7388, 8342, 6563, 7461, 7639, 8607, 7852, 8831, 9024, 10066, 6841, 7759, 7939, 8925, 8157, 9155, 9349, 10406, 8418, 9431, 9628, 10698, 9864, 10944, 11153, 12278, 7182, 8123, 8307, 9313, 8529, 9548, 9745, 10819, 8796, 9828, 10029, 11115, 10269, 11365, 11576, 12714, 9117, 10163, 10366, 11465, 10611, 11718, 11930, 13078, 10904, 12020, 12236, 13390, 12495, 13654, 13876, 15059, 5609, 6435, 6599, 7500, 6797, 7712, 7892, 8875, 7036, 7966, 8148, 9145, 8370, 9379, 9576, 10642, 7325, 8275, 8460, 9476, 8684, 9711, 9910, 10993, 8954, 9994, 10193, 11288, 10437, 11540, 11750, 12896, 7677, 8648, 8838, 9872, 9066, 10111, 10314, 11412, 9340, 10396, 10602, 11709, 10849, 11963, 12180, 13333, 9672, 10744, 10952, 12070, 11200, 12327, 12545, 13706, 11496, 12634, 12852, 14021, 13111, 14286, 14510, 15702, 8109, 9104, 9299, 10353, 9533, 10596, 10804, 11916, 9814, 10890, 11100, 12221, 11350, 12479, 12698, 13860, 10149, 11241, 11451, 12587, 11702, 12845, 13063, 14236, 12005, 13156, 13374, 14554, 13637, 14819, 15042, 16238, 10557, 11663, 11876, 13023, 12132, 13284, 13505, 14684, 12439, 13596, 13820, 15002, 14086, 15270, 15497, 16691, 12803, 13970, 14193, 15380, 14459, 15649, 15875, 17070, 14775, 15970, 16195, 17392, 16463, 17659, 17883, 19066, 6127, 6995, 7165, 8105, 7372, 8325, 8511, 9529, 7624, 8591, 8779, 9810, 9008, 10049, 10251, 11346, 7923, 8907, 9099, 10145, 9331, 10386, 10591, 11698, 9611, 10679, 10885, 12001, 11134, 12257, 12474, 13633, 8289, 9295, 9491, 10553, 9726, 10800, 11009, 12128, 10010, 11096, 11306, 12435, 11556, 12694, 12914, 14082, 10348, 11447, 11658, 12799, 11911, 13059, 13279, 14455, 12216, 13370, 13591, 14771, 13855, 15038, 15265, 16459, 8735, 9765, 9964, 11049, 10204, 11299, 11508, 12646, 10493, 11597, 11809, 12955, 12063, 13215, 13434, 14614, 10839, 11952, 12168, 13321, 12428, 13585, 13808, 14991, 12734, 13898, 14122, 15308, 14389, 15577, 15804, 16999, 11257, 12386, 12603, 13765, 12863, 14032, 14253, 15441, 13172, 14347, 14571, 15762, 14837, 16032, 16256, 17452, 13542, 14722, 14947, 16141, 15217, 16412, 16637, 17831, 15533, 16728, 16955, 18146, 17226, 18414, 18637, 19806, 9282, 10335, 10539, 11644, 10786, 11897, 12113, 13264, 11081, 12202, 12418, 13575, 12679, 13841, 14065, 15249, 11432, 12567, 12783, 13950, 13043, 14215, 14438, 15628, 13354, 14533, 14754, 15949, 15022, 16217, 16442, 17638, 11856, 13003, 13223, 14398, 13484, 14663, 14890, 16083, 13797, 14980, 15207, 16402, 15474, 16669, 16898, 18090, 14172, 15359, 15585, 16780, 15853, 17048, 17276, 18463, 16173, 17370, 17596, 18781, 17861, 19044, 19268, 20424, 12371, 13527, 13750, 14932, 14015, 15200, 15425, 16621, 14332, 15519, 15746, 16940, 16015, 17210, 17435, 18621, 14705, 15898, 16124, 17320, 16394, 17589, 17814, 18997, 16712, 17906, 18130, 19310, 18397, 19572, 19790, 20937, 15156, 16351, 16578, 17772, 16846, 18040, 18263, 19441, 17166, 18355, 18580, 19751, 18844, 20010, 20228, 21362, 17544, 18729, 18953, 20115, 19219, 20376, 20593, 21713, 19529, 20681, 20897, 22008, 21149, 22254, 22459, 23511, 6778, 7691, 7873, 8854, 8088, 9082, 9278, 10331, 8349, 9357, 9555, 10620, 9791, 10867, 11077, 12198, 8662, 9688, 9888, 10970, 10126, 11217, 11428, 12563, 10414, 11516, 11727, 12872, 11981, 13131, 13350, 14529, 9046, 10089, 10291, 11388, 10535, 11640, 11852, 12999, 10826, 11939, 12154, 13307, 12414, 13571, 13793, 14976, 11177, 12304, 12520, 13681, 12779, 13946, 14168, 15355, 13087, 14262, 14484, 15676, 14750, 15945, 16169, 17366, 9511, 10573, 10782, 11893, 11029, 12148, 12366, 13522, 11327, 12456, 12675, 13837, 12935, 14103, 14327, 15514, 11678, 12820, 13039, 14211, 13299, 14476, 14700, 15893, 13613, 14794, 15018, 16213, 15287, 16482, 16707, 17901, 12109, 13260, 13480, 14659, 13745, 14927, 15151, 16346, 14061, 15245, 15470, 16665, 15741, 16935, 17161, 18350, 14434, 15624, 15849, 17044, 16119, 17315, 17539, 18724, 16438, 17634, 17857, 19040, 18125, 19305, 19524, 20676, 10075, 11163, 11374, 12506, 11625, 12765, 12984, 14154, 11923, 13071, 13291, 14468, 13555, 14735, 14960, 16154, 12288, 13443, 13665, 14847, 13930, 15114, 15339, 16535, 14244, 15432, 15658, 16854, 15928, 17124, 17349, 18537, 12723, 13887, 14111, 15297, 14377, 15565, 15792, 16987, 14691, 15884, 16111, 17307, 16380, 17575, 17801, 18984, 15070, 16266, 16492, 17688, 16759, 17954, 18177, 19357, 17079, 18271, 18494, 19669, 18759, 19928, 20145, 21283, 13245, 14420, 14644, 15835, 14912, 16105, 16331, 17525, 15230, 16424, 16650, 17843, 16920, 18111, 18335, 19510, 15608, 16803, 17028, 18219, 17299, 18486, 18708, 19876, 17618, 18803, 19024, 20186, 19289, 20445, 20660, 21779, 16062, 17256, 17482, 18667, 17751, 18933, 19156, 20314, 18069, 19248, 19470, 20622, 19730, 20877, 21091, 22197, 18442, 19617, 19834, 20980, 20094, 21232, 21442, 22537, 20403, 21532, 21740, 22825, 21987, 23061, 23258, 24276, 10762, 11873, 12090, 13242, 12346, 13502, 13726, 14909, 12655, 13817, 14042, 15227, 14307, 15494, 15722, 16917, 13019, 14190, 14416, 15605, 14680, 15872, 16101, 17296, 14998, 16192, 16420, 17615, 16687, 17880, 18107, 19286, 13461, 14641, 14865, 16059, 15132, 16328, 16553, 17748, 15451, 16647, 16873, 18066, 17142, 18332, 18555, 19727, 15831, 17025, 17252, 18439, 17521, 18705, 18929, 20091, 17839, 19021, 19244, 20400, 19506, 20657, 20873, 21984, 13989, 15174, 15400, 16597, 15668, 16864, 17090, 18282, 15990, 17185, 17411, 18598, 17679, 18863, 19085, 20246, 16368, 17563, 17790, 18973, 18057, 19237, 19459, 20612, 18372, 19547, 19767, 20914, 20027, 21166, 21378, 22475, 16821, 18016, 18237, 19416, 18504, 19679, 19894, 21039, 18820, 19987, 20203, 21338, 20462, 21589, 21796, 22878, 19195, 20352, 20568, 21689, 20827, 21940, 22146, 23211, 21126, 22231, 22435, 23488, 22677, 23720, 23912, 24893, 14624, 15815, 16043, 17238, 16311, 17505, 17732, 18915, 16629, 17823, 18049, 19229, 18315, 19491, 19711, 20859, 17008, 18199, 18424, 19599, 18688, 19856, 20076, 21214, 19005, 20167, 20385, 21514, 20642, 21761, 21970, 23044, 17463, 18649, 18873, 20037, 19137, 20296, 20513, 21636, 19450, 20603, 20819, 21932, 21072, 22179, 22384, 23439, 19816, 20962, 21174, 22278, 21424, 22519, 22721, 23762, 21722, 22807, 23006, 24036, 23241, 24259, 24445, 25398, 17999, 19179, 19400, 20554, 19662, 20811, 21023, 22132, 19971, 21112, 21323, 22422, 21573, 22663, 22863, 23899, 20335, 21464, 21674, 22760, 21924, 22999, 23197, 24217, 22217, 23279, 23475, 24481, 23707, 24700, 24881, 25808, 20769, 21885, 22091, 23159, 22336, 23395, 23588, 24588, 22625, 23671, 23863, 24847, 24089, 25062, 25239, 26142, 22960, 23991, 24179, 25146, 24403, 25358, 25531, 26415, 24665, 25605, 25775, 26643, 25976, 26830, 26983, 27761, 7599, 8565, 8752, 9783, 8983, 10023, 10224, 11319, 9254, 10306, 10510, 11615, 10757, 11868, 12083, 13235, 9585, 10652, 10858, 11973, 11108, 12230, 12447, 13605, 11403, 12537, 12754, 13920, 13014, 14185, 14409, 15598, 9983, 11069, 11277, 12406, 11529, 12667, 12885, 14053, 11827, 12974, 13192, 14367, 13454, 14634, 14858, 16052, 12189, 13342, 13562, 14742, 13828, 15010, 15236, 16430, 14143, 15329, 15554, 16749, 15824, 17018, 17245, 18432, 10467, 11570, 11782, 12928, 12035, 13186, 13405, 14585, 12341, 13497, 13720, 14903, 13984, 15169, 15394, 16591, 12707, 13870, 14095, 15280, 14360, 15548, 15775, 16970, 14675, 15867, 16095, 17290, 16363, 17558, 17784, 18967, 13145, 14320, 14543, 15734, 14808, 16003, 16227, 17423, 15126, 16322, 16547, 17742, 16815, 18010, 18231, 19410, 15506, 16700, 16927, 18118, 17197, 18385, 18608, 19778, 17515, 18699, 18923, 20085, 19189, 20346, 20562, 21683, 11053, 12173, 12390, 13547, 12651, 13813, 14037, 15222, 12959, 14127, 14351, 15538, 14619, 15809, 16037, 17231, 13325, 14503, 14726, 15920, 14994, 16188, 16415, 17610, 15312, 16508, 16732, 17927, 17002, 18193, 18417, 19592, 13769, 14952, 15177, 16372, 15446, 16642, 16868, 18061, 15766, 16960, 17188, 18376, 17457, 18642, 18867, 20031, 16145, 17341, 17566, 18751, 17834, 19016, 19239, 20395, 18150, 19330, 19550, 20702, 19809, 20955, 21168, 22272, 14303, 15490, 15718, 16913, 15986, 17181, 17407, 18594, 16306, 17499, 17727, 18909, 17994, 19173, 19395, 20548, 16683, 17876, 18103, 19282, 18368, 19543, 19763, 20910, 18682, 19850, 20070, 21208, 20329, 21458, 21668, 22754, 17138, 18328, 18551, 19723, 18816, 19983, 20199, 21334, 19132, 20290, 20508, 21631, 20764, 21879, 22086, 23154, 19502, 20653, 20869, 21980, 21122, 22227, 22431, 23484, 21418, 22513, 22716, 23757, 22954, 23985, 24174, 25141, 11761, 12907, 13123, 14298, 13384, 14564, 14786, 15981, 13699, 14882, 15105, 16301, 15373, 16570, 16794, 17989, 14075, 15259, 15485, 16680, 15755, 16949, 17176, 18365, 16074, 17268, 17494, 18679, 17763, 18945, 19168, 20326, 14521, 15713, 15937, 17133, 16205, 17402, 17626, 18811, 16526, 17722, 17945, 19127, 18210, 19390, 19608, 20759, 16908, 18100, 18323, 19499, 18589, 19760, 19978, 21119, 18904, 20067, 20285, 21415, 20543, 21665, 21874, 22951, 15053, 16249, 16475, 17671, 16743, 17938, 18161, 19341, 17063, 18255, 18478, 19653, 18744, 19913, 20130, 21268, 17445, 18631, 18855, 20021, 19120, 20279, 20496, 21621, 19432, 20585, 20801, 21916, 21056, 22163, 22368, 23425, 17894, 19077, 19298, 20454, 19560, 20712, 20925, 22036, 19868, 21014, 21224, 22327, 21476, 22571, 22770, 23810, 20238, 21372, 21581, 22671, 21830, 22910, 23108, 24132, 22122, 23189, 23385, 24395, 23619, 24617, 24798, 25729, 15696, 16891, 17117, 18307, 17386, 18573, 18796, 19963, 17705, 18888, 19110, 20269, 19374, 20528, 20744, 21860, 18082, 19261, 19482, 20634, 19743, 20890, 21103, 22209, 20050, 21188, 21399, 22495, 21649, 22735, 22936, 23968, 18530, 19703, 19921, 21064, 20179, 21315, 21525, 22617, 20486, 21611, 21821, 22901, 22066, 23136, 23334, 24347, 20850, 21962, 22170, 23233, 22413, 23467, 23662, 24657, 22698, 23740, 23934, 24913, 24157, 25125, 25304, 26202, 19060, 20221, 20439, 21566, 20696, 21814, 22022, 23094, 20997, 22106, 22312, 23371, 22554, 23603, 23795, 24784, 21354, 22452, 22655, 23700, 22894, 23928, 24118, 25089, 23172, 24193, 24380, 25337, 24601, 25544, 25715, 26587, 21773, 22856, 23055, 24082, 23290, 24306, 24491, 25441, 23564, 24566, 24749, 25684, 24963, 25885, 26052, 26900, 23891, 24874, 25054, 25969, 25266, 26167, 26331, 27157, 25510, 26396, 26557, 27367, 26744, 27540, 27684, 28400, 12624, 13786, 14010, 15195, 14276, 15463, 15691, 16886, 14592, 15783, 16010, 17205, 16278, 17473, 17700, 18883, 14968, 16162, 16389, 17584, 16657, 17850, 18077, 19256, 16977, 18168, 18392, 19567, 18657, 19825, 20045, 21183, 15420, 16616, 16841, 18035, 17112, 18302, 18525, 19698, 17430, 18616, 18839, 20005, 19105, 20264, 20481, 21606, 17809, 18992, 19214, 20371, 19477, 20629, 20845, 21957, 19785, 20932, 21144, 22249, 21394, 22490, 22693, 23735, 15960, 17155, 17382, 18569, 17649, 18833, 19056, 20217, 17967, 19148, 19370, 20524, 19630, 20780, 20993, 22102, 18343, 19518, 19739, 20886, 19998, 21138, 21350, 22448, 20305, 21434, 21645, 22731, 21894, 22970, 23168, 24189, 18792, 19959, 20175, 21311, 20435, 21562, 21769, 22852, 20740, 21856, 22062, 23132, 22308, 23367, 23560, 24562, 21099, 22205, 22409, 23463, 22651, 23696, 23887, 24870, 22932, 23964, 24153, 25121, 24376, 25333, 25506, 26392, 16600, 17794, 18019, 19199, 18286, 19463, 19683, 20831, 18601, 19771, 19990, 21130, 20250, 21382, 21593, 22681, 18976, 20138, 20355, 21484, 20614, 21733, 21942, 23016, 20917, 22028, 22234, 23296, 22477, 23528, 23722, 24714, 19419, 20572, 20788, 21903, 21043, 22150, 22355, 23412, 21341, 22439, 22643, 23688, 22882, 23916, 24107, 25078, 21692, 22778, 22978, 24009, 23213, 24232, 24419, 25373, 23491, 24497, 24681, 25621, 24895, 25821, 25990, 26843, 19941, 21085, 21297, 22396, 21546, 22637, 22838, 23874, 21842, 22920, 23120, 24142, 23353, 24364, 24550, 25495, 22190, 23252, 23449, 24455, 23681, 24675, 24856, 25784, 23951, 24929, 25109, 26020, 25320, 26217, 26380, 27203, 22599, 23645, 23837, 24823, 24065, 25038, 25215, 26120, 24331, 25289, 25465, 26353, 25669, 26543, 26702, 27501, 24639, 25580, 25751, 26620, 25952, 26808, 26961, 27741, 26186, 27024, 27176, 27937, 27352, 28098, 28232, 28900, 17359, 18547, 18770, 19939, 19033, 20195, 20413, 21542, 19349, 20504, 20720, 21838, 20972, 22082, 22288, 23349, 19719, 20867, 21081, 22188, 21330, 22429, 22633, 23679, 21627, 22714, 22916, 23949, 23150, 24172, 24360, 25318, 20155, 21293, 21501, 22595, 21749, 22834, 23032, 24061, 22044, 23116, 23312, 24327, 23542, 24546, 24728, 25665, 22392, 23447, 23641, 24637, 23870, 24854, 25034, 25950, 24138, 25107, 25285, 26184, 25491, 26378, 26539, 27350, 20670, 21789, 21998, 23072, 22243, 23305, 23501, 24507, 22530, 23580, 23773, 24764, 24002, 24979, 25157, 26067, 22871, 23907, 24098, 25071, 24320, 25280, 25456, 26346, 24580, 25525, 25697, 26571, 25899, 26758, 26913, 27697, 23268, 24286, 24470, 25422, 24690, 25630, 25798, 26665, 24943, 25867, 26033, 26883, 26231, 27067, 27216, 27974, 25247, 26150, 26313, 27141, 26507, 27321, 27467, 28202, 26727, 27525, 27668, 28386, 27836, 28541, 28666, 29290, 21277, 22377, 22580, 23628, 22819, 23856, 24047, 25022, 23101, 24125, 24313, 25273, 24533, 25480, 25653, 26529, 23432, 24439, 24624, 25566, 24840, 25769, 25938, 26795, 25095, 26007, 26173, 27012, 26367, 27191, 27340, 28087, 23819, 24807, 24987, 25907, 25198, 26105, 26269, 27101, 25448, 26338, 26500, 27314, 26687, 27488, 27633, 28354, 25736, 26606, 26764, 27558, 26947, 27728, 27867, 28569, 27163, 27925, 28062, 28746, 28220, 28889, 29008, 29599, 24271, 25233, 25409, 26302, 25616, 26494, 26653, 27457, 25854, 26716, 26872, 27659, 27054, 27825, 27963, 28657, 26136, 26978, 27130, 27896, 27308, 28057, 28192, 28864, 27514, 28246, 28377, 29031, 28530, 29167, 29281, 29842, 26462, 27280, 27427, 28166, 27601, 28326, 28455, 29100, 27799, 28507, 28634, 29261, 28780, 29394, 29503, 30038, 28030, 28718, 28839, 29447, 28982, 29576, 29680, 30196, 29145, 29722, 29823, 30324, 29940, 30427, 30511, 30926, 8633, 9656, 9855, 10934, 10094, 11183, 11393, 12526, 10381, 11481, 11692, 12835, 11946, 13095, 13314, 14492, 10728, 11839, 12052, 13204, 12310, 13466, 13687, 14870, 12619, 13780, 14004, 15188, 14270, 15457, 15684, 16879, 11144, 12268, 12486, 13645, 12744, 13909, 14134, 15320, 13053, 14226, 14449, 15640, 14715, 15909, 16135, 17332, 13423, 14603, 14827, 16022, 15093, 16289, 16516, 17712, 15414, 16609, 16836, 18029, 17105, 18295, 18520, 19693, 11646, 12786, 13005, 14175, 13266, 14441, 14665, 15856, 13579, 14759, 14984, 16178, 15253, 16447, 16673, 17866, 13953, 15138, 15362, 16559, 15631, 16827, 17051, 18243, 15954, 17149, 17375, 18562, 17643, 18827, 19049, 20210, 14400, 15588, 15816, 17010, 16085, 17279, 17506, 18690, 16405, 17600, 17825, 19008, 18093, 19272, 19493, 20645, 16783, 17978, 18201, 19381, 18466, 19641, 19858, 21004, 18785, 19952, 20170, 21306, 20428, 21555, 21764, 22847, 12252, 13407, 13628, 14810, 13892, 15076, 15302, 16498, 14208, 15396, 15621, 16817, 15890, 17086, 17312, 18500, 14587, 15777, 16005, 17199, 16272, 17467, 17694, 18877, 16593, 17786, 18012, 919, 18278, 19455, 19675, 20823, 15033, 16229, 16454, 17651, 16722, 17917, 18141, 19322, 17041, 18233, 18456, 19632, 18721, 19890, 20108, 21247, 17425, 18610, 18835, 20000, 19099, 20258, 20477, 21602, 19412, 20564, 20782, 21896, 21035, 22142, 22349, 23406, 15571, 16766, 16993, 18184, 17262, 18449, 18673, 19841, 17581, 18766, 18989, 20151, 19254, 20410, 20627, 21746, 17961, 19142, 19364, 20518, 19624, 20774, 20987, 22096, 19935, 21077, 21289, 22388, 21539, 22630, 22831, 23867, 18408, 19583, 19801, 20948, 20061, 21199, 21410, 22506, 20368, 21497, 21706, 22792, 21955, 23029, 23227, 24246, 20734, 21850, 22058, 23128, 22302, 23361, 23556, 24558, 22591, 23637, 23831, 24817, 24058, 25031, 25210, 26115, 12986, 14156, 14379, 15567, 14646, 15837, 16064, 17258, 14963, 16157, 16383, 17578, 16653, 17846, 18072, 19251, 15341, 16537, 16761, 17956, 17030, 18221, 18444, 19619, 17352, 18540, 18762, 19931, 19027, 20189, 20406, 21535, 15794, 16989, 17217, 18405, 17484, 18669, 18895, 20058, 17803, 18986, 19209, 20366, 19472, 20624, 20841, 21953, 18179, 19359, 19579, 20730, 19836, 20982, 21195, 22298, 20147, 21285, 21494, 22588, 21742, 22827, 23026, 24055, 16334, 17528, 17754, 18936, 18022, 19202, 19422, 20575, 18339, 19514, 19734, 20881, 19994, 21134, 21345, 22443, 18711, 19879, 20097, 21235, 20358, 21487, 21695, 22781, 20664, 21783, 21991, 23065, 22238, 23300, 23495, 24501, 19159, 20317, 20535, 21657, 20791, 21906, 22113, 23180, 21094, 22200, 22405, 23459, 22646, 23691, 23883, 24866, 21445, 22540, 22742, 23782, 22981, 24012, 24200, 25166, 23261, 24279, 24464, 25416, 24684, 25624, 25793, 26660, 16972, 18163, 18387, 19562, 18653, 19821, 20041, 21179, 18969, 20132, 20348, 21478, 20608, 21728, 21936, 23011, 19343, 20498, 20714, 21832, 20967, 22077, 22283, 23344, 21270, 22370, 22573, 23621, 22813, 23850, 24041, 25016, 19780, 20927, 21140, 22245, 21390, 22486, 22690, 23732, 21685, 22772, 22972, 24004, 23207, 24227, 24414, 25369, 22038, 23110, 23307, 24322, 23537, 24541, 24724, 25661, 23812, 24800, 24981, 25901, 25192, 26099, 26264, 27096, 20301, 21430, 21641, 22727, 21890, 22966, 23164, 24185, 22184, 23247, 23443, 24450, 23676, 24671, 24851, 25780, 22525, 23575, 23768, 24759, 23997, 24974, 25152, 26062, 24265, 25227, 25403, 26296, 25611, 26489, 26648, 27452, 22928, 23960, 24150, 25118, 24372, 25329, 25503, 26389, 24633, 25575, 25746, 26616, 25947, 26804, 26957, 27738, 24938, 25862, 26029, 26879, 26226, 27062, 27212, 27970, 26456, 27274, 27422, 28161, 27596, 28321, 28451, 29096, 13868, 15051, 15278, 16473, 15546, 16741, 16968, 18159, 15865, 17061, 17288, 18476, 17556, 18742, 18965, 20128, 16247, 17443, 17669, 18853, 17936, 19118, 19339, 20494, 18253, 19430, 19651, 20799, 19911, 21054, 21266, 22366, 16698, 17892, 18117, 19297, 18383, 19558, 19777, 20924, 18697, 19866, 20084, 21223, 20344, 21474, 21682, 22769, 19075, 20236, 20453, 21580, 20710, 21828, 22035, 23107, 21012, 22120, 22326, 23384, 22569, 23617, 23809, 24797, 17239, 18426, 18650, 19818, 18916, 20078, 20297, 21426, 19231, 20388, 20605, 21725, 20861, 21973, 22181, 23244, 19601, 20752, 20964, 22074, 21216, 22319, 22521, 23571, 21517, 22609, 22810, 23847, 23047, 24074, 24262, 25224, 20038, 21176, 21388, 22484, 21637, 22723, 22925, 23957, 21933, 23008, 23205, 24225, 23440, 24447, 24631, 25573, 22280, 23341, 23535, 24539, 23764, 24755, 24935, 25859, 24038, 25013, 25190, 26097, 25400, 26293, 26454, 27272, 17874, 19058, 19280, 20437, 19541, 20694, 20908, 22020, 19848, 20995, 21206, 22310, 21456, 22552, 22752, 23793, 20219, 21352, 21564, 22653, 21812, 22892, 23092, 24116, 22104, 23170, 23369, 24378, 23601, 24599, 24782, 25713, 20651, 21771, 21979, 23054, 22225, 23288, 23483, 24490, 22511, 23562, 23756, 24748, 23983, 24961, 25140, 26051, 22854, 23889, 24081, 25053, 24304, 25264, 25440, 26330, 24564, 25508, 25683, 26556, 25883, 26742, 26899, 27683, 21161, 22266, 22470, 23522, 22709, 23751, 23944, 24923, 22992, 24023, 24210, 25176, 24433, 25387, 25560, 26442, 23327, 24340, 24526, 25473, 24742, 25677, 25847, 26709, 24999, 25917, 26084, 26928, 26281, 27111, 27261, 28013, 23715, 24708, 24889, 25816, 25102, 26014, 26180, 27019, 25351, 26247, 26410, 27232, 26600, 27407, 27553, 28282, 25646, 26522, 26681, 27482, 26865, 27652, 27793, 28501, 27081, 27849, 27988, 28679, 28148, 28823, 28944, 29541, 18629, 19799, 20019, 21159, 20277, 21408, 21619, 22707, 20583, 21704, 21914, 22990, 22161, 23225, 23423, 24431, 20945, 22055, 22263, 23324, 22503, 23553, 23748, 24739, 22789, 23828, 24020, 24996, 24243, 25207, 25384, 26278, 21370, 22468, 22670, 23714, 22908, 23942, 24131, 25101, 23187, 24208, 24394, 25350, 24615, 25558, 25728, 26599, 23519, 24523, 24706, 25644, 24920, 25844, 26012, 26863, 25173, 26081, 26245, 27079, 26439, 27258, 27405, 28146, 21868, 22945, 23144, 24166, 23378, 24388, 24573, 25518, 23655, 24650, 24833, 25762, 25047, 25962, 26129, 26971, 23976, 24953, 25133, 26043, 25344, 26240, 26403, 27225, 25590, 26470, 26630, 27435, 26817, 27608, 27750, 28462, 24354, 25312, 25486, 26373, 25690, 26564, 26721, 27519, 25931, 26788, 26941, 27722, 27123, 27889, 28024, 28712, 26209, 27045, 27196, 27955, 27373, 28117, 28250, 28916, 27580, 28306, 28435, 29082, 28589, 29221, 29332, 29887, 22450, 23503, 23698, 24692, 23926, 24906, 25087, 26000, 24191, 25159, 25335, 26233, 25542, 26426, 26585, 27394, 24509, 25458, 25632, 26509, 25832, 26696, 26853, 27641, 26069, 26915, 27069, 27838, 27247, 28001, 28137, 28813, 24872, 25800, 25968, 26823, 26165, 27005, 27156, 27919, 26394, 27218, 27366, 28112, 27538, 28269, 28399, 29051, 26667, 27469, 27614, 28337, 27781, 28490, 28617, 29246, 27976, 28668, 28792, 29404, 28933, 29531, 29638, 30158, 25298, 26196, 26361, 27185, 26551, 27361, 27508, 28240, 26774, 27568, 27710, 28425, 27877, 28579, 28702, 29324, 27034, 27807, 27946, 28641, 28107, 28787, 28908, 29509, 28296, 28956, 29074, 29657, 29213, 29781, 29881, 30374, 27334, 28081, 28215, 28884, 28371, 29025, 29140, 29717, 28552, 29188, 29301, 29860, 29432, 29977, 30071, 30542, 28764, 29379, 29488, 30025, 29615, 30138, 30230, 30679, 29760, 30267, 30357, 30790, 30460, 30881, 30954, 31307, 14934, 16127, 16353, 17547, 16624, 17817, 18043, 19222, 16944, 18135, 18359, 19534, 18626, 19795, 20015, 21154, 17323, 18511, 18732, 19901, 18999, 20161, 20378, 21507, 19315, 20470, 20686, 21804, 20941, 22051, 22258, 23319, 17774, 18956, 19180, 20337, 19444, 20596, 20813, 21926, 19754, 20901, 21114, 22220, 21366, 22463, 22666, 23710, 20118, 21256, 21466, 22561, 21715, 22800, 23000, 24030, 22012, 23084, 23282, 24298, 23514, 24518, 24702, 25640, 18310, 19485, 19706, 20853, 19966, 21106, 21318, 22416, 20274, 21404, 21616, 22703, 21865, 22941, 23141, 24162, 20636, 21755, 21964, 23038, 22211, 23273, 23469, 24475, 22499, 23549, 23744, 24735, 23972, 24949, 25129, 26039, 21067, 22173, 22379, 23434, 22620, 23665, 23858, 24842, 22905, 23938, 24128, 25098, 24351, 25308, 25483, 26370, 23235, 24253, 24440, 25393, 24659, 25599, 25770, 26638, 24916, 25840, 26009, 26860, 26205, 27041, 27193, 27952, 18940, 20102, 20321, 21450, 20580, 21700, 21911, 22986, 20884, 21995, 22203, 23265, 22446, 23498, 23694, 24687, 21240, 22342, 22545, 23594, 22785, 23824, 24016, 24992, 23069, 24095, 24283, 25244, 24504, 25453, 25627, 26504, 21660, 22746, 22947, 23979, 23184, 24204, 24391, 25347, 23461, 24467, 24652, 25593, 24868, 25795, 25964, 26819, 23786, 24775, 24956, 25878, 25169, 26077, 26242, 27076, 25419, 26310, 26473, 27289, 26662, 27464, 27610, 28333, 22158, 23221, 23420, 24427, 23652, 24646, 24830, 25758, 23923, 24902, 25084, 25996, 25295, 26192, 26358, 27181, 24239, 25203, 25380, 26274, 25586, 26466, 26626, 27431, 25828, 26692, 26849, 27637, 27030, 27803, 27942, 28637, 24612, 25554, 25725, 26596, 25928, 26784, 26938, 27719, 26162, 27001, 27153, 27916, 27331, 28077, 28212, 28881, 26435, 27254, 27402, 28143, 27576, 28302, 28432, 29079, 27777, 28486, 28614, 29243, 28760, 29375, 29485, 30022, 19686, 20834, 21046, 22153, 21299, 22398, 22601, 23647, 21597, 22685, 22886, 23920, 23123, 24145, 24334, 25292, 21945, 23019, 23216, 24235, 23451, 24457, 24641, 25582, 23726, 24718, 24899, 25825, 25112, 26023, 26189, 27027, 22358, 23415, 23610, 24608, 23839, 24825, 25006, 25924, 24110, 25081, 25259, 26160, 25467, 26355, 26517, 27329, 24422, 25376, 25550, 26432, 25753, 26622, 26780, 27573, 25993, 26846, 26999, 27775, 27178, 27939, 28075, 28758, 22840, 23876, 24067, 25040, 24291, 25252, 25427, 26318, 24553, 25498, 25672, 25546, 25873, 26733, 26889, 27674, 24858, 25786, 25954, 26810, 26153, 26993, 27144, 27908, 26383, 27206, 27355, 28101, 27529, 28259, 28390, 29042, 25217, 26122, 26287, 27117, 26479, 27295, 27443, 28180, 26704, 27503, 27648, 28367, 27814, 28520, 28647, 29272, 26963, 27743, 27882, 28583, 28044, 28730, 28852, 29458, 28234, 28902, 29020, 29610, 29157, 29732, 29833, 30332, 23401, 24409, 24594, 25537, 24812, 25741, 25912, 26769, 25068, 25982, 26147, 26988, 26343, 27168, 27318, 28066, 25363, 26258, 26420, 27241, 26610, 27416, 27562, 28290, 26835, 27624, 27765, 28476, 27929, 28625, 28749, 29366, 25708, 26580, 26738, 27534, 26923, 27705, 27845, 28548, 27138, 27903, 28039, 28726, 28199, 28870, 28989, 29582, 27388, 28131, 28264, 28928, 28419, 29068, 29183, 29755, 28602, 29233, 29345, 29898, 29474, 30013, 30108, 30573, 26110, 26952, 27106, 27872, 27284, 28034, 28170, 28843, 27493, 28225, 28358, 29012, 28511, 29149, 29264, 29826, 27732, 28445, 28573, 29207, 28721, 29340, 29450, 29992, 28893, 29495, 29602, 30127, 29725, 30236, 30326, 30764, 28008, 28697, 28819, 29428, 28962, 29557, 29662, 30179, 29127, 29705, 29807, 30309, 29924, 30412, 30497, 30913, 29318, 29875, 29972, 30455, 30086, 30554, 30635, 31033, 30218, 30669, 30748, 31130, 30839, 31208, 31272, 31578, 20555, 21676, 21886, 22962, 22134, 23199, 23397, 24405, 22424, 23478, 23673, 24668, 23902, 24884, 25065, 25979, 22762, 23802, 23993, 24970, 24218, 25183, 25359, 26254, 24484, 25434, 25608, 26486, 25810, 26675, 26832, 27621, 23160, 24181, 24369, 25326, 24590, 25533, 25705, 26577, 24848, 25777, 25945, 26802, 26144, 26985, 27136, 27901, 25148, 26058, 26223, 27059, 26416, 27237, 27385, 28128, 26645, 27449, 27594, 28319, 27762, 28473, 28600, 29231, 23630, 24626, 24809, 25738, 25024, 25940, 26107, 26949, 25276, 26176, 26341, 27166, 26532, 27343, 27491, 28223, 25567, 26448, 26607, 27413, 26796, 27588, 27729, 28442, 27014, 27788, 27927, 28623, 28089, 28770, 28891, 29493, 25909, 26766, 26921, 27703, 27103, 27869, 28006, 28695, 27316, 28064, 28198, 28869, 28356, 29010, 29126, 29704, 27559, 28287, 28417, 29066, 28570, 29204, 29316, 29873, 28747, 29364, 29473, 30012, 29600, 30125, 30217, 30668, 24168, 25136, 25314, 26212, 25521, 26406, 26567, 27376, 25764, 26633, 26790, 27583, 26973, 27752, 27891, 28591, 26046, 26894, 27048, 27819, 27227, 27983, 28119, 28797, 27438, 28175, 28309, 28967, 28464, 29107, 29223, 29789, 26374, 27198, 27347, 28094, 27521, 28252, 28383, 29036, 27723, 28437, 28565, 29200, 28713, 29333, 29443, 29986, 27957, 28651, 28775, 29389, 28917, 29517, 29624, 30146, 29084, 29666, 29770, 30276, 29888, 30380, 30467, 30887, 26754, 27549, 27693, 28408, 27859, 28561, 28687, 29308, 28053, 28738, 28860, 29465, 29001, 29592, 29697, 30210, 28277, 28939, 29057, 29642, 29195, 29765, 29865, 30360, 29356, 29907, 30005, 30482, 30118, 30581, 30662, 31055, 28537, 29173, 29287, 29847, 29419, 29963, 30059, 30530, 29572, 30099, 30193, 30647, 30301, 30740, 30818, 31189, 29745, 30254, 30344, 30779, 30446, 30869, 30942, 31297, 30565, 30972, 31043, 31384, 31123, 31452, 31508, 31778, 24791, 25722, 25892, 26751, 26091, 26935, 27088, 27856, 26325, 27151, 27302, 28051, 27477, 28210, 28344, 28999, 26593, 27400, 27546, 28275, 27716, 28430, 28558, 29193, 27914, 28612, 28736, 29354, 28879, 29483, 29590, 30116, 26906, 27690, 27830, 28535, 27993, 28684, 28806, 29417, 28186, 28858, 28977, 29571, 29116, 29695, 29797, 30300, 28405, 29055, 29171, 29744, 29305, 29863, 29961, 30445, 29463, 30003, 30098, 30564, 30208, 30660, 30739, 31122, 27267, 28019, 28154, 28829, 28314, 28972, 29089, 29671, 28497, 29136, 29252, 29815, 29385, 29932, 30030, 30504, 28707, 29328, 29437, 29981, 29566, 30094, 30187, 30642, 29713, 30226, 30316, 30755, 30419, 30845, 30919, 31277, 28949, 29546, 29651, 30170, 29774, 30280, 30368, 30800, 29915, 30404, 30489, 30906, 30588, 30992, 31061, 31399, 30075, 30545, 30626, 31026, 30721, 31107, 31173, 31495, 30831, 31201, 31265, 31572, 31339, 31635, 31685, 31925, 27679, 28395, 28525, 29162, 28675, 29297, 29409, 29954, 28848, 29455, 29562, 30091, 29687, 30202, 30293, 30734, 29047, 29634, 29737, 30247, 29856, 30353, 30439, 30863, 29997, 30476, 30559, 30967, 30655, 31050, 31118, 31448, 29276, 29837, 29936, 30423, 30050, 30522, 30605, 31007, 30183, 30639, 30718, 31105, 30810, 31183, 31248, 31558, 30336, 30772, 30849, 31216, 30935, 31291, 31353, 31647, 31037, 31379, 31438, 31719, 31503, 31774, 31820, 32038, 29537, 30067, 30162, 30619, 30272, 30714, 30793, 31167, 30397, 30825, 30900, 31260, 30986, 31334, 31394, 31681, 30538, 30950, 31020, 31365, 31101, 31434, 31490, 31763, 31196, 31514, 31568, 31828, 31631, 31880, 31922, 32121, 30699, 31087, 31155, 31479, 31233, 31544, 31598, 31852, 31322, 31620, 31672, 31914, 31730, 31962, 32001, 32185, 31422, 31706, 31754, 31983, 31808, 32028, 32064, 32237, 31871, 32080, 32115, 32279, 32154, 32310, 32335, 32454, 4249, 4955, 5097, 5882, 5267, 6066, 6226, 7100, 5474, 6290, 6452, 7343, 6648, 7553, 7731, 8704, 5728, 6566, 6732, 7644, 6930, 7856, 8037, 9030, 7170, 8111, 8295, 9302, 8517, 9536, 9733, 10808, 6038, 6898, 7068, 8001, 7274, 8219, 8405, 9416, 7518, 8479, 8667, 9693, 8895, 9931, 10132, 11223, 7822, 8801, 8992, 10034, 9223, 10275, 10477, 11582, 9497, 10560, 10767, 11879, 11016, 12136, 12352, 13509, 6415, 7303, 7480, 8438, 7690, 8661, 8853, 9887, 7945, 8931, 9124, 10170, 9356, 10413, 10619, 11726, 8252, 9258, 9453, 10516, 9687, 10761, 10969, 12089, 9970, 11056, 11264, 12394, 11515, 12654, 12871, 14041, 8627, 9649, 9849, 10927, 10088, 11176, 11387, 12519, 10373, 11472, 11684, 12826, 11938, 13086, 13306, 14483, 10721, 11833, 12045, 13198, 12303, 13460, 13680, 14864, 12610, 13773, 13995, 15181, 14261, 15450, 15675, 16872, 6886, 7808, 7988, 8977, 8206, 9208, 9402, 10461, 8465, 9481, 9678, 10750, 9916, 10999, 11207, 12334, 8785, 9817, 10017, 11104, 10258, 11354, 11564, 12703, 10543, 11649, 11861, 13009, 12118, 13270, 13490, 14670, 9169, 10218, 10421, 11523, 10667, 11776, 11989, 13139, 10958, 12076, 12293, 13448, 12552, 13713, 13936, 15120, 11313, 12443, 12661, 13824, 12922, 14091, 14314, 15502, 13228, 14404, 14628, 15820, 14896, 16090, 16316, 17511, 9636, 10706, 10913, 12029, 11162, 12287, 12505, 13664, 11457, 12593, 12810, 13977, 13070, 14243, 14467, 15657, 11816, 12963, 13180, 14356, 13442, 14623, 14846, 16042, 13755, 14938, 15162, 16358, 15431, 16628, 16853, 18048, 12245, 13399, 13621, 14802, 13886, 15069, 15296, 16491, 14200, 15387, 15614, 16809, 15883, 17078, 17306, 18493, 14579, 15771, 15997, 17193, 16265, 17462, 17687, 18872, 16584, 17779, 18004, 19185, 18270, 19449, 19668, 20818, 7464, 8421, 8612, 9633, 8835, 9868, 10072, 11159, 9106, 10151, 10356, 11454, 10599, 11705, 11920, 13067, 9434, 10496, 10703, 11814, 10948, 12067, 12284, 13440, 11243, 12373, 12590, 13753, 12848, 14018, 14240, 15429, 9833, 10909, 11120, 12241, 11371, 12501, 12720, 13882, 11666, 12806, 13026, 14196, 13288, 14463, 14688, 15879, 12025, 13177, 13395, 14576, 13660, 14843, 15065, 16262, 13973, 15159, 15383, 16581, 15653, 16850, 17074, 18267, 10310, 11407, 11621, 12760, 11872, 13018, 13241, 14415, 12176, 13328, 13551, 14730, 13816, 14997, 15226, 16419, 12541, 13703, 13926, 15111, 14189, 15377, 15604, 16800, 14506, 15699, 15924, 17121, 16191, 17389, 17614, 18800, 12980, 14149, 14373, 15560, 14640, 15830, 16058, 17251, 14956, 16149, 16376, 17570, 16646, 17838, 18065, 19243, 15335, 16532, 16755, 17951, 17024, 18216, 18438, 19614, 17345, 18534, 18755, 19925, 19020, 20183, 20399, 21529, 10894, 12009, 12226, 13379, 12484, 13642, 13866, 15048, 12790, 13957, 14180, 15367, 14446, 15636, 15862, 17057, 13160, 14336, 14559, 15751, 14824, 16020, 16244, 17441, 15142, 16338, 16564, 17759, 16832, 18027, 18249, 19428, 13601, 14780, 15006, 16199, 15276, 16469, 16696, 17888, 15593, 16788, 17014, 18205, 17285, 18472, 18695, 19863, 15975, 17171, 17396, 18584, 17665, 18850, 19071, 20233, 17983, 19164, 19385, 20539, 19647, 20797, 21009, 22118, 14132, 15317, 15544, 16738, 15814, 17007, 17237, 18423, 16132, 17328, 17553, 18738, 17822, 19004, 19228, 20384, 16513, 17710, 17933, 19116, 18198, 19379, 19598, 20750, 18516, 19691, 19907, 21052, 20166, 21304, 21513, 22607, 16966, 18156, 18381, 19555, 18648, 19815, 20036, 21173, 18962, 20124, 20342, 21471, 20602, 21721, 21931, 23005, 19336, 20492, 20707, 21826, 20961, 22072, 22277, 23339, 21262, 22364, 22566, 23615, 22806, 23845, 24035, 25011, 8185, 9185, 9380, 10438, 9615, 10683, 10891, 12006, 9894, 10976, 11184, 12311, 11435, 12570, 12787, 13954, 10235, 11331, 11541, 12680, 11793, 12940, 13157, 14333, 12095, 13247, 13467, 14647, 13732, 14915, 15139, 16335, 10643, 11751, 11964, 13112, 12222, 13375, 13597, 14776, 12527, 13688, 13910, 15094, 14176, 15363, 15589, 16784, 12897, 14066, 14287, 15475, 14555, 15747, 15971, 17167, 14871, 16065, 16290, 17485, 16560, 17755, 17979, 19160, 11138, 12261, 12480, 13638, 12738, 13902, 14128, 15313, 13046, 14218, 14442, 15632, 14708, 15901, 16128, 17324, 13416, 14597, 14820, 16016, 15086, 16283, 16509, 17706, 15406, 16603, 16828, 18023, 17097, 18289, 18512, 19687, 13861, 15043, 15271, 16464, 15539, 16733, 16961, 18151, 15857, 17052, 17280, 18467, 17548, 18733, 18957, 20119, 16239, 17436, 17660, 18845, 17928, 19111, 19331, 20487, 18244, 19423, 19642, 20792, 19902, 21047, 21257, 22359, 11735, 12880, 13096, 14271, 13359, 14538, 14760, 15955, 13671, 14853, 15077, 16273, 15346, 16542, 16767, 17962, 14048, 15233, 15458, 16654, 15729, 16924, 17150, 18340, 16047, 17242, 17468, 18654, 17737, 18920, 19143, 20302, 14493, 15685, 15910, 17106, 16179, 17376, 17601, 18786, 16499, 17695, 17918, 19100, 18185, 19365, 19584, 20735, 16880, 18073, 18296, 19473, 18563, 19735, 19953, 21095, 18878, 20042, 20259, 21391, 20519, 21642, 21851, 22929, 15027, 16222, 16448, 17644, 16717, 17911, 18136, 19316, 17035, 18226, 18450, 19625, 18716, 19884, 20103, 21241, 17418, 18605, 18828, 19995, 19093, 20254, 20471, 21598, 19405, 20559, 20775, 21891, 21029, 22138, 22343, 23402, 17867, 19050, 19273, 20429, 19535, 20687, 20902, 22013, 19842, 20988, 21200, 22303, 21451, 22546, 22747, 23787, 20211, 21346, 21556, 22647, 21805, 22887, 23085, 24111, 22097, 23165, 23362, 24373, 23595, 24595, 24776, 25709, 12460, 13617, 13842, 15023, 14108, 15292, 15520, 16713, 14422, 15610, 15838, 17031, 16108, 17302, 17529, 18712, 14798, 15994, 16218, 17415, 16487, 17684, 17907, 19090, 16805, 18001, 18222, 19402, 18489, 19665, 19880, 21026, 15250, 16443, 16670, 17862, 16941, 18131, 18356, 19530, 17259, 18445, 18670, 19837, 18937, 20098, 20318, 21446, 17639, 18824, 19045, 20207, 19311, 20467, 20682, 21801, 19620, 20771, 20983, 22093, 21236, 22339, 22541, 23591, 15788, 16982, 17211, 18398, 17478, 18662, 18889, 20051, 17797, 18979, 19203, 20359, 19466, 20617, 20835, 21946, 18173, 19354, 19573, 20725, 19830, 20977, 21189, 22293, 20141, 21280, 21488, 22583, 21736, 22822, 23020, 24050, 18622, 19791, 20011, 21150, 20270, 21400, 21612, 22699, 20576, 21696, 21907, 22982, 22154, 23217, 23416, 24423, 20938, 22049, 22255, 23317, 22496, 23547, 23741, 24733, 22782, 23822, 24013, 24990, 24236, 25201, 25377, 26272, 16427, 17621, 17847, 19028, 18115, 19293, 19515, 20665, 18429, 19604, 19822, 20968, 20082, 21220, 21431, 22526, 18806, 19974, 20190, 21326, 20449, 21577, 21784, 22867, 20755, 21871, 22078, 23147, 22323, 23382, 23576, 24577, 19252, 20407, 20625, 21743, 20882, 21992, 22201, 23262, 21180, 22284, 22487, 23538, 22728, 23769, 23961, 24939, 21536, 22628, 22828, 23865, 23066, 24093, 24280, 25242, 23345, 24357, 24542, 25488, 24760, 25694, 25863, 26724, 19775, 20921, 21135, 22239, 21386, 22481, 22686, 23727, 21680, 22766, 22967, 23998, 23203, 24222, 24410, 25364, 22032, 23105, 23301, 24317, 23532, 24537, 24719, 25657, 23806, 24795, 24975, 25896, 25187, 26095, 26259, 27092, 22444, 23496, 23692, 24685, 23921, 24900, 25082, 25994, 24186, 25153, 25330, 26227, 25538, 26421, 26581, 27389, 24502, 25452, 25625, 26503, 25826, 26691, 26847, 27636, 26063, 26910, 27063, 27833, 27242, 27997, 28132, 28809, 9081, 10125, 10330, 11427, 10572, 11677, 11892, 13038, 10866, 11980, 12197, 13349, 12455, 13612, 13836, 15017, 11216, 12345, 12562, 13725, 12819, 13988, 14210, 15399, 13130, 14306, 14528, 15721, 14793, 15989, 16212, 17410, 11639, 12778, 12998, 14167, 13259, 14433, 14658, 15848, 13570, 14749, 14975, 16168, 15244, 16437, 16664, 17856, 13945, 15131, 15354, 16552, 15623, 16820, 17043, 18236, 15944, 17141, 17365, 18554, 17633, 18819, 19039, 20202, 12147, 13298, 13521, 14699, 13785, 14967, 15194, 16388, 14102, 15286, 15513, 16706, 15782, 16976, 17204, 18391, 14475, 15667, 15892, 17089, 16161, 17358, 17583, 18769, 16481, 17678, 17900, 19084, 18167, 19348, 19566, 20719, 14926, 16118, 16345, 17538, 16615, 17808, 18034, 19213, 16934, 18124, 18349, 19523, 18615, 19784, 20004, 21143, 17314, 18503, 18723, 19893, 18991, 20154, 20370, 21500, 19304, 20461, 20675, 21795, 20931, 22043, 22248, 23311, 12764, 13929, 14153, 15338, 14419, 15607, 15834, 17027, 14734, 15927, 16153, 17348, 16423, 17617, 17842, 19023, 15113, 16310, 16534, 17731, 16802, 17998, 18218, 19399, 17123, 18314, 18536, 19710, 18802, 19970, 20185, 21322, 15564, 16758, 16986, 18176, 17255, 18441, 18666, 19833, 17574, 18758, 18983, 20144, 19247, 20402, 20621, 21739, 17953, 19136, 19356, 20512, 19616, 20768, 20979, 22090, 19927, 21071, 21282, 22383, 21531, 22624, 22824, 23862, 16104, 17298, 17524, 18707, 17793, 18975, 19198, 20354, 18110, 19288, 19509, 20659, 19770, 20916, 21129, 22233, 18485, 19661, 19875, 21022, 20137, 21276, 21483, 22579, 20444, 21572, 21778, 22862, 22027, 23100, 23295, 24312, 18932, 20093, 20313, 21441, 20571, 21691, 21902, 22977, 20876, 21986, 22196, 23257, 22438, 23490, 23687, 24680, 21231, 22335, 22536, 23587, 22777, 23818, 24008, 24986, 23060, 24088, 24275, 25238, 24496, 25447, 25620, 26499, 13501, 14679, 14908, 16100, 15173, 16367, 16596, 17789, 15493, 16686, 16916, 18106, 17184, 18371, 18597, 19766, 15871, 17067, 17295, 18483, 17562, 18748, 18972, 20135, 17879, 19063, 19285, 20442, 19546, 20699, 20913, 22025, 16327, 17520, 17747, 18928, 18015, 19194, 19415, 20567, 18331, 19505, 19726, 20872, 19986, 21125, 21337, 22434, 18704, 19873, 20090, 21229, 20351, 21481, 21688, 22775, 20656, 21776, 21983, 23058, 22230, 23293, 23487, 24494, 16863, 18056, 18281, 19458, 18546, 19718, 19938, 21080, 18862, 20026, 20245, 21377, 20503, 21626, 21837, 22915, 19236, 20393, 20611, 21731, 20866, 21978, 22187, 23250, 21165, 22270, 22474, 23526, 22713, 23755, 23948, 24927, 19678, 20826, 21038, 22145, 21292, 22391, 22594, 23640, 21588, 22676, 22877, 23911, 23115, 24137, 24326, 25284, 21939, 23014, 23210, 24230, 23446, 24453, 24636, 25578, 23719, 24712, 24892, 25819, 25106, 26018, 26183, 27022, 17504, 18687, 18914, 20075, 19178, 20334, 20553, 21673, 19490, 20641, 20858, 21969, 21111, 22216, 22421, 23474, 19855, 21002, 21213, 22317, 21463, 22559, 22759, 23800, 21760, 22845, 23043, 24072, 23278, 24296, 24480, 25432, 20295, 21423, 21635, 22720, 21884, 22959, 23158, 24178, 22178, 23240, 23438, 24444, 23670, 24664, 24846, 25774, 22518, 23569, 23761, 24753, 23990, 24968, 25145, 26056, 24258, 25222, 25397, 26291, 25604, 26484, 26642, 27447, 20810, 219211, 22131, 23196, 22376, 23431, 23627, 24623, 22662, 23706, 23898, 24880, 24124, 25094, 25272, 26172, 22998, 24029, 24216, 25182, 24438, 25392, 25565, 26447, 24699, 25639, 25807, 26674, 26006, 26859, 27011, 27787, 23394, 24402, 24587, 25530, 24806, 25735, 25906, 26763, 25061, 25975, 26141, 26982, 26337, 27162, 27313, 28061, 25357, 26253, 26414, 27236, 26605, 27412, 27557, 28286, 26829, 27620, 27760, 28472, 27924, 28622, 28745, 29363, 14393, 15580, 15810, 17003, 16078, 17271, 17500, 18683, 16397, 17591, 17818, 19000, 18085, 19263, 19486, 20637, 16775, 17971, 18194, 19375, 18458, 19634, 19851, 20998, 18776, 19945, 20162, 21300, 20419, 21548, 21756, 22841, 17232, 18418, 18643, 19810, 18910, 20071, 20291, 21419, 19223, 20379, 20597, 21716, 20854, 21965, 22174, 23236, 19593, 20745, 20956, 22067, 21209, 22313, 22514, 23565, 21508, 22602, 22801, 23840, 23039, 24068, 24254, 25218, 17767, 18948, 19174, 20330, 19436, 20588, 20806, 21919, 19746, 20892, 21107, 22212, 21357, 22454, 22658, 23702, 20110, 21249, 21459, 22555, 21708, 22794, 22994, 24025, 22003, 23077, 23274, 24292, 23506, 24512, 24695, 25635, 20549, 21669, 21880, 22955, 22127, 23192, 23390, 24398, 22417, 23470, 23666, 24660, 23894, 24876, 25057, 25971, 22755, 23796, 23986, 24964, 24212, 25178, 25353, 26249, 24476, 25428, 25600, 26480, 25803, 26670, 26825, 27616, 18402, 19576, 19796, 20942, 20055, 21192, 21405, 22500, 20363, 21491, 21701, 22786, 21950, 23023, 23222, 24240, 20727, 21845, 22052, 23124, 22295, 23356, 23550, 24554, 22585, 23633, 23825, 24813, 24052, 25027, 25204, 26111, 21155, 22259, 22464, 23515, 22704, 23745, 23939, 24917, 22987, 24017, 24205, 25170, 24428, 25381, 25555, 26436, 23320, 24335, 24519, 25468, 24736, 25673, 25841, 26705, 24993, 25913, 26078, 26924, 26275, 27107, 27255, 28009, 21654, 22739, 22942, 23973, 23177, 24197, 24385, 25341, 23456, 24461, 24647, 25587, 24863, 25790, 25959, 26814, 23779, 24770, 24950, 25874, 25163, 26073, 26237, 27073, 25413, 26306, 26467, 27285, 26657, 27461, 27605, 28330, 24163, 25130, 25309, 26206, 25515, 26400, 26561, 27370, 25759, 26627, 26785, 27577, 26968, 27747, 27886, 28586, 26040, 26890, 27042, 27815, 27222, 27980, 28114, 28794, 27432, 28171, 28303, 28963, 28459, 29104, 29218, 29786, 19152, 20309, 20529, 21650, 20784, 21898, 22107, 23173, 21087, 22192, 22399, 23452, 22639, 23683, 23877, 24859, 21438, 22534, 22736, 23777, 22974, 24006, 24194, 25161, 23254, 24273, 24458, 25411, 24677, 25618, 25787, 26655, 21861, 22937, 23137, 24158, 23372, 24381, 24567, 25511, 23648, 24642, 24826, 25754, 25041, 25955, 26123, 26964, 23969, 24947, 25126, 26037, 25338, 26235, 26397, 27220, 25583, 26464, 26623, 27429, 26811, 27603, 27744, 28457, 22351, 23408, 23604, 24602, 23833, 24819, 25001, 25919, 24103, 25074, 25253, 26154, 25461, 26349, 26512, 27324, 24416, 25371, 25545, 26428, 25748, 26618, 26776, 27570, 25987, 26841, 26994, 27771, 27173, 27935, 28071, 28755, 24785, 25716, 25886, 26745, 26086, 26930, 27083, 27851, 26319, 27145, 27296, 28045, 27472, 28205, 28339, 28994, 26588, 27396, 27541, 28271, 27712, 28427, 28554, 29190, 27909, 28608, 28731, 29350, 28875, 29480, 29586, 30113, 22923, 23954, 24146, 25113, 24367, 25323, 25499, 26384, 24629, 25570, 25742, 26611, 25943, 26799, 26953, 27733, 24932, 25857, 26024, 26875, 26220, 27057, 27207, 27966, 26451, 27270, 27417, 28157, 27591, 28317, 28446, 29092, 25293, 26190, 26356, 27179, 26547, 27356, 27504, 28235, 26770, 27563, 27706, 28420, 27873, 28574, 28698, 29319, 27028, 27802, 27940, 28636, 28102, 28783, 28903, 29505, 28291, 28952, 29069, 29653, 29208, 29777, 29876, 30370, 25703, 26575, 26734, 27530, 26919, 27701, 27842, 28545, 27134, 27899, 28035, 28722, 28196, 28867, 28986, 29579, 27383, 28127, 28260, 28925, 28415, 29065, 29180, 29753, 28598, 29230, 29341, 29895, 29471, 30011, 30105, 30571, 27675, 28391, 28521, 29158, 28672, 29294, 29406, 29951, 28844, 29451, 29558, 30087, 29684, 30199, 30290, 30731, 29043, 29631, 29733, 30244, 29853, 30351, 30436, 30861, 29993, 30473, 30555, 30964, 30652, 31048, 31115, 31446, 10200, 11295, 11504, 12642, 11757, 12903, 13119, 14294, 12059, 13211, 13430, 14610, 13695, 14878, 15101, 16297, 12424, 13581, 13804, 14987, 14071, 15255, 15481, 16676, 14385, 15573, 15800, 16995, 16070, 17264, 17490, 18675, 12859, 14028, 14250, 15438, 14517, 15709, 15934, 17130, 14833, 16028, 16253, 17449, 16522, 17718, 17942, 19124, 15213, 16408, 16634, 17828, 16904, 18096, 18320, 19496, 17222, 18410, 18634, 19803, 18900, 20063, 20282, 21412, 13381, 14561, 14783, 15978, 15050, 16246, 16472, 17668, 15370, 16567, 16791, 17986, 17060, 18252, 18475, 19650, 15752, 16946, 17173, 18362, 17442, 18628, 18852, 20018, 17760, 18942, 19165, 20323, 19429, 20582, 20798, 21913, 16202, 17399, 17624, 18809, 17891, 19074, 19296, 20452, 18207, 19387, 19606, 20757, 19865, 21011, 21222, 22325, 18586, 19757, 19976, 21117, 20235, 21369, 21579, 22669, 20540, 21662, 21872, 22949, 22119, 23186, 23383, 24393, 14011, 15196, 15421, 16617, 15692, 16887, 17113, 18303, 16011, 17206, 17431, 18617, 17701, 18884, 19106, 20265, 16390, 17585, 17810, 18993, 18078, 19257, 19478, 20630, 18393, 19568, 19786, 20933, 20046, 21184, 21395, 22491, 16842, 18036, 18260, 19438, 18526, 19699, 19918, 21061, 18840, 20006, 20225, 21359, 20482, 21607, 21818, 22898, 19215, 20372, 20590, 21710, 20846, 21958, 22167, 23230, 21145, 22250, 22456, 23508, 22694, 23736, 23931, 24910, 17383, 18570, 18793, 19960, 19057, 20218, 20436, 21563, 19371, 20525, 20741, 21857, 20994, 22103, 22309, 23368, 19740, 20887, 21100, 22206, 21351, 22449, 22652, 23697, 21646, 22732, 22933, 23965, 23169, 24190, 24377, 25334, 20176, 21312, 21523, 22615, 21770, 22853, 23053, 24080, 22063, 23133, 23332, 24345, 23561, 24563, 24747, 25682, 22410, 23464, 23660, 24655, 23888, 24871, 25052, 25967, 24154, 25122, 25302, 26200, 25507, 26393, 26555, 27365, 14762, 15957, 16182, 17379, 16450, 17646, 17870, 19053, 16769, 17964, 18187, 19367, 18452, 19627, 19844, 20990, 17152, 18342, 18566, 19738, 18830, 19997, 20214, 21349, 19145, 20304, 20521, 21644, 20777, 21893, 22099, 23167, 17604, 18789, 19011, 20173, 19276, 20432, 20648, 21767, 19586, 20737, 20950, 22060, 21202, 22305, 22508, 23558, 19956, 21098, 21309, 22408, 21559, 22650, 22850, 23886, 21853, 22931, 23130, 24152, 23364, 24375, 24560, 25505, 18138, 19318, 19538, 20690, 19798, 20944, 21158, 22262, 20105, 21243, 21453, 22548, 21703, 22788, 22989, 24019, 20473, 21600, 21808, 22890, 22054, 23126, 23323, 24338, 22345, 23404, 23597, 24597, 23827, 24815, 24995, 25915, 20905, 22016, 22223, 23285, 22467, 23518, 23713, 24705, 22749, 23789, 23981, 24958, 24207, 25172, 25349, 26244, 23088, 24114, 24301, 25262, 24522, 25471, 25643, 26520, 24778, 25711, 25880, 26740, 26080, 26926, 27078, 27847, 18771, 19940, 20156, 21294, 20414, 21543, 21750, 22835, 20721, 21839, 22045, 23117, 22289, 23350, 23543, 24547, 21082, 22189, 22393, 23448, 22634, 23680, 23871, 24855, 22917, 23950, 24139, 25108, 24361, 25319, 25492, 26379, 21502, 22596, 22796, 23835, 23033, 24062, 24249, 25213, 23313, 24328, 24514, 25463, 24729, 25666, 25836, 26700, 23642, 24638, 24821, 25750, 25035, 25951, 26118, 26960, 25286, 26185, 26351, 27175, 26540, 27351, 27499, 28231, 21999, 23073, 23269, 24287, 23502, 24508, 24691, 25631, 23774, 24765, 24944, 25868, 25158, 26068, 26232, 27068, 24099, 25072, 25248, 26151, 25457, 26347, 26508, 27322, 25698, 26572, 26728, 27526, 26914, 27698, 27837, 28542, 24471, 25423, 25596, 26476, 25799, 26666, 26822, 27613, 26034, 26884, 27038, 27811, 27217, 27975, 28111, 28791, 26314, 27142, 27292, 28042, 27468, 28203, 28336, 28992, 27669, 28387, 28517, 29155, 28667, 29291, 29403, 29949, 15665, 16861, 17087, 18279, 17356, 18544, 18767, 19936, 17676, 18860, 19082, 20243, 19346, 20501, 20717, 21835, 18054, 19234, 19456, 20609, 19716, 20864, 21078, 22185, 20024, 21163, 21375, 22472, 21624, 22711, 22913, 23946, 18501, 19676, 19891, 21036, 20152, 21290, 21498, 22592, 20459, 21586, 21793, 22875, 22041, 23113, 23309, 24324, 20824, 21937, 22143, 23208, 22389, 23444, 23638, 24634, 22674, 23717, 23909, 24890, 24135, 25104, 25282, 26181, 19031, 20193, 20411, 21540, 20668, 21787, 21996, 23070, 20970, 22080, 22286, 23347, 22528, 23578, 23771, 24762, 21328, 22427, 22631, 23677, 22869, 23905, 24096, 25069, 23148, 24170, 24358, 25316, 24578, 25523, 25695, 26569, 21747, 22832, 23030, 24059, 23266, 24284, 24468, 25420, 23540, 24544, 24726, 25663, 24941, 25865, 26031, 26881, 23868, 24852, 25032, 25948, 25245, 26148, 26311, 27139, 25489, 26376, 26537, 27348, 26725, 27523, 27666, 28384, 19659, 20808, 21020, 22129, 21274, 22374, 22577, 23625, 21570, 22660, 22860, 23896, 23098, 24122, 24310, 25270, 21921, 22996, 23194, 24214, 23429, 24436, 24621, 25563, 23704, 24697, 24878, 25805, 25092, 26004, 26170, 27009, 22333, 23392, 23585, 24585, 23816, 24804, 24984, 25904, 24086, 25059, 25236, 26139, 25445, 26335, 26497, 27311, 24400, 25355, 25528, 26412, 25733, 26603, 26761, 27555, 25973, 26827, 26980, 27758, 27160, 27922, 28059, 28743, 22817, 23854, 24045, 25020, 24269, 25231, 25407, 26300, 24531, 25478, 25651, 26527, 25852, 26714, 26870, 27657, 24838, 25767, 25936, 26793, 26134, 26976, 27128, 27894, 26365, 27189, 27338, 28085, 27512, 28244, 28375, 29029, 25196, 26103, 26267, 27099, 26460, 27278, 27425, 28164, 26685, 27486, 27631, 28352, 27797, 28505, 28632, 29259, 26945, 27726, 27865, 28567, 28028, 28716, 28837, 29445, 28218, 28887, 29006, 29597, 29143, 29720, 29821, 30322, 20391, 21520, 21729, 22814, 21976, 23050, 23248, 24266, 22268, 23329, 23524, 24528, 23753, 24744, 24925, 25849, 22612, 23658, 23851, 24836, 24077, 25050, 25228, 26132, 24342, 25300, 25475, 26363, 25679, 26553, 26711, 27510, 23012, 24042, 24228, 25193, 24451, 25404, 25576, 26457, 24710, 25648, 25817, 26682, 26016, 26867, 27020, 27794, 25017, 25934, 26100, 26943, 26297, 27126, 27275, 28026, 26524, 27336, 27483, 28216, 27654, 28373, 28502, 29141, 23481, 24487, 24672, 25612, 24887, 25813, 25983, 26836, 25138, 26048, 26214, 27050, 26408, 27229, 27378, 28121, 25437, 26328, 26490, 27305, 26678, 27480, 27625, 28347, 26896, 27681, 27821, 28527, 27985, 28677, 28799, 29411, 25781, 26649, 26805, 27597, 26989, 27766, 27904, 28603, 27200, 27959, 28095, 28776, 28254, 28919, 29037, 29625, 27453, 28189, 28322, 28979, 28477, 29119, 29234, 29799, 28653, 29278, 29390, 29937, 29519, 30052, 30147, 30606, 24027, 25003, 25180, 26088, 25390, 26284, 26445, 27264, 25637, 26514, 26672, 27474, 26857, 27645, 27785, 28494, 25921, 26778, 26932, 27714, 27114, 27880, 28016, 28705, 27326, 28073, 28207, 28877, 28364, 29018, 29133, 29711, 26251, 27085, 27234, 27990, 27410, 28151, 28284, 28946, 27618, 28341, 28470, 29113, 28620, 29249, 29361, 29912, 27853, 28556, 28681, 29303, 28826, 29435, 29543, 30073, 28996, 29588, 29692, 30206, 29812, 30314, 30401, 30829, 26636, 27441, 27586, 28312, 27755, 28467, 28594, 29226, 27950, 28645, 28768, 29383, 28912, 29513, 29619, 30142, 28178, 28851, 28970, 29565, 29110, 29690, 29792, 30296, 29270, 29832, 29930, 30418, 30046, 30519, 30601, 31004, 28440, 29087, 29202, 29772, 29336, 29891, 29988, 30469, 29491, 30028, 30123, 30586, 30233, 30682, 30761, 31141, 29669, 30186, 30278, 30720, 30383, 30813, 30889, 31250, 30502, 30918, 30990, 31338, 31072, 31409, 31467, 31743, 16740, 17935, 18158, 19338, 18425, 19600, 19817, 20963, 18741, 19910, 20127, 21265, 20387, 21516, 21724, 22809, 19117, 20276, 20493, 21618, 20751, 21867, 22073, 23143, 21053, 22160, 22365, 23422, 22608, 23654, 23846, 24832, 19557, 20709, 20923, 22034, 21175, 22279, 22483, 23534, 21473, 22568, 22768, 23808, 23007, 24037, 24224, 25189, 21827, 22907, 23106, 24130, 23340, 24353, 24538, 25485, 23616, 24614, 24796, 25727, 25012, 25930, 26096, 26940, 20077, 21215, 21425, 22520, 21675, 22761, 22961, 23992, 21972, 23046, 23243, 24261, 23477, 24483, 24667, 25607, 22318, 23377, 23570, 24572, 23801, 24790, 24969, 25891, 24073, 25046, 25223, 26128, 25433, 26324, 26485, 27301, 22722, 23763, 23956, 24934, 24180, 25147, 25325, 26222, 24446, 25399, 25572, 26453, 25776, 26644, 26801, 27593, 24754, 25689, 25858, 26720, 26057, 26905, 27058, 27829, 26292, 27122, 27271, 28023, 27448, 28185, 28318, 28976, 20693, 21811, 22019, 23091, 22265, 23326, 23521, 24525, 22551, 23600, 23792, 24781, 24022, 24998, 25175, 26083, 22891, 23925, 24115, 25086, 24339, 25297, 25472, 26360, 24598, 25541, 25712, 26584, 25916, 26773, 26927, 27709, 23287, 24303, 24489, 25439, 24707, 25645, 25815, 26680, 24960, 25882, 26050, 26898, 26246, 27080, 27231, 27987, 25263, 26164, 26329, 27155, 26521, 27333, 27481, 28214, 26741, 27537, 27682, 28398, 27848, 28551, 28678, 29300, 23750, 24741, 24922, 25846, 25135, 26045, 26211, 27047, 25386, 26280, 26441, 27260, 26632, 27437, 27582, 28308, 25676, 26550, 26708, 27507, 26893, 27678, 27818, 28524, 27110, 27876, 28012, 28701, 28174, 28847, 28966, 29561, 26013, 26864, 27018, 27792, 27197, 27956, 28093, 28774, 27406, 28147, 28281, 28943, 28436, 29083, 29199, 29769, 27651, 28370, 28500, 29139, 28650, 29275, 29388, 29935, 28822, 29431, 29540, 30070, 29665, 30182, 30275, 30717, 21407, 22502, 22706, 23747, 22944, 23975, 24165, 25132, 23224, 24242, 24430, 25383, 24649, 25589, 25761, 26629, 23552, 24556, 24738, 25675, 24952, 25876, 26042, 26892, 25206, 26113, 26277, 27109, 26469, 27287, 27434, 28173, 23941, 24919, 25100, 26011, 25311, 26208, 26372, 27195, 25557, 26438, 26598, 27404, 26787, 27579, 27721, 28434, 25843, 26707, 26862, 27650, 27044, 27817, 27954, 28649, 27257, 28011, 28145, 28821, 28305, 28965, 29081, 29664, 24387, 25343, 25517, 26402, 25721, 26592, 26750, 27545, 25961, 26816, 26970, 27749, 27150, 27913, 28050, 28735, 26239, 27075, 27224, 27982, 27399, 28142, 28274, 28938, 27607, 28332, 28461, 29106, 28611, 29242, 29353, 29906, 26563, 27372, 27518, 28249, 27689, 28404, 28534, 29170, 27888, 28588, 28711, 29331, 28857, 29462, 29570, 30097, 28116, 28796, 28915, 29516, 29054, 29641, 29743, 30253, 29220, 29788, 29886, 30379, 30002, 30481, 30563, 30971, 24905, 25831, 25999, 26852, 26195, 27033, 27184, 27945, 26425, 27246, 27393, 28136, 27567, 28295, 28424, 29073, 26695, 27496, 27640, 28361, 27806, 28514, 28640, 29267, 28000, 28691, 28812, 29423, 28955, 29552, 29656, 30175, 27004, 27780, 27918, 28616, 28080, 28763, 28883, 29487, 28268, 28932, 29050, 29637, 29187, 29759, 29859, 30356, 28489, 29130, 29245, 29809, 29378, 29927, 30024, 30499, 29530, 30062, 30157, 30615, 30266, 30710, 30789, 31164, 27360, 28106, 28239, 28907, 28394, 29046, 29161, 29736, 28578, 29212, 29323, 29880, 29454, 29996, 30090, 30558, 28786, 29400, 29508, 30043, 29633, 30155, 30246, 30693, 29780, 30286, 30373, 30805, 30475, 30895, 30966, 31318, 29024, 29614, 29716, 30229, 29836, 30335, 30422, 30848, 29976, 30459, 30541, 30953, 30638, 31036, 31104, 31437, 30137, 30598, 30678, 31069, 30771, 31149, 31215, 31529, 30880, 31243, 31306, 31606, 31378, 31668, 31718, 31952, 22241, 23303, 23499, 24505, 23729, 24721, 24903, 25829, 24000, 24977, 25155, 26065, 25366, 26261, 26423, 27244, 24318, 25278, 25454, 26344, 25658, 26534, 26693, 27494, 25897, 26756, 26911, 27695, 27093, 27861, 27998, 28689, 24688, 25628, 25796, 26663, 25997, 26850, 27002, 27778, 26229, 27065, 27214, 27972, 27391, 28134, 28266, 28930, 26505, 27319, 27465, 28200, 27638, 28359, 28487, 29128, 27834, 28539, 28664, 29288, 28810, 29421, 29528, 30060, 25115, 26026, 26193, 27031, 26386, 27209, 27358, 28104, 26613, 27419, 27565, 28293, 27735, 28448, 28576, 29210, 26876, 27663, 27804, 28512, 27967, 28661, 28784, 29398, 28158, 28833, 28953, 29550, 29093, 29675, 29778, 30284, 27182, 27943, 28078, 28761, 28237, 28905, 29022, 29612, 28422, 29071, 29185, 29757, 29321, 29878, 29974, 30457, 28638, 29265, 29376, 29925, 29506, 30041, 30135, 30596, 29654, 30173, 30264, 30708, 30371, 30803, 30878, 31241, 25614, 26492, 26651, 27455, 26838, 27627, 27768, 28479, 27052, 27823, 27961, 28655, 28123, 28801, 28921, 29521, 27306, 28055, 28190, 28862, 28348, 29003, 29120, 29699, 28528, 29165, 29279, 29840, 29412, 29957, 30053, 30525, 27599, 28324, 28453, 29098, 28605, 29236, 29347, 29900, 28778, 29392, 29501, 30036, 29627, 30149, 30241, 30688, 28980, 29574, 29678, 30194, 29800, 30303, 30390, 30819, 29938, 30425, 30509, 30924, 30607, 31009, 31077, 31413, 27932, 28628, 28752, 29369, 28896, 29498, 29605, 30130, 29061, 29646, 29749, 30258, 29869, 30364, 30450, 30873, 29255, 29818, 29918, 30407, 30033, 30507, 30591, 30995, 30165, 30622, 30702, 31090, 30796, 31170, 31236, 31547, 29477, 30016, 30110, 30575, 30221, 30672, 30750, 31132, 30347, 30782, 30858, 31224, 30945, 31300, 31361, 31654, 30491, 30908, 30980, 31329, 31063, 31401, 31459, 31736, 31157, 31481, 31536, 31801, 31600, 31854, 31898, 32101, 26178, 27016, 27169, 27930, 27345, 28091, 28226, 28834, 27551, 28279, 28410, 29059, 28563, 29197, 29310, 29867, 27790, 28499, 28626, 29254, 28772, 29387, 29496, 30032, 28941, 29539, 29644, 30164, 29767, 30274, 30362, 30795, 28067, 28750, 28871, 29475, 29013, 29603, 29706, 30219, 29175, 29747, 29848, 30345, 29965, 30448, 30531, 30943, 29367, 29917, 30014, 30490, 30128, 30590, 30670, 31062, 30256, 30701, 30780, 31156, 30871, 31235, 31298, 31599, 28381, 29034, 29150, 29726, 29285, 29845, 29944, 30430, 29441, 29984, 30079, 30548, 30191, 30645, 30725, 31110, 29622, 30145, 30237, 30685, 30342, 30778, 30854, 31221, 30465, 30886, 30958, 31311, 31041, 31383, 31441, 31722, 29827, 30327, 30413, 30840, 30514, 30928, 30999, 31346, 30629, 31028, 31095, 31429, 31176, 31497, 31551, 31814, 30765, 31144, 31209, 31524, 31285, 31589, 31641, 31888, 31372, 31663, 31712, 31947, 31769, 31995, 32033, 32211, 28740, 29358, 29467, 30007, 29594, 30120, 30212, 30664, 29740, 30250, 30339, 30775, 30442, 30866, 30938, 31294, 29909, 30399, 30484, 30902, 30583, 30988, 31057, 31396, 30695, 31084, 31151, 31476, 31230, 31542, 31595, 31850, 30101, 30567, 30648, 31044, 30742, 31125, 31190, 31509, 30851, 31218, 31282, 31586, 31355, 31649, 31698, 31936, 30974, 31324, 31385, 31673, 31454, 31732, 31779, 32002, 31531, 31797, 31842, 32055, 31894, 32098, 32132, 32291, 30319, 30758, 30834, 31204, 30922, 31280, 31342, 31638, 31023, 31368, 31425, 31709, 31493, 31766, 31811, 32031, 31138, 31465, 31520, 31788, 31584, 31841, 31885, 32091, 31659, 31903, 31944, 32139, 31992, 32178, 32209, 32354, 31267, 31574, 31626, 31876, 31687, 31927, 31967, 32158, 31756, 31985, 32022, 32203, 32066, 32239, 32267, 32400, 31833, 32048, 32084, 32252, 32125, 32286, 32313, 32435, 32172, 32324, 32349, 32464, 32377, 32487, 32505, 32585, 11600, 12739, 12960, 14129, 13219, 14394, 14620, 15811, 13529, 14709, 14935, 16129, 15203, 16398, 16625, 17819, 13903, 15087, 15314, 16510, 15581, 16776, 17004, 18195, 15902, 17098, 17325, 18513, 17592, 18777, 19001, 20163, 14352, 15540, 15767, 16962, 16038, 17233, 17458, 18644, 16354, 17549, 17775, 18958, 18044, 19224, 19445, 20598, 16734, 17929, 18152, 19332, 18419, 19594, 19811, 20957, 18734, 19903, 20120, 21258, 20380, 21509, 21717, 22802, 14886, 16079, 16307, 17501, 16574, 17768, 17995, 19175, 16894, 18086, 18311, 19487, 18576, 19747, 19967, 21108, 17272, 18459, 18684, 19852, 18949, 20111, 20331, 21460, 19264, 20420, 20638, 21757, 20893, 22004, 22213, 23275, 17728, 18911, 19133, 20292, 19396, 20550, 20765, 21881, 19707, 20855, 21068, 22175, 21319, 22418, 22621, 23667, 20072, 21210, 21420, 22515, 21670, 22756, 22956, 23987, 21966, 23040, 23237, 24255, 23471, 24477, 24661, 25601, 15523, 16718, 16945, 18137, 17215, 18403, 18627, 19797, 17532, 18717, 18941, 20104, 19207, 20364, 20581, 21702, 17912, 19094, 19317, 20472, 19577, 20728, 20943, 22053, 19885, 21030, 21242, 22344, 21492, 22586, 22787, 23826, 18360, 19536, 19755, 20903, 20016, 21156, 21367, 20465, 20322, 21452, 21661, 22748, 21912, 22988, 23185, 24206, 20688, 21806, 22014, 23086, 22260, 23321, 23516, 24520, 22547, 23596, 23788, 24777, 24018, 24994, 25171, 26079, 18893, 20056, 20275, 21406, 20533, 21655, 21866, 22943, 20839, 21951, 22159, 23223, 22403, 23457, 23653, 24648, 21193, 22296, 22501, 23551, 22740, 23780, 23974, 24951, 23024, 24053, 24241, 25205, 24462, 25414, 25588, 26468, 21617, 22705, 22906, 23940, 23142, 24164, 24352, 25310, 23421, 24429, 24613, 25556, 24831, 25760, 25929, 26786, 23746, 24737, 24918, 25842, 25131, 26041, 26207, 27043, 25382, 26276, 26437, 27256, 26628, 27433, 27578, 28304, 16284, 17479, 17707, 18890, 17972, 19153, 19376, 20530, 18290, 19467, 19688, 20836, 19946, 21088, 21301, 22400, 18663, 19831, 20052, 21190, 20310, 21439, 21651, 22737, 20618, 21737, 21947, 23021, 22193, 23255, 23453, 24459, 19112, 20271, 20488, 21613, 20746, 21862, 22068, 23138, 21048, 22155, 22360, 23417, 22603, 23649, 23841, 24827, 21401, 22497, 22700, 23742, 22938, 23970, 24159, 25127, 23218, 24237, 24424, 25378, 24643, 25584, 25755, 26624, 19635, 20785, 20999, 22108, 21250, 22352, 22556, 23605, 21549, 22640, 22842, 23878, 23078, 24104, 24293, 25254, 21899, 22975, 23174, 24195, 23409, 24417, 24603, 25546, 23684, 24678, 24860, 25788, 25075, 25988, 26155, 26995, 22314, 23373, 23566, 24568, 23797, 24786, 24965, 25887, 24069, 25042, 25219, 26124, 25429, 26320, 26481, 27297, 24382, 25339, 25512, 26398, 25717, 26589, 26746, 27542, 25956, 26812, 26965, 27745, 27146, 27910, 28046, 28732, 20255, 21387, 21599, 22687, 21846, 22924, 23125, 24147, 22139, 23204, 23403, 24411, 23634, 24630, 24814, 25743, 22482, 23533, 23728, 24720, 23955, 24933, 25114, 26025, 24223, 25188, 25365, 26260, 25571, 26452, 26612, 27418, 22888, 23922, 24112, 25083, 24336, 25294, 25469, 26357, 24596, 25539, 25710, 26582, 25914, 26771, 26925, 27707, 24901, 25827, 25995, 26848, 26191, 27029, 27180, 27941, 26422, 27243, 27390, 28133, 27564, 28292, 28421, 29070, 23357, 24368, 24555, 25500, 24771, 25704, 25875, 26735, 25028, 25944, 26112, 26954, 26307, 27135, 27286, 28036, 25324, 26221, 26385, 27208, 26576, 27384, 27531, 28261, 26800, 27592, 27734, 28447, 27900, 28599, 28723, 29342, 25674, 26548, 26706, 27505, 26891, 27676, 27816, 28522, 27108, 27874, 28010, 28699, 28172, 28845, 28964, 29559, 27357, 28103, 28236, 28904, 28392, 29044, 29159, 29734, 28575, 29209, 29320, 29877, 29452, 29994, 30088, 30556, 17189, 18377, 18602, 19772, 18868, 20032, 20251, 21383, 19181, 20338, 20556, 21677, 20814, 21927, 22135, 23200, 19551, 20703, 20918, 22029, 21169, 22273, 22478, 23529, 21467, 22562, 22763, 23803, 23001, 24031, 24219, 25184, 19991, 21131, 21342, 22440, 21594, 22682, 22883, 23917, 21887, 22963, 23161, 24182, 23398, 24406, 24591, 25534, 22235, 23297, 23492, 24498, 23723, 24715, 24896, 25822, 23994, 24971, 25149, 26059, 25360, 26255, 26417, 27238, 20509, 21632, 21843, 22921, 22087, 23155, 23354, 24365, 22380, 23435, 23631, 24627, 23859, 24843, 25025, 25941, 22717, 23758, 23952, 24930, 24175, 25142, 25321, 26218, 24441, 25394, 25568, 26449, 25771, 26639, 26797, 27589, 23121, 24143, 24332, 25290, 24551, 25496, 25670, 26544, 24810, 25739, 25910, 26767, 26108, 26950, 27104, 27870, 25110, 26021, 26187, 27025, 26381, 27204, 27353, 28099, 26608, 27414, 27560, 28288, 27730, 28443, 28571, 29205, 21115, 22221, 22425, 23479, 22667, 23711, 23903, 24885, 22948, 23980, 24169, 25137, 24392, 25348, 25522, 26407, 23283, 24299, 24485, 25435, 24703, 25641, 25811, 26676, 24957, 25879, 26047, 26895, 26243, 27077, 27228, 27984, 23674, 24669, 24849, 25778, 25066, 25980, 26145, 26986, 25315, 26213, 26375, 27199, 26568, 27377, 27522, 28253, 25609, 26487, 26646, 27450, 26833, 27622, 27763, 28474, 27049, 27820, 27958, 28652, 28120, 28798, 28918, 29518, 24129, 25099, 25277, 26177, 25484, 26371, 26533, 27344, 25726, 26597, 26755, 27550, 26939, 27720, 27860, 28562, 26010, 26861, 27015, 27789, 27194, 27953, 28090, 28771, 27403, 28144, 28278, 28940, 28433, 29080, 29196, 29766, 26342, 27167, 27317, 28065, 27492, 28224, 28357, 29011, 27694, 28409, 28538, 29174, 28688, 29309, 29420, 29964, 27928, 28624, 28748, 29365, 28892, 29494, 29601, 30126, 29058, 29643, 29746, 30255, 29866, 30361, 30447, 30870, 21822, 22902, 23102, 24126, 23335, 24348, 24534, 25481, 23611, 24609, 24792, 25723, 25007, 25925, 26092, 26936, 23935, 24914, 25096, 26008, 25305, 26203, 26368, 27192, 25551, 26433, 26594, 27401, 26781, 27574, 27717, 28431, 24314, 25274, 25449, 26339, 25654, 26530, 26688, 27489, 25893, 26752, 26907, 27691, 27089, 27857, 27994, 28685, 26174, 27013, 27164, 27926, 27341, 28088, 28221, 28890, 27547, 28276, 28406, 29056, 28559, 29194, 29306, 29864, 24750, 25685, 25855, 26717, 26053, 26901, 27055, 27826, 26288, 27118, 27268, 28020, 27444, 28181, 28315, 28973, 26558, 27368, 27515, 28247, 27685, 28401, 28531, 29168, 27883, 28584, 28708, 29329, 28853, 29459, 29567, 30095, 26873, 27660, 27800, 28508, 27964, 28658, 28781, 29395, 28155, 28830, 28950, 29547, 29090, 29672, 29775, 30281, 28378, 29032, 29146, 29723, 29282, 29843, 29941, 30428, 29438, 29982, 30076, 30546, 30188, 30643, 30722, 31108, 25260, 26161, 26326, 27152, 26518, 27330, 27478, 28211, 26739, 27535, 27680, 28396, 27846, 28549, 28676, 29298, 27000, 27776, 27915, 28613, 28076, 28759, 28880, 29484, 28265, 28929, 29048, 29635, 29184, 29756, 29857, 30354, 27303, 28052, 28187, 28859, 28345, 29000, 29117, 29696, 28526, 29163, 29277, 29838, 29410, 29955, 30051, 30523, 28737, 29355, 29464, 30004, 29591, 30117, 30209, 30661, 29738, 30248, 30337, 30773, 30440, 30864, 30936, 31292, 27649, 28368, 28498, 29137, 28648, 29273, 29386, 29933, 28820, 29429, 29538, 30068, 29663, 30180, 30273, 30715, 29021, 29611, 29714, 30227, 29834, 30333, 30420, 30846, 29973, 30456, 30539, 30951, 30636, 31034, 31102, 31435, 29253, 29816, 29916, 30405, 30031, 30505, 30589, 30993, 30163, 30620, 30700, 31088, 30794, 31168, 31234, 31545, 30317, 30756, 30832, 31202, 30920, 31278, 31340, 31636, 31021, 31366, 31423, 31707, 31491, 31764, 31809, 32029, 18259, 19437, 19658, 20807, 19917, 21060, 21273, 22373, 20224, 21358, 21569, 22659, 21817, 22897, 23097, 24121, 20589, 21709, 21920, 22995, 22166, 23229, 23428, 24435, 22455, 23507, 23703, 24696, 23930, 24909, 25091, 26003, 21019, 22128, 22332, 23391, 22576, 23624, 23815, 24803, 22859, 23895, 24085, 25058, 24309, 25269, 25444, 26334, 23193, 24213, 24399, 25354, 24620, 25562, 25732, 26602, 24877, 25804, 25972, 26826, 26169, 27008, 27159, 27921, 21522, 22614, 22816, 23853, 23052, 24079, 24268, 25230, 23331, 24344, 24530, 25477, 24746, 25681, 25851, 26713, 23659, 24654, 24837, 25766, 25051, 25966, 26133, 26975, 25301, 26199, 26364, 27188, 26554, 27364, 27511, 28243, 24044, 25019, 25195, 26102, 25406, 26299, 26459, 27277, 25650, 26526, 26684, 27485, 26869, 27656, 27796, 28504, 25935, 26792, 26944, 27725, 27127, 27893, 28027, 28715, 27337, 28084, 28217, 28886, 28374, 29028, 29142, 29719, 22111, 23178, 23376, 24386, 23608, 24606, 24789, 25720, 23881, 24864, 25045, 25960, 25257, 26158, 26323, 27149, 24198, 25164, 25342, 26238, 25548, 26430, 26591, 27398, 25791, 26658, 26815, 27606, 26997, 27773, 27912, 28610, 24571, 25516, 25688, 26562, 25890, 26749, 26904, 27688, 26127, 26969, 27121, 27887, 27300, 28049, 28184, 28856, 26401, 27223, 27371, 28115, 27544, 28273, 28403, 29053, 27748, 28460, 28587, 29219, 28734, 29352, 29461, 30001, 25005, 25923, 26090, 26934, 26286, 27116, 27266, 28018, 26516, 27328, 27476, 28209, 27647, 28366, 28496, 29135, 26779, 27572, 27715, 28429, 27881, 28582, 28706, 29327, 28074, 28757, 28878, 29482, 29019, 29609, 29712, 30225, 27087, 27855, 27992, 28683, 28153, 28828, 28948, 29545, 28343, 28998, 29115, 29694, 29251, 29814, 29914, 30403, 28557, 29192, 29304, 29862, 29436, 29980, 30074, 30544, 29589, 30115, 30207, 30659, 30315, 30754, 30830, 31200, 22795, 23834, 24026, 25002, 24248, 25212, 25389, 26283, 24513, 25462, 25636, 26513, 25835, 26699, 26856, 27644, 24820, 25749, 25920, 26777, 26117, 26959, 27113, 27879, 26350, 27174, 27325, 28072, 27498, 28230, 28363, 29017, 25179, 26087, 26250, 27084, 26444, 27263, 27409, 28150, 26671, 27473, 27617, 28340, 27784, 28493, 28619, 29248, 26931, 27713, 27852, 28555, 28015, 28704, 28825, 29434, 28206, 28876, 28995, 29587, 29132, 29710, 29811, 30313, 25595, 26475, 26635, 27440, 26821, 27612, 27754, 28466, 27037, 27810, 27949, 28644, 28110, 28790, 28911, 29512, 27291, 28041, 28177, 28850, 28335, 28991, 29109, 29689, 28516, 29154, 29269, 29831, 29402, 29948, 30045, 30518, 27585, 28311, 28439, 29086, 28593, 29225, 29335, 29890, 28767, 29382, 29490, 30027, 29618, 30141, 30232, 30681, 28969, 29564, 29668, 30185, 29791, 30295, 30382, 30812, 29929, 30417, 30501, 30917, 30600, 31003, 31071, 31408, 26074, 26920, 27074, 27843, 27251, 28005, 28141, 28817, 27462, 28197, 28331, 28987, 28484, 29125, 29241, 29805, 27702, 28416, 28546, 29181, 28694, 29315, 29426, 29970, 28868, 29472, 29580, 30106, 29703, 30216, 30307, 30746, 27981, 28673, 28795, 29407, 28937, 29535, 29640, 30160, 29105, 29685, 29787, 30291, 29905, 30395, 30480, 30898, 29295, 29854, 29952, 30437, 30065, 30536, 30617, 31018, 30200, 30653, 30732, 31116, 30823, 31194, 31258, 31566, 28300, 28960, 29078, 29661, 29216, 29784, 29884, 30377, 29374, 29923, 30021, 30496, 30134, 30595, 30676, 31067, 29555, 30084, 30178, 30634, 30288, 30729, 30807, 31180, 30411, 30838, 30912, 31271, 30998, 31345, 31404, 31690, 29764, 30271, 30359, 30792, 30463, 30884, 30956, 31309, 30580, 30985, 31054, 31393, 31136, 31463, 31518, 31786, 30713, 31100, 31166, 31489, 31245, 31555, 31608, 31861, 31333, 31630, 31680, 31921, 31739, 31970, 32008, 32191, 23584, 24584, 24768, 25701, 24983, 25903, 26071, 26917, 25235, 26138, 26304, 27132, 26496, 27310, 27459, 28194, 25527, 26411, 26573, 27381, 26760, 27554, 27699, 28413, 26979, 27757, 27897, 28596, 28058, 28742, 28865, 29469, 25871, 26731, 26887, 27672, 27071, 27840, 27978, 28670, 27282, 28032, 28168, 28841, 28328, 28984, 29102, 29682, 27527, 28257, 28388, 29040, 28543, 29178, 29292, 29851, 28719, 29338, 29448, 29990, 29577, 30103, 30197, 30650, 26266, 27098, 27249, 28003, 27424, 28163, 28298, 28958, 27630, 28351, 28482, 29123, 28631, 29258, 29372, 29921, 27864, 28566, 28692, 29313, 28836, 29444, 29553, 30082, 29005, 29596, 29701, 30214, 29820, 30321, 30409, 30836, 28139, 28815, 28935, 29533, 29076, 29659, 29762, 30269, 29239, 29803, 29903, 30393, 30019, 30494, 30578, 30983, 29424, 29968, 30063, 30534, 30176, 30632, 30711, 31098, 30305, 30744, 30821, 31192, 30910, 31269, 31331, 31628, 26719, 27517, 27662, 28380, 27828, 28533, 28660, 29284, 28022, 28710, 28832, 29440, 28975, 29569, 29674, 30190, 28248, 28914, 29033, 29621, 29169, 29742, 29844, 30341, 29330, 29885, 29983, 30464, 30096, 30562, 30644, 31040, 28510, 29148, 29263, 29825, 29397, 29943, 30040, 30513, 29549, 30078, 30172, 30628, 30283, 30724, 30802, 31175, 29724, 30235, 30325, 30763, 30429, 30853, 30927, 31284, 30547, 30957, 31027, 31371, 31109, 31440, 31496, 31768, 28805, 29416, 29525, 30057, 29650, 30169, 30262, 30706, 29796, 30299, 30387, 30816, 30488, 30905, 30978, 31327, 29960, 30444, 30528, 30940, 30625, 31025, 31093, 31427, 30738, 31121, 31187, 31506, 31264, 31571, 31624, 31874, 30153, 30611, 30691, 31080, 30786, 31161, 31227, 31539, 30893, 31253, 31316, 31614, 31389, 31676, 31726, 31958, 31012, 31357, 31415, 31700, 31484, 31758, 31803, 32024, 31561, 31822, 31865, 32075, 31917, 32117, 32150, 32307, 27233, 27989, 28125, 28803, 28283, 28945, 29063, 29648, 28469, 29112, 29228, 29794, 29360, 29911, 30009, 30486, 28680, 29302, 29414, 29959, 29542, 30072, 30167, 30624, 29691, 30205, 30297, 30737, 30400, 30828, 30903, 31263, 28923, 29523, 29629, 30151, 29751, 30260, 30349, 30784, 29893, 30385, 30471, 30891, 30569, 30976, 31046, 31387, 30055, 30527, 30609, 31011, 30704, 31092, 31159, 31483, 30814, 31186, 31251, 31560, 31325, 31623, 31674, 31916, 29201, 29771, 29871, 30366, 29987, 30468, 30551, 30961, 30122, 30585, 30666, 31059, 30760, 31140, 31206, 31522, 30277, 30719, 30798, 31172, 30888, 31249, 31313, 31612, 30989, 31337, 31397, 31684, 31466, 31742, 31789, 32011, 30452, 30875, 30947, 31302, 31031, 31375, 31432, 31715, 31127, 31456, 31511, 31781, 31576, 31835, 31878, 32086, 31238, 31549, 31602, 31856, 31665, 31908, 31949, 32143, 31733, 31965, 32003, 32187, 32049, 32224, 32253, 32388, 29515, 30048, 30144, 30603, 30252, 30697, 30777, 31153, 30378, 30808, 30885, 31246, 30970, 31320, 31382, 31670, 30520, 30933, 31005, 31351, 31085, 31420, 31477, 31752, 31181, 31501, 31556, 31818, 31618, 31869, 31912, 32113, 30684, 31074, 31143, 31469, 31220, 31533, 31588, 31844, 31310, 31609, 31662, 31905, 31721, 31954, 31994, 32179, 31410, 31695, 31744, 31974, 31798, 32019, 32056, 32230, 31862, 32072, 32107, 32272, 32147, 32304, 32329, 32449, 30868, 31232, 31296, 31597, 31370, 31661, 31711, 31946, 31451, 31729, 31777, 32000, 31831, 32046, 32083, 32251, 31543, 31807, 31851, 32063, 31904, 32106, 32140, 32298, 31961, 32153, 32184, 32334, 32221, 32363, 32386, 32494, 31651, 31896, 31938, 32134, 31987, 32174, 32205, 32351, 32040, 32216, 32246, 32382, 32281, 32410, 32432, 32529, 32099, 32265, 32292, 32419, 32325, 32445, 32465, 32554, 32359, 32473, 32490, 32574, 32512, 32591, 32603, 32659, 19517, 20669, 20885, 21997, 21137, 22242, 22447, 23500, 21433, 22529, 22730, 23772, 22969, 24001, 24188, 25156, 21788, 22870, 23071, 24097, 23304, 24319, 24506, 25455, 23579, 24579, 24763, 25696, 24978, 25898, 26066, 26912, 22204, 23267, 23462, 24469, 23695, 24689, 24869, 25797, 23963, 24942, 25120, 26032, 25332, 26230, 26391, 27215, 24285, 25246, 25421, 26312, 25629, 26506, 26664, 27466, 25866, 26726, 26882, 27667, 27066, 27835, 27973, 28665, 22688, 23730, 23924, 24904, 24148, 25116, 25296, 26194, 24412, 25367, 25540, 26424, 25744, 26614, 26772, 27566, 24722, 25659, 25830, 26694, 26027, 26877, 27032, 27805, 26262, 27094, 27245, 27999, 27420, 28159, 28294, 28954, 25085, 25998, 26163, 27003, 26359, 27183, 27332, 28079, 26583, 27392, 27536, 28267, 27708, 28423, 28550, 29186, 26851, 27639, 27779, 28488, 27944, 28639, 28762, 29377, 28135, 28811, 28931, 29529, 29072, 29655, 29758, 30265, 23251, 24270, 24454, 25408, 24674, 25615, 25783, 26652, 24928, 25853, 26019, 26871, 26216, 27053, 27202, 27962, 25232, 26135, 26301, 27129, 26493, 27307, 27456, 28191, 26715, 27513, 27558, 28376, 27824, 28529, 28656, 29280, 25579, 26461, 26619, 27426, 26807, 27600, 27740, 28454, 27023, 27798, 27936, 28633, 28097, 28779, 28899, 29502, 27279, 28029, 28165, 28838, 28325, 28981, 29099, 29679, 28506, 29144, 29260, 29822, 29393, 29939, 30037, 30510, 25985, 26839, 26991, 27769, 27171, 27933, 28069, 28753, 27380, 28124, 28256, 28922, 28412, 29062, 29177, 29750, 27628, 28349, 28480, 29121, 28629, 29256, 29370, 29919, 28802, 29413, 29522, 30054, 29647, 30166, 30259, 30703, 27906, 28606, 28728, 29348, 28873, 29478, 29584, 30111, 29039, 29628, 29730, 30242, 29850, 30348, 30434, 30859, 29237, 29801, 29901, 30391, 30017, 30492, 30576, 30981, 30150, 30608, 30689, 31078, 30783, 31158, 31225, 31537, 23906, 24888, 25070, 25984, 25279, 26179, 26345, 27170, 25524, 26409, 26570, 27379, 26757, 27552, 27696, 28411, 25814, 26679, 26837, 27626, 27017, 27791, 27931, 28627, 27230, 27986, 28122, 28800, 28280, 28942, 29060, 29645, 26149, 26990, 27140, 27905, 27320, 28068, 28201, 28872, 27524, 28255, 28385, 29038, 28540, 29176, 29289, 29849, 27767, 28478, 28604, 29235, 28751, 29368, 29476, 30015, 28920, 29520, 29626, 30148, 29748, 30257, 30346, 30781, 26535, 27346, 27495, 28227, 27664, 28382, 28513, 29151, 27862, 28564, 28690, 29311, 28834, 29442, 29551, 30080, 28092, 28773, 28895, 29497, 29035, 29623, 29727, 30238, 29198, 29768, 29868, 30363, 29985, 30466, 30549, 30959, 28360, 29014, 29129, 29707, 29266, 29828, 29926, 30414, 29422, 29966, 30061, 30532, 30174, 30630, 30709, 31096, 29604, 30129, 30220, 30671, 30328, 30766, 30841, 31210, 30449, 30872, 30944, 31299, 31029, 31373, 31430, 31713, 26977, 27756, 27895, 28595, 28056, 28741, 28863, 29468, 28245, 28913, 29030, 29620, 29166, 29741, 29841, 30340, 28468, 29111, 29227, 29793, 29359, 29910, 30008, 30485, 29514, 30047, 30143, 30602, 30251, 30696, 30776, 31152, 28717, 29337, 29446, 29989, 29575, 30102, 30195, 30649, 29721, 30234, 30323, 30762, 30426, 30852, 30925, 31283, 29892, 30384, 30470, 30890, 30568, 30975, 31045, 31386, 30683, 31073, 31142, 31468, 31219, 31532, 31587, 31843, 29004, 29595, 29700, 30213, 29819, 30320, 30408, 30835, 29958, 30443, 30526, 30939, 30623, 31024, 31091, 31426, 30121, 30584, 30665, 31058, 30759, 31139, 31205, 31521, 30867, 31231, 31295, 31596, 31369, 31660, 31710, 31945, 30304, 30743, 30820, 31191, 30909, 31268, 31330, 31627, 31010, 31356, 31414, 31699, 31482, 31757, 31802, 32023, 31126, 31455, 31510, 31780, 31575, 31834, 31877, 32085, 31650, 31895, 31937, 32133, 31986, 32173, 32204, 32350, 24653, 25594, 25765, 26634, 25965, 26820, 26974, 27753, 26198, 27036, 27187, 27948, 27363, 28109, 28242, 28910, 26474, 27290, 27439, 28176, 27611, 28334, 28465, 29108, 27809, 28515, 28643, 29268, 28789, 29401, 29511, 30044, 26791, 27584, 27724, 28438, 27892, 28592, 28714, 29334, 28083, 28766, 28885, 29489, 29027, 29617, 29718, 30231, 28310, 28968, 29085, 29667, 29224, 29790, 29889, 30381, 29381, 29928, 30026, 30500, 30140, 30599, 30680, 31070, 27154, 27917, 28054, 28739, 28213, 28882, 29002, 29593, 28397, 29049, 29164, 29739, 29299, 29858, 29956, 30441, 28615, 29244, 29357, 29908, 29486, 30023, 30119, 30582, 29636, 30156, 30249, 30694, 30355, 30788, 30865, 31229, 28861, 29466, 29573, 30100, 29698, 30211, 30302, 30741, 29839, 30338, 30424, 30850, 30524, 30937, 31008, 31354, 30006, 30483, 30566, 30973, 30663, 31056, 31124, 31453, 30774, 31150, 31217, 31530, 31293, 31594, 31648, 31893, 27571, 28299, 28428, 29077, 28581, 29215, 29326, 29883, 28756, 29373, 29481, 30020, 29608, 30133, 30224, 30675, 28959, 29554, 29660, 30177, 29783, 30287, 30376, 30806, 29922, 30410, 30495, 30911, 30594, 30997, 31066, 31403, 29191, 29763, 29861, 30358, 29979, 30462, 30543, 30955, 30114, 30579, 30658, 31053, 30753, 31135, 31199, 31517, 30270, 30712, 30791, 31165, 30883, 31244, 31308, 31607, 30984, 31332, 31392, 31679, 31462, 31738, 31785, 32007, 29457, 29999, 30093, 30561, 30204, 30657, 30736, 31120, 30331, 30769, 30844, 31213, 30932, 31289, 31350, 31645, 30478, 30896, 30969, 31319, 31052, 31391, 31450, 31728, 31147, 31472, 31527, 31793, 31592, 31847, 31891, 32095, 30641, 31039, 31106, 31439, 31185, 31505, 31559, 31821, 31276, 31582, 31634, 31883, 31694, 31933, 31973, 32163, 31381, 31669, 31720, 31953, 31776, 31999, 32039, 32215, 31839, 32052, 32089, 32256, 32130, 32289, 32317, 32438, 28040, 28727, 28849, 29456, 28990, 29583, 29688, 30203, 29153, 29729, 29830, 30330, 29947, 30433, 30517, 30931, 29346, 29899, 29998, 30477, 30109, 30574, 30656, 31051, 30240, 30687, 30768, 31146, 30857, 31223, 31288, 31591, 29563, 30092, 30184, 30640, 30294, 30735, 30811, 31184, 30416, 30843, 30916, 31275, 31002, 31349, 31407, 31693, 30560, 30968, 31038, 31380, 31119, 31449, 31504, 31775, 31212, 31526, 31581, 31838, 31644, 31890, 31932, 32129, 29808, 30310, 30398, 30826, 30498, 30914, 30987, 31335, 30614, 31015, 31083, 31418, 31163, 31486, 31541, 31805, 30749, 31131, 31197, 31515, 31273, 31579, 31632, 31881, 31360, 31653, 31703, 31940, 31760, 31988, 32026, 32206, 30901, 31261, 31323, 31621, 31395, 31682, 31731, 31963, 31475, 31750, 31796, 32017, 31849, 32061, 32097, 32263, 31569, 31829, 31872, 32081, 31923, 32122, 32155, 32311, 31980, 32168, 32199, 32346, 32235, 32374, 32397, 32503, 30083, 30552, 30633, 31032, 30728, 31113, 31179, 31500, 30837, 31207, 31270, 31577, 31344, 31640, 31689, 31929, 30962, 31314, 31376, 31666, 31444, 31724, 31772, 31997, 31523, 31790, 31836, 32050, 31887, 32092, 32127, 32287, 31099, 31433, 31488, 31762, 31554, 31817, 31860, 32071, 31629, 31879, 31920, 32120, 31969, 32160, 32190, 32339, 31716, 31950, 31990, 32176, 32036, 32213, 32243, 32380, 32087, 32254, 32283, 32411, 32315, 32436, 32457, 32547, 31256, 31564, 31617, 31868, 31678, 31919, 31960, 32152, 31747, 31977, 32014, 32196, 32059, 32233, 32261, 32395, 31825, 32042, 32078, 32248, 32119, 32282, 32309, 32433, 32166, 32319, 32344, 32460, 32373, 32484, 32502, 32583, 31911, 32112, 32146, 32303, 32183, 32333, 32358, 32472, 32226, 32367, 32390, 32497, 32416, 32517, 32533, 32607, 32277, 32407, 32429, 32527, 32453, 32545, 32561, 32628, 32480, 32565, 32580, 32641, 32596, 32653, 32663, 32702, 25501, 26387, 26549, 27359, 26736, 27532, 27677, 28393, 26955, 27736, 27875, 28577, 28037, 28724, 28846, 29453, 27210, 27968, 28105, 28785, 28262, 28926, 29045, 29632, 28449, 29094, 29211, 29779, 29343, 29896, 29995, 30474, 27506, 28238, 28369, 29023, 28523, 29160, 29274, 29835, 28700, 29322, 29430, 29975, 29560, 30089, 30181, 30637, 28906, 29507, 29613, 30136, 29735, 30245, 30334, 30770, 29879, 30372, 30458, 30879, 30557, 30965, 31035, 31377, 27844, 28547, 28674, 29296, 28818, 29427, 29536, 30066, 28988, 29581, 29686, 30201, 29806, 30308, 30396, 30824, 29182, 29754, 29855, 30352, 29971, 30454, 30537, 30949, 30107, 30572, 30654, 31049, 30747, 31129, 31195, 31513, 29408, 29953, 30049, 30521, 30161, 30618, 30698, 31086, 30292, 30733, 30809, 31182, 30899, 31259, 31321, 31619, 30438, 30862, 30934, 31290, 31019, 31364, 31421, 31705, 31117, 31447, 31502, 31773, 31567, 31827, 31870, 32079, 28228, 28897, 29015, 29606, 29152, 29728, 29829, 30329, 29312, 29870, 29967, 30451, 30081, 30550, 30631, 31030, 29499, 30034, 30131, 30592, 30239, 30686, 30767, 31145, 30365, 30797, 30874, 31237, 30960, 31312, 31374, 31664, 29708, 30222, 30311, 30751, 30415, 30842, 30915, 31274, 30533, 30946, 31016, 31362, 31097, 31431, 31487, 31761, 30673, 31064, 31133, 31460, 31211, 31525, 31580, 31837, 31301, 31601, 31655, 31899, 31714, 31948, 31989, 32175, 29946, 30432, 30516, 30930, 30613, 31014, 31082, 31417, 30727, 31112, 31178, 31499, 31255, 31563, 31616, 31867, 30856, 31222, 31287, 31590, 31359, 31652, 31702, 31939, 31443, 31723, 31771, 31996, 31824, 32041, 32077, 32247, 31001, 31348, 31406, 31692, 31474, 31749, 31795, 32016, 31553, 31816, 31859, 32070, 31910, 32111, 32145, 32302, 31643, 31889, 31931, 32128, 31979, 32167, 32198, 32345, 32035, 32212, 32242, 32379, 32276, 32406, 32428, 32526, 28662, 29286, 29399, 29945, 29526, 30058, 30154, 30612, 29676, 30192, 30285, 30726, 30388, 30817, 30894, 31254, 29846, 30343, 30431, 30855, 30529, 30941, 31013, 31358, 30646, 31042, 31111, 31442, 31188, 31507, 31562, 31823, 30042, 30515, 30597, 31000, 30692, 31081, 31148, 31473, 30804, 31177, 31242, 31552, 31317, 31615, 31667, 31909, 30929, 31286, 31347, 31642, 31416, 31701, 31748, 31978, 31498, 31770, 31815, 32034, 31866, 32076, 32110, 32275, 30263, 30707, 30787, 31162, 30877, 31240, 31304, 31604, 30979, 31328, 31390, 31677, 31458, 31735, 31783, 32005, 31094, 31428, 31485, 31759, 31550, 31813, 31857, 32068, 31625, 31875, 31918, 32118, 31966, 32157, 32188, 32337, 31228, 31540, 31593, 31848, 31657, 31901, 31942, 32137, 31727, 31959, 31998, 32182, 32044, 32219, 32249, 32384, 31804, 32025, 32060, 32234, 32103, 32269, 32295, 32422, 32151, 32308, 32332, 32452, 32361, 32475, 32492, 32576, 30508, 30923, 30996, 31343, 31076, 31412, 31471, 31746, 31171, 31494, 31548, 31812, 31611, 31864, 31907, 32109, 31281, 31585, 31639, 31886, 31697, 31935, 31976, 32165, 31767, 31993, 32032, 32210, 32074, 32245, 32274, 32405, 31402, 31688, 31737, 31968, 31792, 32013, 32051, 32225, 31855, 32067, 32102, 32268, 32142, 32300, 32326, 32446, 31928, 32126, 32159, 32314, 32195, 32343, 32366, 32479, 32240, 32378, 32401, 32506, 32426, 32525, 32540, 32613, 31535, 31800, 31846, 32058, 31897, 32100, 32135, 32293, 31956, 32149, 32181, 32331, 32217, 32360, 32383, 32491, 32021, 32202, 32232, 32372, 32266, 32399, 32420, 32520, 32306, 32431, 32451, 32544, 32474, 32562, 32575, 32638, 32094, 32260, 32288, 32415, 32320, 32440, 32461, 32550, 32356, 32470, 32488, 32572, 32509, 32588, 32601, 32657, 32394, 32501, 32516, 32595, 32535, 32609, 32619, 32671, 32559, 32627, 32636, 32684, 32648, 32692, 32698, 32727, 29138, 29715, 29817, 30318, 29934, 30421, 30506, 30921, 30069, 30540, 30621, 31022, 30716, 31103, 31169, 31492, 30228, 30677, 30757, 31137, 30847, 31214, 31279, 31583, 30952, 31305, 31367, 31658, 31436, 31717, 31765, 31991, 30406, 30833, 30907, 31266, 30994, 31341, 31400, 31686, 31089, 31424, 31480, 31755, 31546, 31810, 31853, 32065, 31203, 31519, 31573, 31832, 31637, 31884, 31926, 32124, 31708, 31943, 31984, 32171, 32030, 32208, 32238, 32376, 30604, 31006, 31075, 31411, 31154, 31478, 31534, 31799, 31247, 31557, 31610, 31863, 31671, 31913, 31955, 32148, 31352, 31646, 31696, 31934, 31753, 31982, 32020, 32201, 31819, 32037, 32073, 32244, 32114, 32278, 32305, 32430, 31470, 31745, 31791, 32012, 31845, 32057, 32093, 32259, 31906, 32108, 32141, 32299, 32180, 32330, 32355, 32469, 31975, 32164, 32194, 32342, 32231, 32371, 32393, 32500, 32273, 32404, 32425, 32524, 32450, 32543, 32558, 32626, 30827, 31198, 31262, 31570, 31336, 31633, 31683, 31924, 31419, 31704, 31751, 31981, 31806, 32027, 32062, 32236, 31516, 31784, 31830, 32045, 31882, 32088, 32123, 32284, 31941, 32136, 32169, 32321, 32207, 32352, 32375, 32485, 31622, 31873, 31915, 32116, 31964, 32156, 32186, 32336, 32018, 32200, 32229, 32370, 32264, 32398, 32418, 32519, 32082, 32250, 32280, 32409, 32312, 32434, 32455, 32546, 32347, 32462, 32482, 32567, 32504, 32584, 32597, 32654, 31741, 31972, 32010, 32193, 32054, 32228, 32258, 32392, 32105, 32271, 32297, 32424, 32328, 32448, 32468, 32557, 32162, 32316, 32341, 32458, 32369, 32481, 32499, 32581, 32403, 32507, 32523, 32599, 32542, 32614, 32625, 32675, 32223, 32365, 32387, 32495, 32414, 32515, 32531, 32605, 32444, 32539, 32553, 32622, 32571, 32635, 32645, 32689, 32478, 32564, 32578, 32640, 32594, 32652, 32661, 32701, 32612, 32665, 32673, 32709, 32683, 32716, 32721, 32742, 31068, 31405, 31464, 31740, 31528, 31794, 31840, 32053, 31605, 31858, 31902, 32104, 31951, 32144, 32177, 32327, 31691, 31930, 31971, 32161, 32015, 32197, 32227, 32368, 32069, 32241, 32270, 32402, 32301, 32427, 32447, 32541, 31787, 32009, 32047, 32222, 32090, 32257, 32285, 32413, 32138, 32296, 32323, 32443, 32353, 32467, 32486, 32570, 32192, 32340, 32364, 32477, 32391, 32498, 32514, 32593, 32423, 32522, 32538, 32611, 32556, 32624, 32634, 32682, 31892, 32096, 32131, 32290, 32170, 32322, 32348, 32463, 32214, 32357, 32381, 32489, 32408, 32510, 32528, 32602, 32262, 32396, 32417, 32518, 32442, 32537, 32552, 32621, 32471, 32560, 32573, 32637, 32589, 32649, 32658, 32699, 32318, 32439, 32459, 32549, 32483, 32568, 32582, 32643, 32508, 32587, 32600, 32656, 32615, 32667, 32676, 32711, 32534, 32608, 32618, 32670, 32632, 32680, 32687, 32719, 32647, 32691, 32697, 32726, 32705, 32731, 32735, 32751, 32006, 32189, 32220, 32362, 32255, 32389, 32412, 32513, 32294, 32421, 32441, 32536, 32466, 32555, 32569, 32633, 32338, 32456, 32476, 32563, 32496, 32579, 32592, 32651, 32521, 32598, 32610, 32664, 32623, 32674, 32681, 32715, 32385, 32493, 32511, 32590, 32530, 32604, 32616, 32668, 32551, 32620, 32631, 32679, 32644, 32688, 32695, 32724, 32577, 32639, 32650, 32693, 32660, 32700, 32706, 32732, 32672, 32708, 32714, 32737, 32720, 32741, 32744, 32756, 32437, 32532, 32548, 32617, 32566, 32630, 32642, 32686, 32586, 32646, 32655, 32696, 32666, 32704, 32710, 32734, 32606, 32662, 32669, 32707, 32678, 32713, 32718, 32740, 32690, 32722, 32725, 32745, 32730, 32748, 32750, 32760, 32629, 32677, 32685, 32717, 32694, 32723, 32728, 32746, 32703, 32729, 32733, 32749, 32738, 32752, 32754, 32762, 32712, 32736, 32739, 32753, 32743, 32755, 32757, 32763, 32747, 32758, 32759, 32764, 32761, 32765, 32766, 32767;

(II). Subchannel row weight sequence RW:

RW_8: 1, 2, 2, 4, 2, 4, 4, 8;

RW_16: 1, 2, 2, 4, 2, 4, 4, 8, 2, 4, 4, 8, 4, 8, 8, 16;

RW_32: 1, 2, 2, 4, 2, 4, 4, 8, 2, 4, 4, 8, 4, 8, 8, 16, 2, 4, 4, 8, 4, 8, 8, 16, 4, 8, 8, 16, 8, 16, 16, 32;

RW_64: 1, 2, 4, 4, 8, 4, 4, 8, 4, 8, 8, 16, 2, 4, 4, 8, 4, 8, 6, 4, 8, 16, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64;

RW_128: 1, 2, 2, 4, 2, 4, 4, 8, 2, 4, 4, 8, 4, 8, 8, 16, 2, 4, 4, 8, 4, 8, 16, 4, 8, 8, 6, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 37, 16, 32, 16, 32, 32, 64, 16, 32, 32, 64, 32, 64, 64, 128;

RW_256: 1, 2, 2, 4, 2, 4, 4, 8, 2, 4, 4, 8, 4, 8, 8, 16, 2, 4, 4, 8, 4, 8, 8, 16, 4, 8, 8, 16, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256;

RW_512: 1, 2, 2, 4, 4, 4, 8, 2, 4, 4, 8, 4, 8, 8, 16, 2, 4, 4, 8, 4, 8, 6, 4, 8, 8, 6, 8, 16, 1, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512;

RW_1024: 1, 2, 2, 4, 2, 4, 4, 8, 2, 4, 4, 8, 4, 8, 8, 16, 2, 4, 4, 8, 4, 8, 8, 16, 4, 8, 8, 16, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 34, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024;

RW_2048: 1, 2, 2, 4, 2, 4, 4, 8, 2, 4, 4, 8, 4, 8, 8, 16, 2, 4, 4, 8, 4, 8, 8, 16, 4, 8, 8, 16, 8, 16, 16, 32, 2, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 6, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 3, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 512, 512, 1024, 128, 256, 256, 512, 256, 512, 512, 1024, 256, 512, 512, 1024, 512, 1024, 1024, 2048;

RW_4096: 1, 2, 4, 4, 4, 8, 2, 4, 4, 8, 4, 8, 8, 16, 2, 4, 4, 8, 4, 8, 8, 16, 4, 8, 8, 16, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 6, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096;

RW_8192: 1, 2, 2, 4, 2, 4, 4, 8, 2, 4, 4, 8, 4, 8, 8, 16, 2, 4, 4, 8, 4, 8, 8, 16, 4, 8, 8, 16, 8, 16, 16, 32, 2, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 512, 512, 1024, 128, 256, 256, 512, 256, 512, 512, 1024, 256, 512, 512, 1024, 512, 1024, 1024, 2048, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 26, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1014, 1024, 2048, 512, 1024, 1024, 2048, 1024, 2048, 2048, 4096, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 31, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192;

RW_16384: 1, 2, 2, 4, 2, 4, 4, 8, 2, 4, 4, 8, 4, 8, 8, 16, 2, 4, 4, 8, 4, 8, 8, 16, 4, 8, 8, 16, 8, 15, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 4, 15, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 255, 255, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 511, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 511, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 12, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 64, 128, 128, 256, 128, 256, 256, 512, 128, 256, 256, 512, 256, 512, 511, 1024, 128, 256, 256, 512, 256, 512, 511, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 511, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 31, 64, 32, 64, 64, 128, 4, 8, 8, 16, 8, 16, 16, 32, 8, 16, 16, 32, 16, 32, 31, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 6, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 255, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 255, 128, 255, 255, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 512, 32, 64, 64, 128, 64, 128, 128, 256, 64, 128, 128, 256, 128, 256, 256, 512, 64, 128, 256, 128, 256, 256, 512, 8, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 250, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384;

RW_32768: 1, 2, 2, 4, 2, 4, 4, 8, 2, 4, 4, 6, 2, 4, 4, 8, 4, 8, 8, 16, 4, 8, 8, 16, 8, 16, 16, 32, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 316, 16, 32, 16, 32, 32, 54, 16, 32, 32, 64, 32, 64, 64, 128, 8, 16, 16, 32, 16, 32, 32, 64, 16, 32, 32, 64, 32, 64, 64, 16, 32, 32, 64, 32, 64, 64, 128, 32, 64, 64, 128, 64, 128, 128, 256, 2, 4, 4, 8, 4, 8, 8, 16, 4, 8, 8, 16, 8, 16, 16, 32, 4, 16, 8, 15, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 64, 16, 32, 32, 64, 32, 61, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 2, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 128, 32, 64, 64, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 364, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 3, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 6, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 3, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 64, 32, 64, 64, 128, 16, 32, 32, 64, 32, 64, 64, 128, 32, 64, 64, 128, 64, 128, 128, 256, 16, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 250, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 250, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 3, 64, 64, 128, 32, 64, 64, 128, 64, 128, 128, 256, 32, 6464, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 6, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 250, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 512, 64, 128, 128, 256, 128, 256, 256, 512, 128, 256, 256, 512, 256, 512, 512, 1024, 64, 128, 128, 128, 256, 128, 256, 256, 512, 128, 256, 256, 512, 256, 512, 512, 1024, 128, 25, 128, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 250, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 6, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 2, 4, 4, 8, 4, 8, 8, 16, 4, 8, 8, 16, 8, 16, 16, 32, 4, 8, 8, 16, 8, 16, 16, 32, 8, 16, 16, 32, 16, 32, 32, 64, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 1, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 232, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 4, 8, 8, 16, 8, 16, 16, 32, 8, 16, 16, 32, 16, 32, 32, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 12, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 12, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 4, 8, 8, 16, 8, 16, 16, 32, 8, 16, 16, 32, 16, 32, 32, 64, 8, 16, 16, 32, 16, 32, 32, 64, 16, 32, 32, 64, 32, 64, 64, 128, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, —2, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 8, 16, 16, 32, 16, 32, 32, 64, 16, 32, 32, 64, 32, 64, 64, 128, 16, 32, 32, 64, 32, 64, 64, 128, 32, 64, 64, 128, 64, 128, 128, 256, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 16, 3, 32, 64, 3, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 512, 256, 512, 512, 1024, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 250, 256, 512, 250, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 16, 32, 32, 64, 32, 64, 64, 128, 32, 64, 64, 128, 64, 128, 128, 256, 32, 64, 64, 128, 64, 128, 128, 256, 64, 128, 128, 250, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 250, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 16, 32, 32, 64, 32, 64, 64, 128, 32, 64, 64, 128, 64, 128, 128, 256, 32, 64, 64, 128, 64, 128, 128, 256, 64, 128, 128, 256, 128, 256, 256, 512, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 32, 64, 64, 128, 64, 128, 128, 256, 64, 128, 128, 256, 128, 256, 256, 512, 64, 128, 128, 256, 128, 256, 256, 512, 128, 256, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 32, 64, 64, 128, 64, 128, 128, 256, 64, 128, 128, 256, 128, 256, 256, 512, 64, 128, 128, 256, 128, 256, 256, 512, 128, 256, 512, 256, 512, 512, 1024, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 64, 128, 128, 256, 128, 256, 256, 512, 128, 256, 256, 512, 256, 512, 512, 1024, 128, 256, 256, 512, 256, 512, 512, 1024, 256, 512, 512, 1024, 512, 1024, 1024, 2048, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 128, 256, 256, 512, 256, 512, 512, 1024, 256, 512, 512, 1024, 512, 1024, 1024, 2048, 256, 512, 512, 1024, 512, 1024, 1024, 2048, 512, 024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 128, 256, 256, 512, 256, 512, 512, 1024, 256, 512, 512, 1024, 512, 1024, 1024, 2048, 256, 512, 512, 1024, 512, 1024, 1024, 2048, 512, 1024, 1024, 2048, 1024, 2048, 2048, 4096, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 256, 512, 512, 1024, 512, 1024, 1024, 2048, 512, 1024, 1024, 2048, 1024, 2048, 2048, 4096, 512, 1024, 1024, 2048, 1024, 2048, 2048, 4096, 1024, 2048, 2048, 4096, 2048, 4096, 4096, 8192, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 512, 1024, 1024, 2048, 1024, 2048, 2048, 4096, 1024, 2048, 2048, 4096, 2048, 4096, 4096, 8192, 1024, 2048, 2048, 4096, 2048, 4096, 4096, 8192, 2048, 4096, 4096, 8192, 4096, 8192, 8192, 16384, 1024, 2048, 2048, 4096, 2048, 4096, 4096, 8192, 2048, 4096, 4096, 8192, 4096, 8192, 8192, 16384, 2048, 4096, 4096, 8192, 4096, 8192, 8192, 16384, 4096, 8192, 8192, 16384, 8192, 16384, 16384, 32768;

(III). Hamming weight sequence HW:

HW_8: 0, 1, 1, 2, 1, 2, 2, 3;

HW_16: 0, 1, 1, 2, 1, 2, 2, 3, 2, 2, 3, 2, 3, 3, 4;

HW_32: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5;

HW_64: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6;

HW_128: 0, 1, 1, 2, 1, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 3, 3, 4, 3, 4, 4, 5, 2, 3, 3, 4, 3, 4; 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7;

HW_256: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2; 2, 3, 2, 3, 3, 4, 2, 3, 3, 4; 3, 4, 4, 5, 2, 3, 3, 4, 3; 4, 4, 5, 3, 4, 4, 5, 4, 5; 5, 6, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8;

HW_512: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 3, 3, 4, 3, 4, 4, 5, 2; 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 5, 4, 5, 5, 6, 4, 5, 5, 6, 5, 6, 6, 7, 2, 3, 3, 4, 3, 4, 4, 5, 3, 4, 4, 5, 4, 5, 5, 3, 4; 4, 5, 4, 5, 5, 6, 4, 5, 5, 6, 5, 6, 7, 3, 4, 4, 5, 4; 5, 5, 6, 4, 5, 5, 6, 5, 6; 6; 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4; 5, 5, 6, 5, 6, 6, 7, 4, 5; 5, 6, 5, 6, 6, 7, 5, 6, 6; 7, 7, 8, 4, 5, 5, 6; 5, 6, 6, 7, 5, 6, 6, 7, 6, 7, 7, 8, 5, 6, 6, 7, 6, 7, 7, 8, 6, 7, 7, 7, 8, 8, 9;

HW_1024: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4; 2, 3, 3, 4, 3, 4, 4, 5, 2; 3, 3, 4, 3, 4, 4, 5, 3, 4, 4; 5; 4, 5, 5, 6, 2, 3, 3, 4, 3; 4, 4, 5, 3, 4, 4, 5, 4, 5, 5, 6, 3, 4, 4, 5, 4, 5, 5, 6, 4, 5, 5, 6, 5, 6, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 3, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10;

HW_2048: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 3, 3, 4, 3, 4, 4, 5, 2, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 5, 6, 4, 5, 5, 6, 6, 6, 7, 1, 2, 2, 2, 3, 3, 3, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 6, 7, 7, 8, 3, 3, 4, 3, 4, 4, 5, 3, 4, 4, 5, 4, 5, 6, 3, 4, 4, 5, 4, 5, 5, 6, 4, 5, 5, 6, 5, 6, 6, 7, 3, 4, 4, 4, 5, 5, 6, 4, 5, 5, 6, 5, 6, 6, 7, 4, 5, 5, 6, 6, 7, 5, 6, 6, 7, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 4, 4, 5, 4, 5, 5, 6, 3, 4, 4, 5, 4, 5, 5, 4, 5, 5, 6, 5, 6, 6, 7, 2, 3, 3, 4, 3, 4, 4, 5, 3, 4, 4, 5, 4, 5, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 4, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 5, 6, 6, 7, 5, 6, 6, 7, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 5, 6, 6, 7, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 5, 6, 6, 7, 5, 6, 6, 7, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 7, 6, 6, 7, 6, 7, 7, 8, 5, 6, 6, 7, 6, 7, 7, 8, 6, 7, 7, 8, 7, 8, 8, 9, 5, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 8, 7, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11;

HW_4096: 0, 1, 1, 2, 2, 3, 1, 2, 2, 3, 2, 3, 3, 4, 1, 2, 2, 3, 2, 3, 3, 4, 4, 3, 4, 2, 2, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 4, 5, 5, 6, 4, 5, 5, 6, 5, 6, 6, 7, 1, 2, 2, 3, 4, 2, 3, 3, 4, 3, 4, 4, 5, 2, 3, 3, 4, 3, 4, 4, 5, 3, 4, 4, 5, 4, 5, 5, 6, 2, 3, 4, 3, 4, 4, 5, 3, 4, 4, 5, 4, 5, 5, 6, 3, 4, 4, 5, 4, 5, 5, 6, 4, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 7, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 5, 4, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 5, 4, 5, 5, 4, 5, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 9, 10, 1, 2, 2, 3, 2, 3, 4, 2, 3, 3, 4, 3, 4, 4, 5, 2, 3, 3, 4, 3, 4, 4, 5, 3, 4, 4, 5, 4, 5, 5, 6, 2, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 5, 4, 5, 5, 6, 4, 5, 5, 6, 5, 6, 6, 4, 5, 5, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 6, 7, 7, 7, 8, 4, 5, 5, 6, 5, 6, 7, 5, 6, 7, 6, 7, 7, 8, 5, 6, 6, 7, 6, 7, 7, 8, 6, 7, 7, 8, 7, 8, 8, 9, 4, 5, 5, 6, 3, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 8, 8, 9, 6, 7, 7, 8, 7, 8, 8, 9, 7, 8, 8, 9, 8, 9, 9, 10, 4, 5, 6, 5, 6, 6, 7, 5, 6, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 7, 8, 6, 7, 7, 8, 7, 8, 8, 9, 5, 6, 6, 7, 6, 7, 7, 8, 6, 7, 7, 8, 7, 8, 8, 9, 6, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 6, 5, 6, 6, 7, 5, 6, 6, 7, 6, 7, 7, 8, 5, 6, 6, 7, 6, 7, 7, 8, 6, 7, 7, 8, 7, 8, 8, 5, 6, 6, 7, 6, 7, 7, 8, 6, 7, 7, 8, 7, 8, 8, 9, 6, 8, 7, 8, 8, 9, 7, 8, 8, 9, 8, 9, 9, 10, 5, 6, 6, 7, 6, 7, 7, 8, 6, 7, 7, 8, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12;

HW_8192: 0, 1, 1, 2, 1, 2, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 3, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 6, 4, 5, 5, 6, 5, 6, 6, 7, 4, 5, 5, 6, 5, 6, 6, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 6, 6, 7, 6, 7, 7, 8, 6, 7, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 5, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 4, 4, 5, 6, 4, 5, 5, 6, 5, 6, 6, 7, 4, 5, 5, 6, 5, 6, 6, 6, 6, 7, 6, 7, 7, 8, 4, 4, 5, 4, 5, 5, 6, 4, 5, 5, 6, 5, 6, 6, 7, 5, 6, 5, 6, 6, 7, 5, 6, 6, 7, 6, 7, 7, 8, 4, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 9, 10, 3, 4, 4, 5, 4, 5, 5, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 5, 6, 6, 7, 6, 7, 7, 8, 5, 6, 6, 7, 6, 7, 7, 8, 7, 8, 8, 7, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 1, 2, 2, 3, 2, 3, 3, 4, 2, 3, 3, 4, 3, 4, 4, 3, 2, 3, 3, 4, 3, 4, 4, 5, 3, 4, 4, 5, 4, 5, 5, 6, 2, 3, 3, 4, 3, 4, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 8, 5, 6, 6, 7, 6, 7, 7, 8, 6, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 5, 6, 6, 7, 5, 6, 6, 7, 7, 8, 5, 6, 7, 6, 7, 8, 6, 7, 7, 8, 7, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 6, 7, 6, 7, 7, 8, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 4, 5, 5, 6, 5, 6, 6, 7, 5, 6, 6, 7, 6, 7, 7, 8, 7, 6, 7, 7, 8, 6, 7, 7, 8, 8, 9, 5, 6, 6, 7, 6, 7, 7, 8, 6, 7, 7, 8, 7, 8, 8, 9, 6, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 1, 0, 8, 9, 9, 10, 9, 10, 10, 11, 8, 9, 9, 10, 9, 10, 10, 11, 9, 10, 10, 11, 10, 11, 11, 12, 2, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13;

HW_16384: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 4, 4, 5, 3, 4, 4, 5, 4, 5, 5, 6, 3, 4, 4, 5, 4, 5, 5, 6, 4, 5, 5, 6, 5, 6, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 4, 5, 5, 6, 4, 5, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 6, 5, 6, 6, 7, 3, 4, 4, 5, 4, 5, 5, 6, 4, 5, 5, 6, 5, 6, 6, 7, 5, 5, 6, 5, 6, 6, 7, 5, 6, 6, 7, 6, 7, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 0, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 0, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 5, 6, 5, 6, 6, 7, 5, 6, 6, 7, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 7, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 5, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6; 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 5, 6, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 6, 7, 6, 7, 7, 8, 5, 6, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 7, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14;

HW_32768: 0, 1, 1, 2, 1, 2, 2, 3, 1, 2, 2, 3, 2, 3, 3, 4, 1, 2, 2, 3, 2, 3, 3, 4, 2, 3, 3, 4, 3, 4, 4, 5, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 1, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 7, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 3, 4, 4, 5, 3, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 5, 6, 6, 7, 5, 6, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 1, 8, 8, 9, 8, 9, 9, 10, 8, 9, 9, 10, 9, 10, 10, 11, 3, 4, 4, 5, 4, 5, 5, 6, 5, 6, 4, 5, 5, 6, 5, 6, 6, 7, 4, 4, 5, 4, 5, 5, 6, 4, 5, 5, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 1, 2, 2, 1, 2, 3, 3, 4, 2, 3, 1, 4, 3, 4, 4, 5, 2, 3, 1, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 8, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 5, 6, 6, 7, 6, 7, 7, 8, 4, 5, 5, 6, 5, 6, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 8, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 10, 11, 10, 11, 11, 12, 10, 11, 11, 12, 11, 12, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 1, 2, 2, 3, 2, 3, 3, 4, 2, 3, 3, 4, 3, 4, 4, 5, 2, 3, 3, 4, 3, 4, 4, 5, 3, 4, 4, 5, 4, 5, 5, 6, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 8, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 8, 6, 7, 7, 8, 7, 8, 8, 9, 3, 4, 4, 5, 4, 5, 5, 6, 4, 5, 5, 6, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 1, 12, 13, 12, 13, 13, 14, 2, 3, 3, 4, 3, 4, 4, 5, 3, 4, 4, 5, 4, 5, 5, 6, 3, 4, 4, 5, 4, 5, 5, 6, 4, 5, 5, 6, 5, 6, 6, 7, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 3, 4, 4, 5, 4, 5, 5, 6, 4, 5, 5, 6, 5, 6, 6, 7, 4, 5, 5, 6, 5, 6, 6, 7, 5, 6, 6, 7, 6, 7, 7, 8, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 2, 6, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 14, 4, 5, 5, 6, 5, 6, 6, 7, 5, 6, 6, 7, 6, 7, 7, 8, 5, 6, 6, 7, 6, 7, 7, 8, 6, 7, 7, 8, 7, 8, 8, 9, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 5, 6, 6, 7, 6, 7, 7, 8, 6, 7, 7, 8, 7, 8, 8, 9, 6, 7, 7, 8, 7, 8, 8, 9, 7, 8, 8, 9, 8, 9, 9, 10, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 2, 9, 10, 10, 11, 10, 11, 11, 12, 10, 11, 11, 12, 11, 12, 12, 13, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 6, 7, 7, 8, 7, 8, 8, 9, 7, 8, 8, 9, 8, 9, 9, 10, 7, 8, 8, 9, 8, 9, 9, 10, 8, 9, 9, 10, 9, 10, 10, 11, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 7, 8, 8, 9, 8, 9, 9, 10, 8, 9, 9, 10, 9, 10, 10, 11, 8, 9, 9, 10, 9, 10, 10, 11, 9, 10, 10, 11, 10, 11, 11, 12, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 8, 9, 9, 10, 9, 10, 10, 11, 9, 10, 10, 11, 10, 11, 11, 12, 9, 10, 10, 11, 10, 11, 11, 12, 10, 11, 11, 12, 11, 12, 12, 13, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 9, 10, 10, 11, 10, 11, 11, 12, 10, 11, 11, 12, 11, 12, 12, 13, 10, 11, 11, 12, 11, 12, 12, 13, 11, 12, 12, 13, 12, 13, 13, 14, 10, 11, 11, 12, 11, 12, 12, 13, 11, 12, 12, 13, 12, 13, 13, 14, 11, 12, 12, 13, 12, 13, 13, 14, 12, 13, 13, 14, 13, 14, 14, 15,

3. Check Equation

Regardless of which encoding scheme such as a CA-polar encoding method, a PC-polar encoding method, or a CA+PC-polar encoding method is used, a check equation of the encoding scheme may be uniquely determined by using a generator polynomial. The generator polynomial has various equivalent representation manners, and may be, for example, represented by using any one of a binary form, an octal form, a decimal form, a hexadecimal form, and a position vector. For example, if a CRC polynomial is [1, 1, 0, 0, 1, 1, 1], the CRC polynomial may also be equivalently represented as a position vector [6, 5, 2, 1, 0] of is of the CRC polynomial (the least significant bit starts from 0); or may be represented by a decimal number corresponding to a binary vector of the CRC polynomial. That is, in the decimal representation given below, bit reversal is performed on a binary vector to perform conversion to obtain a decimal value. For example, a decimal representation of the polynomial [1, 0, 0, 1, 1, 1] is 115.

(1) For an encoding scheme in which CRC bits are used to perform a check in an encoding process, the check equation may be represented by using generator polynomials (polynomial generation). For example, assuming that the generator polynomials are represented in decimal system, these generator polynomials may be: (24): 29254851; (24): 25952259; (19): 1005307; (16): 67601; (15): 57977; (14): 31993; (13) 16299; (12): 7705; (11): 3805; (10): 1939; (9): 817; (8): 435; (7): 211; (6): 115; (5): 41; (4): 25; and (3): 9.

Values in the foregoing brackets represent CRC lengths (that is, quantities of CRC bits). Sequences after the brackets represent polynomials. For each CRC length, a polynomial may be another sequence, and the foregoing examples are only used to facilitate understanding. In the foregoing examples, the polynomials are represented in decimal system, and may alternatively be represented in another numeral system during actual application. This is not limited in this application.

Figure 6:
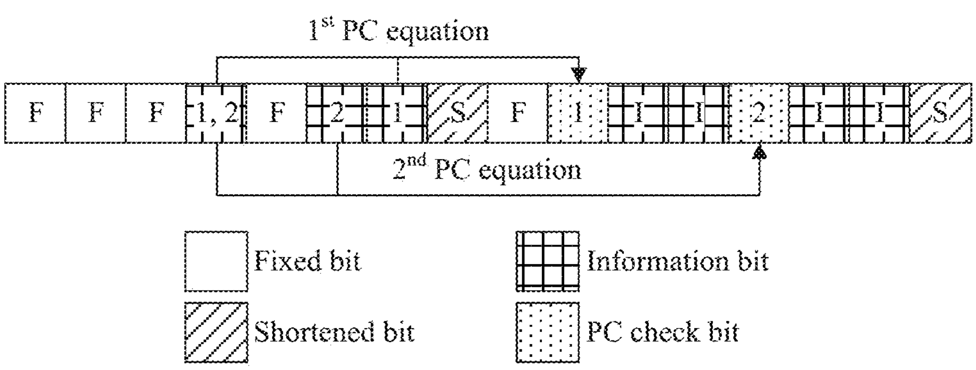
FIG. 6 is a schematic diagram of a table representation of a check equation.

(2) For an encoding scheme in which PC bits are used to perform a check in an encoding process, a table representation may be used for the check equation. FIG. 6 is a schematic diagram of a table representation of a check equation. As shown in FIG. 6, frozen/information/check/shortened positions are represented by different paddings. In the tables. F represents fixed bits. I represents information bits. S represents shortened bits, and other numbers in the tables represent numbers of check equations in which the bits participate. Bits in positions corresponding to a same number participate in a same check equation. A bit having a maximum (last) subchannel sequence number is a PC bit.

Several examples of check manners using a table representation are provided below:

| | i | | | | | | | | | | | | | |
|---|---|---|---|---|---|---|---|---|---|---|---|---|---|---|
| K | 0 | 1 | 2 | 3 | 4 | 5 | 6 | 7 | 8 | 9 | 10 | 11 | 12 | 13 |
| M = 32 and 6 ≤ k ≤ 11 (M represents a code length, and K represents a length of a to-be-encoded sequence (also referred to as an information bit length)) | | | | | | | | | | | | | | |
| 6 | F | F | F | F | F | F | F | F | F | F | F | F | F | F |
| 7 | F | F | F | F | F | F | F | F | F | F | F | F | F | F |
| 8 | F | F | F | F | F | F | F | F | F | F | F | F | F | 2 |
| 9 | F | F | F | F | F | F | F | F | F | F | F | F | F | 4 |
| 10 | F | F | F | F | F | F | F | F | F | F | F | 2, 5 | F | 4 |
| 11 | F | F | F | F | F | F | F | 1, 2, 5, 6 | F | F | F | 1, 2, 5 | F | 2, 4, 5 |
| M = 24 and 5 ≤ k ≤ 13 (M represents a code length, and K represents a length of a to-be-encoded sequence (also referred to as an information bit length)) | | | | | | | | | | | | | | |
| 5 | F | F | F | S | F | S | F | S | F | F | F | S | F | S |
| 6 | F | F | F | S | F | S | F | S | F | F | F | S | F | S |
| 7 | F | F | F | S | F | S | F | S | F | 1, 2, 3 | 1 | S | 2 | S |
| 8 | F | F | F | S | F | S | F | S | F | 2, 3, 4 | F | S | 1, 3 | S |
| 9 | F | F | F | S | F | S | F | S | F | 3 | 1, 2 | S | 2 | S |
| 10 | F | F | F | S | F | S | 1, 4 | S | F | 3 | 1, 2 | S | 2 | S |
| 11 | F | F | F | S | F | S | 2, 3 | S | F | 1, 2, 3 | 2, 3 | S | 1, 2, 3 | S |
| 12 | F | F | F | S | F | S | 1 | S | F | 1 | 2 | S | I | S |
| 13 | F | F | F | S | F | S | 1 | S | F | 1 | I | S | I | S |
| K = 2, 3, 4, 5 and M ≥ 2^K − 1 (When M > 2^K − 1, the following codeword is repeated to a preset code length) (M represents a code length, and K represents a length of a to-be-encoded sequence (also referred to as an information bit length)) | | | | | | | | | | | | | | |
| 2 | F | I | I | S | | | | | | | | | | |
| 3 | F | F | F | I | F | I | I | S | | | | | | |
| 4 | F | F | F | F | F | F | F | I | F | F | F | I | F | I |
| 5 | F | F | F | F | F | F | F | F | F | F | F | F | F | F |

| | i | | | | | | | | | | | | | | | | | |
|---|---|---|---|---|---|---|---|---|---|---|---|---|---|---|---|---|---|---|
| K | 14 | 15 | 16 | 17 | 18 | 19 | 20 | 21 | 22 | 23 | 24 | 25 | 26 | 27 | 28 | 29 | 30 | 31 |
| M = 32 and 6 ≤ k ≤ 11 (M represents a code length, and K represents a length of a to-be-encoded sequence (also referred to as an information bit length)) | | | | | | | | | | | | | | | | | | |
| 6 | F | I | F | F | F | F | F | F | F | I | F | F | F | I | F | I | I | I |
| 7 | F | I | F | F | F | F | F | F | 1 | I | F | 1 | F | I | F | I | I | I |
| 8 | F | I | F | F | F | F | F | F | 1 | I | F | 1 | 2 | I | F | I | I | I |
| 9 | 1, 2, 3 | I | F | F | F | 1 | F | 2 | 3 | I | F | 3 | 4 | I | F | I | I | I |

-continued

| | | | | | | | | | | | | | | | | | | |
|---|---|---|---|---|---|---|---|---|---|---|---|---|---|---|---|---|---|---|
| 10 | 1 | I | F | F | F | 1 | F | 2 | 3 | I | F | 3 | 4 | I | 5 | I | I | I |
| 11 | 1, 2, 4 | I | F | F | F | 1 | F | 2, 3 | 2 | I | F | 3 | 4 | I | 5 | I | I | I |

M = 24 and 5 ≤ k ≤ 13 (M represents a code length, and K represents a length of a to-be-encoded sequence (also referred to as an information bit length))

| | | | | | | | | | | | | | | | | | | |
|---|---|---|---|---|---|---|---|---|---|---|---|---|---|---|---|---|---|---|
| 5 | 1 | S | F | 1 | F | S | F | S | 2 | S | F | 2 | I | S | I | S | I | S |
| 6 | 1 | S | F | 1 | F | S | F | S | I | S | F | I | I | S | I | S | I | S |
| 7 | I | S | F | F | F | S | 3 | S | I | S | F | I | I | S | I | S | I | S |
| 8 | I | S | F | 1 | 2 | S | 3 | S | I | S | 4 | I | I | S | I | S | I | S |
| 9 | I | S | F | 1 | 2 | S | 3 | S | I | S | F | I | I | S | I | S | I | S |
| 10 | I | S | F | 1 | 2 | S | 3 | S | I | S | 4 | I | I | S | I | S | I | S |
| 11 | I | S | F | I | 1 | S | 2 | S | I | S | 3 | I | I | S | I | S | I | S |
| 12 | I | S | F | 2 | I | S | I | S | I | S | I | I | I | S | I | S | I | S |
| 13 | I | S | F | I | I | S | I | S | I | S | I | I | I | S | I | S | I | S |

K = 2, 3, 4, 5 and M ≥ 2^K − 1 (When M > 2^K − 1, the following codeword is repeated to a preset code length) (M represents a code length, and K represents a length of a to-be-encoded sequence (also referred to as an information bit length))

| | | | | | | | | | | | | | | | | | | |
|---|---|---|---|---|---|---|---|---|---|---|---|---|---|---|---|---|---|---|
| 2 | | | | | | | | | | | | | | | | | | |
| 3 | | | | | | | | | | | | | | | | | | |
| 4 | I | S | | | | | | | | | | | | | | | | |
| 5 | I | F | F | F | F | F | F | F | I | F | F | F | I | F | I | F | I | S |

In the foregoing, numbers in various numeral systems are used to represent a polynomial to determine a check equation, or a table is used to represent a check equation. In addition, another polynomial may be further used to represent a check equation, that is, a shift register may be used to represent a check equation.

For a polynomial representation of a PC-polar check equation, in a simpler manner of representing a check equation, only one vector or one decimal number is required to represent each check equation. Several examples of representing a polynomial by using a shift register are provided below.

Figure 7:
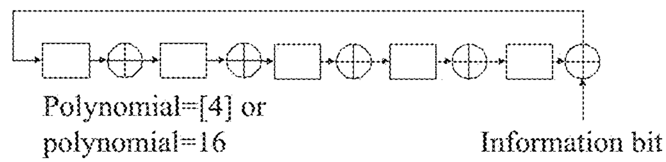
FIG. 7 is a schematic diagram of using a shift register for a polynomial [1, 0, 0, 0, 0]

FIG. 7 is a schematic diagram of using a shift register for a polynomial [1, 0, 0, 0, 0]. As shown in FIG. 7, for a shift register that has a length of 5, a polynomial representation of the shift register may be [1, 0, 0, 0, 0] or [4] or a decimal number 16.

Figure 8:
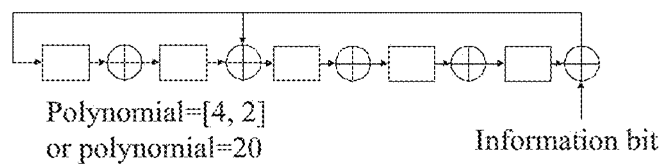
FIG. 8 is a schematic diagram of using a shift register for a polynomial [1, 0, 1, 0, 0]

FIG. 8 is a schematic diagram of using a shift register for a polynomial [1, 0, 1, 0, 0]. As shown in FIG. 8, for a shift register that has a length of 5 but has a feedback tap in the third position, a polynomial representation of the shift register may be [1, 0, 1, 0, 0] or [4, 2] or a decimal number 20.

In addition for a PC check equation, decimal representations of usable polynomials are (but not limited to): 4; 16; 64; 256; 272; 68; 273; 65552; 65808; 65553; 70661; 1028; 4100; 65540; 1029; 65604; 21; 69633; 69636; 69648; and 69636. In an optional manner, for PC-polar, a CRC polynomial may also be directly used as a polynomial of a PC-polar check equation.

It should be noted that for the CA+PC-polar encoding scheme: (1) Different polynomials may be used to define check equations for PC bits and CRC bits, and the PC bits and the CRC bits are independently precoded (for example, by using two different shift registers), (2) A same polynomial is used to define check equations for PC bits and CRC bits, and the PC bits and the CRC bits are jointly precoded (for example, by using a same shift register), (3) Different check equations are used for PC bits and CRC bits. For example, a table is used to define a non-polynomial check equation for the PC bits, and a shift register is used to define a check equation for the CRC bits.

If a transmit end uses the CA-polar encoding scheme or the CA+PC-polar encoding scheme, a receive end may correspondingly use the CA+PC-SCL decoding scheme. Because check bits (for example, CRC bits) are used to perform a check in the CA+PC-polar encoding scheme, normally, the receive end needs to use a CRC to perform a check on all decoding paths (for example, L decoding paths) in a list (list) in a decoding process, to determine whether a checked path is correct. However, the inventors of this application find that there is a particular increase in a false alarm rate after each CRC check, where a "false alarm" means that a decoding error occurs but a CRC bit check is passed, because a plurality of decoding results may have a same CRC check value, but only one of the decoding results is correct.

Figure 9:
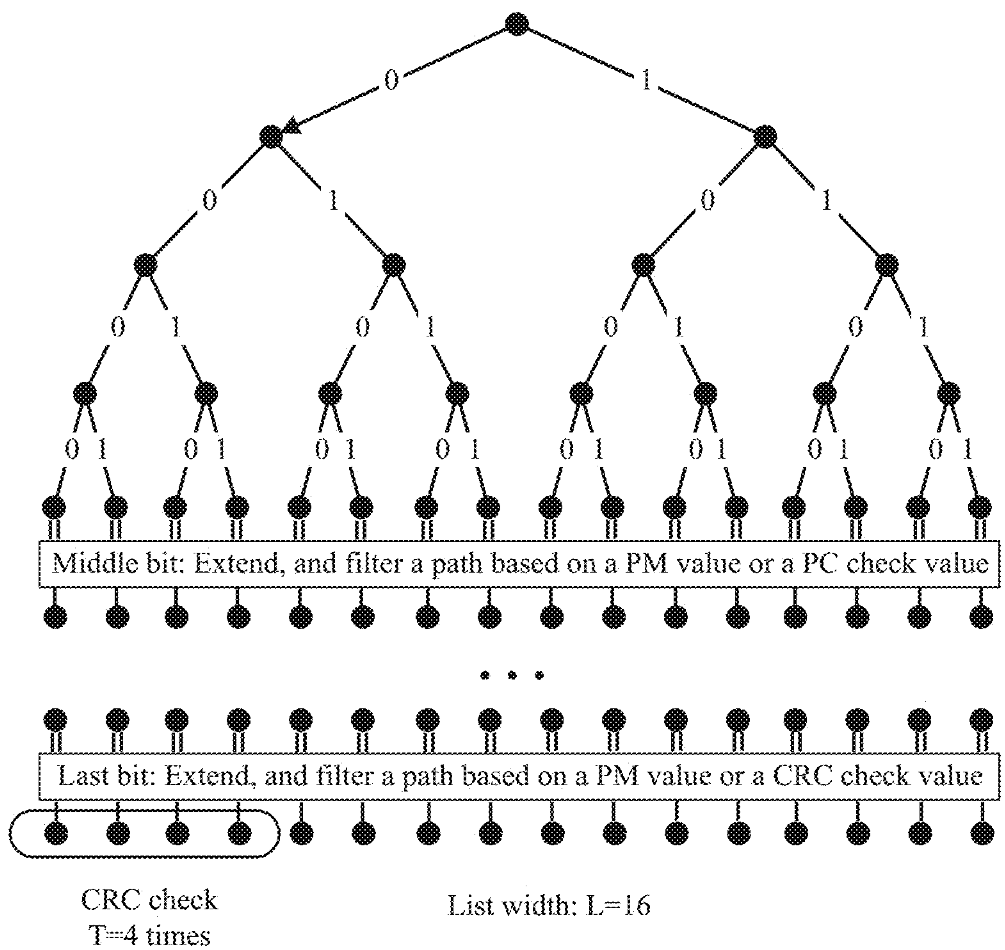
FIG. 9 is a schematic diagram of a decoding process of a decoding method according to this application.

It can be learned from above that a false alarm rate is closely related to a quantity of checks performed by using CRC bits. Based on this, an embodiment of this application further provides a decoding method with a controllable false alarm rate. FIG. 9 is a schematic diagram of a decoding process of a decoding method according to this application. As shown in FIG. 9, when this method is used, it may be unnecessary to perform a CRC check on all decoding paths, so that efficiency of decoding is improved. A sequence encoded in the CA+PC-polar encoding scheme includes four types of bits: information bits, static frozen bits (or referred to as frozen bits, which are optional, that is, the encoded sequence may not include static frozen bits). PC bits, and CRC bits, static frozen bits (or referred to as frozen bits, which are optional, that is, the encoded sequence may not include static frozen bits)

The receive end knows types, quantities, and corresponding positions of all the bits, and therefore distinguishes between the bits during decoding. Assuming that an encoded block output by the transmit end after encoding includes N bits and a width of a decoding list used by the receive end is L, after receiving the bits, the receive end performs different processing based on the types of the bits:

(1) For an information bit, a path corresponding to the information bit is extended into two paths 0 and 1, and metrics, that is, PM values, of the two paths are calculated separately; and if a quantity of paths obtained after the extension is 1≤L, all the paths are retained; or if a quantity of paths obtained after the extension is 1>L, L paths having optimal (minimum) PM values are retained.

(2) For a static frozen bit, a path is not extended, a bit decoding result is directly set to 0, and a PM value of a path in which the static frozen bit is located is calculated.

(3) For a PC bit or a CRC bit, either of the following two manners may be used during processing:

a. Method 1: A path is not extended, a value of the bit is directly set to a value that satisfies a check equation, and a corresponding PM value is calculated.

For a CRC bit, before the last CRC bit is decoded, processing may be performed by using the foregoing Method 1. During decoding of the last CRC bit, processing may be performed in the manner ii in Method 2 below:

b. Method 2:

i. In a decoding process, for example, before the last CRC bit is decoded, a path is extended by using a method the same as that for an information bit, and a PM value of each path is calculated.

ii. When decoding ends, for example, during decoding of the last CRC bit, a maximum of T CRC checks are sequentially performed in a quality-descending (ascending) order of PM values, where T satisfies 1≤T≤I. For example, referring to FIG. 9, a list width is L=16, where only T=4 CRC checks are performed.

ii, 1. If one path that passes a check has been found when the quantity of checks is less than or equal to T, decoding succeeds, and the path that passes CRC is returned as a decoding result.

ii, 2. If a path that passes a check still has not been found when the quantity of checks is greater than T, decoding fails.

In the foregoing embodiments, parameters, namely, a quantity of check bits, positions of the check bits, and a check equation, that need to be used in an encoding process have been described. The receive end also needs to use these parameters during decoding. If the foregoing CA+PC-SCL decoding method with a controllable false alarm rate is used, a value of a maximum quantity T of CRC checks that are allowed further needs to be known.

In an optional embodiment, to satisfy that a false alarm rate is controllable and the false alarm rate is unrelated to a list width (a value of L) of the decoder, based on the method for determining a quantity of CRC bits described above, the quantity J of CRC bits. T, and a maximum false alarm rate FAR (false alarm rate) may be further enabled to satisfy the following relationship:

$$\mathrm{FAR} \approx 2^{-J} \times T$$

Alternatively, the CRC bit length satisfies:

$$J \geq \log_2(T/\mathrm{FAR})$$

Two specific examples are used for description below:

Example 1

It is given that an upper limit of a false alarm rate in single decoding is FAR=$10^{-5}$, and a current decoder parameter is T=4. In this case, a required CRC length is at least J=ceil ($\log_2(4/10^{-5})$)=19 bits.

Example 2

If J=16 bits can already satisfy that a false alarm rate does not exceed a given value FAR when T=1, when T=8, if it is still required to satisfy that a false alarm rate does not exceed the original given value FAR, a quantity of required additional CRC bits needs to satisfy ΔJ=$\log_2$ (T), that is:

$$J(T)=J(1)+\Delta J=J(1)+\log_2 T$$

In the foregoing formula, J(1) is a quantity of CRC bits that satisfies a requirement in a single CRC detection, and J(T) is a quantity of CRC bits that satisfies a requirement in T CRC detections.

In an optional embodiment, the foregoing values of J and T may be specified in advance by using a protocol.

(1) If at least eight CRC bits are required in a single check, values of J and T may be any combination in the following Table:

| | Combination 1 | Combination 2 | Combination 3 | Combination 4 | Combination 5 | Combination 6 | Combination 7 | Combination 8 | Combination 9 |
|---|---|---|---|---|---|---|---|---|---|
| Value of J | 8 | 9 | 10 | 11 | 12 | 13 | 14 | 15 | 16 |
| Value of T | 1 | 2 | 4 | 8 | 16 | 32 | 64 | 128 | 256 |

(2) if at least 16 CRC bits are required in a single check, values of J and T may be any combination in the following Table xx:

| | Combination 1 | Combination 2 | Combination 3 | Combination 4 | Combination 5 | Combination 6 | Combination 7 | Combination 8 | Combination 9 |
|---|---|---|---|---|---|---|---|---|---|
| Value of J | 16 | 17 | 18 | 19 | 20 | 21 | 22 | 23 | 24 |
| Value of T | 1 | 2 | 4 | 8 | 16 | 32 | 64 | 128 | 256 |

(3) If at least 24 CRC bits are required in a single check, values of J and T may be any combination in the following Table xx:

| | Combination 1 | Combination 2 | Combination 3 | Combination 4 | Combination 5 | Combination 6 | Combination 7 | Combination 8 | Combination 9 |
|---|---|---|---|---|---|---|---|---|---|
| Value of J | 24 | 25 | 26 | 27 | 28 | 29 | 30 | 31 | 32 |
| Value of T | 1 | 2 | 4 | 8 | 16 | 32 | 64 | 128 | 256 |

(4) If at least 32 CRC bits are required in a single check, values of J and T may be any combination in the following Table xx:

| | Combination 1 | Combination 2 | Combination 3 | Combination 4 | Combination 5 | Combination 6 | Combination 7 | Combination 8 | Combination 9 |
|---|---|---|---|---|---|---|---|---|---|
| Value of J | 32 | 33 | 34 | 35 | 36 | 37 | 38 | 39 | 40 |
| Value of T | 1 | 2 | 4 | 8 | 16 | 32 | 64 | 128 | 256 |

In an optional embodiment, to achieve good block error rate (BLER) performance with various list widths L, a particular quantity of type-A PC bits need to be set. For example, a value of a quantity P of PC bits may be any one of values listed after the following equal sign:

P=1, 2, 3, 4, 5, 6, 7, 8, 9, 10, 11, 12, 13, 14, 15, 16.

The values of T and P are closely related to an encoding scheme used by an encoder side, for example:

Case (1): If T=L and P=0, the encoder side uses the CA-polar encoding scheme, and a false alarm rate in the CA-polar encoding scheme is uncontrollable.

Case (2): If T=1 and P>0, the encoder side uses the PC-polar encoding scheme, and a false alarm rate in the PC-polar encoding scheme is controllable.

Case (3): If 1<T<L, T is a constant that does not change with L, and P>0, the encoder side uses the PC+CA-polar encoding scheme, and a false alarm rate in the PC+CA-polar encoding scheme is controllable.

Case (4): If 1<T<L, T is a constant that does not change with L, and P=0, a constructed code is a CA-polar code with a controllable false alarm rate.

In the foregoing solution, it should be understood that when T=1, T checks mean one error detection on a decoding result corresponding to the path.

Each error detection (CRC check) causes a particular increase in the false alarm rate, and the definition of the “false alarm” is “a decoding error occurs but the decoding error is not detected (for example, CRC is passed)”, because a plurality of decoding results have a same error detection check value (for example, CRC check value), but only one of the decoding results is correct. Therefore, the false alarm rate increases proportionally with the quantity (for example, a quantity of times of using CRC) of error detections. In view of this, the quantity of error detections (for example, a quantity of times of using CRC) is limited in the solution provided in this application, so that the problem that a false alarm rate is uncontrollable is thoroughly resolved. In a conventional method, when a list for list decoding is larger, a false alarm rate is higher. However, in the solution provided in this application, the false alarm rate does not increase as a list becomes larger.

Figure 10:
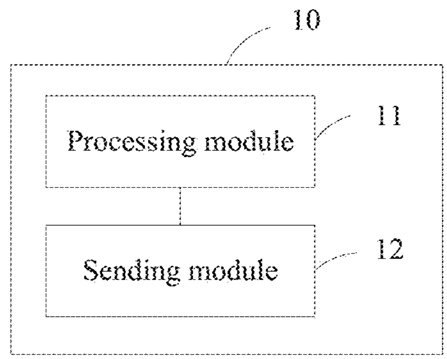
FIG. 10 is a schematic structural diagram of an embodiment of an information transmission apparatus according to this application.

FIG. 10 is a schematic structural diagram of an embodiment of an information transmission apparatus according to this application. As shown in FIG. 10, the information transmission apparatus 10 includes:

a processing module 11, configured to encode a to-be-encoded sequence based on preset parameters, to obtain an encoded sequence, where the parameters include a quantity of check bits, positions of the check bits, and a check equation, a length of the to-be-encoded sequence is K, and K is an integer greater than 0; and a sending module 12, configured to send the encoded sequence to a receiving device.

For configuration or determining of the quantity of the check bits, the positions of the check bits, and the check equation, refer to the description in the foregoing method embodiments. Details are not described herein again.

During implementation, the processing module 11 may be one or more processors. When program code is stored in the processor, the processor runs the program code to implement a function of the processing module 11. When the processor does not store program code, the processor may read program code stored in an external memory to implement a function of the processing module 11. The processing module 11 may alternatively be a processing circuit. The sending module 12 may be a transmitter or a transmitter circuit.

The information transmission apparatus provided in this embodiment may be configured to perform a technical solution on a sending device side in any one of the foregoing method embodiments, and implementation principles and technical effects of the information transmission apparatus are similar to those in the method embodiments. Details are not described herein again.

This embodiment further provides an encoding apparatus. The apparatus includes a processing module 11, an input interface, and an output interface. The input interface is configured to input a to-be-encoded sequence to the processing module 11. The output interface is configured to output a sequence encoded by the processing module 11.

The encoding apparatus provided in this embodiment may be implemented by using a chip or a circuit, and is configured to perform an encoding technical solution on a sending device side in any one of the foregoing method embodiments. Implementation principles and technical effects of the encoding apparatus are similar to those in the method embodiments. Details are not described herein again.

Figure 11:
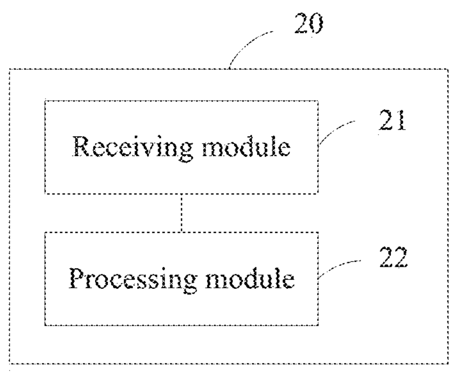
FIG. 11 is a schematic structural diagram of Embodiment 2 of an information transmission apparatus according to this application.

FIG. 11 is a schematic structural diagram of Embodiment 2 of an information transmission apparatus according to this application. As shown in FIG. 11, the information transmission apparatus 20 includes:

a receiving module 21, configured to receive an encoded sequence sent by a sending device, where the encoded sequence is obtained by encoding a to-be-encoded sequence based on preset parameters, a length of the to-be-encoded sequence is K, and K is an integer greater than 0; and a processing module 22, configured to decode the encoded sequence based on the preset parameters, to obtain a decoded sequence, where the parameters include a quantity of check bits, positions of the check bits, and a check equation.

For configuration or determining of the quantity of the check bits, the positions of the check bits, and the check equation, refer to the description in the foregoing method embodiments. Details are not described herein again.

The information transmission apparatus provided in this embodiment is configured to perform a technical solution on a receiving device side in any one of the foregoing method embodiments. Implementation principles and technical effects of the information transmission apparatus are similar to those in the method embodiments. Details are not described herein again.

The information transmission apparatus 20 provided in this embodiment may further include an input interface and an output interface. The input interface is configured to input the encoded sequence to the processing module 22, and the output interface is configured to output the sequence decoded by the processing module 22.

The information transmission apparatus provided in this embodiment may be implemented by using a chip or a circuit, and is configured to perform a decoding technical solution on a receiving device side in any one of the foregoing method embodiments. Implementation principles and technical effects are similar to those in the method embodiments. Details are not described herein again.

Figure 12:
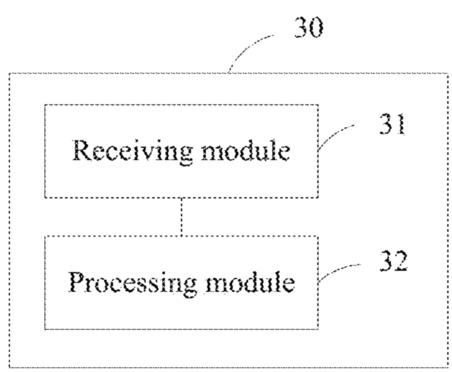
FIG. 12 is a schematic structural diagram of an embodiment of a decoding apparatus according to this application.

FIG. 12 is a schematic structural diagram of an embodiment of a decoding apparatus according to this application. As shown in FIG. 12, the decoding apparatus 30 includes:

a receiving module 31, configured to receive a to-be-decoded bit sequence from a sending device, where the to-be-decoded bit sequence includes at least information bits and at least one check bit; and a processing module 32, configured to decode the to-be-decoded bit sequentially by using a successive cancellation list SCL decoding algorithm, where 1 candidate paths having optimal metrics are output, 1≤1≤L, L is a width of an SCL, and L is an integer greater than or equal to 1, where the processing module 32 is further configured to: check, starting from a candidate path having an optimal metric, T candidate paths by using the at least one check bit, and use a bit sequence in a first candidate path that passes the check as a decoding output, where T is an integer, and 1≤T≤1.

The decoding apparatus provided in this embodiment may further include an input interface and an output interface. The input interface is configured to input the encoded sequence to the processing module 32, and the output interface is configured to output the sequence decoded by the processing module 32.

The decoding apparatus provided in this embodiment may be implemented by using a chip or a circuit, and is configured to perform a decoding technical solution on a receiving device side in any one of the foregoing method embodiments. Implementation principles and technical effects are similar to those in the method embodiments. Details are not described herein again.

This application further provides a readable storage medium, where the readable storage medium stores an instruction, and when at least one processor of a sending device executes the instruction, the sending device performs the information transmission method and the encoding method provided in any one of the foregoing method embodiments.

This application further provides a readable storage medium, where the readable storage medium stores an instruction, and when at least one processor of a receiving device executes the instruction, the receiving device performs the information transmission method and the decoding method provided in any one of the foregoing method embodiments.

This application further provides a program product, where the program product includes an instruction, and the instruction is stored in a readable storage medium. At least one processor of a sending device may read the instruction from the readable storage medium, and execute the instruction so that the sending device implements the information transmission method and the encoding method provided in any one of the foregoing method embodiments.

This application further provides a program product, where the program product includes an instruction, and the instruction is stored in a readable storage medium. At least one processor of a receiving device may read the instruction from the readable storage medium, and execute the instruction so that the receiving device implements the information transmission method and the decoding method provided in any one of the foregoing method embodiments.

In a specific implementation of the sending device or the receiving device, it should be understood that the processor may be a central processing unit (English: Central Processing Unit, CPU for short), or may be another general-purpose processor, a digital signal processor (English: Digital Signal Processor, DSP for short), an application-specific integrated circuit (English: Application-Specific Integrated Circuit, ASIC for short), or the like. The general-purpose processor may be a microprocessor, or the processor may be any conventional processor or the like. The steps of the method disclosed with reference to this application may be directly performed by a hardware processor, or may be performed by using a combination of hardware in the processor and a software module.

All or some steps in the foregoing method embodiments may be performed by a program instructing related hardware. The program may be stored in a readable storage medium. When the program runs, the steps of the method embodiments are performed. The foregoing storage (storage medium) includes: a, read-only memory (English: read-only memory, ROM for short), a RAM, a flash memory, a hard disk, a solid-state drive, a magnetic tape (English: magnetic tape), a floppy disk (English: floppy disk), an optical disc (English: optical disc), or any combination thereof.

It should finally be noted that the foregoing embodiments are merely intended for describing the technical solutions of this application rather than limiting this application.

The invention claimed is:

1. An information transmission method in wireless communications, comprising:

encoding, by a transmit end, a to-be-encoded sequence based on preset parameters to obtain an encoded sequence, wherein the preset parameters comprise a quantity of check bits, positions of the check bits, and a check equation, wherein a length of the to-be-encoded sequence is K, and wherein K is an integer greater than 0; and sending, by the transmit end, the encoded sequence;

wherein:

the quantity of the check bits is J, and $J \geq \log_2(T/FAR)$ wherein T is a maximum quantity of checks that are allowed to be performed by using a check bit, and wherein FAR is a maximum false alarm rate of a single check performed by using a check bit; or the quantity of the check bits is J(T), and $J(T)=J(1)+\Delta J=J(1)+\log_2 T$, wherein J(1) is a quantity of check bits that need to be used in a single check, wherein J(T) is a quantity of check bits that need to be used in T checks, and wherein T is a maximum quantity of checks that are allowed to be performed by using a check bit; and values of (J, T) are any combination of (8, 1), (9, 2), (10, 4), (11, 8), (12, 16), (13, 32), (16, 64), (15, 128), and (16, 256); or values of (J, T) are any combination of (16, 1), (17, 2), (18, 4), (19, 8), (20, 16), (21, 32), (22, 64), (23, 128), and (24, 256).

2. The method according to claim 1, wherein a position sequence number of a bit in the to-be-encoded sequence is any integer greater than or equal to 0 and less than K; and wherein the positions of the check bits are:

positions of $F_P$ consecutive bits selected starting from a bit whose position sequence number is $N_X$ in descending order of position sequence numbers of bits in the to-be-encoded sequence; or positions of $F_P$ consecutive bits selected starting from a bit whose position sequence number is $N_X$ in ascending order of position sequence numbers of bits in the to-be-encoded sequence, wherein $0 \le N_X \le K$, and wherein $0 < F_p < K$.

3. The method according to claim 1, wherein the positions of the check bits are:

bit positions selected from a new generator matrix, wherein the new generator matrix is obtained by performing row-column transformation on a check generator matrix and moving check bits in the check generator matrix that depend only on some information bits to subchannels with smaller sequence numbers.

4. The method according to claim 1, wherein:

the positions of the check bits correspond to a position of any bit in the to-be-encoded sequence;

the positions of the check bits correspond to positions of a plurality of bits in the to-be-encoded sequence, wherein positions of at least two of the plurality of bits are non-consecutive; or the positions of the check bits are determined based on position parameters, wherein the position parameters comprise at least an information threshold $Z_I$ and a check threshold $Z_P$, wherein the information threshold $Z_I$ is used to represent reliability corresponding to a least reliable subchannel of all information subchannels, and wherein the check threshold $Z_P$ is used to represent reliability corresponding to a least reliable subchannel in a set of subchannels whose reliability is greater than the information threshold $Z_I$ and whose row weight is the largest among all check subchannels.

5. The method according to claim 1, wherein the check equation is determined based on a polynomial, wherein the polynomial is represented by using one of a binary form, an octal form, a decimal form, a hexadecimal form, and a position vector.

6. The method according to claim 1, wherein the check equation is determined based on a check equation table, wherein the check equation table comprises at least check bits, information bits, and information bits that participate in the check equation.

7. The method according to claim 1, wherein optional positions of the check bits are all subchannel positions whose reliability is less than information threshold $Z_I$, wherein the information threshold $Z_I$ is reliability or a polarization weight corresponding to a least reliable subchannel of all information sub channels.

8. The method according to claim 1, wherein the check bits are parity check bits, and wherein positions of the parity check bits are selected based on a subchannel row weight.

9. An apparatus in a wireless communication network, comprising a memory and at least one processor, wherein the memory stores program instructions which, when executed by the at least one processor, cause the apparatus to perform the method according to claim 1.

10. An information transmission apparatus, comprising:

at least one processor;

one or more memories coupled to the at least one processor and storing programming instructions for execution by the at least one processor to encode a to-be-encoded sequence based on preset parameters to obtain an encoded sequence, wherein the preset parameters comprise a quantity of check bits, positions of the check bits, and a check equation, wherein a length of the to-be-encoded sequence is K, and wherein K is an integer greater than 0; and a transmitter, the transmitter configured to send the encoded sequence to a receiving device;

wherein:

the quantity of the check bits is J, and $J \ge \log_2(T/FAR)$, wherein T is a maximum quantity of checks that are allowed to be performed by using a check bit, and wherein FAR is a maximum false alarm rate of a single check performed by using a check bit; or the quantity of the check bits is J(T), and $J(T)=J(1)+\Delta J=J(1)+\log_2 T$, wherein J(1) is a quantity of check bits that need to be used in a single check, wherein J(T) is a quantity of check bits that need to be used in T checks, and wherein T is a maximum quantity of checks that are allowed to be performed by using a check bit; and values of (J, T) are any combination of (8, 1), (9, 2), (10, 4), (11, 8), (12, 16), (13, 32), (16, 64), (15, 128), and (16, 256); or values of (J, T) are any combination of (16, 1), (17, 2), (18, 4), (19, 8), (20, 16), (21, 32), (22, 64), (23, 128), and (24, 256).

11. The apparatus according to claim 10, wherein a position sequence number of a bit in the to-be-encoded sequence is any integer greater than or equal to 0 and less than K, and wherein the positions of the check bits are:

positions of $F_P$ consecutive bits selected starting from a bit whose position sequence number is $N_X$ in descending order of position sequence numbers of bits in the to-be-encoded sequence; or positions of $F_P$ consecutive bits selected starting from a bit whose position sequence number is $N_X$ in ascending order of position sequence numbers of bits in the to-be-encoded sequence, wherein $0 \le N_X \le K$, and wherein $0 < F_p < K$.

12. The apparatus according to claim 10, wherein the positions of the check bits are:

bit positions selected from a new generator matrix, wherein the new generator matrix is obtained by performing row-column transformation on a check generator matrix and moving check bits in the check generator matrix that depend only on some information bits to subchannels with smaller sequence numbers.

13. The apparatus according to claim 10, wherein:

the positions of the check bits correspond to a position of any bit in the to-be-encoded sequence;

the positions of the check bits correspond to positions of a plurality of bits in the to-be-encoded sequence, wherein positions of at least two of the plurality of bits are non-consecutive; or the positions of the check bits are determined based on position parameters, wherein the position parameters comprise at least an information threshold $Z_I$ and a check threshold $Z_P$, wherein the information threshold $Z_I$ is used to represent reliability corresponding to a least reliable subchannel of all information subchannels, and wherein the check threshold $Z_P$ is used to represent reliability corresponding to a least reliable subchannel in a set of subchannels whose reliability is greater than the information threshold $Z_I$ and whose row weight is the largest among all check subchannels.

14. The apparatus according to claim 10, wherein the check equation is determined based on a polynomial, wherein the polynomial is represented by using one of a binary form, an octal form, a decimal form, a hexadecimal form, and a position vector.

15. The apparatus according to claim 10, wherein the check equation is determined based on a check equation table, wherein the check equation table comprises at least check bits, information bits, and information bits that participate in the check equation.

16. The apparatus according to claim 10, wherein optional positions of the check bits are all subchannel positions whose reliability is less than information threshold $Z_I$, wherein the information threshold $Z_I$ is reliability or a polarization weight corresponding to a least reliable subchannel of all information subchannels.

17. The apparatus according to claim 10, wherein the check bits are parity check bits, and wherein positions of the parity check bits are selected based on a subchannel row weight.

18. A non-transitory computer-readable storage medium comprising instructions which, when executed by at least one processor of a sending device, cause the sending device to perform:

encoding a to-be-encoded sequence based on preset parameters to obtain an encoded sequence, wherein the preset parameters comprise a quantity of check bits, positions of the check bits, and a check equation, wherein a length of the to-be-encoded sequence is K, and wherein K is an integer greater than 0; and sending the encoded sequence;

wherein:

the quantity of the check bits is J, and $J \geq \log_2(T/FAR)$, wherein T is a maximum quantity of checks that are allowed to be performed by using a check bit, and wherein FAR is a maximum false alarm rate of a single check performed by using a check bit; or the quantity of the check bits is J(T), and $J(T)=J(1)+\Delta J=J(1)+\log_2 T$, wherein J(1) is a quantity of check bits that need to be used in a single check, wherein J(T) is a quantity of check bits that need to be used in T checks, and wherein T is a maximum quantity of checks that are allowed to be performed by using a check bit; and values of (J, T) are any combination of (8, 1), (9, 2), (10, 4), (11, 8), (12, 16), (13, 32), (16, 64), (15, 128), and (16, 256); or values of (J, T) are any combination of (16, 1), (17, 2), (18, 4), (19, 8), (20, 16), (21, 32), (22, 64), (23, 128), and (24, 256).

* * * * *